United States Patent
Lee et al.

(10) Patent No.: US 10,600,936 B2
(45) Date of Patent: Mar. 24, 2020

(54) SEMICONDUCTOR DEVICE

(71) Applicant: LG INNOTEK CO., LTD., Seoul (KR)

(72) Inventors: Sang Youl Lee, Seoul (KR); Chung Song Kim, Seoul (KR); Ji Hyung Moon, Seoul (KR); Sun Woo Park, Seoul (KR); June O Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 41 days.

(21) Appl. No.: 16/090,051

(22) PCT Filed: Mar. 28, 2017

(86) PCT No.: PCT/KR2017/003289
§ 371 (c)(1),
(2) Date: Sep. 28, 2018

(87) PCT Pub. No.: WO2017/171337
PCT Pub. Date: Oct. 5, 2017

(65) Prior Publication Data
US 2019/0131494 A1    May 2, 2019

(30) Foreign Application Priority Data

Mar. 30, 2016  (KR) .................. 10-2016-0038240
Jun. 30, 2016  (KR) .................. 10-2016-0082381

(51) Int. Cl.
*H01L 33/38*   (2010.01)
*H01L 25/16*   (2006.01)
(Continued)

(52) U.S. Cl.
CPC .............. *H01L 33/38* (2013.01); *G08C 23/04* (2013.01); *G09G 3/22* (2013.01); *G09G 3/3258* (2013.01);
(Continued)

(58) Field of Classification Search
CPC ... H01L 33/38; H01L 25/167; H01L 27/1214; H01L 27/156; H01L 29/41733;
(Continued)

(56) References Cited

U.S. PATENT DOCUMENTS

2002/0173062 A1* 11/2002 Chen ................. H01L 33/38
                                                             438/30
2013/0251313 A1*  9/2013 Wu .................. H01L 25/0657
                                                             385/88
(Continued)

FOREIGN PATENT DOCUMENTS

JP   2005-72153 A   3/2005
JP   2008-16700 A   1/2008
(Continued)

OTHER PUBLICATIONS

International Search Report for PCT/KR2017/003289 (PCT/ISA/210) dated Jul. 12, 2017.

*Primary Examiner* — Peter D McLoone
(74) *Attorney, Agent, or Firm* — Birch, Stewart, Kolasch & Birch, LLP

(57) ABSTRACT

A semiconductor device, according to one embodiment, may comprise: a light-emitting structure comprising a first conductivity type semiconductor layer, an active layer disposed on the first conductivity type semiconductor layer, and a second conductivity type semiconductor layer disposed on the active layer; a transistor disposed on the light-emitting structure and comprising a semiconductor layer, a source electrode, a gate electrode, and a drain electrode; a second electrode disposed on the second conductivity type semiconductor layer and electrically connected to the drain electrode and the second conductivity type semiconductor layer; a first bonding pad disposed on the light-emitting structure and electrically connected to the first conductivity type semiconductor layer; a second bonding pad disposed on
(Continued)

the transistor and electrically connected to the source electrode; and a third bonding pad disposed on the transistor and electrically connected to the gate electrode.

20 Claims, 43 Drawing Sheets

(51) Int. Cl.
| | |
|---|---|
| H01L 29/772 | (2006.01) |
| H01L 29/423 | (2006.01) |
| G08C 23/04 | (2006.01) |
| H01L 29/66 | (2006.01) |
| G09G 3/22 | (2006.01) |
| G09G 3/3258 | (2016.01) |
| G09G 3/3266 | (2016.01) |
| H01L 27/12 | (2006.01) |
| H01L 29/417 | (2006.01) |
| H01L 27/15 | (2006.01) |

(52) U.S. Cl.
CPC ......... *G09G 3/3266* (2013.01); *H01L 25/167* (2013.01); *H01L 27/1214* (2013.01); *H01L 29/41733* (2013.01); *H01L 29/423* (2013.01); *H01L 29/42384* (2013.01); *H01L 29/66969* (2013.01); *H01L 29/772* (2013.01); *H01L 27/156* (2013.01)

(58) Field of Classification Search
CPC ............ H01L 29/423; H01L 29/42384; H01L 29/66969; H01L 29/772; G08C 23/04; G09G 3/22; G09G 3/3258; G09G 3/3266
See application file for complete search history.

(56) References Cited

U.S. PATENT DOCUMENTS

| | | | |
|---|---|---|---|
| 2013/0270599 A1* | 10/2013 | Hsu | ............... H01L 24/24 |
| | | | 257/98 |
| 2014/0048825 A1* | 2/2014 | Hsieh | ............... H01L 27/15 |
| | | | 257/88 |
| 2019/0334067 A1* | 10/2019 | Lo | ............... H01L 24/10 |
| 2019/0371856 A1* | 12/2019 | Cha | ............... H01L 27/156 |

FOREIGN PATENT DOCUMENTS

| | | |
|---|---|---|
| JP | 2014-78575 A | 5/2014 |
| KR | 10-2013-0031525 A | 3/2013 |
| KR | 10-2014-0078959 A | 6/2014 |

* cited by examiner

SEMICONDUCTOR DEVICE

CROSS REFERENCE TO RELATED APPLICATIONS

This application is the National Phase of PCT International Application No. PCT/KR2017/003289, filed on Mar. 28, 2017, which claims priority under 35 U.S.C. 119(a) to Patent Application No. 10-2016-0038240, filed in the Republic of Korea on Mar. 30, 2016 and Patent Application No. 10-2016-0082381, filed in the Republic of Korea on Jun. 30, 2016, all of which are hereby expressly incorporated by reference into the present application.

TECHNICAL FIELD

Embodiments relate to a semiconductor device. In addition, embodiments relates to a display panel including a semiconductor device, a display apparatus including a semiconductor device, and a communication device including a semiconductor device.

BACKGROUND ART

A light emitting diode (LED) is one of semiconductor devices that emit light when current is applied. The light emitting diode may emit light having high efficiency at a low voltage and thus have an excellent energy saving effect. As the luminance problem of the light emitting diode is improved, the light emitting diode has been variously applied to various devices such as a light source of a liquid crystal display device, an electric sign board, a display, a home appliance, and the like. Such a semiconductor device may include a light emitting diode, a laser diode, a quantum dot device, and the like.

Meanwhile, research has been conducted into a method of efficiently driving a light emitting diode by connecting transistors to the light emitting diode. Since materials for constituting the light emitting diode and the transistor are usually different, research has been conducted into the material and the manufacturing method of the light emitting diode and the transistor. Further, research has been conducted to improve the characteristics of the light emitting diode and the transistors and improve the production yield.

DISCLOSURE OF THE INVENTION

Technical Problem

Embodiments can provide a semiconductor device capable of improving light extraction efficiency and providing efficient driving, and a display panel and a display apparatus including the same.

Embodiments can provide a communication device capable of improving light extraction efficiency, providing efficient control, and transmitting data by using light.

Technical Solution

A semiconductor device according to an embodiment includes: a light-emitting structure including a first conductivity type semiconductor layer, an active layer disposed on the first conductivity type semiconductor layer, and a second conductivity type semiconductor layer disposed on the active layer; a transistor disposed on the light-emitting structure and including a semiconductor layer, a source electrode, a gate electrode, and a drain electrode; a second electrode disposed on the second conductivity type semiconductor layer and electrically connected to the drain electrode and the second conductivity type semiconductor layer; a first bonding pad disposed on the light-emitting structure and electrically connected to the first conductivity type semiconductor layer; a second bonding pad disposed on the transistor and electrically connected to the source electrode; and a third bonding pad disposed on the transistor and electrically connected to the gate electrode.

A display panel according to an embodiment includes: a substrate; and a semiconductor device disposed on the substrate, wherein the semiconductor device includes: a light-emitting structure including a first conductivity type semiconductor layer, an active layer disposed on the first conductivity type semiconductor layer, and a second conductivity type semiconductor layer disposed on the active layer; a transistor disposed on the light-emitting structure and including a semiconductor layer, a source electrode, a gate electrode, and a drain electrode; a second electrode disposed on the second conductivity type semiconductor layer and electrically connected to the drain electrode and the second conductivity type semiconductor layer; a first bonding pad disposed on the light-emitting structure and electrically connected to the first conductivity type semiconductor layer; a second bonding pad disposed on the transistor and electrically connected to the source electrode; and a third bonding pad disposed on the transistor and electrically connected to the gate electrode.

A display apparatus according to an embodiment includes: a substrate; a semiconductor device disposed on the substrate; and a control unit configured to control light emission of the semiconductor device, wherein the semiconductor device includes: a light-emitting structure including a first conductivity type semiconductor layer, an active layer disposed on the first conductivity type semiconductor layer, and a second conductivity type semiconductor layer disposed on the active layer; a transistor disposed on the light-emitting structure and including a semiconductor layer, a source electrode, a gate electrode, and a drain electrode; a second electrode disposed on the second conductivity type semiconductor layer and electrically connected to the drain electrode and the second conductivity type semiconductor layer; a first bonding pad disposed on the light-emitting structure and electrically connected to the first conductivity type semiconductor layer; a second bonding pad disposed on the transistor and electrically connected to the source electrode; and a third bonding pad disposed on the transistor and electrically connected to the gate electrode.

A communication device according to an embodiment includes: a substrate, a semiconductor device disposed on the substrate; and a control unit configured to control light emission of the semiconductor device and modulate and transmit data, wherein the semiconductor device includes: a light-emitting structure including a first conductivity type semiconductor layer, an active layer disposed on the first conductivity type semiconductor layer, and a second conductivity type semiconductor layer disposed on the active layer; a transistor disposed on the light-emitting structure and including a semiconductor layer, a source electrode, a gate electrode, and a drain electrode; a second electrode disposed on the second conductivity type semiconductor layer and electrically connected to the drain electrode and the second conductivity type semiconductor layer; a first bonding pad disposed on the light-emitting structure and electrically connected to the first conductivity type semi-conductor layer; a second bonding pad disposed on the transistor and electrically connected to the source electrode;

and a third bonding pad disposed on the transistor and electrically connected to the gate electrode.

A semiconductor device according to an embodiment includes: a light-emitting structure including a first conductivity type semiconductor layer, an active layer disposed on the first conductivity type semiconductor layer, and a second conductivity type semiconductor layer disposed on the active layer; a transistor disposed on the light-emitting structure and including a semiconductor layer, a source electrode, a gate electrode, and a drain electrode; a first electrode electrically connected to the first conductivity type semiconductor layer; and a second electrode disposed on the second conductivity type semiconductor layer and electrically connected to the drain electrode and the second conductivity type semiconductor layer.

A display panel according to an embodiment includes: a substrate; and a semiconductor device disposed on the substrate, wherein the semiconductor device includes: a light-emitting structure including a first conductivity type semiconductor layer, an active layer disposed on the first conductivity type semiconductor layer, and a second conductivity type semiconductor layer disposed on the active layer; a transistor disposed on the light-emitting structure and including a semiconductor layer, a source electrode, a gate electrode, and a drain electrode; a first electrode electrically connected to the first conductivity type semiconductor layer; and a second electrode disposed on the second conductivity type semiconductor layer and electrically connected to the drain electrode and the second conductivity type semiconductor layer.

A display apparatus according to an embodiment includes: a substrate; a semiconductor device disposed on the substrate; and a control unit configured to control light emission of the semiconductor device, wherein the semiconductor device includes: a light-emitting structure including a first conductivity type semiconductor layer, an active layer disposed on the first conductivity type semiconductor layer, and a second conductivity type semiconductor layer disposed on the active layer; a transistor disposed on the light-emitting structure and including a semiconductor layer, a source electrode, a gate electrode, and a drain electrode; a first electrode electrically connected to the first conductivity type semiconductor layer; and a second electrode disposed on the second conductivity type semiconductor layer and electrically connected to the drain electrode and the second conductivity type semiconductor layer.

A communication device according to an embodiment includes: a substrate; a semiconductor device disposed on the substrate; and a control unit configured to control light emission of the semiconductor device and modulate and transmit data, wherein the semiconductor device includes: a light-emitting structure including a first conductivity type semiconductor layer, an active layer disposed on the first conductivity type semiconductor layer, and a second conductivity type semiconductor layer disposed on the active layer; a transistor disposed on the light-emitting structure and including a semiconductor layer, a source electrode, a gate electrode, and a drain electrode; a first electrode electrically connected to the first conductivity type semiconductor layer; and a second electrode disposed on the second conductivity type semiconductor layer and electrically connected to the drain electrode and the second conductivity type semiconductor layer.

Advantageous Effects

In a semiconductor device, and a display panel and a display apparatus including the same according to embodiments, light extraction efficiency may be improved, and efficient driving may be provided.

In a communication device according to an embodiment, light extraction efficiency may be improved, efficient control may be provided, and data may be transmitted by using light.

MODE FOR CARRYING OUT THE INVENTION

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on/over' and 'below/under' each layer will be made on the basis of drawings.

Hereinafter, a semiconductor device, a display panel, a display apparatus, and a communication device according to embodiments will be described with reference to the accompanying drawings.

Figure 1:
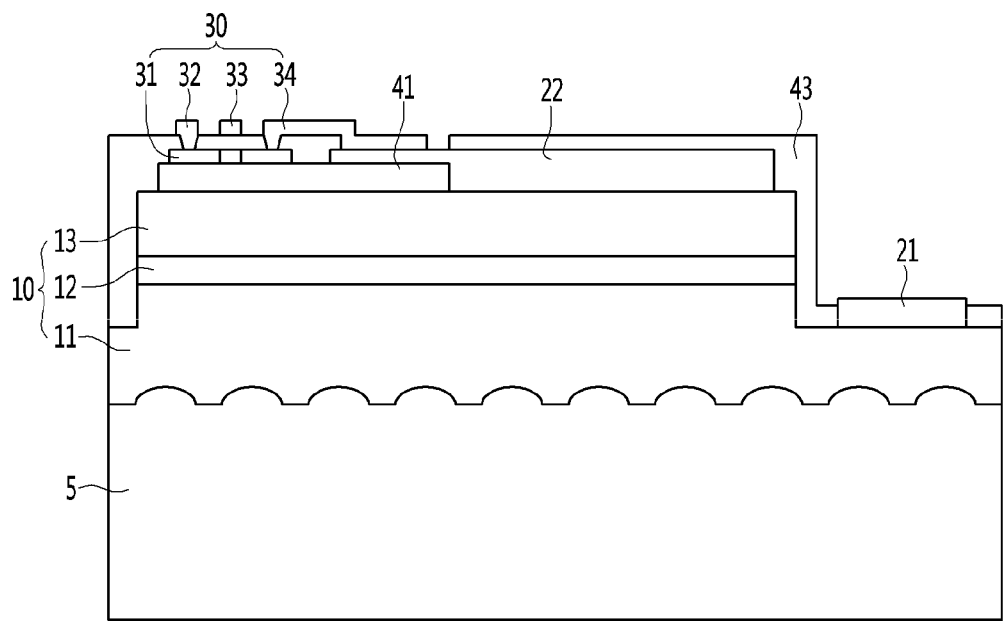
FIG. 1 is a view illustrating a semiconductor device according to an embodiment of the present invention.

FIG. 1 is a view illustrating a semiconductor device according to an embodiment of the present invention.

A semiconductor device according to an embodiment may include a light-emitting structure 10 and a transistor 30 as illustrated in FIG. 1. For example, the transistor 30 may be disposed on the light-emitting structure 10. The transistor 30 may be electrically connected to the light-emitting structure 10. The semiconductor device according to the embodiment may control the driving of the transistor 30 and adjust the light emission of the light-emitting structure 10. The transistor 30 may be provided as, for example, a top gate transistor structure.

The light-emitting structure 10 may include a first conductivity type semiconductor layer 11, an active layer 12, and a second conductivity type semiconductor layer 13. The active layer 12 may be disposed between the first conductivity type semiconductor layer 11 and the second conductivity type semiconductor layer 13. For example, the active layer 12 may be disposed on the first conductivity type semiconductor layer 11, and the second conductivity type semiconductor layer 13 may be disposed on the active layer 12.

For example, the first conductivity type semiconductor layer 11 may be formed as an n-type semiconductor layer in which an n-type dopant is added as a first conductive dopant, and the second conductivity type semiconductor layer 13 may be formed as a p-type semiconductor layer in which a p-type dopant is added as a second conductive dopant. In addition, on the contrary, the first conductivity type semiconductor layer 11 may be formed as a p-type semiconductor layer, and the second conductivity type semiconductor layer 13 may be formed as an n-type semiconductor layer. Hereinafter, a case where the first conductivity type semiconductor layer 11 is provided as an n-type semiconductor layer and the second conductivity type semiconductor layer 13 is provided as a p-type semiconductor layer will be described.

In the light-emitting structure 10, a wavelength band of generated light may be changed according to a material constituting the active layer 12. The selection of materials constituting the first conductivity type semiconductor layer 11 and the second conductivity type semiconductor layer 13 may be changed according to the material constituting the active layer 12. The light-emitting structure 10 may be implemented by compound semiconductor. The light-emitting structure 10 may be implemented by, for example, a group II-VI compound semiconductor or a group III-V compound semiconductor. For example, the light-emitting structure 10 may be implemented by including at least two elements selected from the group consisting of aluminum (Al), gallium (Ga), indium (In), Phosphorus (P), arsenic (As), and nitrogen (N).

The active layer 12 is a layer in which electrons (or holes) injected through the first conductivity type semiconductor layer 11 and holes (or electrons) injected through the second conductivity type semiconductor layer 13 recombine with each other and light is emitted by a band gap difference between energy bands according to a forming material of the active layer 12. The active layer 12 may be formed to have one of a single well structure, a multiple well structure, a quantum dot structure, or a quantum wire structure. The active layer 12 may be implemented by compound semiconductor. The active layer 12 may be implemented by, for example, a group II-VI compound semiconductor or a group III-V compound semiconductor.

When light of a blue wavelength band or a green wavelength band is generated in the active layer 12, the active layer 12 may be implemented by, for example, a semiconductor material having a formula of $In_xAl_yGa_{1-x-y}N$ ($0 \leq x \leq 1$, $0 \leq y \leq 1$, $0 \leq x+y \leq 1$). When the active layer 12 is implemented by a multi well structure, the active layer 12 may be implemented by stacking a plurality of well layers and a plurality of barrier layers. In addition, when light of a red wavelength band is generated in the active layer 12, the active layer 12 may be implemented by, for example, a semiconductor material having a formula of $(Al_xGa_{1-x})_yIn_{1-y}P$ ($0 \leq x \leq 1$, $0 \leq y \leq 1$). The active layer 12 may be selected from, for example, AlGaInP, AlInP, GaP, and GaInP.

The first conductivity type semiconductor layer 11 may include, for example, an n-type semiconductor layer. The first conductivity type semiconductor layer 11 may be implemented by compound semiconductor. The first conductivity type semiconductor layer 11 may be implemented by, for example, a group II-VI compound semiconductor or a group III-V compound semiconductor. For example, when light of a blue wavelength band or a green wavelength band is generated in the active layer 12, the first conductivity type semiconductor layer 11 may be implemented by, for example, a semiconductor material having a formula of $In_xAl_yGa_{1-x-y}N$ ($0 \leq x \leq 1$, $0 \leq y \leq 1$, $0 \leq x+y \leq 1$). In addition, when light of a red wavelength band is generated in the active layer 12, the first conductivity type semiconductor layer 11 may be implemented by, for example, a semiconductor material having a formula of $(Al_xGa_{1-x})_yIn_{1-y}P$ ($0 \leq x \leq 1$, $0 \leq y \leq 1$). In the first conductivity type semiconductor layer 11, y may have a value of 0.5 and x may have a value of 0.5 to 0.8 in the formula. The first conductivity type semiconductor layer 11 may be selected from the group consisting of GaN, AlN, AlGaN, InGaN, InN, InAlGaN, AlInN, AlGaAs, GaP, GaAs, GaAsP, AlGaInP, AlInP, and GaInP, and an n-type dopant such as Si, Ge, Sn, Se, or Te may be doped.

The second conductivity type semiconductor layer 13 may be implemented by compound semiconductor. The second conductivity type semiconductor layer 13 may be implemented by, for example, a group II-VI compound semiconductor or a group III-V compound semiconductor. For example, when light of a blue wavelength band or a green wavelength band is generated in the active layer 12, the second conductivity type semiconductor layer 13 may be implemented by, for example, a semiconductor material having a formula of $In_xAl_yGa_{1-x-y}N$ ($0 \leq x \leq 1$, $0 \leq y \leq 1$, $0 \leq x+y \leq 1$). In addition, when light of a red wavelength band is generated in the active layer 12, the second conductivity type semiconductor layer 13 may be implemented by, for example, a semiconductor material having a formula of $(Al_xGa_{1-x})_yIn_{1-y}P$ ($0 \leq x \leq 1$, $0 \leq y \leq 1$). The second conductivity type semiconductor layer 13 may be selected from the group consisting of GaN, AlN, AlGaN, InGaN, InN, InAlGaN, AlInN, AlGaAs, GaP, GaAs, GaAsP, AlGaInP, AlInP, and GaInP, and a p-type dopant such as Mg, Zn, Ca, Sr, or Ba may be doped.

In addition, a first conductive InGaN/GaN superlattice structure or InGaN/InGaN superlattice structure may be formed between the first conductivity type semiconductor layer 11 and the active layer 12. In addition, a second conductive AlGaN layer may be formed between the second conductivity type semiconductor layer 13 and the active layer 12.

The transistor 30 may include a semiconductor layer 31, a source electrode 32, a gate electrode 33, and a drain electrode 34. The transistor 30 may be disposed on the light-emitting structure 10. The transistor 30 may be disposed on the second conductivity type semiconductor layer 13. The area of the transistor 30 may be smaller than the area of the second conductivity type semiconductor layer 13 when viewed from above the semiconductor device. The transistor 30 may be disposed on the active layer 12. The area of the transistor 30 may be smaller than the area of the active layer 12 when viewed from above the semiconductor device.

The semiconductor layer 31 may be formed of, for example, a material different from the material forming the light-emitting structure 10. For example, the semiconductor layer 31 may include a material selected from the group consisting of amorphous silicon, polycrystalline silicon, single crystal silicon, and oxide semiconductor. The material constituting the semiconductor layer 31 may be selected from materials that can be formed at a lower temperature than a forming temperature of the light-emitting structure 10. Therefore, even when the semiconductor layer 31 is formed after the light-emitting structure 10 is formed, it does not influence the physical properties of the light-emitting structure 10, and it is possible to prevent the light extraction efficiency of the light-emitting structure 10 from being reduced. Examples of the oxide semiconductor may be selected from the group consisting of indium gallium zinc oxide (IGZO), indium gallium oxide (IGO), and indium zinc oxide (IZO).

The source electrode 32 may be electrically connected to a first region of the semiconductor layer 31. The source electrode 32 may be disposed on the first region of the semiconductor layer 31. The drain electrode 34 may be electrically connected to a second region of the semiconductor layer 31. The drain electrode 34 may be disposed on the second region of the semiconductor layer 31.

The gate electrode 33 may be disposed between the first region and the second region of the semiconductor layer 31. The gate electrode 33 may be disposed above between the first region and the second region of the semiconductor layer 31. For example, the first region and the second region of the semiconductor layer 31 may be provided to include relatively higher concentration impurities than a third region of the semiconductor layer 31 disposed under the gate electrode 33. The gate electrode 33 may be disposed spaced apart from the semiconductor layer 31. The lower surface of the gate electrode 33 may be disposed spaced apart from the upper surface of the semiconductor layer 31. A second insulating layer 43 may be disposed between the gate electrode 33 and the semiconductor layer 31. For example, the gate electrode 33 and the semiconductor layer 31 may be disposed spaced apart by the thickness of the second insulating layer 43.

According to an embodiment, a current flow from the source electrode 32 to the drain electrode 34 may be controlled according to the magnitude of a voltage applied to the gate electrode 33. That is, when a voltage exceeding a threshold voltage of the transistor 30 is applied to the gate electrode 33, a current may flow from the source electrode 32 to the drain electrode 34.

Meanwhile, the semiconductor device according to an embodiment may include a first electrode 21 and a second electrode 22 as illustrated in FIG. 1. The first electrode 21 and the second electrode 22 may be electrically connected to the light-emitting structure 10. The first electrode 21 may be electrically connected to the first conductivity type semiconductor layer 11. For example, the first electrode 21 may be disposed on the first conductivity type semiconductor layer 11. The first electrode 21 may be disposed spaced apart from the side surface of the active layer 12. The second electrode 22 may be electrically connected to the second conductivity type semiconductor layer 13. For example, the second electrode 22 may be disposed on the second conductivity type semiconductor layer 13. The second electrode 22 may be disposed on the active layer 12. The light-emitting structure 10 may be driven by the voltage applied to the first electrode 21 and the second electrode 22. Light may be generated in the active layer 12 of the light-emitting structure 10 by the voltage applied between the first electrode 21 and the second electrode 22.

For example, the first electrode 21 may include a region that ohmic-contacts the first conductivity type semiconductor layer 11. The first electrode 21 may include a single layer or a multi-layer including at least one selected from Cr, Ni, Ti, Ge, Zn, Mg, Ca, Al, Ag, Rh, W, Pt, Au, AuGe, and AuGe/Ni/Au.

For example, the second electrode 22 may include a material that ohmic-contacts the second conductivity type semiconductor layer 13. For example, the second electrode 22 may include a transparent conductive oxide. For example, the second electrode 22 may include at least one material selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

The semiconductor device according to an embodiment may include a first insulating layer 41 as illustrated in FIG. 1. The first insulating layer 41 may be disposed on the light-emitting structure 10. The first insulating layer 41 may be disposed on the second conductivity type semiconductor layer 13. The first insulating layer 41 may be disposed on the active layer 12. The first insulating layer 41 may be disposed under the transistor 30. The first insulating layer 41 may be disposed between the light-emitting structure 10 and the transistor 30. The first insulating layer 41 may be disposed between the second conductivity type semiconductor layer 13 and the transistor 30. The width of the first insulating layer 41 may be smaller than the width of the second conductivity type semiconductor layer 13.

According to an embodiment, the semiconductor layer 31 may be disposed on the first insulating layer 41. The second electrode 22 may be electrically connected to the drain electrode 34. The first region of the drain electrode 34 may be electrically connected to the semiconductor layer 31. The first region of the drain electrode 34 may be disposed on the semiconductor layer 31. The second region of the drain electrode 34 may be electrically connected to the second electrode 22. The second region of the drain electrode 34 may be disposed on the second electrode 22. Therefore, a current flow from the source electrode 32 to the drain electrode 34 may be controlled according to power applied to the gate electrode 33, and power may be applied to the second electrode 22 through the drain electrode 34. According to an embodiment, power applied between the first electrode 21 and the second electrode 22 may be controlled by the control of the gate electrode 33, and the light emission in the light-emitting structure 10 may be controlled.

The first insulating layer 41 may reflect light provided from the light-emitting structure 10. The first insulating layer 41 may reflect light provided from the active layer 12. The first insulating layer 41 may receive light generated in the active layer 12 and reflect the light downward. Therefore, it is possible to prevent the light generated in the active layer 12 from being incident on the transistor 30 and disappearing and to improve the light extraction efficiency of the semiconductor device.

For example, the first insulating layer 41 may include an insulating material. The first insulating layer 41 may include oxide or nitride. The first insulating layer 41 may include silicon-based oxide or silicon-based nitride. The first insulating layer 41 may include metal oxide. For example, the first insulating layer 41 may include at least one selected from $SiO_2$, $SiN_x$, $Al_2O_3$, and the like. The first insulating layer 41 may include metal oxide including $TiO_2$.

The first insulating layer 41 may be provided as a plurality of layers having different refractive indices. For example, the first insulating layer 41 may be formed by stacking a first layer having a first refractive index and a second layer having a second refractive index as one pair, and may be formed by sequentially stacking a plurality of pairs. Therefore, the first insulating layer 41 may be provided as a distributed Bragg reflector (DBR) layer and reflects light incident from the light-emitting structure 10, thereby preventing light generated in the light-emitting structure 10 from disappearing at the transistor 30. As one example, the first insulating layer 41 may be provided by stacking a plurality of pairs each including a $SiO_2$ layer and a $TiO_2$ layer as one pair.

The semiconductor device according to an embodiment may include a second insulating layer 43 as illustrated in FIG. 1. The second insulating layer 43 may be disposed on the upper surface and the side surface of the light-emitting structure 10. The second insulating layer 43 may be disposed on the second electrode 22. The second insulating layer 43 may be disposed on the semiconductor layer 31. The gate electrode 33 may be disposed on the gate electrode 33. For example, the source electrode 32 may be disposed on the second insulating layer 43, and one end of the source electrode 32 may pass through the second insulating layer 43 and be electrically connected to the semiconductor layer 31. In addition, the drain electrode 34 may be disposed on the second insulating layer 43, and one end of the drain electrode 34 may pass through the second insulating layer 43 and be electrically connected to the semiconductor layer 31.

For example, the second insulating layer 43 may include an insulating material. The second insulating layer 43 may include oxide, nitride, or an organic material. For example, the second insulating layer 43 may include at least one selected from $SiO_2$, $SiN_x$, $Al_2O_3$, and the like.

The semiconductor device according to an embodiment may include a substrate 5 as illustrated in FIG. 1. For example, the substrate 5 may be a growth substrate on which the light-emitting structure 10 can be grown. For example, an uneven structure may be provided on the upper surface of the substrate 5. The uneven structure provided in the substrate 5 may reduce defects during the growth of the light-emitting structure 10, may improve crystal quality, and may reflect light emitted from the active layer 12 so as to improve the luminescent efficiency. For example, the substrate 5 may include at least one selected from a sapphire ($Al_2O_3$) substrate, SiC, GaAs, GaN, ZnO, Si, GaP, InP, and Ge.

As described above, the semiconductor device according to the embodiment may control the light emission of the light-emitting structure 10 through the control of the transistor 30. According to an embodiment, since whether to cause the light-emitting structure 10 to emit light by using the control of the transistor 30 can be controlled, it is possible to more accurately control whether to cause the light-emitting structure 10 to emit light, thereby more easily implementing the control of the light emission time and the light emission interval.

In addition, the transistor 30 is disposed on the light-emitting structure 10, thereby maximizing the size of the active layer 12. If the transistor 30 is disposed at or near the side surface of the active layer 12, the size of the active layer 12 may be reduced as much as the size of the transistor 30. However, according to an embodiment, the transistor 30 is disposed on the active layer 12, thereby preventing the area of the active layer 12 from being reduced. Since an amount of light generated in the light-emitting structure 10 is affected by the area of the active layer 12, an amount of light generated in the active layer 12 increases, thereby improving the light extraction efficiency and the luminance as a whole.

Meanwhile, the case of the semiconductor device in which one light-emitting structure 10 and one transistor 30 are provided is illustrated in FIG. 1, but the semiconductor device according to an embodiment may include a plurality of light-emitting structures and a plurality of transistors. When the plurality of transistors are provided, the plurality of transistors may be connected in parallel or in series according to a circuit design. Therefore, the degree of freedom of the circuit design can be increased, and the degree of light emitted in the plurality of light-emitting structures can be effectively controlled according to necessity. In addition, the semiconductor device according to an embodiment may include a plurality of light-emitting structures, and the plurality of light-emitting structures may be implemented to emit light of different wavelength bands. Therefore, the semiconductor device according to an embodiment may selectively or independently control the light emission in the plurality of light-emitting structures having different wavelength bands through the control of the plurality of transistors.

The semiconductor device described above may be implemented to emit light of various wavelength bands according to the selection of the active layer. For example, it is possible to implement a display panel or a display apparatus in which one color pixel is constituted by using the blue semiconductor device, the green semiconductor device, and the red semiconductor device described above. The semiconductor device according to an embodiment may be applied to various fields requiring a light source. The semiconductor device according to an embodiment may be applied to, for example, an electronic sign board, a large-size display apparatus, and a signage, thereby implementing a high-resolution light source. In addition, the semiconductor device according to an embodiment may be applied to a communication device. For example, the semiconductor device according to an embodiment may be applied to a visible light communication (VLC), light WiFi (LiFi), or the like which transmits data by using light.

An example of a method for manufacturing the semiconductor device illustrated in FIG. 1 will be described with reference to the accompanying drawings. In describing the semiconductor device manufacturing method according to the embodiment with reference to the accompanying drawings, the description redundant to the matters described with reference to FIG. 1 will be omitted.

Figure 2A:
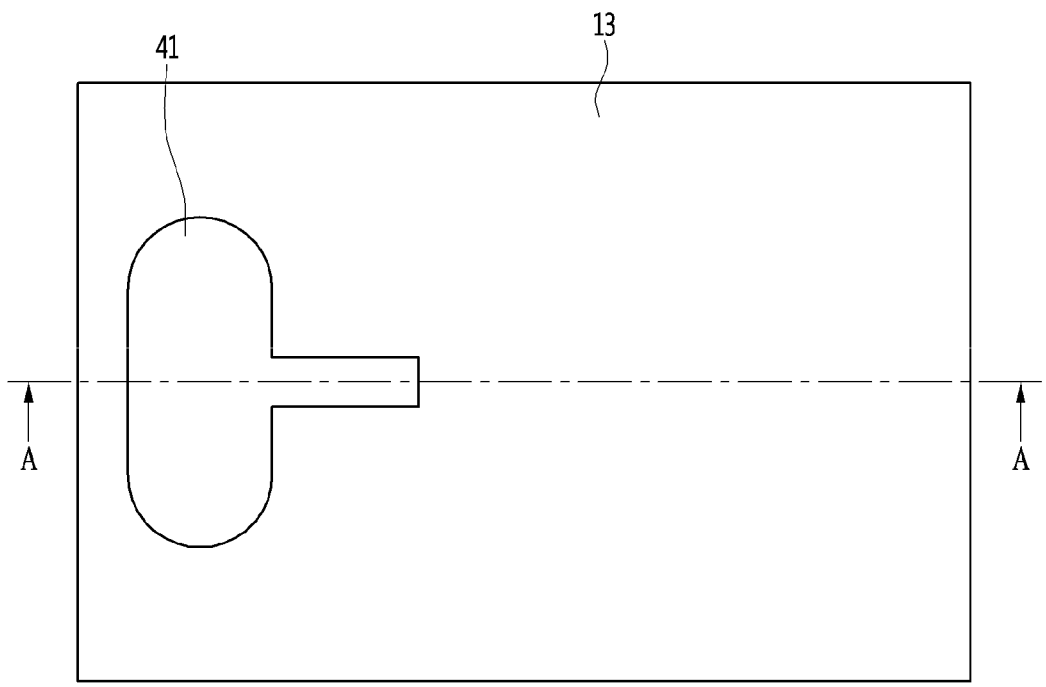
FIGS. 2a and 2b are respectively a plan view and a cross-sectional view illustrating an example in which a light-emitting structure and a first insulating layer are formed by a semiconductor device manufacturing method according to an embodiment of the present invention.
Figure 2B:
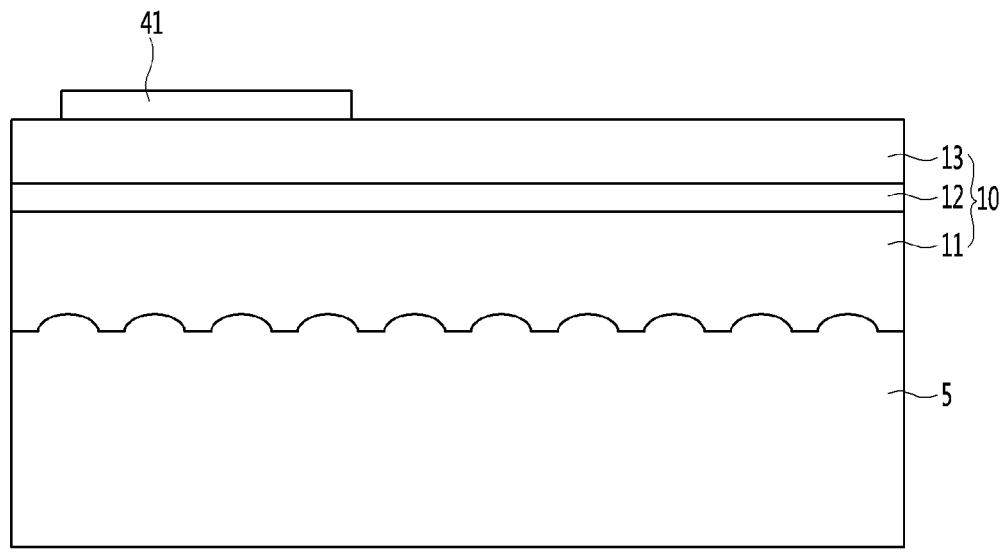

FIGS. 2a and 2b are respectively a plan view and a cross-sectional view illustrating an example in which a light-emitting structure and a first insulating layer are formed by a semiconductor device manufacturing method according to an embodiment of the present invention. FIG. 2b is a cross-sectional view taken along line A-A of the plan view illustrated in FIG. 2a.

According to the semiconductor device manufacturing method according to an embodiment, a light-emitting structure 10 may be formed on a substrate 5 as illustrated in FIGS. 2a and 2b. For example, the light-emitting structure 10 may be grown on the substrate 5. The light-emitting structure 10 may include a first conductivity type semiconductor layer 11, an active layer 12, and a second conductivity type semiconductor layer 13.

For example, the first conductivity type semiconductor layer 11 may be formed as an n-type semiconductor layer in which an n-type dopant is added as a first conductive dopant, and the second conductivity type semiconductor layer 13 may be formed as a p-type semiconductor layer in which a p-type dopant is added as a second conductive dopant. In addition, on the contrary, the first conductivity type semiconductor layer 11 may be formed as a p-type semiconductor layer, and the second conductivity type semiconductor layer 13 may be formed as an n-type semiconductor layer. Hereinafter, a case where the first conductivity type semiconductor layer 11 is provided as an n-type semiconductor layer and the second conductivity type semiconductor layer 13 is provided as a p-type semiconductor layer will be described.

In the light-emitting structure 10, a wavelength band of generated light may be changed according to a material constituting the active layer 12. The selection of materials constituting the first conductivity type semiconductor layer 11 and the second conductivity type semiconductor layer 13 may be changed according to the material constituting the active layer 12. The light-emitting structure 10 may be implemented by compound semiconductor. The light-emitting structure 10 may be implemented by, for example, a group II-VI compound semiconductor or a group III-V compound semiconductor. For example, the light-emitting structure 10 may be implemented by including at least two elements selected from the group consisting of aluminum (Al), gallium (Ga), indium (In), Phosphorus (P), arsenic (As), and nitrogen (N).

The active layer 12 is a layer in which electrons (or holes) injected through the first conductivity type semiconductor layer 11 and holes (or electrons) injected through the second conductivity type semiconductor layer 13 recombine with each other and light is emitted by a band gap difference between energy bands according to a forming material of the active layer 12. The active layer 12 may be formed to have one of a single well structure, a multiple well structure, a quantum dot structure, or a quantum wire structure. The active layer 12 may be implemented by compound semiconductor. The active layer 12 may be implemented by, for example, a group II-VI compound semiconductor or a group III-V compound semiconductor.

When light of a blue wavelength band or a green wavelength band is generated in the active layer 12, the active layer 12 may be implemented by, for example, a semiconductor material having a formula of $In_xAl_yGa_{1-x-y}N$ ($0 \leq x \leq 1$, $0 \leq y \leq 1$, $0 \leq x+y \leq 1$). When the active layer 12 is implemented by a multi well structure, the active layer 12 may be implemented by stacking a plurality of well layers and a plurality of barrier layers. In addition, when light of a red wavelength band is generated in the active layer 12, the active layer 12 may be implemented by, for example, a semiconductor material having a formula of $(Al_xGa_{1-x})_yIn_{1-y}P$ ($0 \leq x \leq 1$, $0 \leq y \leq 1$). The active layer 12 may be selected from, for example, AlGaInP, AlInP, GaP, and GaInP.

The first conductivity type semiconductor layer 11 may include, for example, an n-type semiconductor layer. The first conductivity type semiconductor layer 11 may be implemented by compound semiconductor. The first conductivity type semiconductor layer 11 may be implemented by, for example, a group II-VI compound semiconductor or a group III-V compound semiconductor. For example, when light of a blue wavelength band or a green wavelength band is generated in the active layer 12, the first conductivity type semiconductor layer 11 may be implemented by, for example, a semiconductor material having a formula of $In_xAl_yGa_{1-x-y}N$ ($0 \leq x \leq 1$, $0 \leq y \leq 1$, $0 \leq x+y \leq 1$). In addition, when light of a red wavelength band is generated in the active layer 12, the first conductivity type semiconductor layer 11 may be implemented by, for example, a semiconductor material having a formula of $(Al_xGa_{1-x})_yIn_{1-y}P$ ($0 \leq x \leq 1$, $0 \leq y \leq 1$). In the first conductivity type semiconductor layer 11, y may have a value of 0.5 and x may have a value of 0.5 to 0.8 in the formula. The first conductivity type semiconductor layer 11 may be selected from the group consisting of GaN, AlN, AlGaN, InGaN, InN, InAlGaN, AlInN, AlGaAs, GaP, GaAs, GaAsP, AlGaInP, AlInP, and GaInP, and an n-type dopant such as Si, Ge, Sn, Se, or Te may be doped.

The second conductivity type semiconductor layer 13 may be implemented by compound semiconductor. The second conductivity type semiconductor layer 13 may be implemented by, for example, a group II-VI compound semiconductor or a group III-V compound semiconductor. For example, when light of a blue wavelength band or a green wavelength band is generated in the active layer 12, the second conductivity type semiconductor layer 13 may be implemented by, for example, a semiconductor material having a formula of $In_xAl_yGa_{1-x-y}N$ ($0 \leq x \leq 1$, $0 \leq y \leq 1$, $0 \leq x+y \leq 1$). In addition, when light of a red wavelength band is generated in the active layer 12, the second conductivity type semiconductor layer 13 may be implemented by, for example, a semiconductor material having a formula of $(Al_xGa_{1-x})_yIn_{1-y}P$ ($0 \leq x \leq 1$, $0 \leq y \leq 1$). The second conductivity type semiconductor layer 13 may be selected from the group consisting of GaN, AlN, AlGaN, InGaN, InN, InAlGaN, AlInN, AlGaAs, GaP, GaAs, GaAsP, AlGaInP, AlInP, and GaInP, and a p-type dopant such as Mg, Zn, Ca, Sr, or Ba may be doped.

For example, the substrate 5 may be a growth substrate on which the light-emitting structure 10 can be grown. For example, an uneven structure may be provided on the upper surface of the substrate 5. The uneven structure provided in the substrate 5 may reduce defects during the growth of the light-emitting structure 10, may improve crystal quality, and may reflect light emitted from the active layer 12 so as to improve the luminescent efficiency. For example, the substrate 5 may include at least one selected from a sapphire ($Al_2O_3$) substrate, SiC, GaAs, GaN, ZnO, Si, GaP, InP, and Ge.

A first insulating layer 41 may be formed on the light-emitting structure 10. The first insulating layer 41 may be disposed on the second conductivity type semiconductor layer 13. For example, the first insulating layer 41 may be disposed on a portion of the upper portion of the second conductivity type semiconductor layer 13. The first insulating layer 41 may include an insulating material. For example, the first insulating layer 41 may include oxide or nitride. The first insulating layer 41 may include silicon-based oxide or silicon-based nitride. The first insulating layer 41 may include metal oxide. For example, the first insulating layer 41 may include at least one selected from $SiO_2$, $SiN_x$, $Al_2O_3$, and the like. The first insulating layer 41 may include metal oxide including $TiO_2$.

The first insulating layer 41 may be provided as a plurality of layers having different refractive indices. For example, the first insulating layer 41 may be formed by stacking a first layer having a first refractive index and a second layer having a second refractive index as one pair, and may be formed by sequentially stacking a plurality of pairs. Therefore, the first insulating layer 41 may be provided as a distributed Bragg reflector (DBR) layer and reflects light incident from the light-emitting structure 10. As one example, the first insulating layer 41 may be provided by stacking a plurality of pairs each including a $SiO_2$ layer and a $TiO_2$ layer as one pair.

Figure 3A:
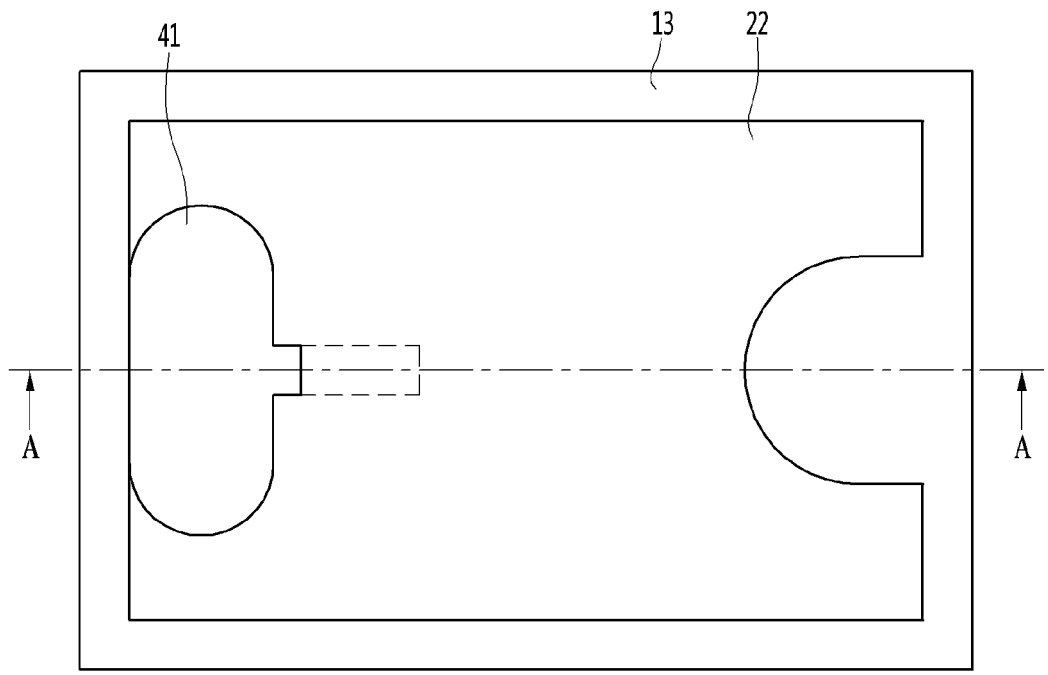
FIGS. 3a and 3b are respectively a plan view and a cross-sectional view illustrating an example in which a second electrode is formed by the semiconductor device manufacturing method according to an embodiment of the present invention.
Figure 3B:
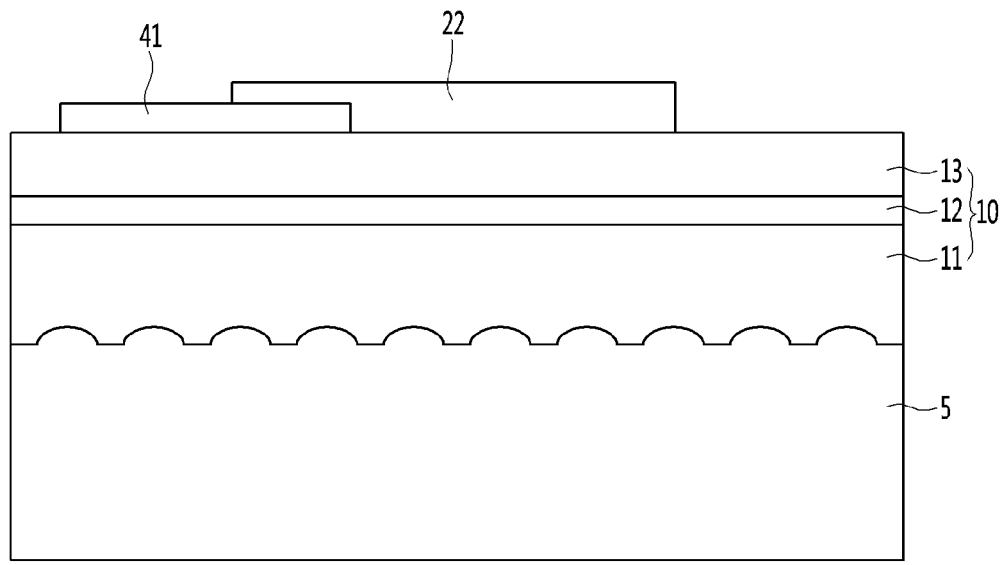

Next, as illustrated in FIGS. 3a and 3b, a second electrode 22 may be formed on the light-emitting structure 10.

FIGS. 3a and 3b are respectively a plan view and a cross-sectional view illustrating an example in which the second electrode is formed by the semiconductor device manufacturing method according to an embodiment of the present invention. FIG. 3b is a cross-sectional view taken along line A-A of the plan view illustrated in FIG. 3a.

The second electrode 22 may be provided on the second conductivity type semiconductor layer 13. A partial region of the second electrode 22 may be provided on the first insulating layer 41.

For example, the second electrode 22 may include a material that ohmic-contacts the second conductivity type semiconductor layer 13. For example, the second electrode 22 may include a transparent conductive oxide. For example, the second electrode 22 may include at least one material selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

Figure 4A:
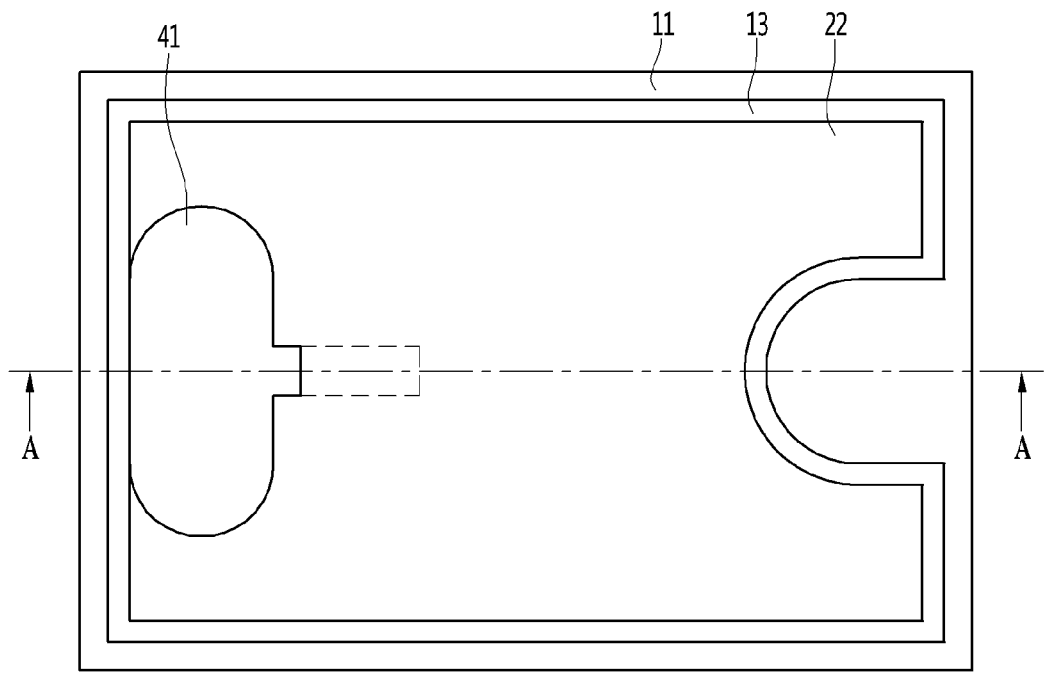
FIGS. 4a and 4b are respectively a plan view and a cross-sectional view illustrating an example in which a partial region of the light-emitting structure is etched by the semiconductor device manufacturing method according to an embodiment of the present invention.
Figure 4B:
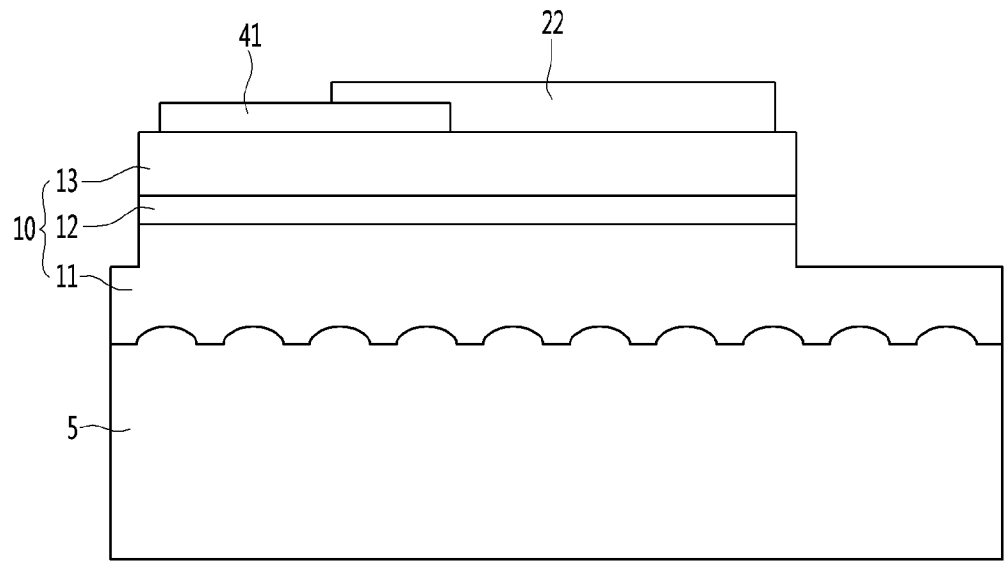

Next, as illustrated in FIGS. 4a and 4b, a part of the upper surface of the first conductivity type semiconductor layer 11 may be exposed through a process of etching the light-emitting structure 10.

FIGS. 4a and 4b are respectively a plan view and a cross-sectional view illustrating an example in which a partial region of the light-emitting structure is etched by the semiconductor device manufacturing method according to an embodiment of the present invention. FIG. 4b is a cross-sectional view taken along line A-A of the plan view illustrated in FIG. 4a.

A part of the upper surface of the first conductivity type semiconductor layer 11 may be exposed through a process of etching a partial region of the first conductivity type semiconductor layer 11 and a partial region of the active layer 12. At this time, a partial region of the first conductivity type semiconductor layer 11 may also be etched, and the first conductivity type semiconductor layer 11 may be provided as a stepped structure having different thicknesses according to a region.

Figure 5A:
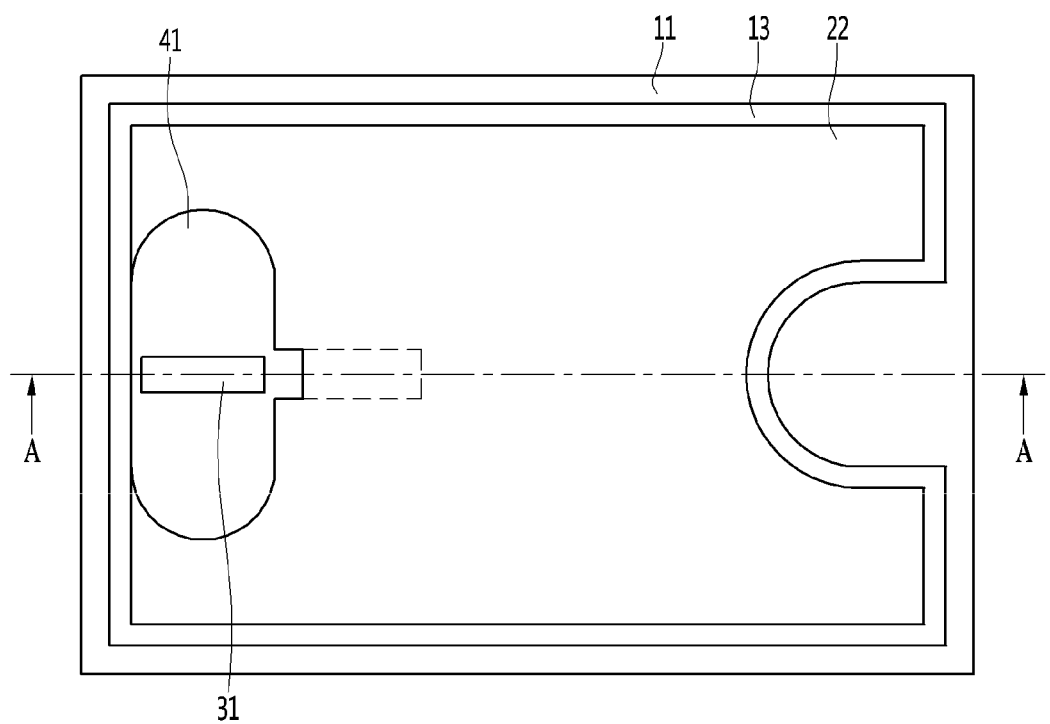
FIGS. 5a and 5b are respectively a plan view and a cross-sectional view illustrating an example in which a semiconductor layer is formed by the semiconductor device manufacturing method according to an embodiment of the present invention.
Figure 5B:
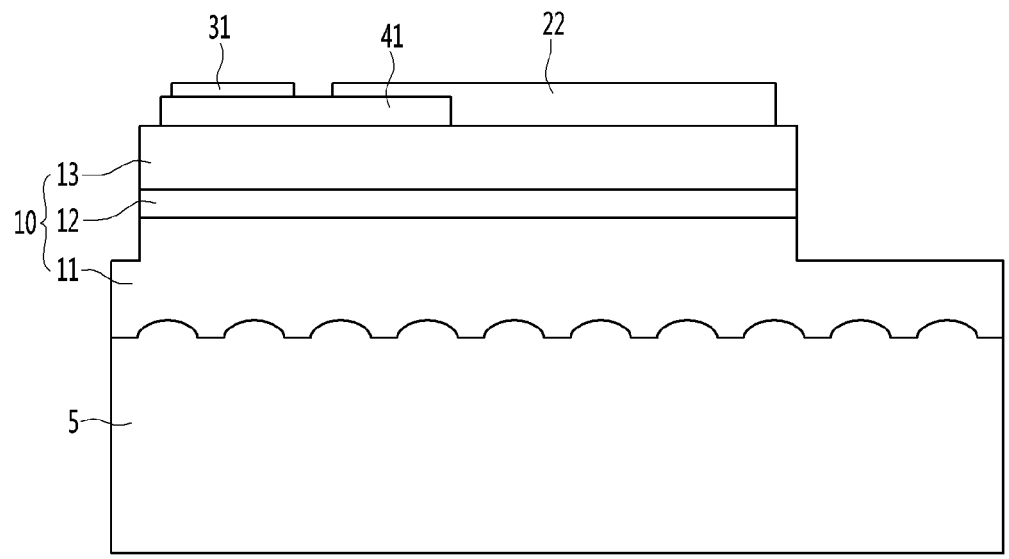

Next, as illustrated in FIGS. 5a and 5b, a semiconductor layer 31 may be formed on the first insulating layer 41.

FIGS. 5a and 5b are respectively a plan view and a cross-sectional view illustrating an example in which the semiconductor layer is formed by the semiconductor device manufacturing method according to an embodiment of the present invention. FIG. 5b is a cross-sectional view taken along line A-A of the plan view illustrated in FIG. 5a.

The semiconductor layer 31 may be disposed in a partial region of the upper surface of the first insulating layer 41. The semiconductor layer 31 may be disposed on the first insulating layer 41 and spaced apart from the second electrode 22 by a predetermined distance.

The semiconductor layer 31 may be formed of, for example, a material different from the material forming the light-emitting structure 10. For example, the semiconductor layer 31 may include a material selected from the group consisting of amorphous silicon, polycrystalline silicon, single crystal silicon, and oxide semiconductor. The material constituting the semiconductor layer 31 may be selected from materials that can be formed at a lower temperature than a forming temperature of the light-emitting structure 10. Therefore, even when the semiconductor layer 31 is formed after the light-emitting structure 10 is formed, it does not influence the physical properties of the light-emitting structure 10, and it is possible to prevent the light extraction efficiency of the light-emitting structure 10 from being reduced. Examples of the oxide semiconductor may be selected from the group consisting of indium gallium zinc oxide (IGZO), indium gallium oxide (IGO), and indium zinc oxide (IZO).

Figure 6A:
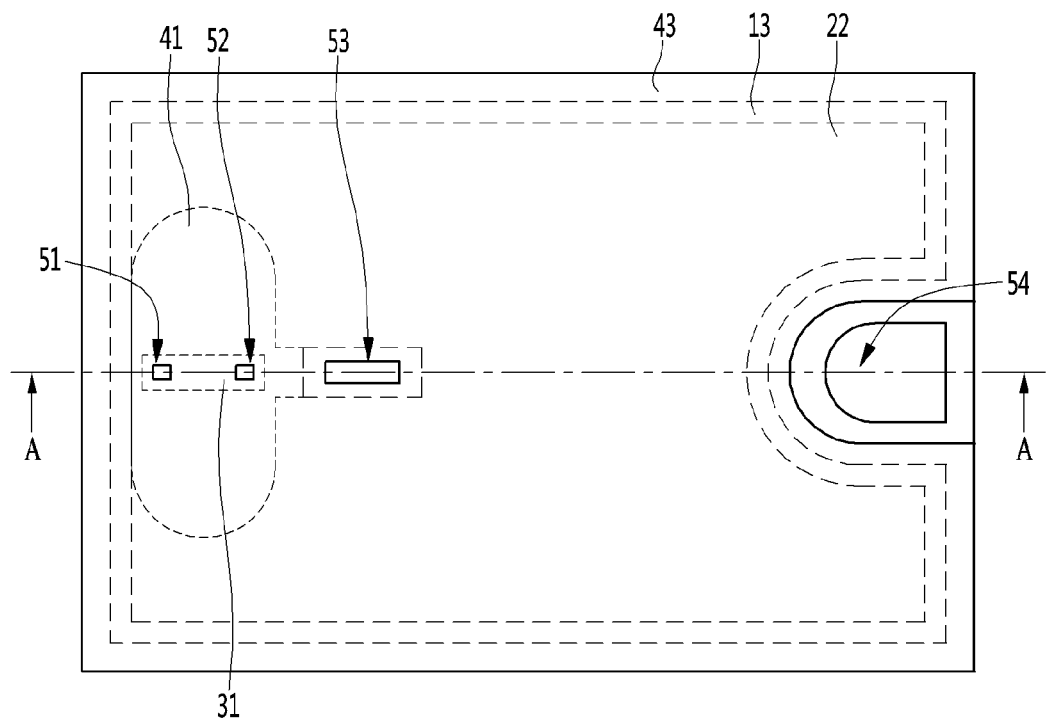
FIGS. 6a and 6b are respectively a plan view and a cross-sectional view illustrating an example in which a second insulating layer is formed by the semiconductor device manufacturing method according to an embodiment of the present invention.
Figure 6B:
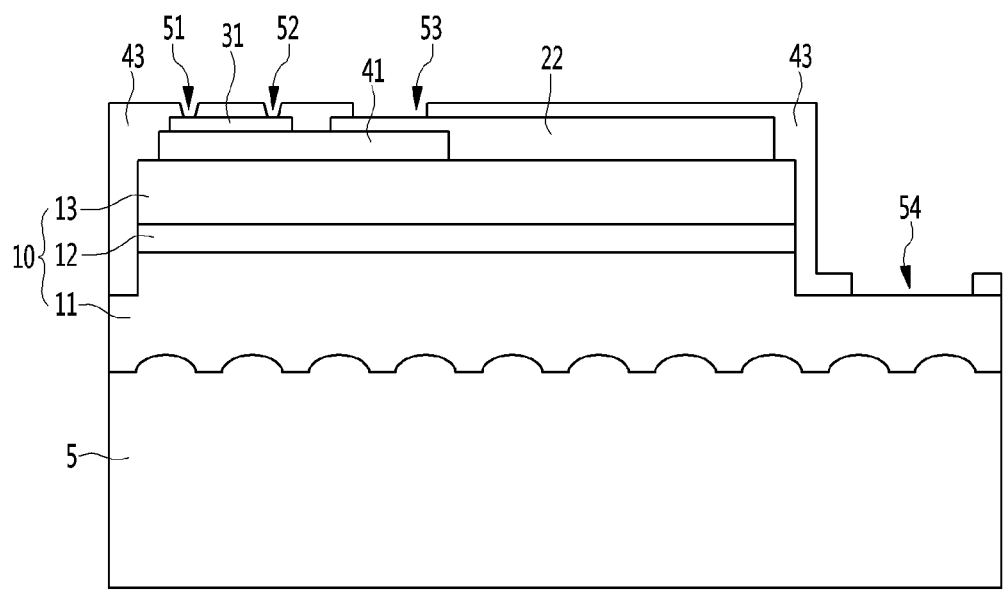

Next, as illustrated in FIGS. 6a and 6b, a second insulating layer 43 may be formed on the upper surface and the side surface of the light-emitting structure 10.

FIGS. 6a and 6b are respectively a plan view and a cross-sectional view illustrating an example in which the second insulating layer is formed by the semiconductor device manufacturing method according to an embodiment of the present invention. FIG. 6b is a cross-sectional view taken along line A-A of the plan view illustrated in FIG. 6a.

The second insulating layer 43 may include a first contact hole 51, a second contact hole 52, a third contact hole 53, and a fourth contact hole 54. A first region of the semiconductor layer 31 may be exposed by the first contact hole 51. A second region of the semiconductor layer 31 may be exposed by the second contact hole 52. A partial region of the second electrode 22 may be exposed by the third contact hole 53. A partial region of the first conductivity type semiconductor layer 11 may be exposed by the fourth contact hole 54. The second insulating layer 43 may be disposed on the upper surface and the side surface of the light-emitting structure 10. The second insulating layer 43 may be disposed on the second electrode 22. The second insulating layer 43 may be disposed on the semiconductor layer 31.

For example, the second insulating layer 43 may include an insulating material. The second insulating layer 43 may include oxide, nitride, or an organic material. For example, the second insulating layer 43 may include at least one selected from $SiO_2$, $SiN_x$, $Al_2O_3$, and the like.

Figure 7A:
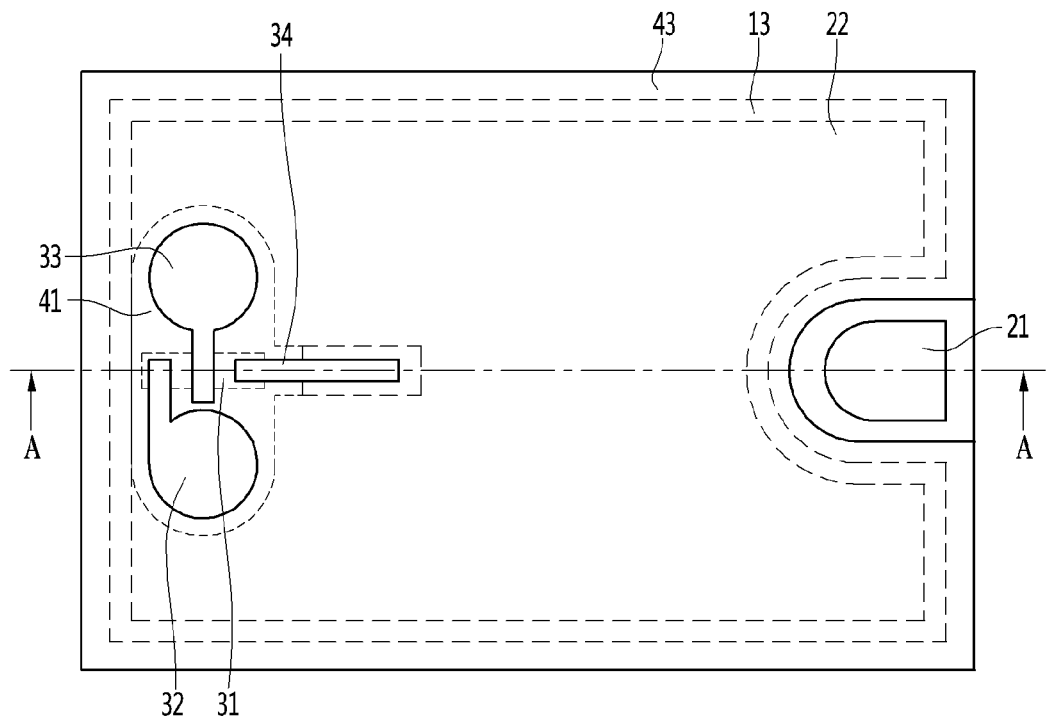
FIGS. 7a and 7b are respectively a plan view and a cross-sectional view illustrating an example in which a transistor is formed by the semiconductor device manufacturing method according to an embodiment of the present invention.
Figure 7B:
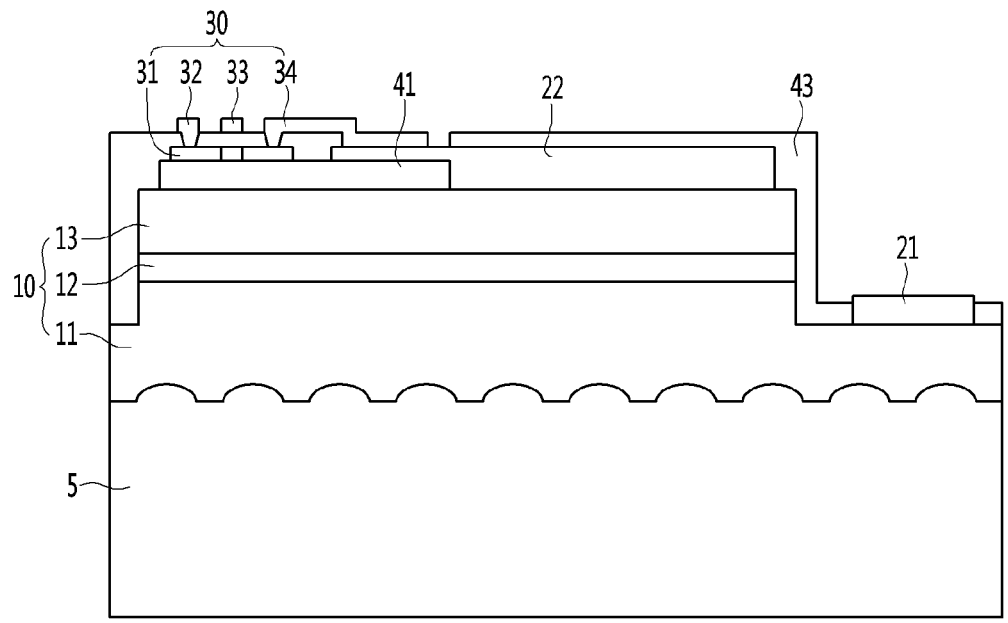

Next, as illustrated in FIGS. 7a and 7b, a transistor may be formed on the second insulating layer 43.

FIGS. 7a and 7b are respectively a plan view and a cross-sectional view illustrating an example in which the transistor is formed by the semiconductor device manufacturing method according to an embodiment of the present invention. FIG. 7b is a cross-sectional view taken along line A-A of the plan view illustrated in FIG. 7a.

First, as illustrated in FIGS. 7a and 7b, a gate electrode 33 may be formed on the second insulating layer 43. The gate electrode 33 may be disposed on the semiconductor layer 31. For example, impurities may be added to the semiconductor layer 31 through an implant process by using the gate electrode 33 as a mask. Therefore, in the semiconductor layer 31, the first region to which the source electrode 32 is to be electrically connected and the second region to which the drain electrode 34 is to be electrically connected may be formed as high-concentration impurity regions.

Next, as illustrated in FIGS. 7a and 7b, a source electrode 32, a drain electrode 34, and a first electrode 21 may be formed on the second insulating layer 43. The source electrode 32 may be electrically connected to the first region of the semiconductor layer 31 through the first contact hole 51. The drain electrode 34 may be electrically connected to the second region of the semiconductor layer 31 through the second contact hole 52, and may be electrically connected to the second electrode 22 through the third contact hole 53. The second region of the semiconductor layer 31 may be electrically connected to the second electrode 22 through the drain electrode 34.

The source electrode 32 may be electrically connected to a first region of the semiconductor layer 31. The source electrode 32 may be disposed on the first region of the semiconductor layer 31. The drain electrode 34 may be electrically connected to a second region of the semiconductor layer 31. The drain electrode 34 may be disposed on the second region of the semiconductor layer 31.

The gate electrode 33 may be disposed between the first region and the second region of the semiconductor layer 31. The gate electrode 33 may be disposed above between the first region and the second region of the semiconductor layer 31. For example, the first region and the second region of the semiconductor layer 31 may be provided to include relatively higher concentration impurities than a third region of the semiconductor layer 31 disposed under the gate electrode 33. The gate electrode 33 may be disposed spaced apart from the semiconductor layer 31. The lower surface of the gate electrode 33 may be disposed spaced apart from the upper surface of the semiconductor layer 31. A second insulating layer 43 may be disposed between the gate electrode 33 and the semiconductor layer 31. For example, the gate electrode 33 and the semiconductor layer 31 may be disposed spaced apart by the thickness of the second insulating layer 43.

According to an embodiment, a current flow from the source electrode 32 to the drain electrode 34 may be controlled according to the magnitude of a voltage applied to the gate electrode 33. That is, when a voltage exceeding a threshold voltage of the transistor 30 is applied to the gate electrode 33, a current may flow from the source electrode 32 to the drain electrode 34.

Meanwhile, the semiconductor device according to an embodiment may include a first electrode 21 and a second electrode 22 as illustrated in FIGS. 7a and 7b. The first electrode 21 and the second electrode 22 may be electrically connected to the light-emitting structure 10. The first electrode 21 may be electrically connected to the first conductivity type semiconductor layer 11. For example, the first electrode 21 may be disposed on the first conductivity type semiconductor layer 11. The first electrode 21 may be disposed spaced apart from the side surface of the active layer 12. The second electrode 22 may be electrically connected to the second conductivity type semiconductor layer 13. For example, the second electrode 22 may be disposed on the second conductivity type semiconductor layer 13. The second electrode 22 may be disposed on the active layer 12. The light-emitting structure 10 may be driven by the voltage applied to the first electrode 21 and the second electrode 22. Light may be generated in the active layer 12 of the light-emitting structure 10 by the voltage applied between the first electrode 21 and the second electrode 22.

For example, the first electrode 21 may include a region that ohmic-contacts the first conductivity type semiconductor layer 11. The first electrode 21 may include a single layer or a multi-layer including at least one selected from Cr, Ni, Ti, Ge, Zn, Mg, Ca, Al, Ag, Rh, W, Pt, Au, AuGe, and AuGe/Ni/Au. For example, the source electrode 32, the gate electrode 33, and the drain electrode 34 may be formed of the same material as the first electrode 21. In addition, the source electrode 32, the gate electrode 33, and the drain electrode 34 may be formed of different materials as the first electrode 21.

The above-described semiconductor device manufacturing method according to the embodiment is merely an example, and it can be understood by a person skilled in the art that various modifications and applications can be made thereto.

Figure 8A:
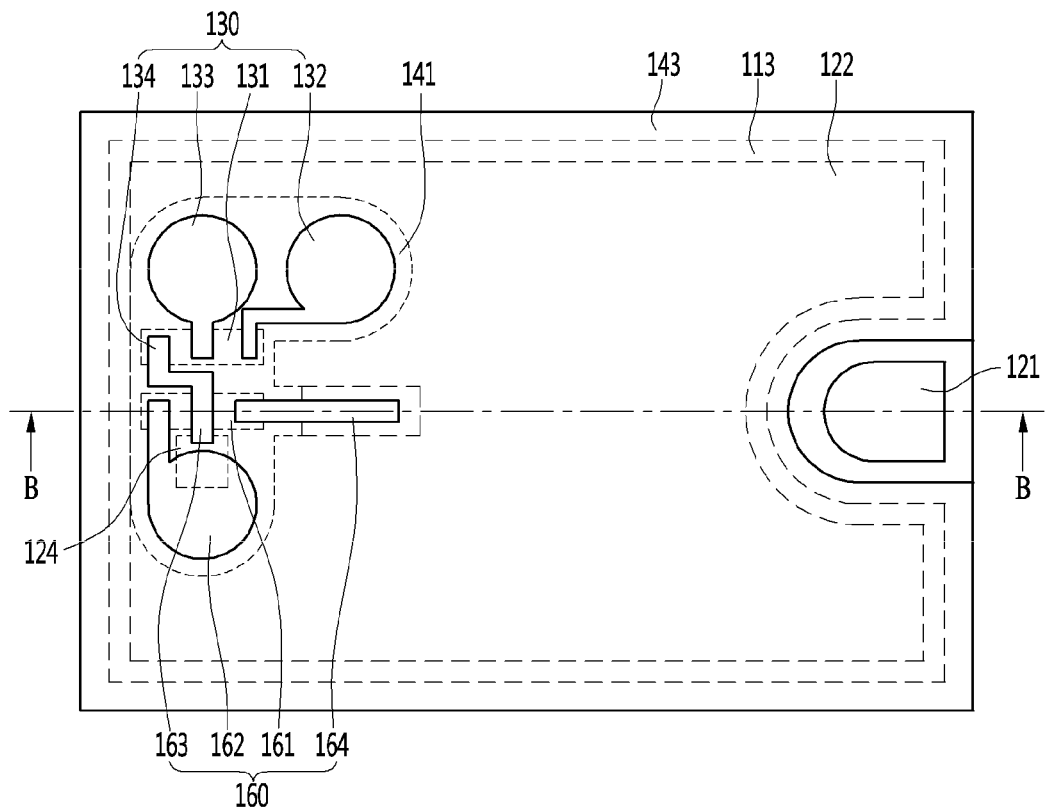
FIGS. 8a and 8b are respectively a plan view and a cross-sectional view illustrating another example of a semiconductor device according to an embodiment of the present invention.
Figure 8B:
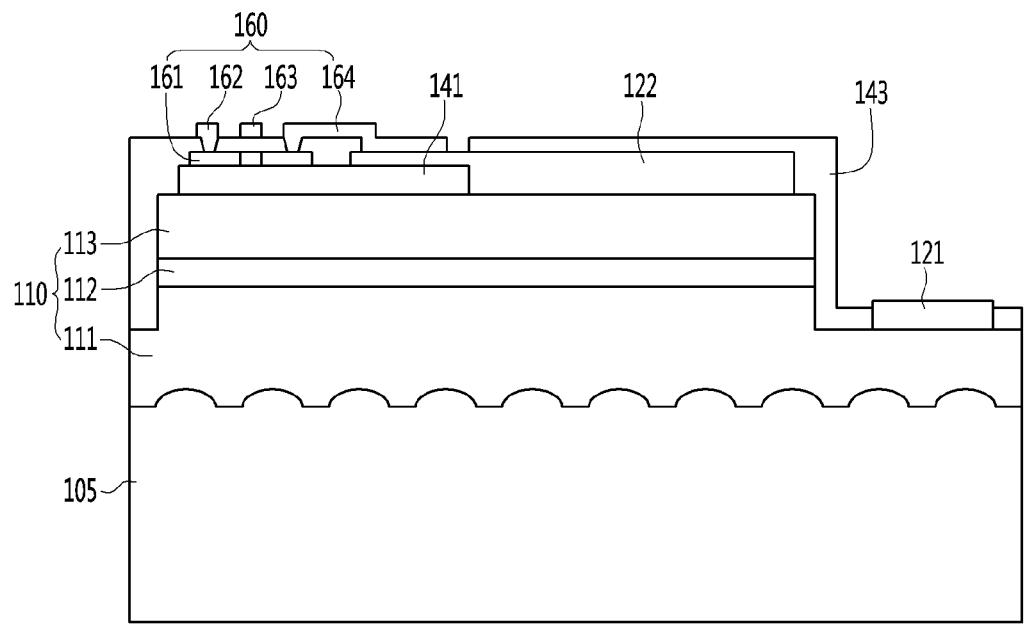
Figure 9:
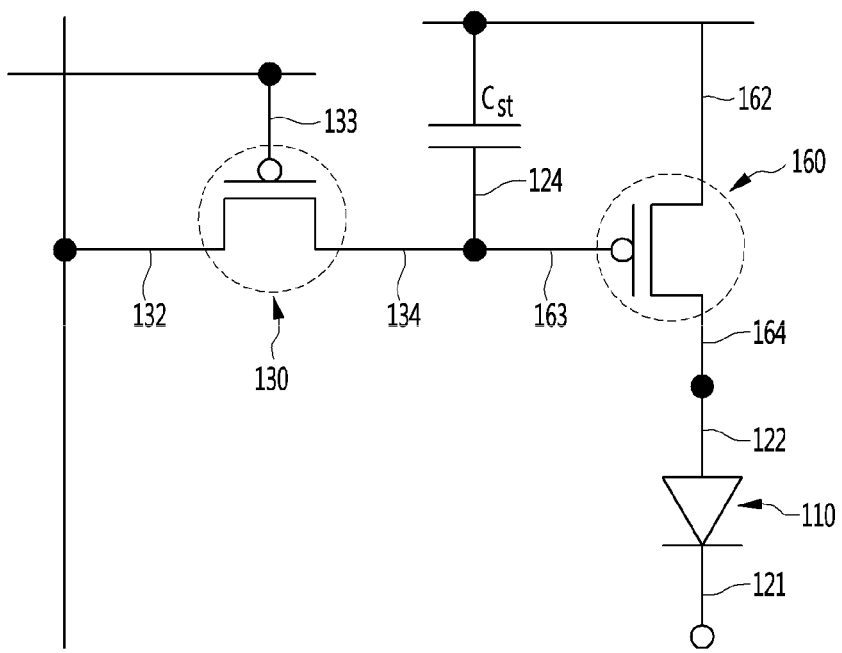
FIG. 9 is an equivalent circuit diagram of the semiconductor device illustrated in FIGS. 8a and 8b.

Meanwhile, FIGS. 8a and 8b are views illustrating another example of a semiconductor device according to an embodiment, and FIG. 9 is an equivalent circuit diagram of the semiconductor device illustrated in FIGS. 8a and 8b. In describing the semiconductor device according to the embodiment with reference to FIGS. 8a, 8b, and 9, the description redundant to the matters described above will be omitted.

FIGS. 8a and 8b are respectively a plan view and a cross-sectional view illustrating another example of a semiconductor device according to an embodiment of the present invention. FIG. 8b is a cross-sectional view taken along line B-B of the plan view illustrated in FIG. 8a.

A semiconductor device according to an embodiment may include a light-emitting structure 110, a first transistor 130, and a second transistor 160 as illustrated in FIGS. 8a, 8b, and 9. For example, the first transistor 130 may be disposed on the light-emitting structure 110. The second transistor 160 may be disposed on the light-emitting structure 110. The semiconductor device according to the embodiment may control the driving of the first transistor 130 and the second transistor 160 and adjust the light emission of the light-emitting structure 110. The first transistor 130 and the second transistor 160 may be provided as, for example, a top gate transistor structure. In addition, the first transistor 130 and the second transistor 160 may be provided as a bottom gate transistor structure.

The light-emitting structure 110 may include a first conductivity type semiconductor layer 111, an active layer 112, and a second conductivity type semiconductor layer 113. The active layer 112 may be disposed between the first conductivity type semiconductor layer 111 and the second conductivity type semiconductor layer 113. For example, the active layer 112 may be disposed on the first conductivity type semiconductor layer 111, and the second conductivity type semiconductor layer 113 may be disposed on the active layer 112.

For example, the first conductivity type semiconductor layer 111 may be formed as an n-type semiconductor layer in which an n-type dopant is added as a first conductive dopant, and the second conductivity type semiconductor layer 113 may be formed as a p-type semiconductor layer in which a p-type dopant is added as a second conductive dopant. In addition, on the contrary, the first conductivity type semiconductor layer 111 may be formed as a p-type semiconductor layer, and the second conductivity type semiconductor layer 113 may be formed as an n-type semiconductor layer. Hereinafter, a case where the first conductivity type semiconductor layer 111 is provided as an n-type semiconductor layer and the second conductivity type semiconductor layer 113 is provided as a p-type semiconductor layer will be described.

In the light-emitting structure 110, a wavelength band of generated light may be changed according to a material constituting the active layer 112. The selection of materials constituting the first conductivity type semiconductor layer 111 and the second conductivity type semiconductor layer 113 may be changed according to the material constituting the active layer 112. The light-emitting structure 110 may be implemented by compound semiconductor. The light-emitting structure 110 may be implemented by, for example, a group II-VI compound semiconductor or a group III-V compound semiconductor. For example, the light-emitting structure 110 may be implemented by including at least two elements selected from the group consisting of aluminum (Al), gallium (Ga), indium (In), Phosphorus (P), arsenic (As), and nitrogen (N).

The active layer 112 is a layer in which electrons (or holes) injected through the first conductivity type semiconductor layer 111 and holes (or electrons) injected through the second conductivity type semiconductor layer 113 recombine with each other and light is emitted by a band gap difference between energy bands according to a forming material of the active layer 112. The active layer 112 may be formed to have one of a single well structure, a multiple well structure, a quantum dot structure, or a quantum wire structure. The active layer 112 may be implemented by compound semiconductor. The active layer 112 may be implemented by, for example, a group II-VI compound semiconductor or a group III-V compound semiconductor.

When light of a blue wavelength band or a green wavelength band is generated in the active layer 112, the active layer 112 may be implemented by, for example, a semiconductor material having a formula of $In_xAl_yGa_{1-x-y}N$ ($0 \leq x \leq 1$, $0 \leq y \leq 1$, $0 \leq x+y \leq 1$). When the active layer 112 is implemented by a multi well structure, the active layer 112 may be implemented by stacking a plurality of well layers and a plurality of barrier layers. In addition, when light of a red wavelength band is generated in the active layer 112, the active layer 112 may be implemented by, for example, a semiconductor material having a formula of $(Al_xGa_{1-x})_yIn_{1-y}P$ ($0 \leq x \leq 1$, $0 \leq y \leq 1$). The active layer 112 may be selected from, for example, AlGaInP, AlInP, GaP, and GaInP.

The first conductivity type semiconductor layer 111 may include, for example, an n-type semiconductor layer. The first conductivity type semiconductor layer 111 may be implemented by compound semiconductor. The first conductivity type semiconductor layer 111 may be implemented by, for example, a group II-VI compound semiconductor or a group III-V compound semiconductor. For example, when light of a blue wavelength band or a green wavelength band is generated in the active layer 112, the first conductivity type semiconductor layer 111 may be implemented by, for example, a semiconductor material having a formula of $In_xAl_yGa_{1-x-y}N$ ($0 \leq x \leq 1$, $0 \leq y \leq 1$, $0 \leq x+y \leq 1$). In addition, when light of a red wavelength band is generated in the active layer 112, the first conductivity type semiconductor layer 111 may be implemented by, for example, a semiconductor material having a formula of $(Al_xGa_{1-x})_yIn_{1-y}P$ ($0 \leq x \leq 1$, $0 \leq y \leq 1$). In the first conductivity type semiconductor layer 111, y may have a value of 0.5 and x may have a value of 0.5 to 0.8 in the formula. The first conductivity type semiconductor layer 111 may be selected from the group consisting of GaN, AlN, AlGaN, InGaN, InN, InAlGaN, AlInN, AlGaAs, GaP, GaAs, GaAsP, AlGaInP, AlInP, and GaInP, and an n-type dopant such as Si, Ge, Sn, Se, or Te may be doped.

The second conductivity type semiconductor layer 113 may be implemented by compound semiconductor. The second conductivity type semiconductor layer 113 may be implemented by, for example, a group II-VI compound semiconductor or a group III-V compound semiconductor. For example, when light of a blue wavelength band or a green wavelength band is generated in the active layer 112, the second conductivity type semiconductor layer 113 may be implemented by, for example, a semiconductor material having a formula of $In_xAl_yGa_{1-x-y}N$ ($0 \leq x \leq 1$, $0 \leq y \leq 1$, $0 \leq x+y \leq 1$). In addition, when light of a red wavelength band is generated in the active layer 112, the second conductivity type semiconductor layer 113 may be implemented by, for example, a semiconductor material having a formula of $(Al_xGa_{1-x})_yIn_{1-y}P$ ($0 \leq x \leq 1$, $0 \leq y \leq 1$). The second conductivity type semiconductor layer 113 may be selected from the group consisting of GaN, AlN, AlGaN, InGaN, InN, InAlGaN, AlInN, AlGaAs, GaP, GaAs, GaAsP, AlGaInP, AlInP, and GaInP, and a p-type dopant such as Mg, Zn, Ca, Sr, or Ba may be doped.

The first transistor 130 may include a first semiconductor layer 131, a first source electrode 132, a first gate electrode 133, and a first drain electrode 134. The first transistor 130 may be disposed on the light-emitting structure 110. The first transistor 130 may be disposed on the second conductivity type semiconductor layer 113. The area of the first transistor 130 may be smaller than the area of the second conductivity type semiconductor layer 113 when viewed from above the semiconductor device. The first transistor 130 may be disposed on the active layer 112. The area of the first transistor 130 may be smaller than the area of the active layer 112 when viewed from above the semiconductor device.

The second transistor 160 may include a second semiconductor layer 161, a second source electrode 162, a second gate electrode 163, and a second drain electrode 164. The second transistor 160 may be disposed on the light-emitting structure 110. The second transistor 160 may be disposed on the second conductivity type semiconductor layer 113. The area of the second transistor 160 may be smaller than the area of the second conductivity type semiconductor layer 113 when viewed from above the semiconductor device. The second transistor 160 may be disposed on the active layer 112. The area of the second transistor 160 may be smaller than the area of the active layer 112 when viewed from above the semiconductor device.

The first semiconductor layer 131 and the second semiconductor layer 161 may be formed of, for example, a material different from the material forming the light-emitting structure 110. For example, the first semiconductor layer 131 and the second semiconductor layer 161 may include a material selected from the group consisting of amorphous silicon, polycrystalline silicon, single crystal silicon, and oxide semiconductor. The first semiconductor layer 131 and the second semiconductor layer 161 may be formed of the same material. In addition, the first semiconductor layer 131 and the second semiconductor layer 161 may be formed of different materials. The materials constituting the first semiconductor layer 131 and the second semiconductor layer 161 may be selected from materials that can be formed at a lower temperature than a forming temperature of the light-emitting structure 110. Therefore, even when the first semiconductor layer 131 and the second semiconductor layer 161 are formed after the light-emitting structure 110 is formed, it does not influence the physical properties of the light-emitting structure 110, and it is possible to prevent the light extraction efficiency of the light-emitting structure 110 from being reduced. Examples of the oxide semiconductor may be selected from the group consisting of indium gallium zinc oxide (IGZO), indium gallium oxide (IGO), and indium zinc oxide (IZO).

The first source electrode 132 may be electrically connected to a first region of the first semiconductor layer 131. The source electrode 132 may be disposed on the first region of the first semiconductor layer 131. The first drain electrode 134 may be electrically connected to a second region of the first semiconductor layer 131. The first drain electrode 134 may be disposed on the second region of the first semiconductor layer 131.

The first gate electrode 133 may be disposed between the first region and the second region of the first semiconductor layer 131. The first gate electrode 133 may be disposed above between the first region and the second region of the first semiconductor layer 131. For example, the first region and the second region of the first semiconductor layer 1 may be provided to include relatively higher concentration impurities than a third region of the first semiconductor layer 131 disposed under the first gate electrode 133. The first gate electrode 133 may be disposed spaced apart from the first semiconductor layer 131. The lower surface of the first gate electrode 133 may be disposed spaced apart from the upper surface of the first semiconductor layer 131. A second insulating layer 143 may be disposed between the first gate electrode 133 and the first semiconductor layer 131. For example, the first gate electrode 133 and the first semiconductor layer 131 may be disposed spaced apart by the thickness of the second insulating layer 143.

The second source electrode 162 may be electrically connected to the first region of the second semiconductor layer 161. The second source electrode 162 may be disposed on the first region of the second semiconductor layer 161. The second drain electrode 164 may be electrically connected to the second region of the second semiconductor layer 161. The second drain electrode 164 may be disposed on the second region of the second semiconductor layer 161.

The second gate electrode 163 may be disposed between the first region and the second region of the second semiconductor layer 161. The second gate electrode 163 may be disposed above between the first region and the second region of the second semiconductor layer 161. For example, the first region and the second region of the second semiconductor layer 161 may be provided to include relatively higher concentration impurities than a third region of the second semiconductor layer 161 disposed under the second gate electrode 163. The second gate electrode 163 may be disposed spaced apart from the second semiconductor layer 161. The lower surface of the second gate electrode 163 may be disposed spaced apart from the upper surface of the second semiconductor layer 161. A second insulating layer 143 may be disposed between the second gate electrode 163 and the second semiconductor layer 161. For example, the second gate electrode 163 and the second semiconductor layer 161 may be disposed spaced apart by the thickness of the second insulating layer 143.

In addition, in the semiconductor device according to an embodiment, as illustrated in FIGS. 8a, 8b, and 9, the first drain electrode 134 of the first transistor 130 may be electrically connected to the second gate electrode 163 of the second transistor 160. For example, the first drain electrode 134 may be disposed to contact the second gate electrode 163.

According to an embodiment, a current flow from the first source electrode 132 to the first drain electrode 134 may be controlled according to the magnitude of a voltage applied to the first gate electrode 133. That is, when a voltage exceeding a threshold voltage of the first transistor 130 is applied to the first gate electrode 133, a current may flow from the first source electrode 132 to the first drain electrode 134.

When the current flows to the first drain electrode 134 due to the control of the first gate electrode 133, power is supplied to the second gate electrode 163 electrically connected to the first drain electrode 134. At this time, when a voltage exceeding a threshold voltage of the second transistor 160 is applied to the second gate electrode 163, a current may flow from the second source electrode 162 to the second drain electrode 164.

Meanwhile, the semiconductor device according to an embodiment may include a first electrode 121 and a second electrode 122 as illustrated in FIGS. 8a, 8b, and 9. The first electrode 121 and the second electrode 122 may be electrically connected to the light-emitting structure 110. The first electrode 121 may be electrically connected to the first conductivity type semiconductor layer 111. For example, the first electrode 121 may be disposed on the first conductivity type semiconductor layer 111. The first electrode 121 may be disposed spaced apart from the side surface of the active layer 112. The second electrode 122 may be electrically connected to the second conductivity type semiconductor layer 113. For example, the second electrode 122 may be disposed on the second conductivity type semiconductor layer 113. The second electrode 122 may be disposed on the active layer 112. The light-emitting structure 110 may be driven by the voltage applied to the first electrode 121 and the second electrode 122. Light may be generated in the active layer 112 of the light-emitting structure 110 by the voltage applied between the first electrode 121 and the second electrode 122.

For example, the first electrode 121 may include a region that ohmic-contacts the first conductivity type semiconductor layer 111. The first electrode 121 may include a single layer or a multi-layer including at least one selected from Cr, Ni, Ti, Ge, Zn, Mg, Ca, Al, Ag, Rh, W, Pt, Au, AuGe, and AuGe/Ni/Au.

For example, the second electrode 122 may include a material that ohmic-contacts the second conductivity type semiconductor layer 113. For example, the second electrode 122 may include a transparent conductive oxide. For example, the second electrode 122 may include at least one material selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

The semiconductor device according to an embodiment may include a first insulating layer 141 as illustrated in FIGS. 8a and 8b. The first insulating layer 141 may be disposed on the light-emitting structure 110. The first insulating layer 141 may be disposed on the second conductivity type semiconductor layer 113. The first insulating layer 141 may be disposed on the active layer 112. The first insulating layer 141 may be disposed under the first transistor 130. The first insulating layer 141 may be disposed under the second transistor 160. The first insulating layer 141 may be disposed between the light-emitting structure 110 and the first transistor 130. The first insulating layer 141 may be disposed between the light-emitting structure 110 and the second transistor 160. The first insulating layer 141 may be disposed between the second conductivity type semiconductor layer 113 and the first transistor 130. The first insulating layer 141 may be disposed between the second conductivity type semiconductor layer 113 and the second transistor 160. The width of the first insulating layer 141 may be smaller than the width of the second conductivity type semiconductor layer 113. The size of the first insulating layer 141 may be smaller than the size of the second conductivity type semiconductor layer 113 when viewed from above the semiconductor device. The size of the first insulating layer 141 may be smaller than the size of the active layer 112 when viewed from above the semiconductor device.

According to an embodiment, the first semiconductor layer 131 and the second semiconductor layer 161 may be disposed on the first insulating layer 141. The second electrode 122 may be electrically connected to the second drain electrode 164. The first region of the second drain electrode 164 may be electrically connected to the second semiconductor layer 161. The first region of the second drain electrode 164 may be disposed on the second semiconductor layer 161. The second region of the second drain electrode 164 may be electrically connected to the second electrode 122. The second region of the second drain electrode 164 may be disposed on the second electrode 122. Therefore, a current flow from the second source electrode 162 to the second drain electrode 164 may be controlled according to power applied to the second gate electrode 163, and power may be applied to the second electrode 122 through the second drain electrode 164. According to an embodiment, power applied between the first electrode 121 and the second electrode 122 may be controlled by the control of the second gate electrode 163, and the light emission in the light-emitting structure 110 may be controlled.

Meanwhile, the semiconductor device according to an embodiment may include a metal layer 124 electrically connected to the second gate electrode 163 as illustrated in FIGS. 8a, 8b, and 9. For example, the metal layer 124 may be provided to overlap the partial region of the second source electrode 162 in a vertical direction. Therefore, a capacitor Cst may be provided between the metal layer 124 and the second source electrode 162. For example, the metal layer 124 may be provided on the same layer as the second electrode 122. The metal layer 124 may be provided by the same material as the second electrode 122. In addition, the metal layer 124 may be provided by different materials as the second electrode 122.

According to an embodiment, the first transistor 130 may be indicated by a type of a switching transistor, and the second transistor 160 may be indicated by a type of a driving transistor. A current flow in the first transistor 130 may be controlled according to a magnitude of a voltage applied to the first gate electrode 133 of the first transistor 130, and a current flow in the second transistor 160 may be controlled according to the driving of the first transistor 130. Meanwhile, even when a current flowing from the first drain electrode 134 to the second gate electrode 163 is changed from a turned-on state to a turned-off state, a current may be made to flow through the second transistor 160 for a predetermined time by the capacitor Cst. The capacitor Cst may be indicated by a storage capacitor. In the capacitor Cst, a partial region of the metal layer 124 may be provided as a lower electrode, and a partial region of the source electrode 162 may be provided as an upper electrode. Accordingly, the light emission and the light emission time of the light-emitting structure 110 may be actively controlled by controlling the driving of the first transistor 130 and the second transistor 160. In the semiconductor device according to an embodiment, for example, external power may be applied to the first electrode 121, the first source electrode 132, the first gate electrode 133, and the second source electrode 162.

The first insulating layer 141 may reflect light provided from the light-emitting structure 110. The first insulating layer 141 may reflect light provided from the active layer 112. The first insulating layer 141 may receive light generated in the active layer 112 and reflect the light downward. Therefore, it is possible to prevent the light generated in the active layer 112 from being incident on the first transistor 130 or the second transistor 160 and disappearing and to improve the light extraction efficiency of the semiconductor device.

For example, the first insulating layer 141 may include an insulating material. The first insulating layer 141 may include oxide or nitride. The first insulating layer 141 may include silicon-based oxide or silicon-based nitride. The first insulating layer 141 may include metal oxide. For example, the first insulating layer 141 may include at least one selected from $SiO_2$, $SiN_x$, $Al_2O_3$, and the like. The first insulating layer 141 may include metal oxide including $TiO_2$.

The first insulating layer 141 may be provided as a plurality of layers having different refractive indices. For example, the first insulating layer 141 may be formed by stacking a first layer having a first refractive index and a second layer having a second refractive index as one pair, and may be formed by sequentially stacking a plurality of pairs. Therefore, the first insulating layer 141 may be provided as a distributed Bragg reflector (DBR) layer and reflects light incident from the light-emitting structure 110, thereby preventing light generated in the light-emitting structure 110 from disappearing at the first transistor 130 or at the second transistor 160. As one example, the first insulating layer 141 may be provided by stacking a plurality of pairs each including a $SiO_2$ layer and a $TiO_2$ layer as one pair.

The semiconductor device according to an embodiment may include a second insulating layer 143 as illustrated in FIGS. 8a and 8b. The second insulating layer 143 may be disposed on the upper surface and the side surface of the light-emitting structure 110. The second insulating layer 143 may be disposed on the second electrode 122. The second insulating layer 143 may be disposed on the first semiconductor layer 131. The first gate electrode 133 may be disposed on the second insulating layer 143. For example, the first source electrode 132 may be disposed on the second insulating layer 143, and one end of the first source electrode 132 may pass through the second insulating layer 143 and be electrically connected to the first semiconductor layer 131. In addition, the first drain electrode 134 may be disposed on the second insulating layer 143, and one end of the first drain electrode 134 may pass through the second insulating layer 143 and be electrically connected to the first semiconductor layer 131.

In addition, the second insulating layer 143 may be disposed on the second semiconductor layer 161. The second gate electrode 163 may be disposed on the second insulating layer 143. For example, the second source electrode 162 may be disposed on the second insulating layer 143, and one end of the second source electrode 162 may pass through the second insulating layer 143 and be electrically connected to the second semiconductor layer 161. In addition, the second drain electrode 164 may be disposed on the second insulating layer 143, and one end of the second drain electrode 164 may pass through the second insulating layer 143 and be electrically connected to the second semiconductor layer 161. The other end of the second drain electrode 164 may be electrically connected to the second electrode 122.

For example, the second insulating layer 143 may include an insulating material. The second insulating layer 143 may include oxide, nitride, or an organic material. For example, the second insulating layer 143 may include at least one selected from $SiO_2$, $SiN_x$, $Al_2O_3$, and the like.

The semiconductor device according to an embodiment may include a substrate 105 as illustrated in FIGS. 8a and 8b. For example, the substrate 105 may be a growth substrate on which the light-emitting structure 110 can be grown. For example, an uneven structure may be provided on the upper surface of the substrate 105. The uneven structure provided in the substrate 105 may reduce defects during the growth of the light-emitting structure 110, may improve crystal quality, and may reflect light emitted from the active layer 112 so as to improve the luminescent efficiency. For example, the substrate 105 may include at least one selected from a sapphire ($Al_2O_3$) substrate, SiC, GaAs, GaN, ZnO, Si, GaP, InP, and Ge.

As described above, the semiconductor device according to the embodiment may actively control the light emission of the light-emitting structure 110 through the control of the first transistor 130 and the second transistor 160. According to an embodiment, since whether to cause the light-emitting structure 110 to emit light by using the control of the first transistor 130 and the second transistor 160 can be controlled, it is possible to more accurately control whether to cause the light-emitting structure 110 to emit light, thereby more easily implementing the control of the light emission time and the light emission interval.

In addition, the first transistor 130 and the second transistor 160 are disposed on the light-emitting structure 110, thereby maximizing the size of the active layer 112. If the first transistor 130 or the second transistor 160 is disposed at or near the side surface of the active layer 112, the size of the active layer 112 may be reduced as much as the size of the first transistor 130 or the second transistor 160. However, according to an embodiment, the first transistor 130 and the second transistor 160 are disposed on the active layer 112, thereby preventing the area of the active layer 112 from being reduced. Since an amount of light generated in the light-emitting structure 110 is affected by the area of the active layer 112, an amount of light generated in the active layer 112 increases, thereby improving the light extraction efficiency and the luminance as a whole.

Meanwhile, the case of the semiconductor device in which one light-emitting structure 110 and two transistors 130 and 160 are provided is illustrated in FIGS. 8a, 8b, and 9, but the semiconductor device according to an embodiment may include a plurality of light-emitting structures and a plurality of transistors. When the plurality of transistors are provided, the plurality of transistors may be connected in parallel or in series according to a circuit design. Therefore, the degree of freedom of the circuit design can be increased, and the degree of light emitted in the plurality of light-emitting structures can be effectively controlled according to necessity.

In addition, the semiconductor device according to an embodiment may include a plurality of light-emitting structures, and the plurality of light-emitting structures may be implemented to emit light of different wavelength bands. Therefore, the semiconductor device according to an embodiment may selectively or independently control the light emission in the plurality of light-emitting structures having different wavelength bands through the control of the plurality of transistors.

The semiconductor device described above may be implemented to emit light of various wavelength bands according to the selection of the active layer. For example, it is possible to implement a display panel or a display apparatus in which one color pixel is constituted by using the blue semiconductor device, the green semiconductor device, and the red semiconductor device described above. The semiconductor device according to an embodiment may be applied to various fields requiring a light source. The semiconductor device according to an embodiment may be applied to, for example, an electronic sign board, a large-size display apparatus, and a signage, thereby implementing a high-resolution light source. In addition, the semiconductor device according to an embodiment may be applied to a communication device. For example, the semiconductor device according to an embodiment may be applied to a visible light communication (VLC), light WiFi (LiFi), or the like which transmits data by using light.

A method for manufacturing the semiconductor device illustrated in FIGS. 8a and 8b will be described with reference to the accompanying drawings. In describing the semiconductor device manufacturing method according to the embodiment with reference to the accompanying drawings, the description redundant to the matters described above will be omitted.

Figure 10A:
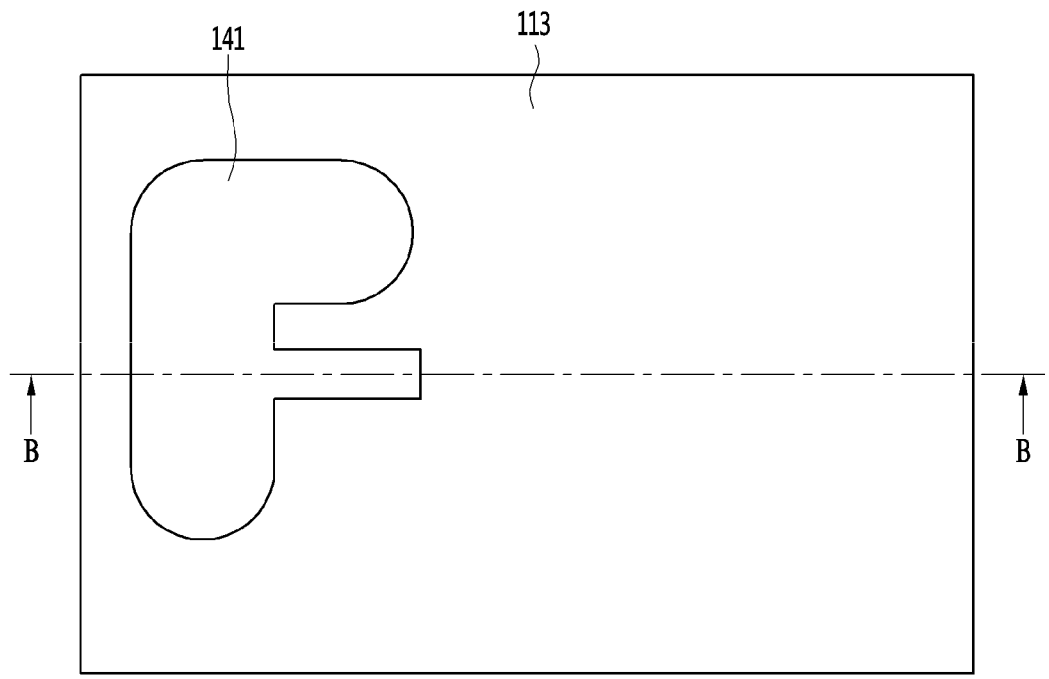
FIGS. 10a and 10b are respectively a plan view and a cross-sectional view illustrating an example in which a light-emitting structure and a first insulating layer are formed by a semiconductor device manufacturing method according to an embodiment of the present invention.
Figure 10B:
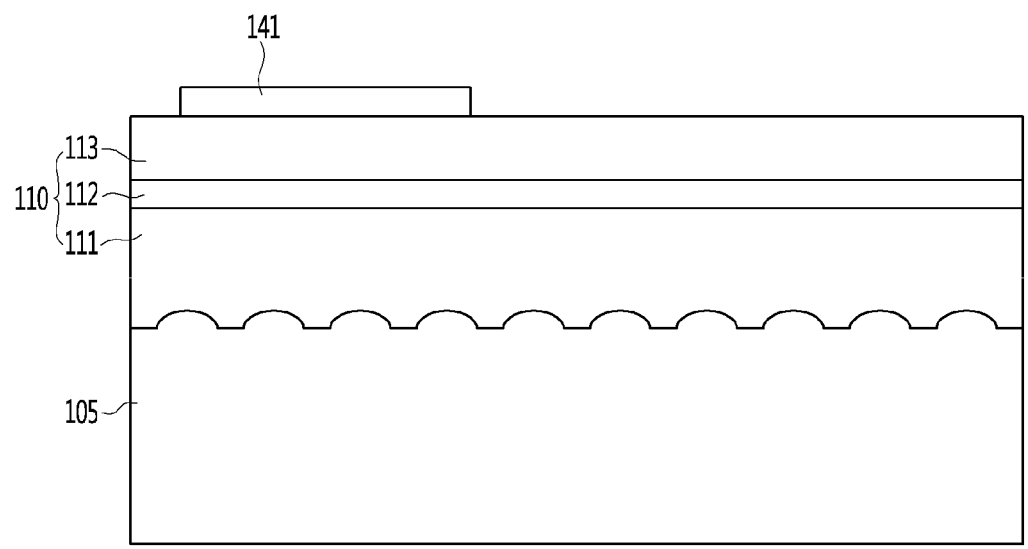

FIGS. 10a and 10b are respectively a plan view and a cross-sectional view illustrating an example in which the light-emitting structure and the first insulating layer are formed by a semiconductor device manufacturing method according to an embodiment of the present invention. FIG. 10b is a cross-sectional view taken along line B-B of the plan view illustrated in FIG. 10a.

According to the semiconductor device manufacturing method according to an embodiment, a light-emitting structure 110 may be formed on a substrate 105 as illustrated in FIGS. 10a and 10b. For example, the light-emitting structure 110 may be grown on the substrate 105. The light-emitting structure 110 may include a first conductivity type semiconductor layer 111, an active layer 112, and a second conductivity type semiconductor layer 113.

For example, the first conductivity type semiconductor layer 111 may be formed as an n-type semiconductor layer in which an n-type dopant is added as a first conductive dopant, and the second conductivity type semiconductor layer 113 may be formed as a p-type semiconductor layer in which a p-type dopant is added as a second conductive dopant. In addition, on the contrary, the first conductivity type semiconductor layer 111 may be formed as a p-type semiconductor layer, and the second conductivity type semiconductor layer 113 may be formed as an n-type semiconductor layer. Hereinafter, a case where the first conductivity type semiconductor layer 111 is provided as an n-type semiconductor layer and the second conductivity type semiconductor layer 113 is provided as a p-type semiconductor layer will be described.

In the light-emitting structure 110, a wavelength band of generated light may be changed according to a material constituting the active layer 112. The selection of materials constituting the first conductivity type semiconductor layer 111 and the second conductivity type semiconductor layer 113 may be changed according to the material constituting the active layer 112. The light-emitting structure 110 may be implemented by compound semiconductor. The light-emitting structure 110 may be implemented by, for example, a group II-VI compound semiconductor or a group III-V compound semiconductor. For example, the light-emitting structure 110 may be implemented by including at least two elements selected from the group consisting of aluminum (Al), gallium (Ga), indium (In), Phosphorus (P), arsenic (As), and nitrogen (N).

The active layer 112 is a layer in which electrons (or holes) injected through the first conductivity type semiconductor layer 111 and holes (or electrons) injected through the second conductivity type semiconductor layer 113 recombine with each other and light is emitted by a band gap difference between energy bands according to a forming material of the active layer 112. The active layer 112 may be formed to have one of a single well structure, a multiple well structure, a quantum dot structure, or a quantum wire structure. The active layer 112 may be implemented by compound semiconductor. The active layer 112 may be implemented by, for example, a group II-VI compound semiconductor or a group III-V compound semiconductor.

When light of a blue wavelength band or a green wavelength band is generated in the active layer 112, the active layer 112 may be implemented by, for example, a semiconductor material having a formula of $In_xAl_yGa_{1-x-y}N$ ($0 \le x \le 1$, $0 \le y \le 1$, $0 \le x+y \le 1$). When the active layer 112 is implemented by a multi well structure, the active layer 112 may be implemented by stacking a plurality of well layers and a plurality of barrier layers. In addition, when light of a red wavelength band is generated in the active layer 112, the active layer 112 may be implemented by, for example, a semiconductor material having a formula of $(Al_xGa_{1-x})_yIn_{1-y}P$ ($0 \le x \le 1$, $0 \le y \le 1$). The active layer 112 may be selected from, for example, AlGaInP, AlInP, GaP, and GaInP.

The first conductivity type semiconductor layer 111 may include, for example, an n-type semiconductor layer. The first conductivity type semiconductor layer 111 may be implemented by compound semiconductor. The first conductivity type semiconductor layer 111 may be implemented by, for example, a group II-VI compound semiconductor or a group III-V compound semiconductor. For example, when light of a blue wavelength band or a green wavelength band is generated in the active layer 112, the first conductivity type semiconductor layer 111 may be implemented by, for example, a semiconductor material having a formula of $In_xAl_yGa_{1-x-y}N$ ($0 \le x \le 1$, $0 \le y \le 1$, $0 \le x+y \le 1$). In addition, when light of a red wavelength band is generated in the active layer 112, the first conductivity type semiconductor layer 111 may be implemented by, for example, a semiconductor material having a formula of $(Al_xGa_{1-x})_yIn_{1-y}P$ ($0 \le x \le 1$, $0 \le y \le 1$). In the first conductivity type semiconductor layer 111, y may have a value of 0.5 and x may have a value of 0.5 to 0.8 in the formula. The first conductivity type semiconductor layer 111 may be selected from the group consisting of GaN, AlN, AlGaN, InGaN, InN, InAlGaN, AlInN, AlGaAs, GaP, GaAs, GaAsP, AlGaInP, AlInP, and GaInP, and an n-type dopant such as Si, Ge, Sn, Se, or Te may be doped.

The second conductivity type semiconductor layer 113 may be implemented by compound semiconductor. The second conductivity type semiconductor layer 113 may be implemented by, for example, a group II-VI compound semiconductor or a group III-V compound semiconductor. For example, when light of a blue wavelength band or a green wavelength band is generated in the active layer 112, the second conductivity type semiconductor layer 113 may be implemented by, for example, a semiconductor material having a formula of $In_xAl_yGa_{1-x-y}N$ ($0 \le x \le 1$, $0 \le y \le 1$, $0 \le x+y \le 1$). In addition, when light of a red wavelength band is generated in the active layer 112, the second conductivity type semiconductor layer 113 may be implemented by, for example, a semiconductor material having a formula of $(Al_xGa_{1-x})_yIn_{1-y}P$ ($0 \le x \le 1$, $0 \le y \le 1$). The second conductivity type semiconductor layer 113 may be selected from the group consisting of GaN, AlN, AlGaN, InGaN, InN, $In_x$AlGaN, AlInN, AlGaAs, GaP, GaAs, GaAsP, AlGaInP, AlInP, and GaInP, and a p-type dopant such as Mg, Zn, Ca, Sr, or Ba may be doped.

For example, the substrate 105 may be a growth substrate on which the light-emitting structure 110 can be grown. For example, an uneven structure may be provided on the upper surface of the substrate 105. The uneven structure provided in the substrate 105 may reduce defects during the growth of the light-emitting structure 110, may improve crystal quality, and may reflect light emitted from the active layer 112 so as to improve the luminescent efficiency. For example, the substrate 105 may include at least one selected from a sapphire ($Al_2O_3$) substrate, SiC, GaAs, GaN, ZnO, Si, GaP, InP, and Ge.

A first insulating layer 141 may be formed on the light-emitting structure 110. The first insulating layer 141 may be disposed on the second conductivity type semiconductor layer 113. For example, the first insulating layer 141 may be disposed on a portion of the upper portion of the second conductivity type semiconductor layer 113. The first insulating layer 141 may include an insulating material. For example, the first insulating layer 141 may include oxide or nitride. The first insulating layer 141 may include silicon-based oxide or silicon-based nitride. The first insulating layer 141 may include metal oxide. For example, the first insulating layer 141 may include at least one selected from $SiO_2$, $SiN_x$, $Al_2O_3$, and the like. The first insulating layer 141 may include metal oxide including $TiO_2$.

The first insulating layer 141 may be provided as a plurality of layers having different refractive indices. For example, the first insulating layer 141 may be formed by stacking a first layer having a first refractive index and a second layer having a second refractive index as one pair, and may be formed by sequentially stacking a plurality of pairs. Therefore, the first insulating layer 141 may be provided as a distributed Bragg reflector (DBR) layer and reflects light incident from the light-emitting structure 110.

As one example, the first insulating layer 141 may be provided by stacking a plurality of pairs each including a SiO₂ layer and a TiO₂ layer as one pair.

Figure 11A:
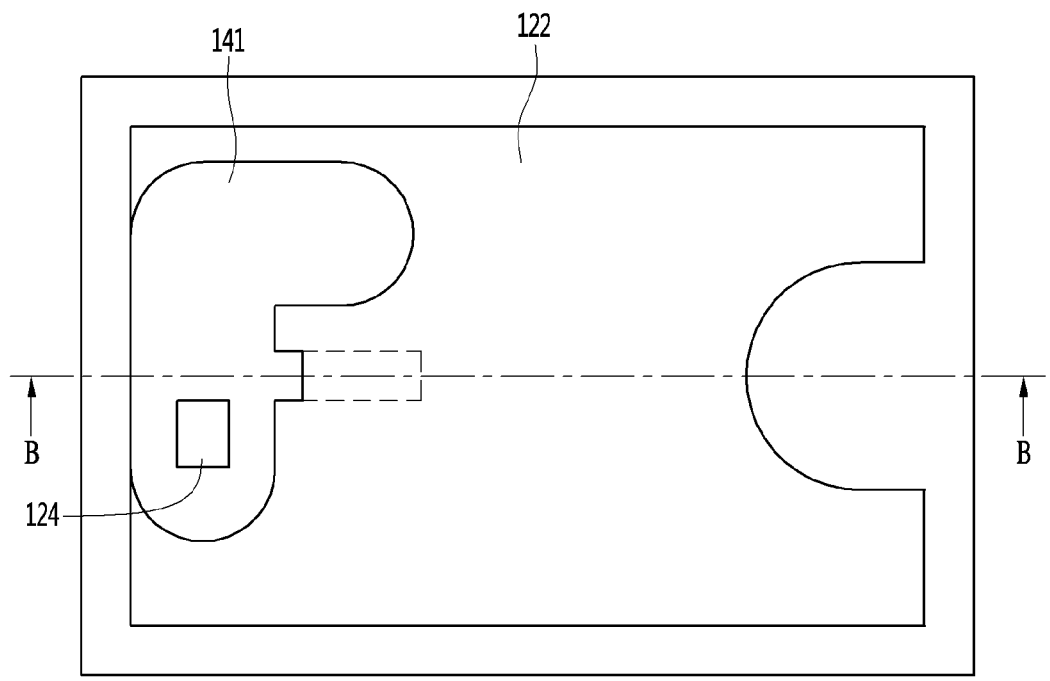
FIGS. 11a and 11b are respectively a plan view and a cross-sectional view illustrating an example in which a second electrode is formed by the semiconductor device manufacturing method according to an embodiment of the present invention.
Figure 11B:
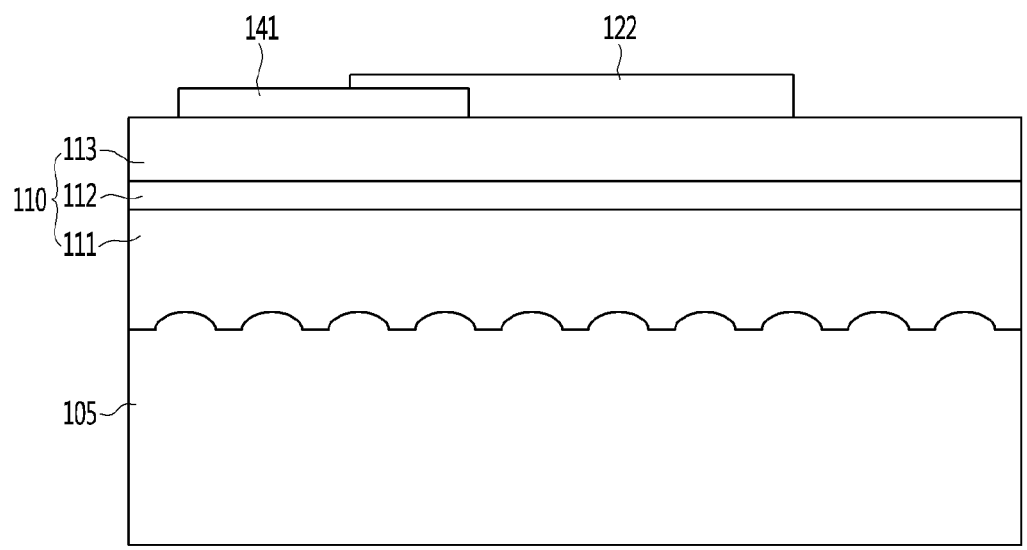

Next, as illustrated in FIGS. 11a and 11b, a second electrode 122 may be formed on the light-emitting structure 110.

FIGS. 11a and 11b are respectively a plan view and a cross-sectional view illustrating an example in which the second electrode is formed by the semiconductor device manufacturing method according to an embodiment of the present invention. FIG. 11b is a cross-sectional view taken along line B-B of the plan view illustrated in FIG. 11a.

The second electrode 122 may be provided on the second conductivity type semiconductor layer 113. A partial region of the second electrode 122 may be provided on the first insulating layer 141. In addition, a metal layer 124 may be formed on the first insulating layer 141. The second electrode 122 and the metal layer 124 may be disposed spaced apart from each other.

For example, the second electrode 122 may include a material that ohmic-contacts the second conductivity type semiconductor layer 113. For example, the second electrode 122 may include a transparent conductive oxide. For example, the second electrode 122 may include at least one material selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti. The metal layer 124 may be provided by, for example, the same material as the second electrode 122. In addition, the metal layer 124 may be provided by different materials as the second electrode 122.

Figure 12A:
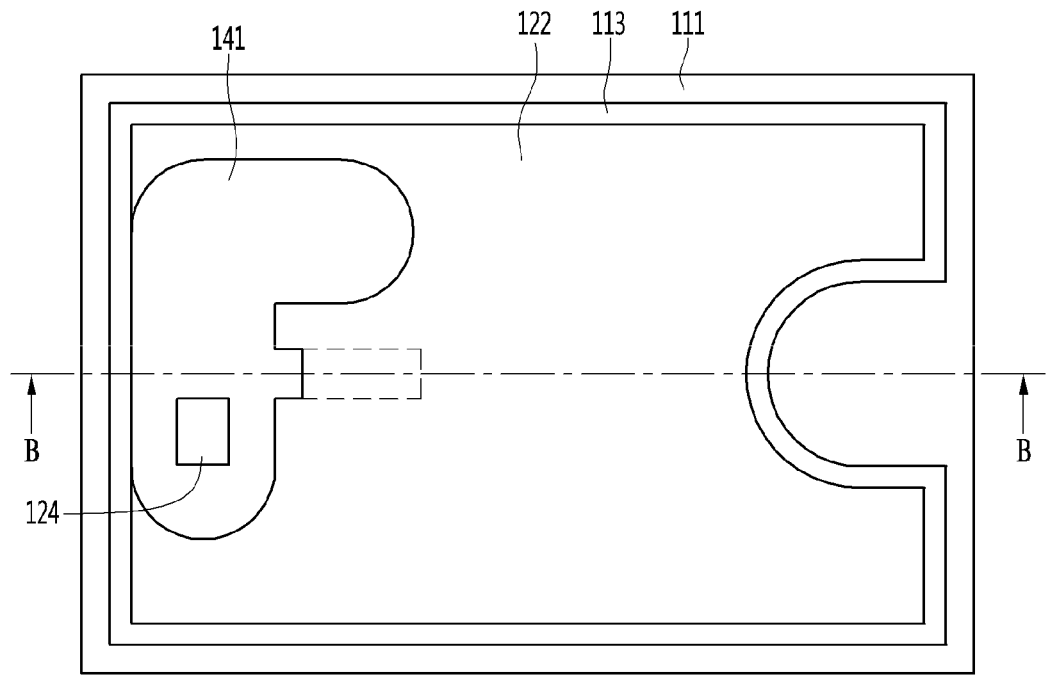
FIGS. 12a and 12b are respectively a plan view and a cross-sectional view illustrating an example in which a partial region of the light-emitting structure is etched by the semiconductor device manufacturing method according to an embodiment of the present invention.
Figure 12B:
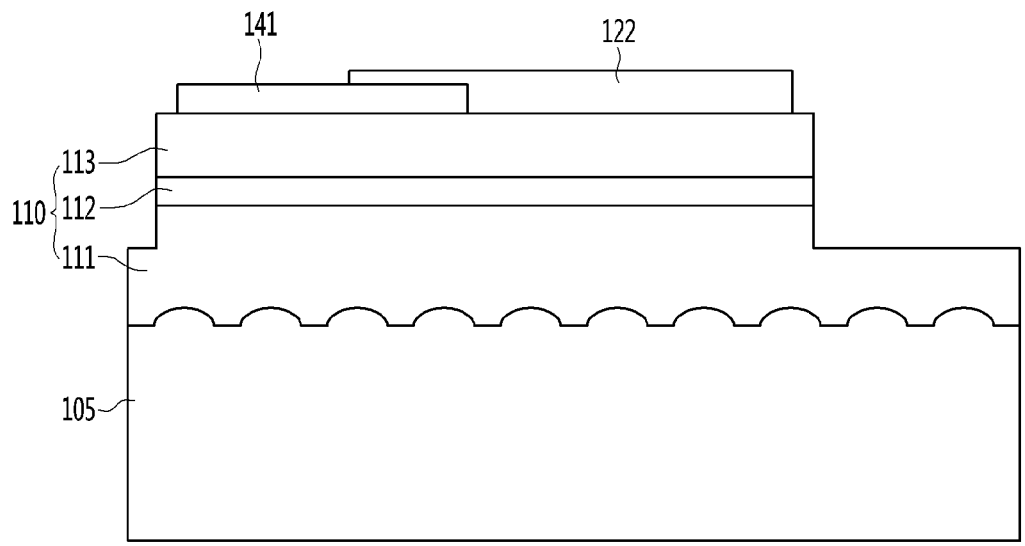

Next, as illustrated in FIGS. 12a and 12b, a part of the upper surface of the first conductivity type semiconductor layer 111 may be exposed through a process of etching the light-emitting structure 110.

FIGS. 12a and 12b are respectively a plan view and a cross-sectional view illustrating an example in which a partial region of the light-emitting structure is etched by the semiconductor device manufacturing method according to an embodiment of the present invention. FIG. 12b is a cross-sectional view taken along line B-B of the plan view illustrated in FIG. 12a.

A part of the upper surface of the first conductivity type semiconductor layer 111 may be exposed through a process of etching a partial region of the first conductivity type semiconductor layer 111 and a partial region of the active layer 112. At this time, a partial region of the first conductivity type semiconductor layer 111 may also be etched, and the first conductivity type semiconductor layer 111 may be provided as a stepped structure having different thicknesses according to a region.

Figure 13A:
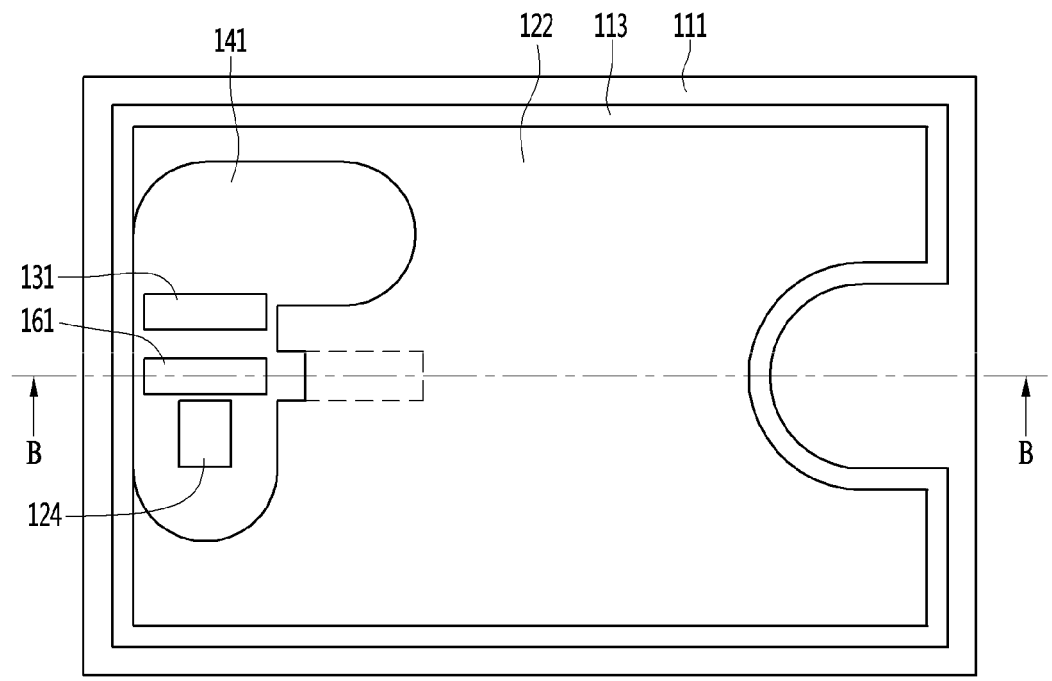
FIGS. 13a and 13b are respectively a plan view and a cross-sectional view illustrating an example in which a first semiconductor layer and a second semiconductor layer are formed by the semiconductor device manufacturing method according to an embodiment of the present invention.
Figure 13B:
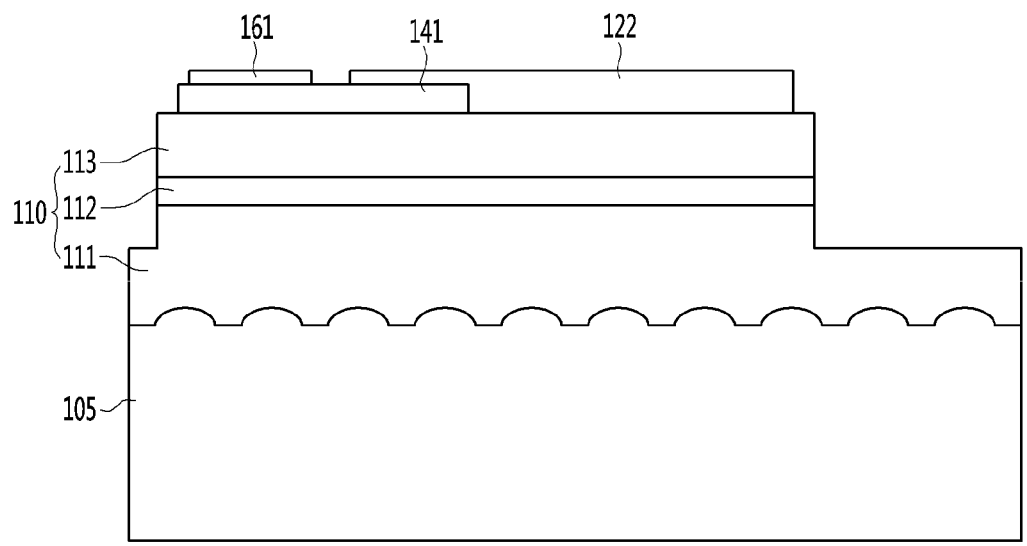

Next, as illustrated in FIGS. 13a and 13b, a first semiconductor layer 131 and a second semiconductor layer 161 may be formed on the first insulating layer 141.

FIGS. 13a and 13b are respectively a plan view and a cross-sectional view illustrating an example in which the first semiconductor layer and the second semiconductor layer are formed by the semiconductor device manufacturing method according to an embodiment of the present invention. FIG. 13b is a cross-sectional view taken along line B-B of the plan view illustrated in FIG. 13a.

The first semiconductor layer 131 and the second semiconductor layer 161 may be disposed on a partial region of the upper surface of the first insulating layer 141. The first semiconductor layer 131 and the second semiconductor layer 161 may be disposed on the first insulating layer 141 and spaced apart from the second electrode 122 by a predetermined distance.

The first semiconductor layer 131 and the second semiconductor layer 161 may be formed of, for example, a material different from the material forming the light-emitting structure 110. For example, the first semiconductor layer 131 and the second semiconductor layer 161 may include a material selected from the group consisting of amorphous silicon, polycrystalline silicon, single crystal silicon, and oxide semiconductor. The material constituting the first semiconductor layer 131 and the second semiconductor layer 161 may be selected from materials that can be formed at a lower temperature than a forming temperature of the light-emitting structure 110. Therefore, even when the first semiconductor layer 131 and the second semiconducdtor layer 161 are formed after the light-emitting structure 110 is formed, it does not influence the physical properties of the light-emitting structure 110, and it is possible to prevent the light extraction efficiency of the light-emitting structure 110 from being reduced. Examples of the oxide semiconductor may be selected from the group consisting of indium gallium zinc oxide (IGZO), indium gallium oxide (IGO), and indium zinc oxide (IZO).

Figure 14A:
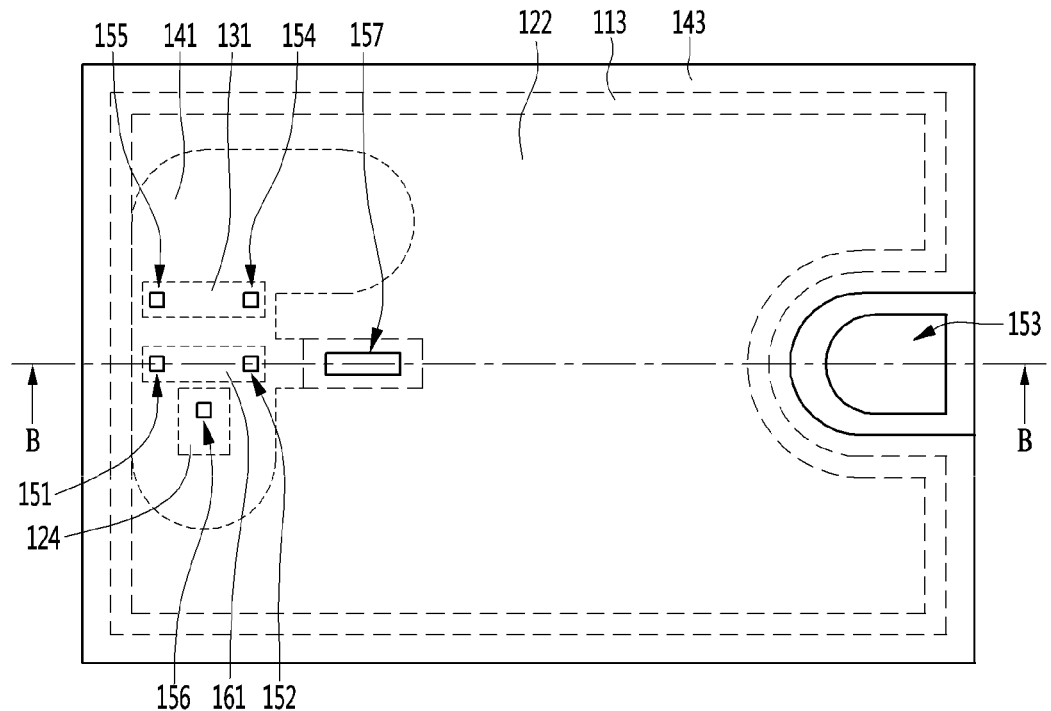
FIGS. 14a and 14b are respectively a plan view and a cross-sectional view illustrating an example in which a second insulating layer is formed by the semiconductor device manufacturing method according to an embodiment of the present invention.
Figure 14B:
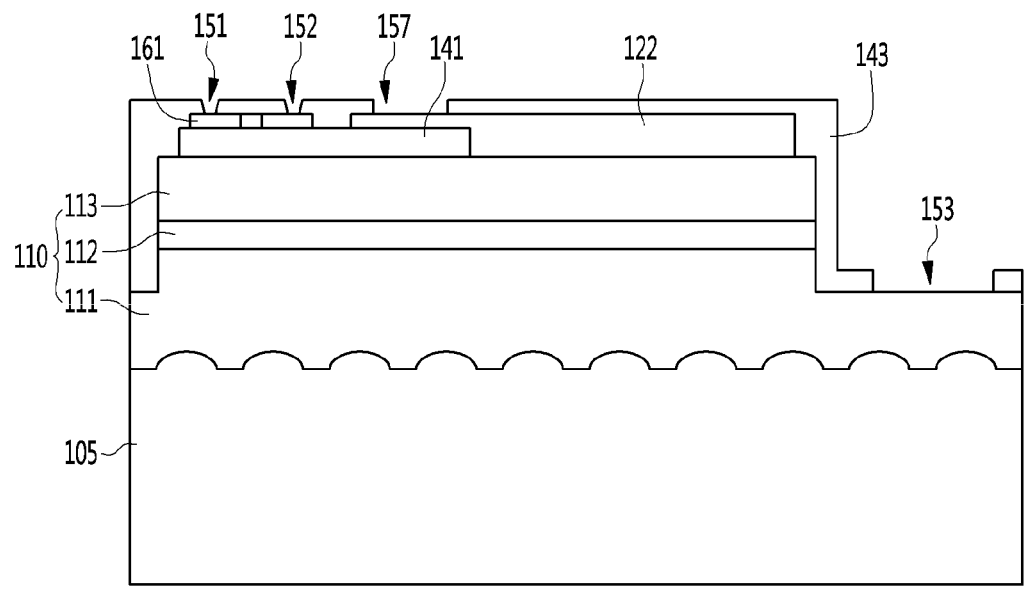

Next, as illustrated in FIGS. 14a and 14b, a second insulating layer 143 may be formed on the upper surface and the side surface of the light-emitting structure 110.

FIGS. 14a and 14b are respectively a plan view and a cross-sectional view illustrating an example in which the second insulating layer is formed by the semiconductor device manufacturing method according to an embodiment of the present invention. FIG. 14b is a cross-sectional view taken along line B-B of the plan view illustrated in FIG. 14a.

The second insulating layer 143 may include a first contact hole 151, a second contact hole 152, a third contact hole 153, a fourth contact hole 154, a fifth contact hole 155, a sixth contact hole 156, and a seventh contact hole 157. A first region of the second semiconductor layer 161 may be exposed by the first contact hole 151. A second region of the second semiconductor layer 161 may be exposed by the second contact hole 152. A partial region of the first conductivity type semiconductor layer 111 may be exposed by the third contact hole 153. A first region of the first semiconductor layer 131 may be exposed by the fourth contact hole 154. A second region of the first semiconductor layer 131 may be exposed by the fifth contact hole 155. A partial region of the metal layer 124 may be exposed by the sixth contact hole 156. A partial region of the second electrode 122 may be exposed by the seventh contact hole 157. The second insulating layer 143 may be disposed on the upper surface and the side surface of the light-emitting structure 110. The second insulating layer 143 may be disposed on the second electrode 122. The second insulating layer 143 may be disposed on the first semiconductor layer 131. The second insulating layer 143 may be disposed on the second semiconductor layer 161.

For example, the second insulating layer 143 may include an insulating material. The second insulating layer 143 may include oxide, nitride, or an organic material. For example, the second insulating layer 143 may include at least one selected from SiO₂, SiN$_x$, Al₂O₃, and the like.

Figure 15A:
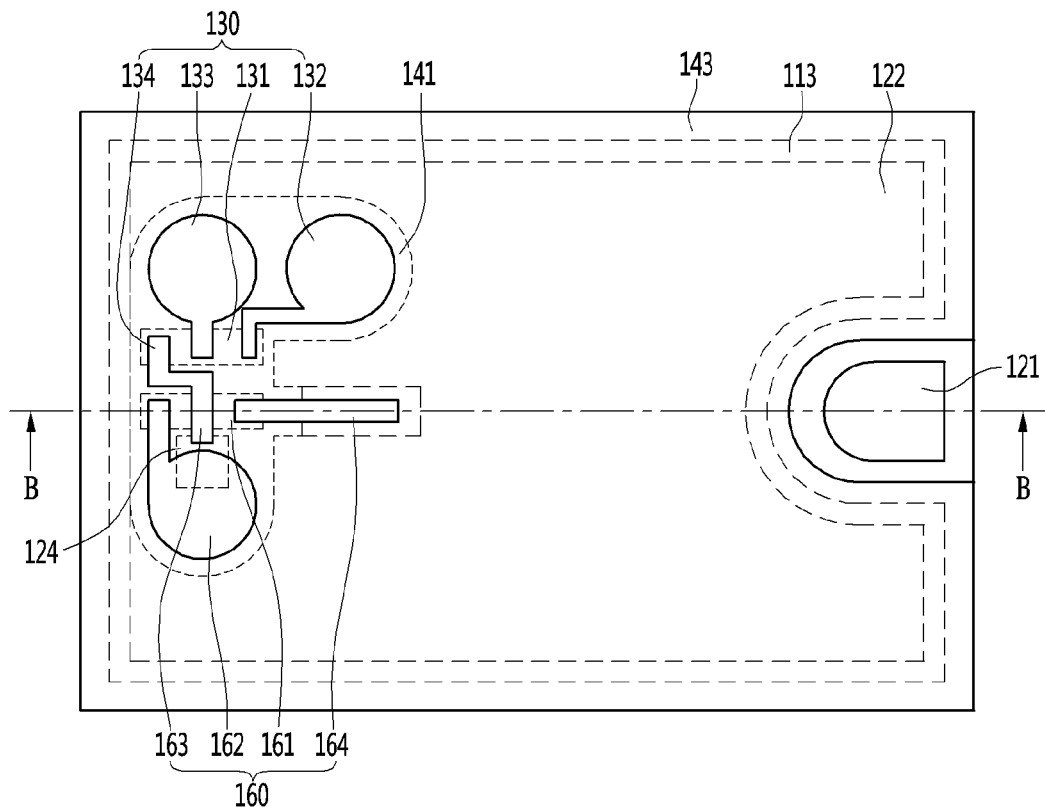
FIGS. 15a and 15b are respectively a plan view and a cross-sectional view illustrating an example in which a first transistor and a second transistor are formed by the semiconductor device manufacturing method according to an embodiment of the present invention.
Figure 15B:
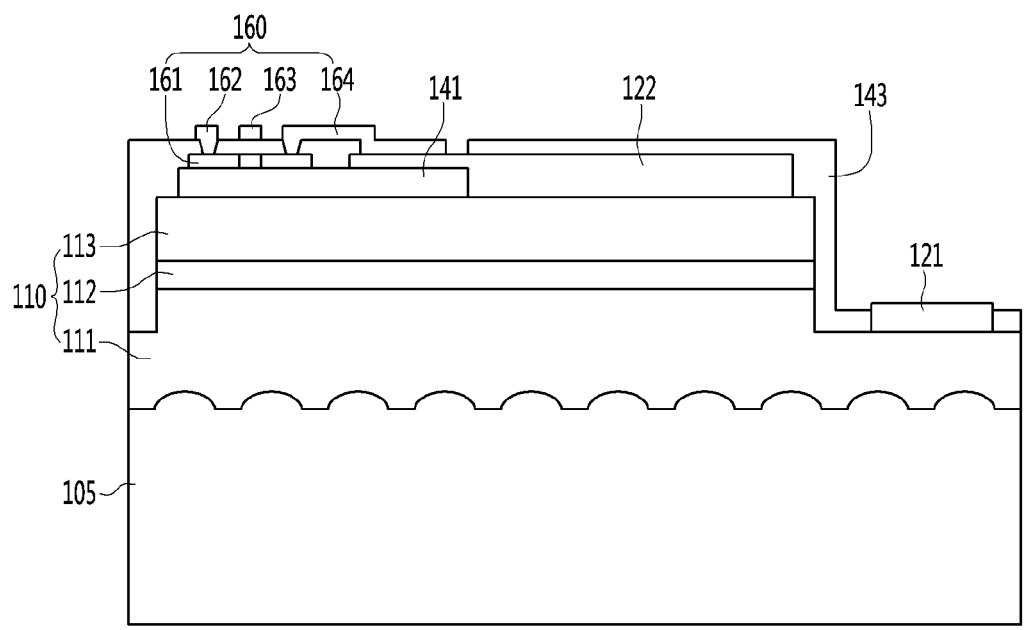

Next, as illustrated in FIGS. 15a and 15b, a first transistor and a second transistor may be formed.

FIGS. 15a and 15b are respectively a plan view and a cross-sectional view illustrating an example in which the first transistor and the second semiconductor layer are formed by the semiconductor device manufacturing method according to an embodiment of the present invention. FIG. 15b is a cross-sectional view taken along line B-B of the plan view illustrated in FIG. 15a.

First, a first gate electrode 133 and a second gate electrode 163 may be formed on the second insulating layer 143. The first gate electrode 133 may be formed on the first semiconductor layer 131. The second gate electrode 163 may be formed on the second semiconductor layer 161. At this time, one region extending from the second gate electrode 163 may be electrically connected to the second metal layer 124 through the sixth contact hole 156. For example, impurities may be added to the first semiconductor layer 131 and the second semiconductor layer 161 through an implant process by using the first gate electrode 133 and the second gate electrode 163 as a mask. Therefore, in the first semiconductor layer 131, the first region to which the first source electrode 132 is to be electrically connected and the second region to which the first drain electrode 134 is to be electrically connected may be formed as high-concentration impurity regions. In addition, in the second semiconductor layer 161, the first region to which the second source electrode 162 is to be electrically connected and the second region to which the second drain electrode 164 is to be electrically connected may be formed as high-concentration impurity regions.

Next, as illustrated in FIGS. 15a and 15b, a first source electrode 132, a first drain electrode 134, a second source electrode 162, and a second drain electrode 164, and a first electrode 121 may be formed on the second insulating layer 143. The first source electrode 132 may be electrically connected to the first region of the first semiconductor layer 131 through the fourth contact hole 154. The first drain electrode 134 may be electrically connected to the second region of the first semiconductor layer 131 through the fifth contact hole 155. The second source electrode 162 may be electrically connected to the first region of the second semiconductor layer 161 through the first contact hole 151. The second drain electrode 164 may be electrically connected to the second region of the second semiconductor layer 161 through the second contact hole 152, and may be electrically connected to the second electrode 122 through the seventh contact hole 157. The second drain electrode 164 may be electrically connected to the second region of the second semiconductor layer 161 and the second electrode 122.

The first source electrode 132 may be electrically connected to a first region of the first semiconductor layer 131. The first source electrode 132 may be disposed on the first region of the first semiconductor layer 131. The first drain electrode 134 may be electrically connected to a second region of the first semiconductor layer 131. The first drain electrode 134 may be disposed on the second region of the first semiconductor layer 131. The first drain electrode 134 may be electrically connected to the second gate electrode 163. For example, the first drain electrode 134 may be disposed to contact the second gate electrode 163. In addition, the first drain electrode 134 and the second gate electrode 163 may be formed at the same time in the same process.

The first gate electrode 133 may be disposed between the first region and the second region of the first semiconductor layer 131. The first gate electrode 133 may be disposed above between the first region and the second region of the first semiconductor layer 131. For example, the first region and the second region of the first semiconductor layer 131 may be provided to include relatively higher concentration impurities than a third region of the first semiconductor layer 131 disposed under the first gate electrode 133. The first gate electrode 133 may be disposed spaced apart from the first semiconductor layer 131. The lower surface of the first gate electrode 133 may be disposed spaced apart from the upper surface of the first semiconductor layer 131. A second insulating layer 143 may be disposed between the first gate electrode 133 and the first semiconductor layer 131. For example, the first gate electrode 133 and the first semiconductor layer 131 may be disposed spaced apart by the thickness of the second insulating layer 143.

The second source electrode 162 may be electrically connected to the first region of the second semiconductor layer 161. The second source electrode 162 may be disposed on the first region of the second semiconductor layer 161. The second drain electrode 164 may be electrically connected to the second region of the second semiconductor layer 161. The second drain electrode 164 may be disposed on the second region of the second semiconductor layer 161. The partial region of the second source electrode 162 may be disposed to overlap the partial region of the metal layer 124 in a vertical direction. Therefore, a capacitor may be provided between the second source electrode 162 and the metal layer 124 overlapping each other.

The second gate electrode 163 may be disposed between the first region and the second region of the second semiconductor layer 161. The second gate electrode 163 may be disposed above between the first region and the second region of the second semiconductor layer 161. For example, the first region and the second region of the second semiconductor layer 161 may be provided to include relatively higher concentration impurities than a third region of the second semiconductor layer 161 disposed under the second gate electrode 163. The second gate electrode 163 may be disposed spaced apart from the second semiconductor layer 161. The lower surface of the second gate electrode 163 may be disposed spaced apart from the upper surface of the second semiconductor layer 161. A second insulating layer 143 may be disposed between the second gate electrode 163 and the second semiconductor layer 161. For example, the second gate electrode 163 and the second semiconductor layer 161 may be disposed spaced apart by the thickness of the second insulating layer 143.

According to an embodiment, a current flow from the first source electrode 132 to the first drain electrode 134 may be controlled according to the magnitude of a voltage applied to the first gate electrode 133. That is, when a voltage exceeding a threshold voltage of the first transistor 130 is applied to the first gate electrode 133, a current may flow from the first source electrode 132 to the first drain electrode 134.

When the current flows to the first drain electrode 134 due to the control of the first gate electrode 133, power is supplied to the second gate electrode 163 electrically connected to the first drain electrode 134. At this time, when a voltage exceeding a threshold voltage of the second transistor 160 is applied to the second gate electrode 163, a current may flow from the second source electrode 162 to the second drain electrode 164.

Meanwhile, the semiconductor device according to an embodiment may include a first electrode 121 and a second electrode 122 as illustrated in FIGS. 15a and 15b. The first electrode 121 and the second electrode 122 may be electrically connected to the light-emitting structure 110. The first electrode 121 may be electrically connected to the first conductivity type semiconductor layer 111. For example, the first electrode 121 may be disposed on the first conductivity type semiconductor layer 111. The first electrode 121 may be disposed spaced apart from the side surface of the active layer 112. The second electrode 122 may be electrically connected to the second conductivity type semiconductor layer 113. For example, the second electrode 122 may be disposed on the second conductivity type semiconductor layer 113. The second electrode 122 may be disposed on the active layer 112. The light-emitting structure 110 may be driven by the voltage applied to the first electrode 121 and the second electrode 122. Light may be generated in the active layer 112 of the light-emitting structure 110 by the voltage applied between the first electrode 121 and the second electrode 122.

For example, the first electrode 121 may include a region that ohmic-contacts the first conductivity type semiconductor layer 111. The first electrode 121 may include a single layer or a multi-layer including at least one selected from Cr, Ni, Ti, Ge, Zn, Mg, Ca, Al, Ag, Rh, W, Pt, Au, AuGe, and AuGe/Ni/Au.

For example, the second electrode 122 may include a material that ohmic-contacts the second conductivity type semiconductor layer 113. For example, the second electrode 122 may include a transparent conductive oxide. For example, the second electrode 122 may include at least one material selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

According to an embodiment, the first semiconductor layer 131 and the second semiconductor layer 161 may be disposed on the first insulating layer 141. The second electrode 122 may be electrically connected to the second drain electrode 164. The first region of the second drain electrode 164 may be electrically connected to the second semiconductor layer 161. The first region of the second drain electrode 164 may be disposed on the second semiconductor layer 161. The second region of the second drain electrode 164 may be electrically connected to the second electrode 122. The second region of the second drain electrode 164 may be disposed on the second electrode 122. Therefore, a current flow from the second source electrode 162 to the second drain electrode 164 may be controlled according to power applied to the second gate electrode 163, and power may be applied to the second electrode 122 through the second drain electrode 164. According to an embodiment, power applied between the first electrode 121 and the second electrode 122 may be controlled by the control of the second gate electrode 163, and the light emission in the light-emitting structure 110 may be controlled.

Meanwhile, the semiconductor device according to an embodiment may include a metal layer 124 electrically connected to the second gate electrode 163 as illustrated in FIGS. 8a, 8b, and 9. For example, the metal layer 124 may be provided to overlap the partial region of the second source electrode 162 in a vertical direction. Therefore, a capacitor Cst may be provided between the metal layer 124 and the second source electrode 162.

According to an embodiment, the first transistor 130 may be indicated by a type of a switching transistor, and the second transistor 160 may be indicated by a type of a driving transistor. A current flow in the first transistor 130 may be controlled according to a magnitude of a voltage applied to the first gate electrode 133 of the first transistor 130, and a current flow in the second transistor 160 may be controlled according to the driving of the first transistor 130. Meanwhile, even when a current flowing from the first drain electrode 134 to the second gate electrode 163 is changed from a turned-on state to a turned-off state, a current may be made to flow through the second transistor 160 for a predetermined time by the capacitor Cst. Accordingly, the light emission and the light emission time of the light-emitting structure 110 may be actively controlled by controlling the driving of the first transistor 130 and the second transistor 160.

The above-described semiconductor device manufacturing method according to the embodiment is merely an example, and it can be understood by a person skilled in the art that various modifications and applications can be made thereto.

Figure 16A:
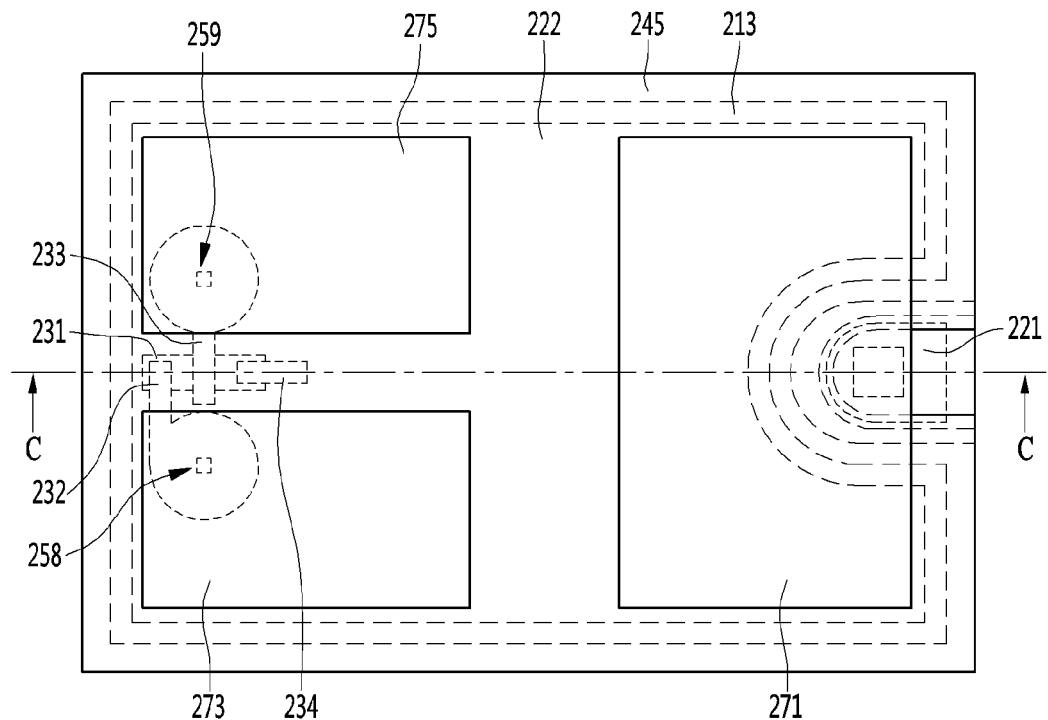
FIGS. 16a and 16b are respectively a plan view and a cross-sectional view illustrating another example of a semiconductor device according to an embodiment of the present invention.
Figure 16B:
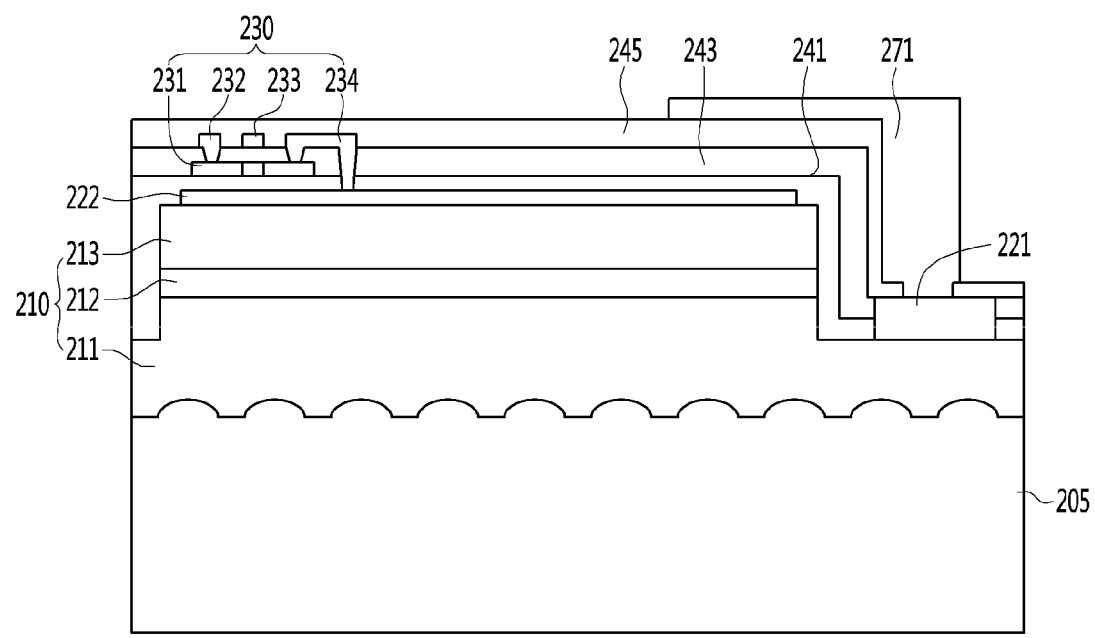

Meanwhile, FIGS. 16a and 16b are respectively a plan view and a cross-sectional view illustrating another example of a semiconductor device according to an embodiment of the present invention. In describing the semiconductor device according to the embodiment with reference to FIGS. 16a and 16b, the description redundant to the matters described above will be omitted.

FIGS. 16a and 16b are respectively a plan view and a cross-sectional view illustrating another example of a semiconductor device according to an embodiment of the present invention. FIG. 16b is a cross-sectional view taken along line C-C of the plan view illustrated in FIG. 16a.

A semiconductor device according to an embodiment may include a light-emitting structure 210 and a transistor 230 as illustrated in FIGS. 16a and 16b. For example, the transistor 230 may be disposed on the light-emitting structure 210. The transistor 230 may be electrically connected to the light-emitting structure 210. The semiconductor device according to the embodiment may control the driving of the transistor 230 and adjust the light emission of the light-emitting structure 210. The transistor 230 may be provided as, for example, a top gate transistor structure.

The light-emitting structure 210 may include a first conductivity type semiconductor layer 211, an active layer 212, and a second conductivity type semiconductor layer 213. The active layer 212 may be disposed between the first conductivity type semiconductor layer 211 and the second conductivity type semiconductor layer 213. For example, the active layer 212 may be disposed on the first conductivity type semiconductor layer 211, and the second conductivity type semiconductor layer 213 may be disposed on the active layer 212.

For example, the first conductivity type semiconductor layer 211 may be formed as an n-type semiconductor layer in which an n-type dopant is added as a first conductive dopant, and the second conductivity type semiconductor layer 213 may be formed as a p-type semiconductor layer in which a p-type dopant is added as a second conductive dopant. In addition, on the contrary, the first conductivity type semiconductor layer 211 may be formed as a p-type semiconductor layer, and the second conductivity type semiconductor layer 213 may be formed as an n-type semiconductor layer. Hereinafter, a case where the first conductivity type semiconductor layer 211 is provided as an n-type semiconductor layer and the second conductivity type semiconductor layer 213 is provided as a p-type semiconductor layer will be described.

In the light-emitting structure 210, a wavelength band of generated light may be changed according to a material constituting the active layer 212. The selection of materials constituting the first conductivity type semiconductor layer 211 and the second conductivity type semiconductor layer 213 may be changed according to the material constituting the active layer 212. The light-emitting structure 210 may be implemented by compound semiconductor. The light-emitting structure 210 may be implemented by, for example, a group II-VI compound semiconductor or a group III-V compound semiconductor. For example, the light-emitting structure 210 may be implemented by including at least two elements selected from the group consisting of aluminum (Al), gallium (Ga), indium (In), Phosphorus (P), arsenic (As), and nitrogen (N).

The active layer 212 is a layer in which electrons (or holes) injected through the first conductivity type semiconductor layer 211 and holes (or electrons) injected through the second conductivity type semiconductor layer 213 recombine with each other and light is emitted by a band gap difference between energy bands according to a forming material of the active layer 212. The active layer 212 may be formed to have one of a single well structure, a multiple well structure, a quantum dot structure, or a quantum wire structure. The active layer 212 may be implemented by compound semiconductor. The active layer 212 may be implemented by, for example, a group II-VI compound semiconductor or a group III-V compound semiconductor.

When light of a blue wavelength band or a green wavelength band is generated in the active layer 212, the active layer 212 may be implemented by, for example, a semiconductor material having a formula of $In_xAl_yGa_{1-x-y}N$ ($0 \leq x \leq 1$, $0 \leq y \leq 1$, $0 \leq x+y \leq 1$). When the active layer 212 is implemented by a multi well structure, the active layer 212 may be implemented by stacking a plurality of well layers and a plurality of barrier layers. In addition, when light of a red wavelength band is generated in the active layer 212, the active layer 212 may be implemented by, for example, a semiconductor material having a formula of $(Al_xGa_{1-x})_yIn_{1-y}P$ ($0 \leq x \leq 1$, $0 \leq y \leq 1$). The active layer 212 may be selected from, for example, AlGaInP, AlInP, GaP, and GaInP.

The first conductivity type semiconductor layer 211 may include, for example, an n-type semiconductor layer. The first conductivity type semiconductor layer 211 may be implemented by compound semiconductor. The first conductivity type semiconductor layer 211 may be implemented by, for example, a group II-VI compound semiconductor or a group III-V compound semiconductor. For example, when light of a blue wavelength band or a green wavelength band is generated in the active layer 212, the first conductivity type semiconductor layer 211 may be implemented by, for example, a semiconductor material having a formula of $In_xAl_yGa_{1-x-y}N$ ($0 \leq x \leq 1$, $0 \leq y \leq 1$, $0 \leq x+y \leq 1$). In addition, when light of a red wavelength band is generated in the active layer 212, the first conductivity type semiconductor layer 211 may be implemented by, for example, a semiconductor material having a formula of $(Al_xGa_{1-x})_yIn_{1-y}P$ ($0 \leq x \leq 1$, $0 \leq y \leq 1$). In the first conductivity type semiconductor layer 211, y may have a value of 0.5 and x may have a value of 0.5 to 0.8 in the formula. The first conductivity type semiconductor layer 211 may be selected from the group consisting of GaN, AlN, AlGaN, InGaN, InN, InAlGaN, AlInN, AlGaAs, GaP, GaAs, GaAsP, AlGaInP, AlInP, and GaInP, and an n-type dopant such as Si, Ge, Sn, Se, or Te may be doped.

The second conductivity type semiconductor layer 213 may be implemented by compound semiconductor. The second conductivity type semiconductor layer 213 may be implemented by, for example, a group II-VI compound semiconductor or a group III-V compound semiconductor. For example, when light of a blue wavelength band or a green wavelength band is generated in the active layer 212, the second conductivity type semiconductor layer 213 may be implemented by, for example, a semiconductor material having a formula of $In_xAl_yGa_{1-x-y}N$ ($0 \leq x \leq 1$, $0 \leq y \leq 1$, $0 \leq x+y \leq 1$). In addition, when light of a red wavelength band is generated in the active layer 212, the second conductivity type semiconductor layer 213 may be implemented by, for example, a semiconductor material having a formula of $(Al_xGa_{1-x})_yIn_{1-y}P$ ($0 \leq x \leq 1$, $0 \leq y \leq 1$). The second conductivity type semiconductor layer 213 may be selected from the group consisting of GaN, AlN, AlGaN, InGaN, InN, InAlGaN, AlInN, AlGaAs, GaP, GaAs, GaAsP, AlGaInP, AlInP, and GaInP, and a p-type dopant such as Mg, Zn, Ca, Sr, or Ba may be doped.

The transistor 230 may include a semiconductor layer 231, a source electrode 232, a gate electrode 233, and a drain electrode 234. The transistor 230 may be disposed on the light-emitting structure 210. The transistor 230 may be disposed on the second conductivity type semiconductor layer 213. The area of the transistor 230 may be smaller than the area of the second conductivity type semiconductor layer 213 when viewed from above the semiconductor device. The transistor 230 may be disposed on the active layer 212. The area of the transistor 230 may be smaller than the area of the active layer 212 when viewed from above the semiconductor device.

The semiconductor layer 231 may be formed of, for example, a material different from the material forming the light-emitting structure 210. For example, the semiconductor layer 231 may include a material selected from the group consisting of amorphous silicon, polycrystalline silicon, single crystal silicon, and oxide semiconductor. The material constituting the semiconductor layer 231 may be selected from materials that can be formed at a lower temperature than a forming temperature of the light-emitting structure 210. Therefore, even when the semiconductor layer 231 is formed after the light-emitting structure 210 is formed, it does not influence the physical properties of the light-emitting structure 210, and it is possible to prevent the light extraction efficiency of the light-emitting structure 210 from being reduced. Examples of the oxide semiconductor may be selected from the group consisting of indium gallium zinc oxide (IGZO), indium gallium oxide (IGO), and indium zinc oxide (IZO).

The source electrode 232 may be electrically connected to a first region of the semiconductor layer 231. The source electrode 232 may be disposed on the first region of the semiconductor layer 231. The drain electrode 234 may be electrically connected to a second region of the semiconductor layer 231. The drain electrode 234 may be disposed on the second region of the semiconductor layer 231.

The gate electrode 233 may be disposed between the first region and the second region of the semiconductor layer 231. The gate electrode 233 may be disposed above between the first region and the second region of the semiconductor layer 231. For example, the first region and the second region of the semiconductor layer 231 may be provided to include relatively higher concentration impurities than a third region of the semiconductor layer 231 disposed under the gate electrode 233. The gate electrode 233 may be disposed spaced apart from the semiconductor layer 231. The lower surface of the gate electrode 233 may be disposed spaced apart from the upper surface of the semiconductor layer 231. A second insulating layer 243 may be disposed between the gate electrode 233 and the semiconductor layer 231. For example, the gate electrode 233 and the semiconductor layer 231 may be disposed spaced apart by the thickness of the second insulating layer 243.

According to an embodiment, a current flow from the source electrode 232 to the drain electrode 234 may be controlled according to the magnitude of a voltage applied to the gate electrode 233. That is, when a voltage exceeding a threshold voltage of the transistor 230 is applied to the gate electrode 233, a current may flow from the source electrode 232 to the drain electrode 234.

Meanwhile, the semiconductor device according to an embodiment may include a first electrode 221 and a second electrode 222 as illustrated in FIGS. 16a and 16b. The first electrode 221 and the second electrode 222 may be electrically connected to the light-emitting structure 210. The first electrode 221 may be electrically connected to the first conductivity type semiconductor layer 211. For example, the first electrode 221 may be disposed on the first conductivity type semiconductor layer 211. The first electrode 221 may be disposed spaced apart from the side surface of the active layer 212. The second electrode 222 may be electrically connected to the second conductivity type semiconductor layer 213. For example, the second electrode 222 may be disposed on the second conductivity type semiconductor layer 213. The second electrode 222 may be disposed on the active layer 212. The light-emitting structure 210 may be driven by the voltage applied to the first electrode 221 and the second electrode 222. Light may be generated in the active layer 212 of the light-emitting structure 210 by the voltage applied between the first electrode 221 and the second electrode 222.

For example, the first electrode 221 may include a region that ohmic-contacts the first conductivity type semiconductor layer 211. The first electrode 221 may include a single layer or a multi-layer including at least one selected from Cr, Ni, Ti, Ge, Zn, Mg, Ca, Al, Ag, Rh, W, Pt, Au, AuGe, and AuGe/Ni/Au.

For example, the second electrode 222 may include a material that ohmic-contacts the second conductivity type semiconductor layer 213. For example, the second electrode 222 may include a transparent conductive oxide. For example, the second electrode 222 may include at least one material selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

The semiconductor device according to an embodiment may include a first insulating layer 241 as illustrated in FIGS. 16a and 16b. The first insulating layer 241 may be disposed on the light-emitting structure 210. The first insulating layer 241 may be disposed on an upper surface and a side suface of the light emitting-structure 210. The first insulating layer 241 may be disposed on the second conductivity type semiconductor layer 213. The first insulating layer 241 may be disposed on the active layer 212. The first insulating layer 241 may be disposed under the transistor 230. The first insulating layer 241 may be disposed between the light-emitting structure 210 and the transistor 230. The first insulating layer 241 may be disposed between the second conductivity type semiconductor layer 213 and the transistor 230.

According to an embodiment, the semiconductor layer 231 may be disposed on the first insulating layer 241. The second electrode 222 may be electrically connected to the drain electrode 234. The first region of the drain electrode 234 may be electrically connected to the semiconductor layer 231. The first region of the drain electrode 234 may be disposed on the semiconductor layer 231. The second region of the drain electrode 234 may be electrically connected to the second electrode 222. The second region of the drain electrode 234 may be disposed on the second electrode 222. One end of the drain electrode 234 may pass through the first insulating layer 241 and be electrically connected to the second electrode 222. For example, one end of the drain electrode 234 may pass through the first insulating layer 241 and contact the upper surface of the second electrode 222.

Therefore, a current flow from the source electrode 232 to the drain electrode 234 may be controlled according to power applied to the gate electrode 233, and power may be applied to the second electrode 222 through the drain electrode 234. According to an embodiment, power applied between the first electrode 221 and the second electrode 222 may be controlled by the control of the gate electrode 233, and the light emission in the light-emitting structure 210 may be controlled.

The first insulating layer 241 may reflect light provided from the light-emitting structure 210. The first insulating layer 241 may reflect light provided from the active layer 212. The first insulating layer 241 may receive light generated in the active layer 212 and reflect the light downward. Therefore, it is possible to prevent the light generated in the active layer 212 from being incident on the transistor 230 and disappearing and to improve the light extraction efficiency of the semiconductor device.

For example, the first insulating layer 241 may include an insulating material. The first insulating layer 241 may include oxide or nitride. The first insulating layer 241 may include silicon-based oxide or silicon-based nitride. The first insulating layer 241 may include metal oxide. For example, the first insulating layer 241 may include at least one selected from $SiO_2$, $SiN_x$, $Al_2O_3$, and the like. The first insulating layer 241 may include metal oxide including $TiO_2$.

The first insulating layer 241 may be provided as a plurality of layers having different refractive indices. For example, the first insulating layer 241 may be formed by stacking a first layer having a first refractive index and a second layer having a second refractive index as one pair, and may be formed by sequentially stacking a plurality of pairs. Therefore, the first insulating layer 241 may be provided as a distributed Bragg reflector (DBR) layer and reflects light incident from the light-emitting structure 210, thereby preventing light generated in the light-emitting structure 210 from disappearing at the transistor 230. As one example, the first insulating layer 241 may be provided by stacking a plurality of pairs each including a $SiO_2$ layer and a $TiO_2$ layer as one pair.

The semiconductor device according to an embodiment may include a second insulating layer 243 as illustrated in FIGS. 16a and 16b. The second insulating layer 243 may be disposed on the upper surface of the light-emitting structure 210. The second insulating layer 243 may be disposed on the side surface of the light-emitting structure 210. The second insulating layer 243 may be disposed on the first insulating layer 241. The second insulating layer 243 may be disposed on the semiconductor layer 231. The second insulating layer 243 may be disposed on the second electrode 222. The gate electrode 233 may be disposed on the second insulating layer 243. For example, the source electrode 232 may be disposed on the second insulating layer 243, and one end of the source electrode 232 may pass through the second insulating layer 243 and be electrically connected to the semiconductor layer 231. In addition, the drain electrode 234 may be disposed on the second insulating layer 243, and one end of the drain electrode 234 may pass through the second insulating layer 243 and be electrically connected to the semiconductor layer 231. The other end of the drain electrode 234 may pass through the first insulating layer 241 and the second insulating layer 243 and contact the second electrode 222.

For example, the second insulating layer 243 may include an insulating material. The second insulating layer 243 may include oxide, nitride, or an organic material. For example, the second insulating layer 243 may include at least one selected from $SiO_2$, $SiN_x$, $Al_2O_3$, and the like.

The semiconductor device according to an embodiment may include a third insulating layer 245 as illustrated in FIGS. 16a and 16b. The third insulating layer 245 may be disposed on the second insulating layer 243. The third insulating layer 245 may be disposed on the transistor 230. For example, the third insulating layer 245 may include an insulating material. The third insulating layer 245 may include oxide, nitride, or an organic material. For example, the third insulating layer 245 may include at least one selected from $SiO_2$, $SiN_x$, $Al_2O_3$, and the like.

The semiconductor device according to an embodiment may include a first bonding pad 271, a second bonding pad 273, and a third bonding pad 275 as illustrated in FIGS. 16a and 16b. The first bonding pad 271 may be electrically connected to the first electrode 221. The first bonding pad 271 may be disposed on the first electrode 221. The first bonding pad 271 may be disposed on the third insulating layer 245. In addition, the second bonding pad 273 and the third bonding pad 275 may be disposed on the third insulating layer 245. The second bonding pad 273 may be electrically connected to the source electrode 232. For example, one end of the second bonding pad 273 may pass through the third insulating layer 245 and contact the upper surface of the source electrode 232. The third bonding pad 275 may be electrically connected to the gate electrode 233. For example, one end of the third bonding pad 275 may pass through the third insulating layer 245 and contact the upper surface of the gate electrode 233.

For example, the first bonding pad 271, the second bonding pad 273, and the third bonding pad 275 may include a single layer or a multi-layer including at least one selected from Cr, Ni, Ti, Ge, Zn, Mg, Ca, Al, Ag, Rh, W, Pt, Au, AuGe, AuGe/Ni/Au, In, InAg, and AuIn.

The semiconductor device according to an embodiment may include a substrate 205 as illustrated in FIGS. 16a and 16b. For example, the substrate 205 may be a growth substrate on which the light-emitting structure 210 can be grown. For example, an uneven structure may be provided on the upper surface of the substrate 205. The uneven structure provided in the substrate 205 may reduce defects during the growth of the light-emitting structure 210, may improve crystal quality, and may reflect light emitted from the active layer 212 so as to improve the luminescent efficiency. For example, the substrate 205 may include at least one selected from a sapphire ($Al_2O_3$) substrate, SiC, GaAs, GaN, ZnO, Si, GaP, InP, and Ge.

Meanwhile, the semiconductor device according to an embodiment may be supplied with power from the outside by, for example, a flip chip bonding method. The first bonding pad 271, the second bonding pad 273, and the third bonding pad 275 are illustrated in FIGS. 16a and 16b as being provided in an upper direction, but when the flip chip bonding method is applied, the upper and lower structure may be reversed such that the first bonding pad 271, the second bonding pad 273, and the third bonding pad 275 are disposed in a lower direction. Therefore, the substrate 205 may be disposed at the upper portion.

When the semiconductor device according to an embodiment is electrically connected to the circuit substrate by the flip chip bonding method, power may be supplied to the first electrode 221 through the first bonding pad 271. In addition, power may be supplied to the source electrode 232 through the second bonding pad 273. In addition, power may be supplied to the gate electrode 233 through the third bonding pad 275. Therefore, when a voltage higher than a threshold voltage of the transistor 230 is applied through the third bonding pad 275, a current flows from the source electrode 232 to the drain electrode 234. Power may be supplied to the second electrode 222 through the drain electrode 234. In addition, light may be generated in the light-emitting structure 210 by the voltage applied between the first electrode 221 and the second electrode 222.

As described above, the semiconductor device according to the embodiment may control the light emission of the light-emitting structure 210 through the control of the transistor 230. According to an embodiment, since whether to cause the light-emitting structure 210 to emit light by using the control of the transistor 230 can be controlled, it is possible to more accurately control whether to cause the light-emitting structure 210 to emit light, thereby more easily implementing the control of the light emission time and the light emission interval.

In addition, the transistor 230 is disposed on the light-emitting structure 210, thereby maximizing the size of the active layer 212. If the transistor 230 is disposed at or near the side surface of the active layer 212, the size of the active layer 212 may be reduced as much as the size of the transistor 230. However, according to an embodiment, the transistor 230 is disposed on the active layer 212, thereby preventing the area of the active layer 212 from being reduced. Since an amount of light generated in the light-emitting structure 210 is affected by the area of the active layer 212, an amount of light generated in the active layer 212 increases, thereby improving the light extraction efficiency and the luminance as a whole.

Meanwhile, the case of the semiconductor device in which one light-emitting structure 210 and one transistor 230 are provided is illustrated in FIGS. 16a and 16b, but one semiconductor device according to an embodiment may include a plurality of light-emitting structures and a plurality of transistors. When the plurality of transistors are provided, the plurality of transistors may be connected in parallel or in series according to a circuit design. Therefore, the degree of freedom of the circuit design can be increased, and the degree of light emitted in the plurality of light-emitting structures can be effectively controlled according to necessity. In addition, the semiconductor device according to an embodiment may include a plurality of light-emitting structures, and the plurality of light-emitting structures may be implemented to emit light of different wavelength bands. Therefore, the semiconductor device according to an embodiment may selectively or independently control the light emission in the plurality of light-emitting structures having different wavelength bands through the control of the plurality of transistors.

The semiconductor device described above may be implemented to emit light of various wavelength bands according to the selection of the active layer. For example, it is possible to implement a display panel or a display apparatus in which one color pixel is constituted by using the blue semiconductor device, the green semiconductor device, and the red semiconductor device described above. The semiconductor device according to an embodiment may be applied to various fields requiring a light source. The semiconductor device according to an embodiment may be applied to, for example, an electronic sign board, a large-size display apparatus, and a signage, thereby implementing a high-resolution light source. In addition, the semiconductor device according to an embodiment may be applied to a communication device. For example, the semiconductor device according to an embodiment may be applied to a visible light communication (VLC), light WiFi (LiFi), or the like which transmits data by using light.

An example of a method for manufacturing the semiconductor device illustrated in FIGS. 16a and 16b will be described with reference to the accompanying drawings. In describing the semiconductor device manufacturing method according to the embodiment with reference to the accompanying drawings, the description redundant to the matters described above will be omitted.

Figure 17A:
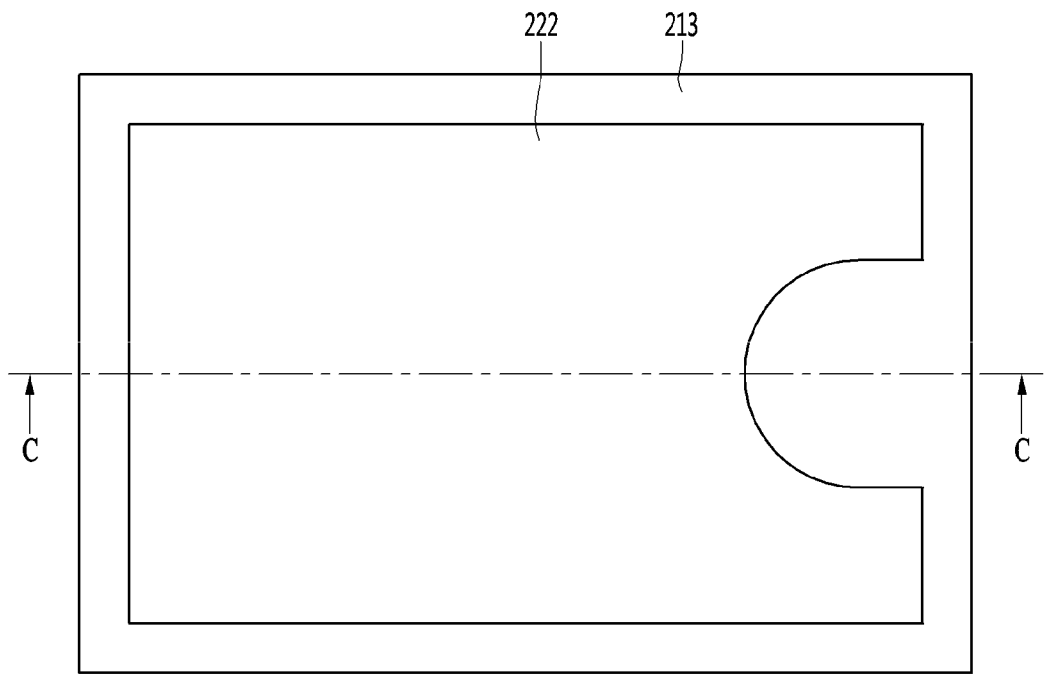
FIGS. 17a and 17b are respectively a plan view and a cross-sectional view illustrating an example in which a light-emitting structure and a second electrode are formed by the semiconductor device manufacturing method according to an embodiment of the present invention.
Figure 17B:
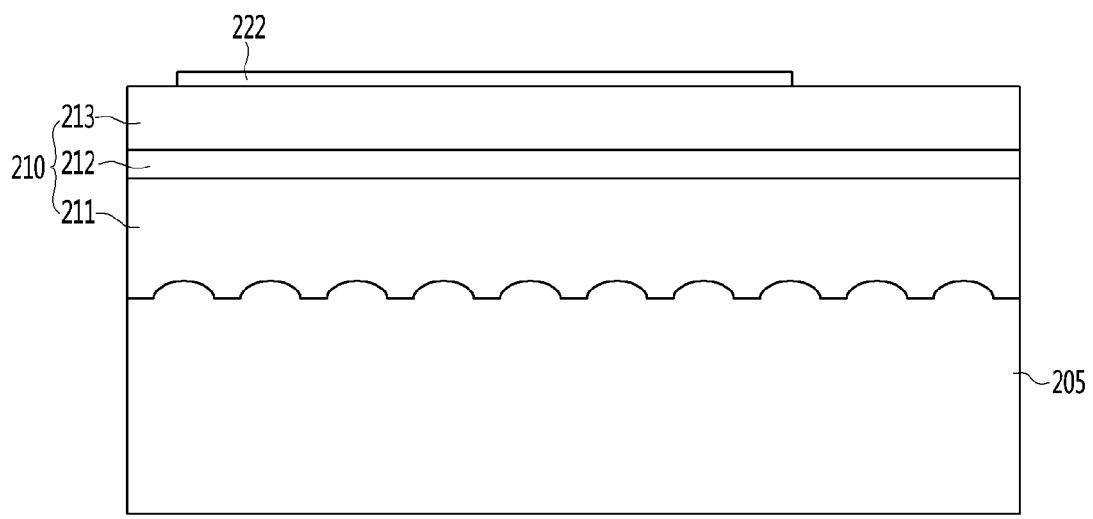

FIGS. 17a and 17b are respectively a plan view and a cross-sectional view illustrating an example in which the light-emitting structure and the second electrode are formed by the semiconductor device manufacturing method according to an embodiment of the present invention. FIG. 17b is a cross-sectional view taken along line C-C of the plan view illustrated in FIG. 17a.

According to the semiconductor device manufacturing method according to an embodiment, a light-emitting structure 210 may be formed on a substrate 205 as illustrated in FIGS. 17a and 17b. For example, the light-emitting structure 210 may be grown on the substrate 205. The light-emitting structure 210 may include a first conductivity type semiconductor layer 211, an active layer 212, and a second conductivity type semiconductor layer 213.

For example, the first conductivity type semiconductor layer 211 may be formed as an n-type semiconductor layer in which an n-type dopant is added as a first conductive dopant, and the second conductivity type semiconductor layer 213 may be formed as a p-type semiconductor layer in which a p-type dopant is added as a second conductive dopant. In addition, on the contrary, the first conductivity type semiconductor layer 211 may be formed as a p-type semiconductor layer, and the second conductivity type semiconductor layer 213 may be formed as an n-type semiconductor layer. Hereinafter, a case where the first conductivity type semiconductor layer 211 is provided as an n-type semiconductor layer and the second conductivity type semiconductor layer 213 is provided as a p-type semiconductor layer will be described.

In the light-emitting structure 210, a wavelength band of generated light may be changed according to a material constituting the active layer 212. The selection of materials constituting the first conductivity type semiconductor layer 211 and the second conductivity type semiconductor layer 213 may be changed according to the material constituting the active layer 212. The light-emitting structure 210 may be implemented by compound semiconductor. The light-emitting structure 210 may be implemented by, for example, a group II-VI compound semiconductor or a group III-V compound semiconductor. For example, the light-emitting structure 210 may be implemented by including at least two elements selected from the group consisting of aluminum (Al), gallium (Ga), indium (In), Phosphorus (P), arsenic (As), and nitrogen (N).

The active layer 212 is a layer in which electrons (or holes) injected through the first conductivity type semiconductor layer 211 and holes (or electrons) injected through the second conductivity type semiconductor layer 213 recombine with each other and light is emitted by a band gap difference between energy bands according to a forming material of the active layer 212. The active layer 212 may be formed to have one of a single well structure, a multiple well structure, a quantum dot structure, or a quantum wire structure. The active layer 212 may be implemented by compound semiconductor. The active layer 212 may be implemented by, for example, a group II-VI compound semiconductor or a group III-V compound semiconductor.

When light of a blue wavelength band or a green wavelength band is generated in the active layer 212, the active layer 212 may be implemented by, for example, a semiconductor material having a formula of $In_xAl_yGa_{1-x-y}N$ ($0 \le x \le 1$, $0 \le y \le 1$, $0 \le x+y \le 1$). When the active layer 212 is implemented by a multi well structure, the active layer 212 may be implemented by stacking a plurality of well layers and a plurality of barrier layers. In addition, when light of a red wavelength band is generated in the active layer 212, the active layer 212 may be implemented by, for example, a semiconductor material having a formula of $(Al_xGa_{1-x})_yIn_{1-y}P$ ($0 \le x \le 1$, $0 \le y \le 1$). The active layer 212 may be selected from, for example, AlGaInP, AlInP, GaP, and GaInP.

The first conductivity type semiconductor layer 211 may include, for example, an n-type semiconductor layer. The first conductivity type semiconductor layer 211 may be implemented by compound semiconductor. The first conductivity type semiconductor layer 211 may be implemented by, for example, a group II-VI compound semiconductor or a group III-V compound semiconductor. For example, when light of a blue wavelength band or a green wavelength band is generated in the active layer 212, the first conductivity type semiconductor layer 211 may be implemented by, for example, a semiconductor material having a formula of $In_xAl_yGa_{1-x-y}N$ ($0 \le x \le 1$, $0 \le y \le 1$, $0 \le x+y \le 1$). In addition, when light of a red wavelength band is generated in the active layer 212, the first conductivity type semiconductor layer 211 may be implemented by, for example, a semiconductor material having a formula of $(Al_xGa_{1-x})_yIn_{1-y}P$ ($0 \le x \le 1$, $0 \le y \le 1$). In the first conductivity type semiconductor layer 211, y may have a value of 0.5 and x may have a value of 0.5 to 0.8 in the formula. The first conductivity type semiconductor layer 211 may be selected from the group consisting of GaN, AlN, AlGaN, InGaN, InN, InAlGaN, AlInN, AlGaAs, GaP, GaAs, GaAsP, AlGaInP, AlInP, and GaInP, and an n-type dopant such as Si, Ge, Sn, Se, or Te may be doped.

The second conductivity type semiconductor layer 213 may be implemented by compound semiconductor. The second conductivity type semiconductor layer 213 may be implemented by, for example, a group II-VI compound semiconductor or a group III-V compound semiconductor. For example, when light of a blue wavelength band or a green wavelength band is generated in the active layer 212, the second conductivity type semiconductor layer 213 may be implemented by, for example, a semiconductor material having a formula of $In_xAl_yGa_{1-x-y}N$ ($0 \le x \le 1$, $0 \le y \le 1$, $0 \le x+y \le 1$). In addition, when light of a red wavelength band is generated in the active layer 212, the second conductivity type semiconductor layer 213 may be implemented by, for example, a semiconductor material having a formula of $(Al_xGa_{1-x})_yIn_{1-y}P$ ($0 \le x \le 1$, $0 \le y \le 1$). The second conductivity type semiconductor layer 213 may be selected from the group consisting of GaN, AlN, AlGaN, InGaN, InN, InAlGaN, AlInN, AlGaAs, GaP, GaAs, GaAsP, AlGaInP, AlInP, and GaInP, and a p-type dopant such as Mg, Zn, Ca, Sr, or Ba may be doped.

For example, the substrate 205 may be a growth substrate on which the light-emitting structure 210 can be grown. For example, an uneven structure may be provided on the upper surface of the substrate 205. The uneven structure provided in the substrate 205 may reduce defects during the growth of the light-emitting structure 210, may improve crystal quality, and may reflect light emitted from the active layer 212 so as to improve the luminescent efficiency. For example, the substrate 205 may include at least one selected from a sapphire ($Al_2O_3$) substrate, SiC, GaAs, GaN, ZnO, Si, GaP, InP, and Ge.

A second electrode 222 may be formed on the light-emitting structure 210. The second electrode 222 may be disposed on the second conductivity type semiconductor layer 213. The second electrode 222 may be disposed on a partial region of the upper surface of the second conductivity type semiconductor layer 213.

For example, the second electrode 222 may include a material that ohmic-contacts the second conductivity type semiconductor layer 213. For example, the second electrode 222 may include a transparent conductive oxide. For example, the second electrode 222 may include at least one material selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

Figure 18A:
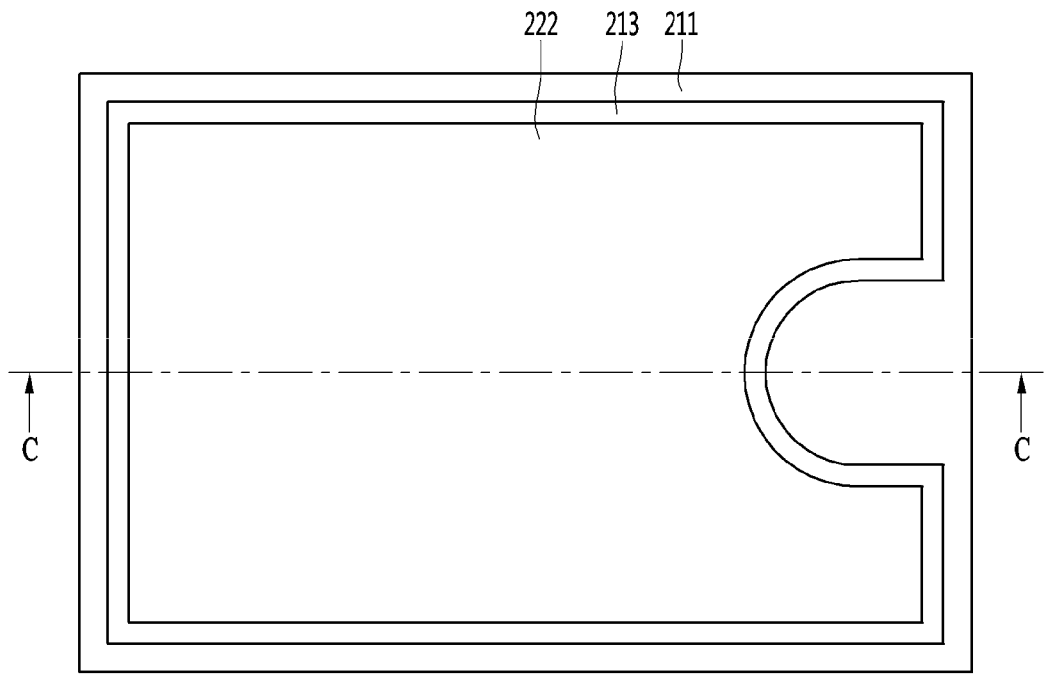
FIGS. 18a and 18b are respectively a plan view and a cross-sectional view illustrating an example in which a partial region of the light-emitting structure is etched by the semiconductor device manufacturing method according to an embodiment of the present invention.
Figure 18B:
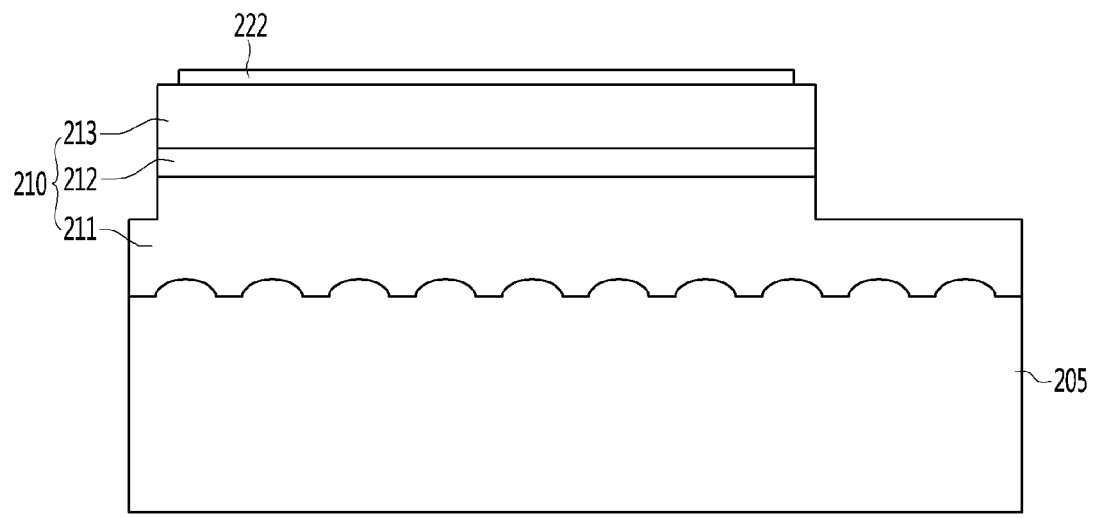

Next, as illustrated in FIGS. 18a and 18b, a part of the upper surface of the first conductivity type semiconductor layer 211 may be exposed through a process of etching the light-emitting structure 210.

FIGS. 18a and 18b are respectively a plan view and a cross-sectional view illustrating an example in which a partial region of the light-emitting structure is etched by the semiconductor device manufacturing method according to an embodiment of the present invention. FIG. 18b is a cross-sectional view taken along line C-C of the plan view illustrated in FIG. 18a.

A part of the upper surface of the first conductivity type semiconductor layer 211 may be exposed through a process of etching a partial region of the first conductivity type semiconductor layer 211 and a partial region of the active layer 212. At this time, a partial region of the first conductivity type semiconductor layer 211 may also be etched, and the first conductivity type semiconductor layer 211 may be provided as a stepped structure having different thicknesses according to a region.

Figure 19A:
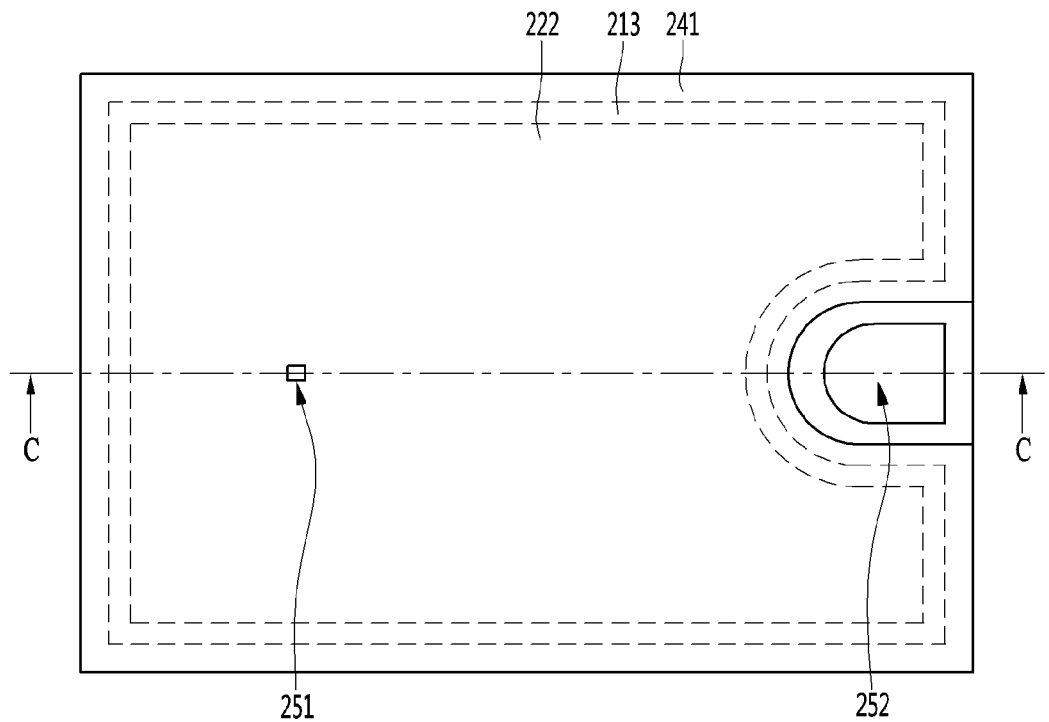
FIGS. 19a and 19b are respectively a plan view and a cross-sectional view illustrating an example in which a first insulating layer is formed by the semiconductor device manufacturing method according to an embodiment of the present invention.
Figure 19B:
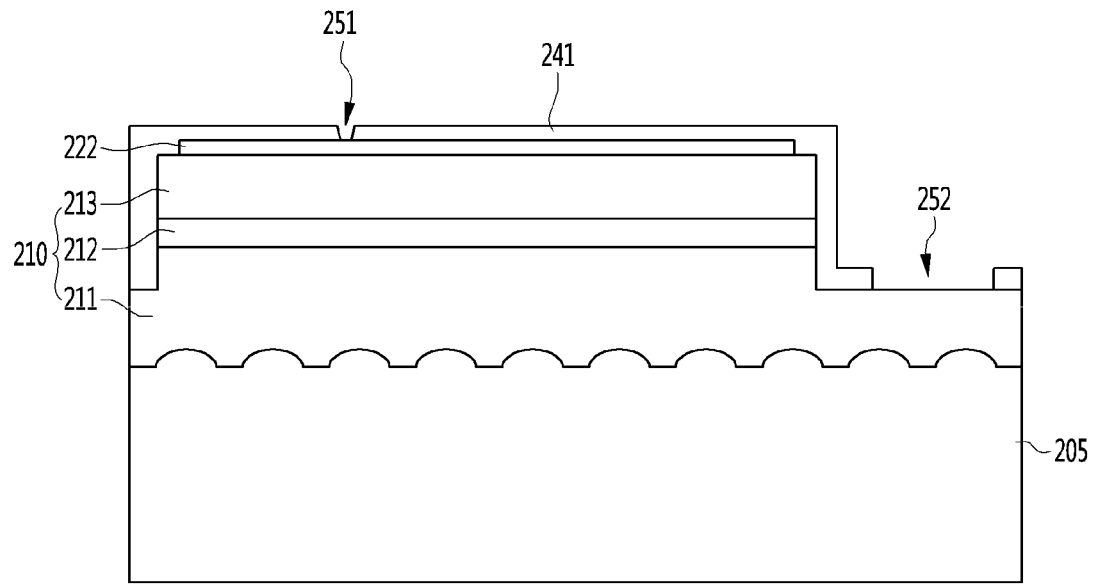

Next, as illustrated in FIGS. 19a and 19b, a first insulating layer 241 may be formed on the light-emitting structure 210.

FIGS. 19a and 19b are respectively a plan view and a cross-sectional view illustrating an example in which the first insulating layer is formed by the semiconductor device manufacturing method according to an embodiment of the present invention. FIG. 19b is a cross-sectional view taken along line C-C of the plan view illustrated in FIG. 19a.

The first insulating layer 241 may be disposed on the second conductivity type semiconductor layer 213. The first insulating layer 241 may be disposed on the second electrode 222. The first insulating layer 241 may include a first contact hole 251 and a second contact hole 252. The second electrode 222 may be exposed through the first contact hole 251. The first conductivity type semiconductor layer 211 may be exposed through the second contact hole 252.

For example, the first insulating layer 241 may include an insulating material. The first insulating layer 241, as an example, may include oxide or nitride. The first insulating layer 241 may include silicon-based oxide or silicon-based nitride. The first insulating layer 241 may include metal oxide. For example, the first insulating layer 241 may include at least one selected from $SiO_2$, $SiN_x$, $Al_2O_3$, and the like. The first insulating layer 241 may include metal oxide including $TiO_2$.

The first insulating layer 241 may be provided as a plurality of layers having different refractive indices. For example, the first insulating layer 241 may be formed by stacking a first layer having a first refractive index and a second layer having a second refractive index as one pair, and may be formed by sequentially stacking a plurality of pairs. Therefore, the first insulating layer 241 may be provided as a distributed Bragg reflector (DBR) layer and reflects light incident from the light-emitting structure 210. As one example, the first insulating layer 241 may be provided by stacking a plurality of pairs each including a $SiO_2$ layer and a $TiO_2$ layer as one pair.

Figure 20A:
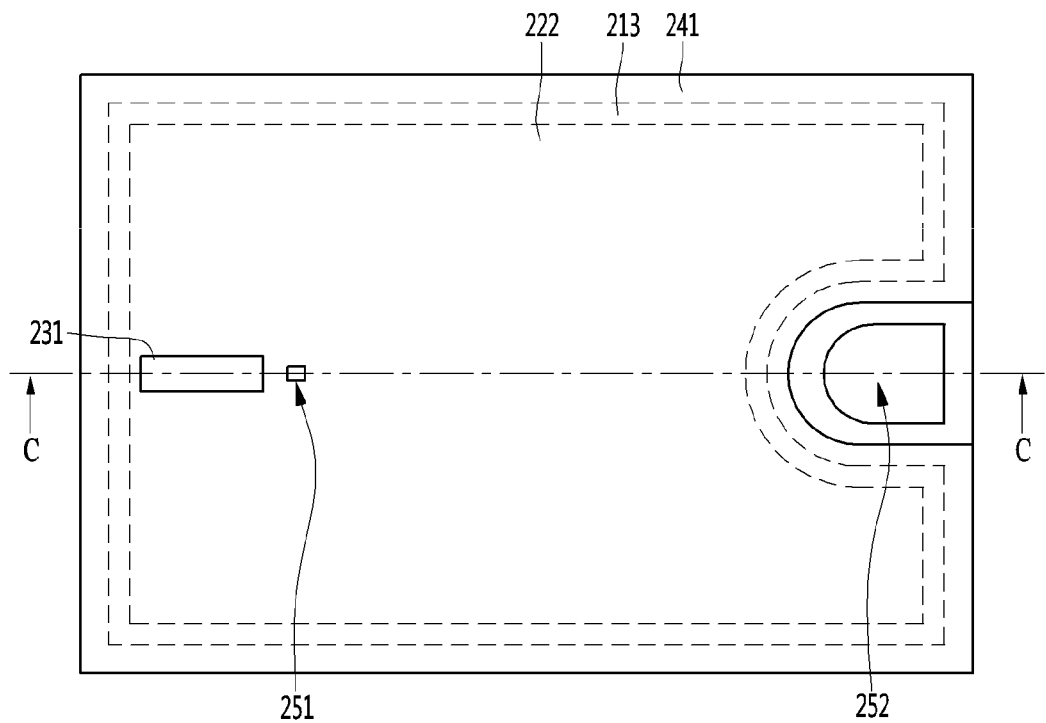
FIGS. 20a and 20b are respectively a plan view and a cross-sectional view illustrating an example in which a semiconductor layer is formed by the semiconductor device manufacturing method according to an embodiment of the present invention.
Figure 20B:
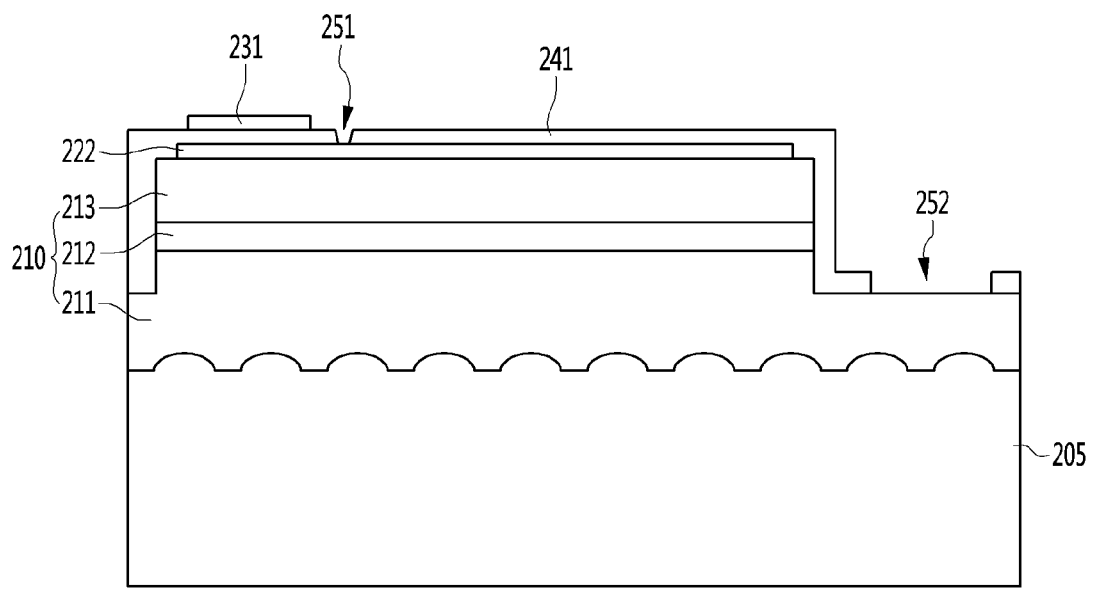

Next, as illustrated in FIGS. 20a and 20b, a semiconductor layer 231 may be formed on the first insulating layer 241.

FIGS. 20a and 20b are respectively a plan view and a cross-sectional view illustrating an example in which the semiconductor layer is formed by the semiconductor device manufacturing method according to an embodiment of the present invention. FIG. 20b is a cross-sectional view taken along line C-C of the plan view illustrated in FIG. 20a.

The semiconductor layer 231 may be disposed in a partial region of the upper surface of the first insulating layer 241. For example, the semiconductor layer 231 may be disposed on the first insulating layer 241 to overlap the second electrode 222 in a vertical direction.

The semiconductor layer 231 may be formed of, for example, a material different from the material forming the light-emitting structure 210. For example, the semiconductor layer 231 may include a material selected from the group consisting of amorphous silicon, polycrystalline silicon, single crystal silicon, and oxide semiconductor. The material constituting the semiconductor layer 231 may be selected from materials that can be formed at a lower temperature than a forming temperature of the light-emitting structure 210. Therefore, even when the semiconductor layer 231 is formed after the light-emitting structure 210 is formed, it does not influence the physical properties of the light-emitting structure 210, and it is possible to prevent the light extraction efficiency of the light-emitting structure 210 from being reduced. Examples of the oxide semiconductor may be selected from the group consisting of indium gallium zinc oxide (IGZO), indium gallium oxide (IGO), and indium zinc oxide (IZO).

Figure 21A:
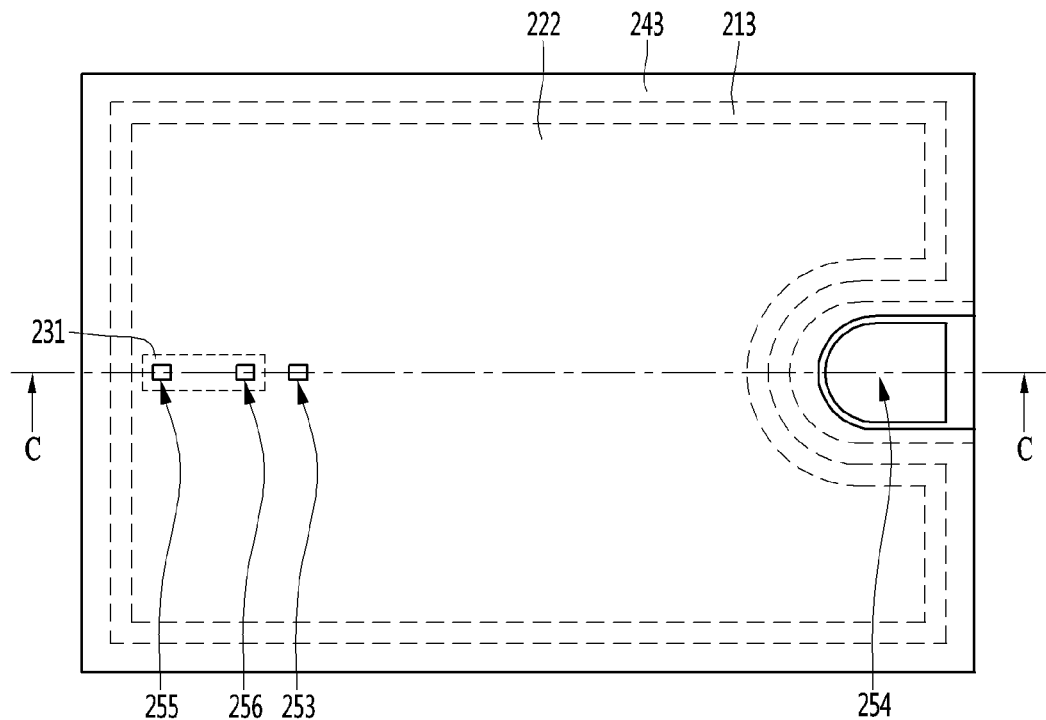
FIGS. 21a and 21b are respectively a plan view and a cross-sectional view illustrating an example in which a second insulating layer is formed by the semiconductor device manufacturing method according to an embodiment of the present invention.
Figure 21B:
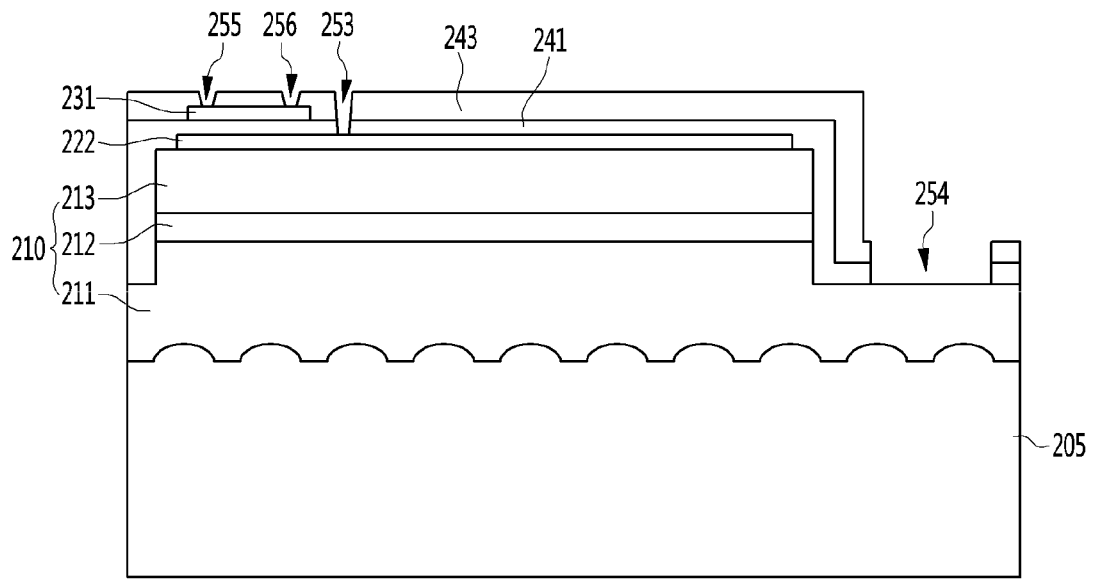

Next, as illustrated in FIGS. 21a and 21b, a second insulating layer 243 may be formed on the upper surface and the side surface of the light-emitting structure 210.

FIGS. 21a and 21b are respectively a plan view and a cross-sectional view illustrating an example in which the second insulating layer is formed by the semiconductor device manufacturing method according to an embodiment of the present invention. FIG. 21b is a cross-sectional view taken along line C-C of the plan view illustrated in FIG. 21a.

The second insulating layer 243 may include a third contact hole 253, a fourth contact hole 254, a fifth contact hole 255, and a sixth contact hole 256. A partial region of the second electrode 222 may be exposed by the third contact hole 253. A partial region of the first conductivity type semiconductor layer 211 may be exposed by the fourth contact hole 254. A first region of the semiconductor layer 231 may be exposed by the fifth contact hole 255. A second region of the semiconductor layer 231 may be exposed by the sixth contact hole 256. The second insulating layer 243 may be disposed on the second electrode 222. The second insulating layer 243 may be disposed on the semiconductor layer 231. The second insulating layer 243 may be disposed on the first insulating layer 241.

For example, the second insulating layer 243 may include an insulating material. The second insulating layer 243 may include oxide, nitride, or an organic material. For example, the second insulating layer 243 may include at least one selected from $SiO_2$, $SiN_x$, $Al_2O_3$, and the like.

Figure 22A:
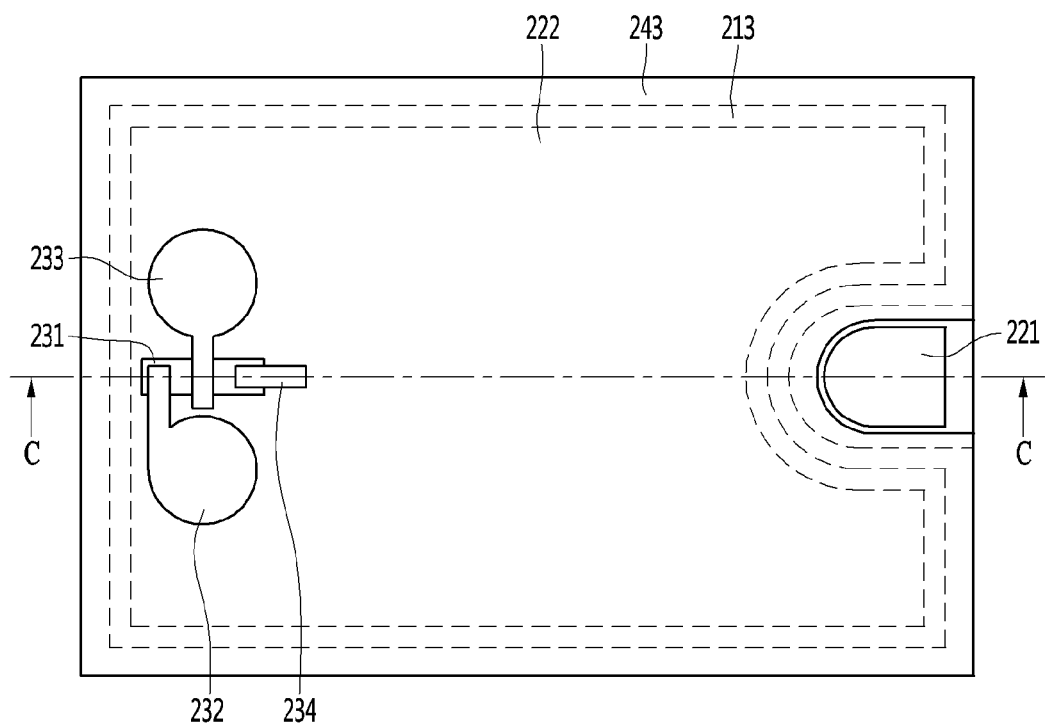
FIGS. 22a and 22b are respectively a plan view and a cross-sectional view illustrating an example in which a transistor is formed by the semiconductor device manufacturing method according to an embodiment of the present invention.
Figure 22B:
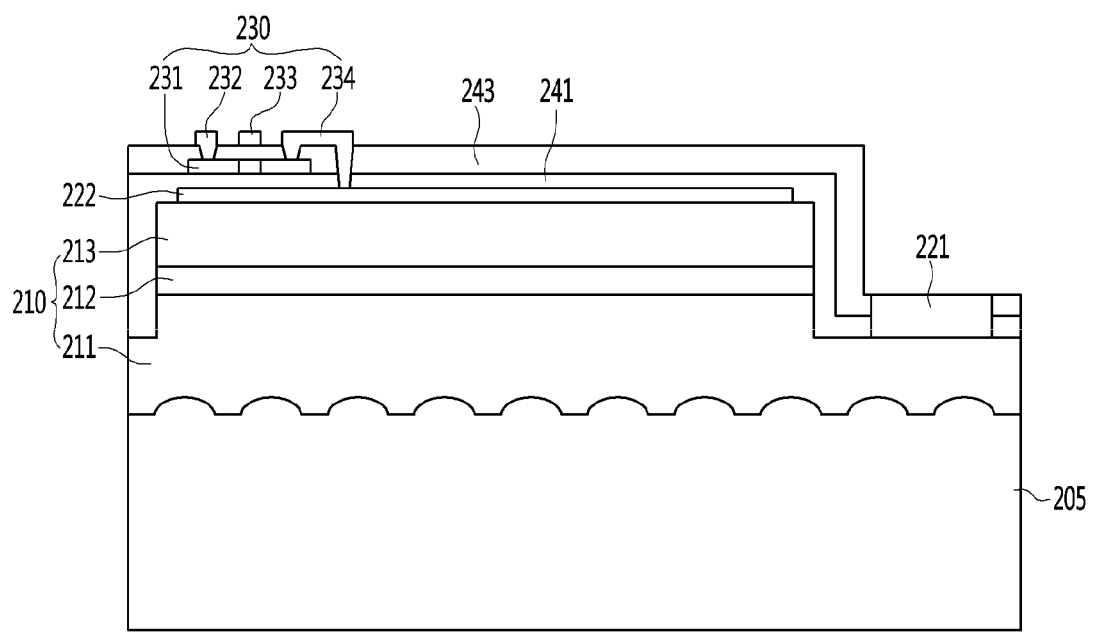

Next, as illustrated in FIGS. 22a and 22b, a transistor may be formed.

FIGS. 22a and 22b are respectively a plan view and a cross-sectional view illustrating an example in which the transistor is formed by the semiconductor device manufacturing method according to an embodiment of the present invention. FIG. 22b is a cross-sectional view taken along line C-C of the plan view illustrated in FIG. 22a.

First, a gate electrode 233 may be formed on the second insulating layer 243. The gate electrode 233 may be disposed on the semiconductor layer 231. For example, impurities may be added to the semiconductor layer 231 through an implant process by using the gate electrode 233 as a mask. Therefore, in the semiconductor layer 231, the first region to which the source electrode 232 is to be electrically connected and the second region to which the drain electrode 234 is to be electrically connected may be formed as high-concentration impurity regions.

Next, as illustrated in FIGS. 22a and 22b, a source electrode 232, a drain electrode 234, and a first electrode 221 may be formed on the second insulating layer 243. The source electrode 232 may be electrically connected to the first region of the semiconductor layer 231 through the fifth contact hole 255. The drain electrode 234 may be electrically connected to the second region of the semiconductor layer 231 through the sixth contact hole 256, and may be electrically connected to the second electrode 222 through the third contact hole 253. The second region of the semiconductor layer 231 may be electrically connected to the second electrode 222 through the drain electrode 234.

The source electrode 232 may be electrically connected to a first region of the semiconductor layer 231. The source electrode 232 may be disposed on the first region of the semiconductor layer 231. The drain electrode 234 may be electrically connected to a second region of the semiconductor layer 231. The drain electrode 234 may be disposed on the second region of the semiconductor layer 231.

The gate electrode 233 may be disposed between the first region and the second region of the semiconductor layer 231. The gate electrode 233 may be disposed above between the first region and the second region of the semiconductor layer 231. For example, the first region and the second region of the semiconductor layer 231 may be provided to include relatively higher concentration impurities than a third region of the semiconductor layer 231 disposed under the gate electrode 233. The gate electrode 233 may be disposed spaced apart from the semiconductor layer 231. The lower surface of the gate electrode 233 may be disposed spaced apart from the upper surface of the semiconductor layer 231. A second insulating layer 243 may be disposed between the gate electrode 233 and the semiconductor layer 231. For example, the gate electrode 233 and the semiconductor layer 231 may be disposed spaced apart by the thickness of the second insulating layer 243.

According to an embodiment, a current flow from the source electrode 232 to the drain electrode 234 may be controlled according to the magnitude of a voltage applied to the gate electrode 233. That is, when a voltage exceeding a threshold voltage of the transistor 230 is applied to the gate electrode 233, a current may flow from the source electrode 232 to the drain electrode 234.

Meanwhile, the semiconductor device according to an embodiment may include a first electrode 221 and a second electrode 222 as illustrated in FIGS. 22a and 22b. The first electrode 221 and the second electrode 222 may be electrically connected to the light-emitting structure 210. The first electrode 221 may be electrically connected to the first conductivity type semiconductor layer 211. For example, the first electrode 221 may be disposed on the first conductivity type semiconductor layer 211. The first electrode 221 may be disposed spaced apart from the side surface of the active layer 212. The second electrode 222 may be electrically connected to the second conductivity type semiconductor layer 213. For example, the second electrode 222 may be disposed on the second conductivity type semiconductor layer 213. The second electrode 222 may be disposed on the active layer 212. The light-emitting structure 210 may be driven by the voltage applied to the first electrode 221 and the second electrode 222. Light may be generated in the active layer 212 of the light-emitting structure 210 by the voltage applied between the first electrode 221 and the second electrode 222.

For example, the first electrode 221 may include a region that ohmic-contacts the first conductivity type semiconductor layer 211. The first electrode 221 may include a single layer or a multi-layer including at least one selected from Cr, Ni, Ti, Ge, Zn, Mg, Ca, Al, Ag, Rh, W, Pt, Au, AuGe, and AuGe/Ni/Au. For example, the source electrode 232, the gate electrode 233, and the drain electrode 234 may be formed of the same material as the first electrode 221. In addition, the source electrode 232, the gate electrode 233, and the drain electrode 234 may be formed of different materials as the first electrode 221.

Figure 23A:
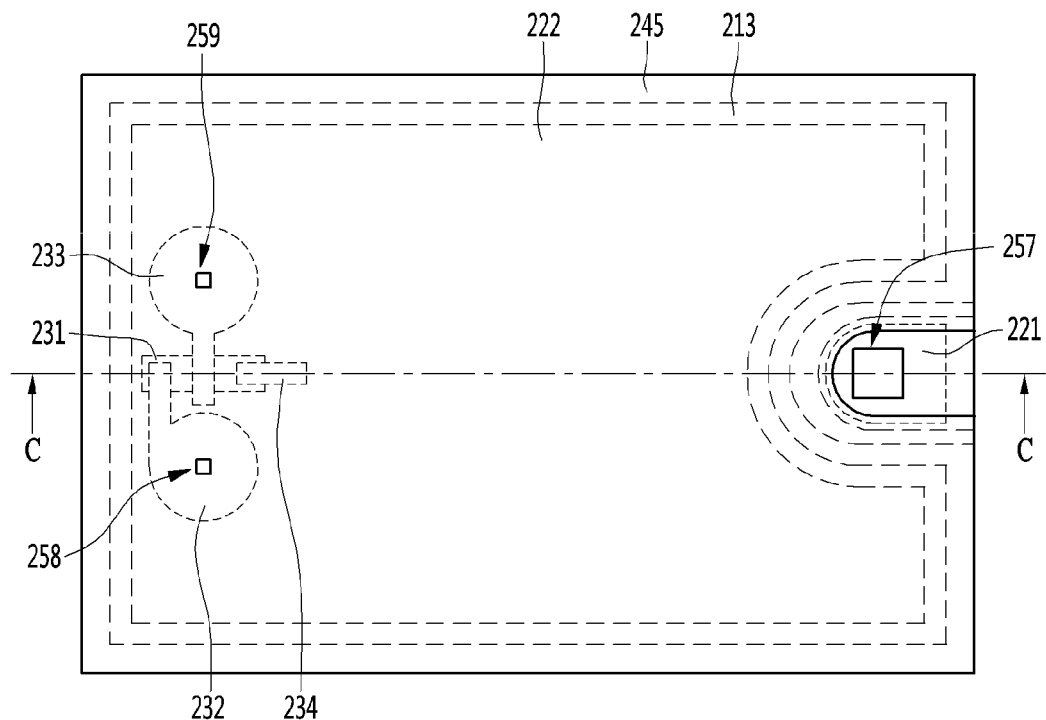
FIGS. 23a and 23b are respectively a plan view and a cross-sectional view illustrating an example in which a third insulating layer is formed by the semiconductor device manufacturing method according to an embodiment of the present invention.
Figure 23B:
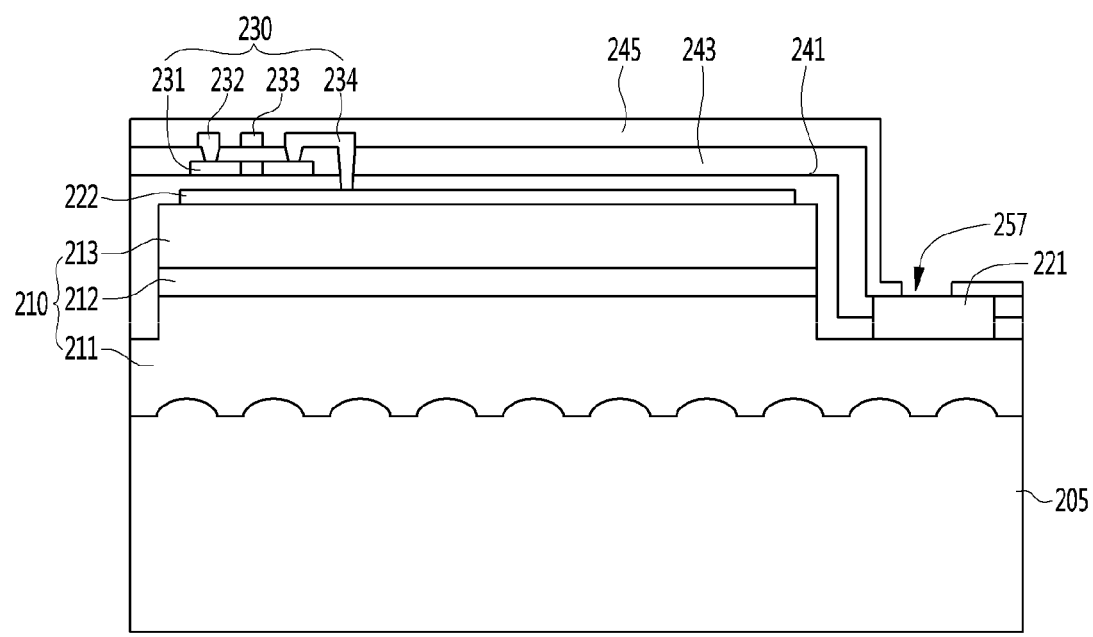

Next, as illustrated in FIGS. 23a and 23b, a third insulating layer 245 may be formed on the second insulating layer 243.

FIGS. 23a and 23b are respectively a plan view and a cross-sectional view illustrating an example in which the third insulating layer is formed by the semiconductor device manufacturing method according to an embodiment of the present invention. FIG. 23b is a cross-sectional view taken along line C-C of the plan view illustrated in FIG. 23a.

The third insulating layer 245 may be disposed on the light-emitting structure 210. The third insulating layer 245 may be disposed on the transistor 230. The third insulating layer 245 may include a seventh contact hole 257, an eighth contact hole 258, and a ninth third contact hole 259. A partial region of the first electrode 221 may be exposed by the seventh contact hole 257. A partial region of the source electrode 232 may be exposed by the eighth contact hole 258. A partial region of the gate electrode 233 may be exposed by the ninth contact hole 259.

For example, the third insulating layer 245 may include an insulating material. The third insulating layer 245 may include oxide, nitride, or an organic material. For example, the third insulating layer 245 may include at least one selected from $SiC_2$, $SiN_x$, $Al_2O_3$, and the like.

Figure 24A:
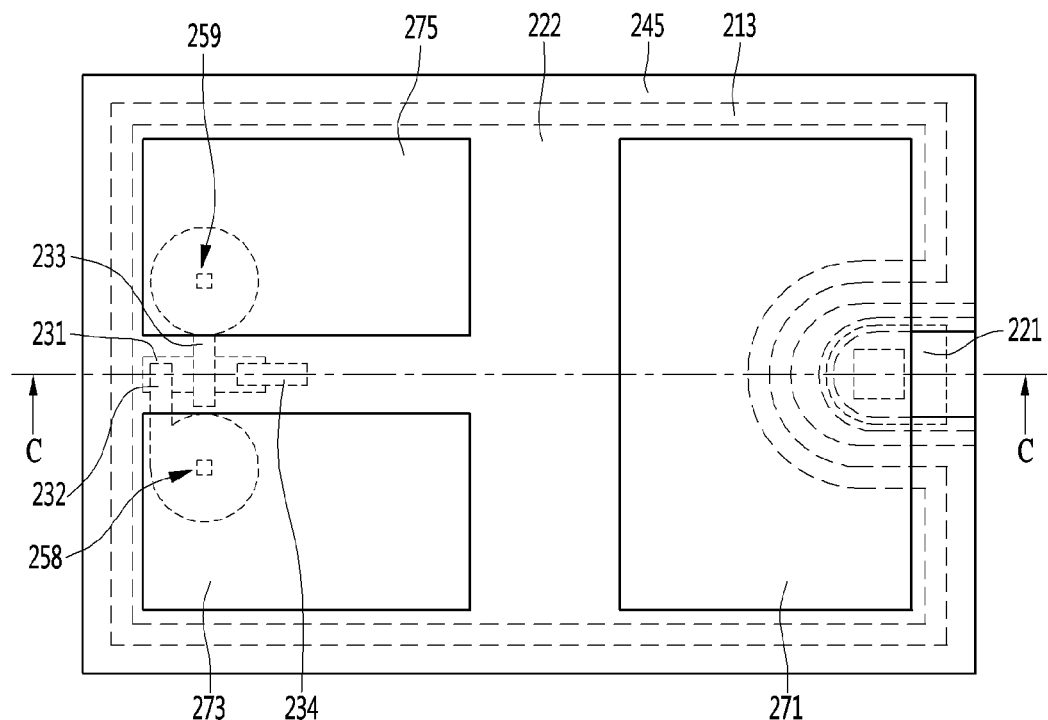
FIGS. 24a and 24b are respectively a plan view and a cross-sectional view illustrating an example in which a first bonding pad, a second bonding pad, and a third bonding pad are formed by the semiconductor device manufacturing method according to an embodiment of the present invention.
Figure 24B:
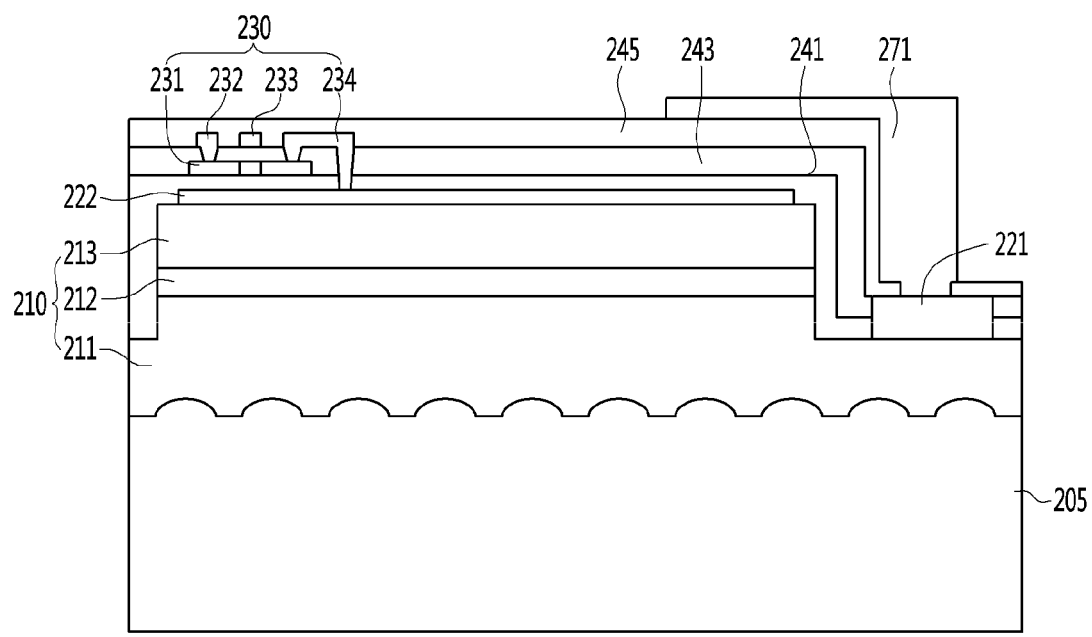

Next, as illustrated in FIGS. 24a and 24b a first bonding pad 271, a second bonding pad 273, and a third bonding pad 275 may be formed on the third insulating layer 245.

FIGS. 24a and 24b are respectively a plan view and a cross-sectional view illustrating an example in which the first bonding pad, the second bonding pad, and the third bonding pad are formed by the semiconductor device manufacturing method according to an embodiment of the present invention. FIG. 24b is a cross-sectional view taken along line C-C of the plan view illustrated in FIG. 24a.

The first bonding pad 271 may be electrically connected to the first electrode 221. For example, the first bonding pad 271 may contact the upper surface of the first electrode 221 through the seventh contact hole 257 provided in the third insulating film 245. The second bonding pad 273 may be electrically connected to the source electrode 232. For example, the second bonding pad 273 may contact the upper surface of the source electrode 232 through the eighth contact hole 258 provided in the third insulating film 245. The third bonding pad 275 may be electrically connected to the gate electrode 233. For example, the third bonding pad 275 may contact the upper surface of the gate electrode 233 through the ninth contact hole 259 provided in the third insulating film 245.

Meanwhile, the semiconductor device according to an embodiment may be supplied with power from the outside by, for example, a flip chip bonding method. The first bonding pad 271, the second bonding pad 273, and the third bonding pad 275 are illustrated in FIGS. 24a and 24b as being provided in an upper direction, but when the flip chip bonding method is applied, the upper and lower structure may be reversed such that the first bonding pad 271, the second bonding pad 273, and the third bonding pad 275 are disposed in a lower direction. Therefore, the substrate 205 may be disposed at the upper portion. For example, the first bonding pad 271, the second bonding pad 273, and the third bonding pad 275 may include a single layer or a multi-layer including at least one selected from Cr, Ni, Ti, Ge, Zn, Mg, Ca, Al, Ag, Rh, W, Pt, Au, AuGe, AuGe/Ni/Au, In, InAg, and AuIn.

When the semiconductor device according to an embodiment is electrically connected to the circuit substrate by the flip chip bonding method, power may be supplied to the first electrode 221 through the first bonding pad 271. In addition, power may be supplied to the source electrode 232 through the second bonding pad 273. In addition, power may be supplied to the gate electrode 233 through the third bonding pad 275. Therefore, when a voltage higher than a threshold voltage of the transistor 230 is applied through the third bonding pad 275, a current flows from the source electrode 232 to the drain electrode 234. Power may be supplied to the second electrode 222 through the drain electrode 234. In addition, light may be generated in the light-emitting structure 210 by the voltage applied between the first electrode 221 and the second electrode 222.

The above-described semiconductor device manufacturing method according to the embodiment is merely an example, and it can be understood by a person skilled in the art that various modifications and applications can be made thereto.

Figure 25A:
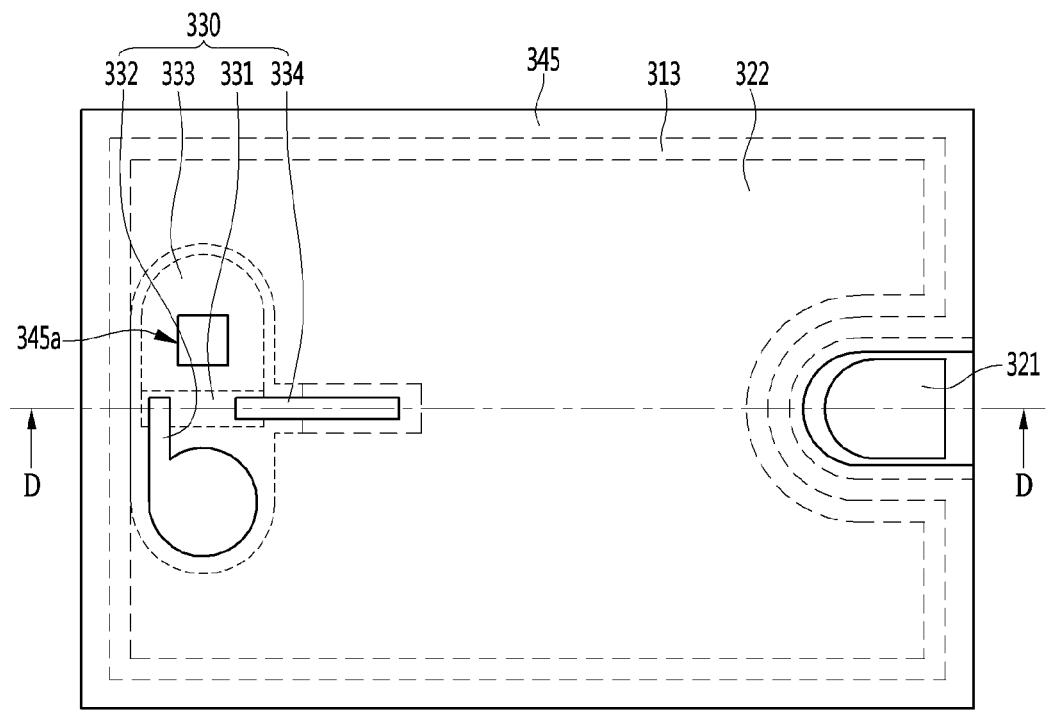
FIGS. 25a and 25b are respectively a plan view and a cross-sectional view illustrating another example of a semiconductor device according to an embodiment of the present invention.
Figure 25B:
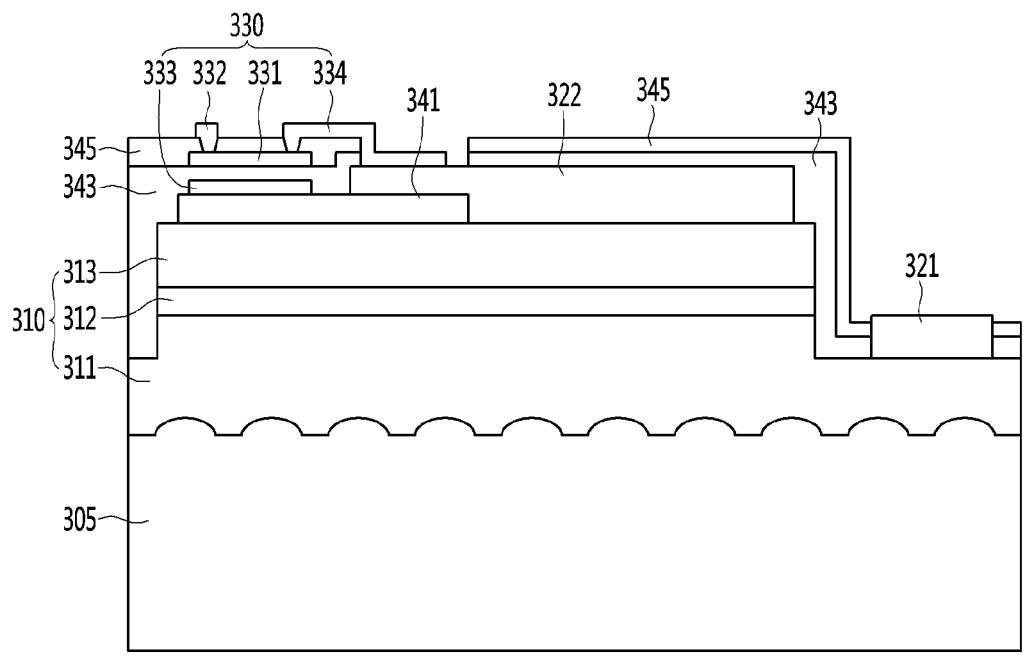

Meanwhile, FIGS. 25a and 25b are views illustrating another example of a semiconductor device according to an embodiment of the present invention. In describing the semiconductor device according to the embodiment, the description redundant to the matters described above will be omitted.

FIGS. 25a and 25b are views illustrating another example of a semiconductor device according to an embodiment of the present invention. FIG. 25b is a cross-sectional view taken along line D-D of the plan view illustrated in FIG. 25a.

A semiconductor device according to an embodiment may include a light-emitting structure 310 and a transistor 330 as illustrated in FIGS. 25a and 25b. For example, the transistor 330 may be disposed on the light-emitting structure 310. The transistor 330 may be electrically connected to the light-emitting structure 310. The semiconductor device according to the embodiment may control the driving of the transistor 330 and adjust the light emission of the light-emitting structure 310. The transistor 330 may be provided as, for example, a bottom gate transistor structure.

The light-emitting structure 310 may include a first conductivity type semiconductor layer 311, an active layer 312, and a second conductivity type semiconductor layer 313. The active layer 312 may be disposed between the first conductivity type semiconductor layer 311 and the second conductivity type semiconductor layer 313. For example, the active layer 312 may be disposed on the first conductivity type semiconductor layer 311, and the second conductivity type semiconductor layer 313 may be disposed on the active layer 312.

For example, the first conductivity type semiconductor layer 311 may be formed as an n-type semiconductor layer in which an n-type dopant is added as a first conductive dopant, and the second conductivity type semiconductor layer 313 may be formed as a p-type semiconductor layer in which a p-type dopant is added as a second conductive dopant. In addition, on the contrary, the first conductivity type semiconductor layer 311 may be formed as a p-type semiconductor layer, and the second conductivity type semiconductor layer 313 may be formed as an n-type semiconductor layer. Hereinafter, a case where the first conductivity type semiconductor layer 311 is provided as an n-type semiconductor layer and the second conductivity type semiconductor layer 313 is provided as a p-type semiconductor layer will be described.

In the light-emitting structure 310, a wavelength band of generated light may be changed according to a material constituting the active layer 312. The selection of materials constituting the first conductivity type semiconductor layer 311 and the second conductivity type semiconductor layer 313 may be changed according to the material constituting the active layer 312. The light-emitting structure 310 may be implemented by compound semiconductor. The light-emitting structure 310 may be implemented by, for example, a group II-VI compound semiconductor or a group III-V compound semiconductor. For example, the light-emitting structure 310 may be implemented by including at least two elements selected from the group consisting of aluminum (Al), gallium (Ga), indium (In), Phosphorus (P), arsenic (As), and nitrogen (N).

The active layer 312 is a layer in which electrons (or holes) injected through the first conductivity type semiconductor layer 311 and holes (or electrons) injected through the second conductivity type semiconductor layer 313 recombine with each other and light is emitted by a band gap difference between energy bands according to a forming material of the active layer 312. The active layer 312 may be formed to have one of a single well structure, a multiple well structure, a quantum dot structure, or a quantum wire structure. The active layer 312 may be implemented by compound semiconductor. The active layer 312 may be implemented by, for example, a group II-VI compound semiconductor or a group III-V compound semiconductor.

When light of a blue wavelength band or a green wavelength band is generated in the active layer 312, the active layer 312 may be implemented by, for example, a semiconductor material having a formula of $In_xAl_yGa_{1-x-y}N$ ($0 \le x \le 1$, $0 \le y \le 1$, $0 \le x+y \le 1$). When the active layer 312 is implemented by a multi well structure, the active layer 312 may be implemented by stacking a plurality of well layers and a plurality of barrier layers. In addition, when light of a red wavelength band is generated in the active layer 312, the active layer 312 may be implemented by, for example, a semiconductor material having a formula of $(Al_xGa_{1-x})_yIn_{1-y}P$ (0≤x≤1, 0≤y≤1). The active layer 312 may be selected from, for example, AlGaInP, AlInP, GaP, and GaInP.

The first conductivity type semiconductor layer 311 may include, for example, an n-type semiconductor layer. The first conductivity type semiconductor layer 311 may be implemented by compound semiconductor. The first conductivity type semiconductor layer 311 may be implemented by, for example, a group II-VI compound semiconductor or a group III-V compound semiconductor. For example, when light of a blue wavelength band or a green wavelength band is generated in the active layer 312, the first conductivity type semiconductor layer 311 may be implemented by, for example, a semiconductor material having a formula of $In_xAl_yGa_{1-x-y}N$ (0≤x≤1, 0≤y≤1, 0≤x+y≤1). In addition, when light of a red wavelength band is generated in the active layer 312, the first conductivity type semiconductor layer 311 may be implemented by, for example, a semiconductor material having a formula of $(Al_xGa_{1-x})_yIn_{1-y}P$ (0≤x≤1, 0≤y≤1). In the first conductivity type semiconductor layer 311, y may have a value of 0.5 and x may have a value of 0.5 to 0.8 in the formula. The first conductivity type semiconductor layer 311 may be selected from the group consisting of GaN, AlN, AlGaN, InGaN, InN, InAlGaN, AlInN, AlGaAs, GaP, GaAs, GaAsP, AlGaInP, AlInP, and GaInP, and an n-type dopant such as Si, Ge, Sn, Se, or Te may be doped.

The second conductivity type semiconductor layer 313 may be implemented by compound semiconductor. The second conductivity type semiconductor layer 313 may be implemented by, for example, a group II-VI compound semiconductor or a group III-V compound semiconductor. For example, when light of a blue wavelength band or a green wavelength band is generated in the active layer 312, the second conductivity type semiconductor layer 313 may be implemented by, for example, a semiconductor material having a formula of $In_xAl_yGa_{1-x-y}N$ (0≤x≤1, 0≤y≤1, 0≤x+y≤1). In addition, when light of a red wavelength band is generated in the active layer 312, the second conductivity type semiconductor layer 313 may be implemented by, for example, a semiconductor material having a formula of $(Al_xGa_{1-x})_yIn_{1-y}P$ (0≤x≤1, 0≤y≤1). The second conductivity type semiconductor layer 313 may be selected from the group consisting of GaN, AlN, AlGaN, InGaN, InN, InAlGaN, AlInN, AlGaAs, GaP, GaAs, GaAsP, AlGaInP, AlInP, and GaInP, and a p-type dopant such as Mg, Zn, Ca, Sr, or Ba may be doped.

The transistor 330 may include a semiconductor layer 331, a source electrode 332, a gate electrode 333, and a drain electrode 334. The transistor 330 may be disposed on the light-emitting structure 310. The transistor 330 may be disposed on the second conductivity type semiconductor layer 313. The area of the transistor 330 may be smaller than the area of the second conductivity type semiconductor layer 313 when viewed from above the semiconductor device. The transistor 330 may be disposed on the active layer 312. The area of the transistor 330 may be smaller than the area of the active layer 312 when viewed from above the semiconductor device.

The semiconductor layer 331 may be formed of, for example, a material different from the material forming the light-emitting structure 310. For example, the semiconductor layer 331 may include a material selected from the group consisting of amorphous silicon, polycrystalline silicon, single crystal silicon, and oxide semiconductor. The material constituting the semiconductor layer 331 may be selected from materials that can be formed at a lower temperature than a forming temperature of the light-emitting structure 310. Therefore, even when the semiconductor layer 331 is formed after the light-emitting structure 310 is formed, it does not influence the physical properties of the light-emitting structure 310, and it is possible to prevent the light extraction efficiency of the light-emitting structure 310 from being reduced. Examples of the oxide semiconductor may be selected from the group consisting of indium gallium zinc oxide (IGZO), indium gallium oxide (IGO), and indium zinc oxide (IZO).

The source electrode 332 may be electrically connected to a first region of the semiconductor layer 331. The source electrode 332 may be disposed on the first region of the semiconductor layer 331. The drain electrode 334 may be electrically connected to a second region of the semiconductor layer 331. The drain electrode 334 may be disposed on the second region of the semiconductor layer 331.

The gate electrode 333 may be disposed between the first region and the second region of the semiconductor layer 331. The gate electrode 333 may be disposed below between the first region and the second region of the semiconductor layer 331. For example, the first region and the second region of the semiconductor layer 331 may be provided to include relatively higher concentration impurities than a third region of the semiconductor layer 331 disposed above the gate electrode 333. The gate electrode 333 may be disposed spaced apart from the semiconductor layer 331. The upper surface of the gate electrode 333 may be disposed spaced apart from the lower surface of the semiconductor layer 331. A second insulating layer 343 may be disposed between the gate electrode 333 and the semiconductor layer 331. For example, the gate electrode 333 and the semiconductor layer 331 may be disposed spaced apart by the thickness of the second insulating layer 343.

According to an embodiment, a current flow from the source electrode 332 to the drain electrode 334 may be controlled according to the magnitude of a voltage applied to the gate electrode 333. That is, when a voltage exceeding a threshold voltage of the transistor 330 is applied to the gate electrode 333, a current may flow from the source electrode 332 to the drain electrode 334.

Meanwhile, the semiconductor device according to an embodiment may include a first electrode 321 and a second electrode 322 as illustrated in FIGS. 25a and 25b. The first electrode 321 and the second electrode 322 may be electrically connected to the light-emitting structure 310. The first electrode 321 may be electrically connected to the first conductivity type semiconductor layer 311. For example, the first electrode 321 may be disposed on the first conductivity type semiconductor layer 311. The first electrode 321 may be disposed spaced apart from the side surface of the active layer 312. The second electrode 322 may be electrically connected to the second conductivity type semiconductor layer 313. For example, the second electrode 322 may be disposed on the second conductivity type semiconductor layer 313. The second electrode 322 may be disposed on the active layer 312. The light-emitting structure 310 may be driven by the voltage applied to the first electrode 321 and the second electrode 322. Light may be generated in the active layer 312 of the light-emitting structure 310 by the voltage applied between the first electrode 321 and the second electrode 322.

For example, the first electrode 321 may include a region that ohmic-contacts the first conductivity type semiconductor layer 311. The first electrode 321 may include a single layer or a multi-layer including at least one selected from Cr, Ni, Ti, Ge, Zn, Mg, Ca, Al, Ag, Rh, W, Pt, Au, AuGe, and AuGe/Ni/Au.

For example, the second electrode 322 may include a material that ohmic-contacts the second conductivity type semiconductor layer 313. For example, the second electrode 322 may include a transparent conductive oxide. For example, the second electrode 322 may include at least one material selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

The semiconductor device according to an embodiment may include a first insulating layer 341 as illustrated in FIGS. 25a and 25b. The first insulating layer 341 may be disposed on the light-emitting structure 310. The first insulating layer 341 may be disposed on the second conductivity type semiconductor layer 313. The first insulating layer 341 may be disposed on the active layer 312. The first insulating layer 341 may be disposed under the transistor 330. The first insulating layer 341 may be disposed between the light-emitting structure 310 and the transistor 330. The first insulating layer 341 may be disposed between the second conductivity type semiconductor layer 313 and the transistor 330. The width of the first insulating layer 341 may be smaller than the width of the second conductivity type semiconductor layer 313.

According to an embodiment, the gate electrode 333 may be disposed on the first insulating layer 341. In addition, a second insulating layer 343 may be disposed on the gate electrode 333 and the second electrode 322. According to an embodiment, the semiconductor layer 331 may be disposed on the second insulating layer 343. A third insulating layer 345 may be disposed on the second insulating layer 331 and the second insulating layer 343.

According to an embodiment, the second electrode 322 may be electrically connected to the drain electrode 334. The first region of the drain electrode 334 may be electrically connected to the semiconductor layer 331. The first region of the drain electrode 334 may be disposed on the semiconductor layer 331. The second region of the drain electrode 334 may be electrically connected to the second electrode 322. The second region of the drain electrode 334 may be disposed on the second electrode 322. Therefore, a current flow from the source electrode 332 to the drain electrode 334 may be controlled according to power applied to the gate electrode 333, and power may be applied to the second electrode 322 through the drain electrode 334. According to an embodiment, power applied between the first electrode 321 and the second electrode 322 may be controlled by the control of the gate electrode 333, and the light emission in the light-emitting structure 310 may be controlled.

The first insulating layer 341 may reflect light provided from the light-emitting structure 310. The first insulating layer 341 may reflect light provided from the active layer 312. The first insulating layer 341 may receive light generated in the active layer 312 and reflect the light downward. Therefore, it is possible to prevent the light generated in the active layer 312 from being incident on the transistor 330 and disappearing and to improve the light extraction efficiency of the semiconductor device.

For example, the first insulating layer 341 may include an insulating material. The first insulating layer 341 may include oxide or nitride. The first insulating layer 341 may include silicon-based oxide or silicon-based nitride. The first insulating layer 341 may include metal oxide. For example, the first insulating layer 341 may include at least one selected from $SiO_2$, $SiN_x$, $Al_2O_3$, and the like. The first insulating layer 341 may include metal oxide including $TiO_2$.

The first insulating layer 341 may be provided as a plurality of layers having different refractive indices. For example, the first insulating layer 341 may be formed by stacking a first layer having a first refractive index and a second layer having a second refractive index as one pair, and may be formed by sequentially stacking a plurality of pairs. Therefore, the first insulating layer 341 may be provided as a distributed Bragg reflector (DBR) layer and reflects light incident from the light-emitting structure 310, thereby preventing light generated in the light-emitting structure 310 from disappearing at the transistor 330. As one example, the first insulating layer 341 may be provided by stacking a plurality of pairs each including a $SiO_2$ layer and a $TiO_2$ layer as one pair.

The semiconductor device according to an embodiment may include a second insulating layer 343 and a third insulating layer 345 as illustrated in FIGS. 25a and 25b. The second insulating layer 343 may be disposed on the top surface and the side surface of the light-emitting structure 310. The second insulating layer 343 and the third insulating layer 345 may be disposed on the second electrode 322. The third insulating layer 345 may be disposed on the semiconductor layer 331. The gate electrode 333 may be disposed under the second insulating layer 343. For example, the source electrode 332 may be disposed on the third insulating layer 345, and one end of the source electrode 332 may pass through the third insulating layer 345 and be electrically connected to the semiconductor layer 331. In addition, the drain electrode 334 may be disposed on the third insulating layer 345, and one end of the drain electrode 334 may pass through the third insulating layer 345 and be electrically connected to the semiconductor layer 331.

External power is electrically connected to the gate electrode 333 through the second gate contact hole 345a. Meanwhile, according to an embodiment, in forming the source electrode 332 and the drain electrode 334, a gate pad electrically connected to the gate electrode 333 may be provided on the third insulating film 345 through the second gate contact hole 345a.

For example, the second insulating layer 343 and the third insulating layer 345 may include an insulating material. The second insulating layer 343 and the third insulating layer 345 may include oxide, nitride, or an organic material. The second insulating layer 343 and the third insulating layer 345 may include at least one selected from $SiO_2$, $SiN_x$, $Al_2O_3$, and the like. The second insulating layer 343 and the third insulating layer 345 may be provided by the same material. In addition, the second insulating layer 343 and the third insulating layer 345 may be provided by different materials.

The semiconductor device according to an embodiment may include a substrate 305 as illustrated in FIGS. 25a and 25b. For example, the substrate 305 may be a growth substrate on which the light-emitting structure 310 can be grown. For example, an uneven structure may be provided on the upper surface of the substrate 305. The uneven structure provided in the substrate 305 may reduce defects during the growth of the light-emitting structure 310, may improve crystal quality, and may reflect light emitted from the active layer 312 so as to improve the luminescent efficiency. For example, the substrate 305 may include at least one selected from a sapphire ($Al_2O_3$) substrate, SiC, GaAs, GaN, ZnO, Si, GaP, InP, and Ge.

As described above, the semiconductor device according to the embodiment may control the light emission of the light-emitting structure 310 through the control of the transistor 330. According to an embodiment, since whether to cause the light-emitting structure 310 to emit light by using the control of the transistor 330 can be controlled, it is possible to more accurately control whether to cause the light-emitting structure 310 to emit light, thereby more easily implementing the control of the light emission time and the light emission interval.

In addition, the transistor 330 is disposed on the light-emitting structure 310, thereby maximizing the size of the active layer 312. If the transistor 330 is disposed at or near the side surface of the active layer 312, the size of the active layer 312 may be reduced as much as the size of the transistor 330. However, according to an embodiment, the transistor 330 is disposed on the active layer 312, thereby preventing the area of the active layer 312 from being reduced. Since an amount of light generated in the light-emitting structure 310 is affected by the area of the active layer 312, an amount of light generated in the active layer 312 increases, thereby improving the light extraction efficiency and the luminance as a whole.

Meanwhile, the case of the semiconductor device in which one light-emitting structure 310 and one transistor 330 are provided is illustrated in FIGS. 25a and 25b, but the semiconductor device according to an embodiment may include a plurality of light-emitting structures and a plurality of transistors. When the plurality of transistors are provided, the plurality of transistors may be connected in parallel or in series according to a circuit design. Therefore, the degree of freedom of the circuit design can be increased, and the degree of light emitted in the plurality of light-emitting structures can be effectively controlled according to necessity. In addition, the semiconductor device according to an embodiment may include a plurality of light-emitting structures, and the plurality of light-emitting structures may be implemented to emit light of different wavelength bands. Therefore, the semiconductor device according to an embodiment may selectively or independently control the light emission in the plurality of light-emitting structures having different wavelength bands through the control of the plurality of transistors.

The semiconductor device described above may be implemented to emit light of various wavelength bands according to the selection of the active layer. For example, it is possible to implement a display panel or a display apparatus in which one color pixel is constituted by using the blue semiconductor device, the green semiconductor device, and the red semiconductor device described above. The semiconductor device according to an embodiment may be applied to various fields requiring a light source. The semiconductor device according to an embodiment may be applied to, for example, an electronic sign board, a large-size display apparatus, and a signage, thereby implementing a high-resolution light source. In addition, the semiconductor device according to an embodiment may be applied to a communication device. For example, the semiconductor device according to an embodiment may be applied to a visible light communication (VLC), light WiFi (LiFi), or the like which transmits data by using light.

An example of a method for manufacturing the semiconductor device illustrated in FIGS. 25a and 25b will be described with reference to the accompanying drawings. In describing the semiconductor device manufacturing method according to the embodiment with reference to the accompanying drawings, the description redundant to the matters described above will be omitted.

Figure 26A:
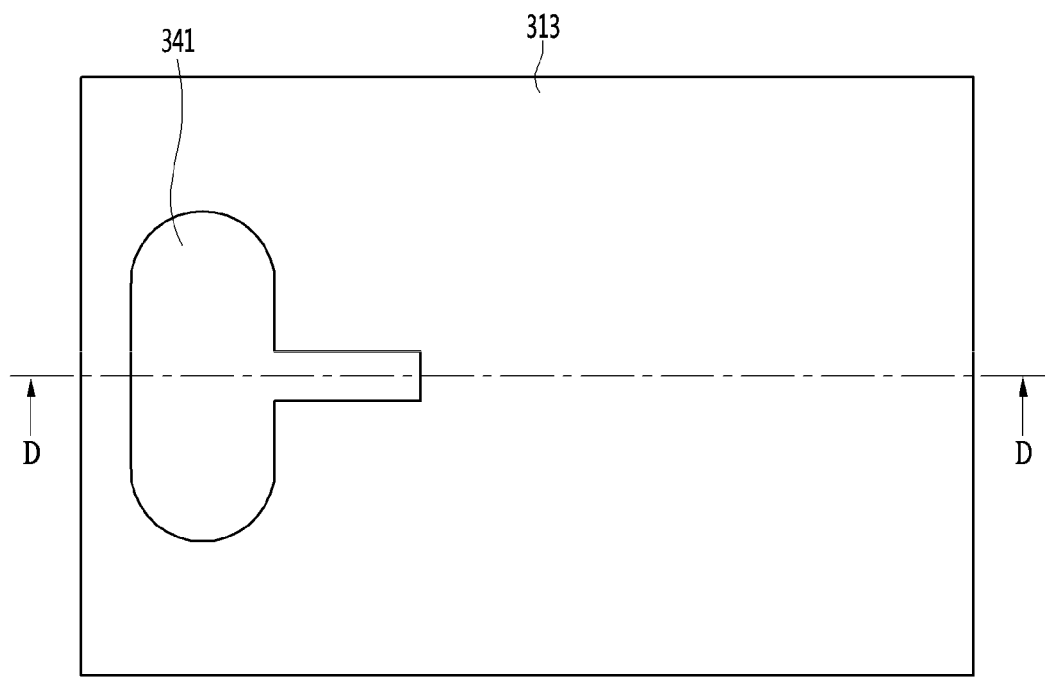
FIGS. 26a and 26b are respectively a plan view and a cross-sectional view illustrating an example in which a light-emitting structure and a first insulating layer are formed by a semiconductor device manufacturing method according to an embodiment of the present invention.
Figure 26B:
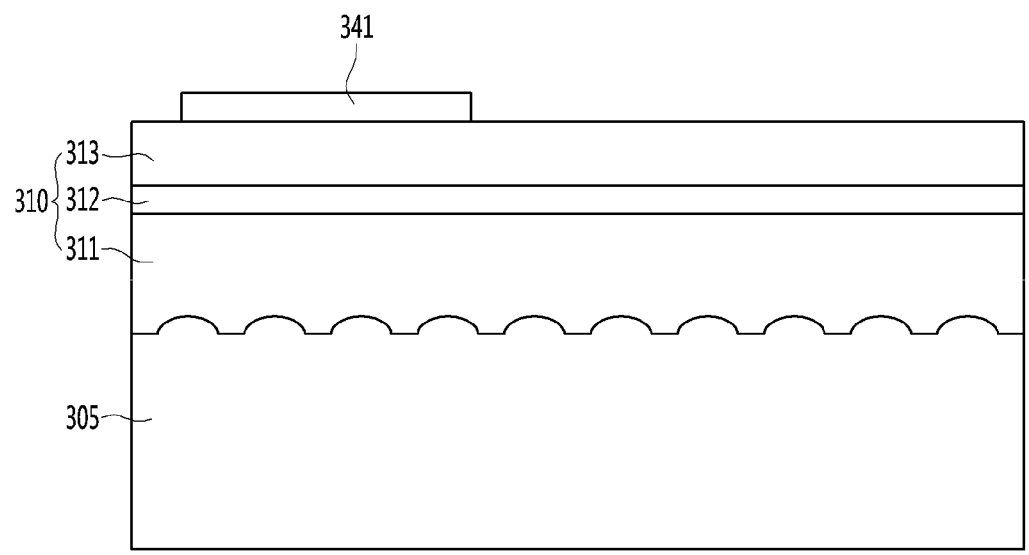

FIGS. 26a and 26b are respectively a plan view and a cross-sectional view illustrating an example in which a light-emitting structure and a first insulating layer are formed by a semiconductor device manufacturing method according to an embodiment of the present invention. FIG. 26b is a cross-sectional view taken along line D-D of the plan view illustrated in FIG. 26a.

According to the semiconductor device manufacturing method according to an embodiment, a light-emitting structure 310 may be formed on a substrate 305 as illustrated in FIGS. 26a and 26b. For example, the light-emitting structure 310 may be grown on the substrate 305. The light-emitting structure 310 may include a first conductivity type semiconductor layer 311, an active layer 312, and a second conductivity type semiconductor layer 313.

For example, the first conductivity type semiconductor layer 311 may be formed as an n-type semiconductor layer in which an n-type dopant is added as a first conductive dopant, and the second conductivity type semiconductor layer 313 may be formed as a p-type semiconductor layer in which a p-type dopant is added as a second conductive dopant. In addition, on the contrary, the first conductivity type semiconductor layer 311 may be formed as a p-type semiconductor layer, and the second conductivity type semiconductor layer 313 may be formed as an n-type semiconductor layer. Hereinafter, a case where the first conductivity type semiconductor layer 311 is provided as an n-type semiconductor layer and the second conductivity type semiconductor layer 313 is provided as a p-type semiconductor layer will be described.

In the light-emitting structure 310, a wavelength band of generated light may be changed according to a material constituting the active layer 312. The selection of materials constituting the first conductivity type semiconductor layer 311 and the second conductivity type semiconductor layer 313 may be changed according to the material constituting the active layer 312. The light-emitting structure 310 may be implemented by compound semiconductor. The light-emitting structure 310 may be implemented by, for example, a group II-VI compound semiconductor or a group III-V compound semiconductor. For example, the light-emitting structure 310 may be implemented by including at least two elements selected from the group consisting of aluminum (Al), gallium (Ga), indium (In), Phosphorus (P), arsenic (As), and nitrogen (N).

The active layer 312 is a layer in which electrons (or holes) injected through the first conductivity type semiconductor layer 311 and holes (or electrons) injected through the second conductivity type semiconductor layer 313 recombine with each other and light is emitted by a band gap difference between energy bands according to a forming material of the active layer 312. The active layer 312 may be formed to have one of a single well structure, a multiple well structure, a quantum dot structure, or a quantum wire structure. The active layer 312 may be implemented by compound semiconductor. The active layer 312 may be implemented by, for example, a group II-VI compound semiconductor or a group III-V compound semiconductor.

When light of a blue wavelength band or a green wavelength band is generated in the active layer 312, the active layer 312 may be implemented by, for example, a semiconductor material having a formula of $In_xAl_yGa_{1-x-y}N$ ($0 \leq x \leq 1$, $0 \leq y \leq 1$, $0 \leq x+y \leq 1$). When the active layer 312 is implemented by a multi well structure, the active layer 312 may be implemented by stacking a plurality of well layers and a plurality of barrier layers. In addition, when light of a red wavelength band is generated in the active layer 312, the active layer 312 may be implemented by, for example, a semiconductor material having a formula of $(Al_xGa_{1-x})_yIn_{1-y}P$ ($0 \le x \le 1$, $0 \le y \le 1$). The active layer 312 may be selected from, for example, AlGaInP, AlInP, GaP, and GaInP.

The first conductivity type semiconductor layer 311 may include, for example, an n-type semiconductor layer. The first conductivity type semiconductor layer 311 may be implemented by compound semiconductor. The first conductivity type semiconductor layer 311 may be implemented by, for example, a group II-VI compound semiconductor or a group III-V compound semiconductor. For example, when light of a blue wavelength band or a green wavelength band is generated in the active layer 312, the first conductivity type semiconductor layer 311 may be implemented by, for example, a semiconductor material having a formula of $In_xAl_yGa_{1-x-y}N$ ($0 \le x \le 1$, $0 \le y \le 1$, $0 \le x+y \le 1$). In addition, when light of a red wavelength band is generated in the active layer 312, the first conductivity type semiconductor layer 311 may be implemented by, for example, a semiconductor material having a formula of $(Al_xGa_{1-x})_yIn_{1-y}P$ ($0 \le x \le 1$, $0 \le y \le 1$). In the first conductivity type semiconductor layer 311, y may have a value of 0.5 and x may have a value of 0.5 to 0.8 in the formula. The first conductivity type semiconductor layer 311 may be selected from the group consisting of GaN, AlN, AlGaN, InGaN, InN, InAlGaN, AlInN, AlGaAs, GaP, GaAs, GaAsP, AlGaInP, AlInP, and GaInP, and an n-type dopant such as Si, Ge, Sn, Se, or Te may be doped.

The second conductivity type semiconductor layer 313 may be implemented by compound semiconductor. The second conductivity type semiconductor layer 313 may be implemented by, for example, a group II-VI compound semiconductor or a group III-V compound semiconductor. For example, when light of a blue wavelength band or a green wavelength band is generated in the active layer 312, the second conductivity type semiconductor layer 313 may be implemented by, for example, a semiconductor material having a formula of $In_xAl_yGa_{1-x-y}N$ ($0 \le x \le 1$, $0 \le y \le 1$, $0 \le x+y \le 1$). In addition, when light of a red wavelength band is generated in the active layer 312, the second conductivity type semiconductor layer 313 may be implemented by, for example, a semiconductor material having a formula of $(Al_xGa_{1-x})_yIn_{1-y}P$ ($0 \le x \le 1$, $0 \le y \le 1$). The second conductivity type semiconductor layer 313 may be selected from the group consisting of GaN, AlN, AlGaN, InGaN, InN, InAlGaN, AlInN, AlGaAs, GaP, GaAs, GaAsP, AlGaInP, AlInP, and GaInP, and a p-type dopant such as Mg, Zn, Ca, Sr, or Ba may be doped.

For example, the substrate 305 may be a growth substrate on which the light-emitting structure 310 can be grown. For example, an uneven structure may be provided on the upper surface of the substrate 305. The uneven structure provided in the substrate 305 may reduce defects during the growth of the light-emitting structure 310, may improve crystal quality, and may reflect light emitted from the active layer 312 so as to improve the luminescent efficiency. For example, the substrate 305 may include at least one selected from a sapphire ($Al_2O_3$) substrate, SiC, GaAs, GaN, ZnO, Si, GaP, InP, and Ge.

A first insulating layer 341 may be formed on the light-emitting structure 310. The first insulating layer 341 may be disposed on the second conductivity type semiconductor layer 313. For example, the first insulating layer 341 may be disposed on a portion of the upper portion of the second conductivity type semiconductor layer 313. The first insulating layer 341 may include an insulating material. For example, the first insulating layer 341 may include oxide or nitride. The first insulating layer 341 may include silicon-based oxide or silicon-based nitride. The first insulating layer 341 may include metal oxide. For example, the first insulating layer 341 may include at least one selected from $SiO_2$, $SiN_x$, $Al_2O_3$, and the like. The first insulating layer 341 may include metal oxide including $TiO_2$.

The first insulating layer 341 may be provided as a plurality of layers having different refractive indices. For example, the first insulating layer 341 may be formed by stacking a first layer having a first refractive index and a second layer having a second refractive index as one pair, and may be formed by sequentially stacking a plurality of pairs. Therefore, the first insulating layer 341 may be provided as a distributed Bragg reflector (DBR) layer and reflects light incident from the light-emitting structure 310. As one example, the first insulating layer 341 may be provided by stacking a plurality of pairs each including a $SiO_2$ layer and a $TiO_2$ layer as one pair.

Figure 27A:
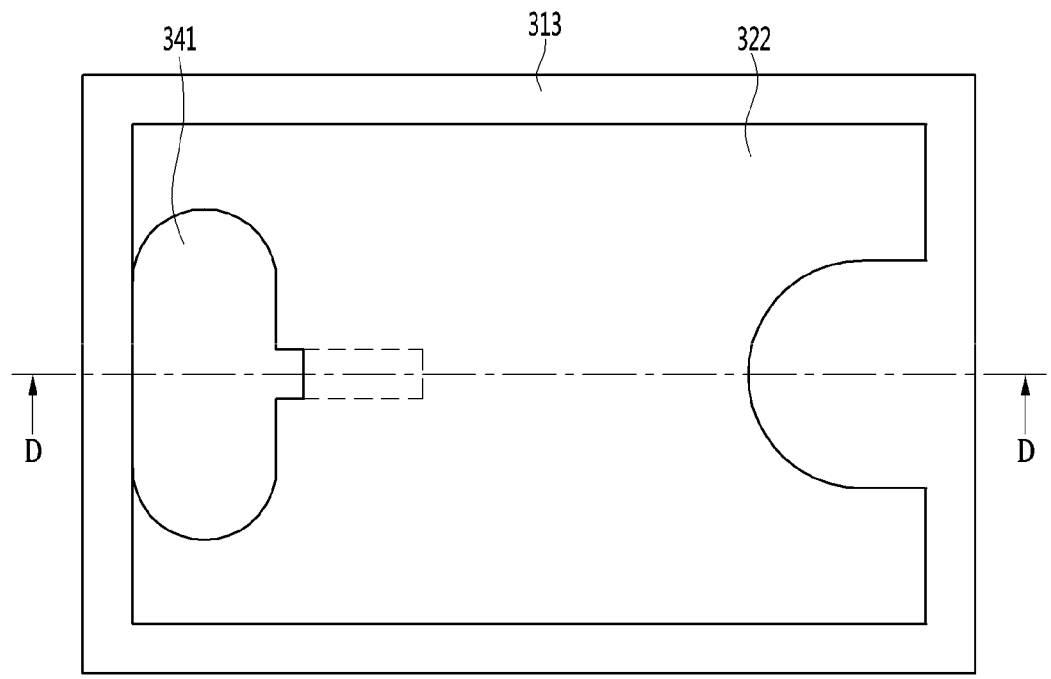
FIGS. 27a and 27b are respectively a plan view and a cross-sectional view illustrating an example in which a second electrode is formed by the semiconductor device manufacturing method according to an embodiment of the present invention.
Figure 27B:
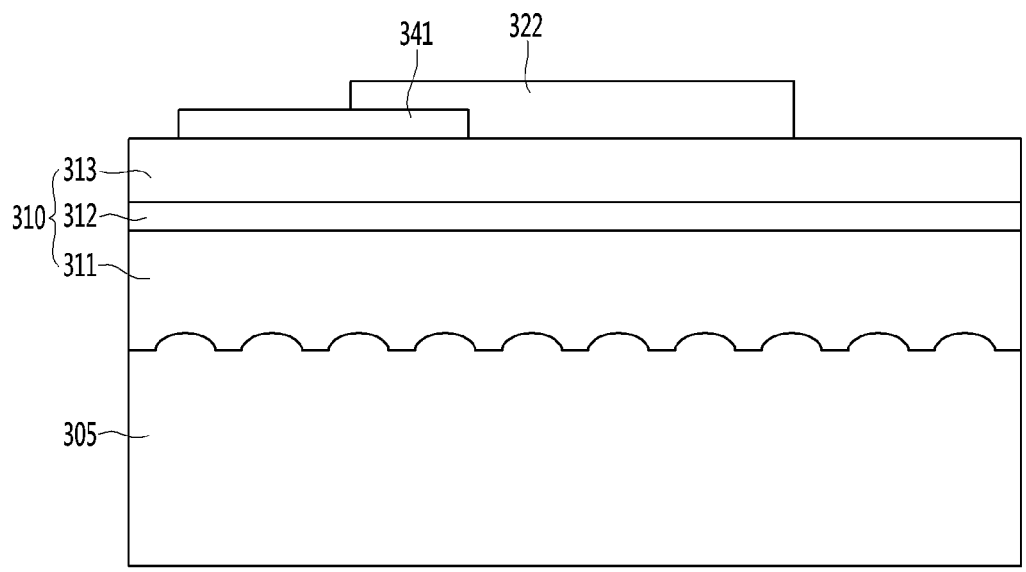

Next, as illustrated in FIGS. 27a and 27b, a second electrode 322 may be formed on the light-emitting structure 310.

FIGS. 27a and 27b are respectively a plan view and a cross-sectional view illustrating an example in which the second electrode is formed by the semiconductor device manufacturing method according to an embodiment of the present invention. FIG. 27b is a cross-sectional view taken along line D-D of the plan view illustrated in FIG. 27a.

The second electrode 322 may be provided on the second conductivity type semiconductor layer 313. A partial region of the second electrode 322 may be provided on the first insulating layer 341.

For example, the second electrode 322 may include a material that ohmic-contacts the second conductivity type semiconductor layer 313. For example, the second electrode 322 may include a transparent conductive oxide. For example, the second electrode 322 may include at least one material selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

Figure 28A:
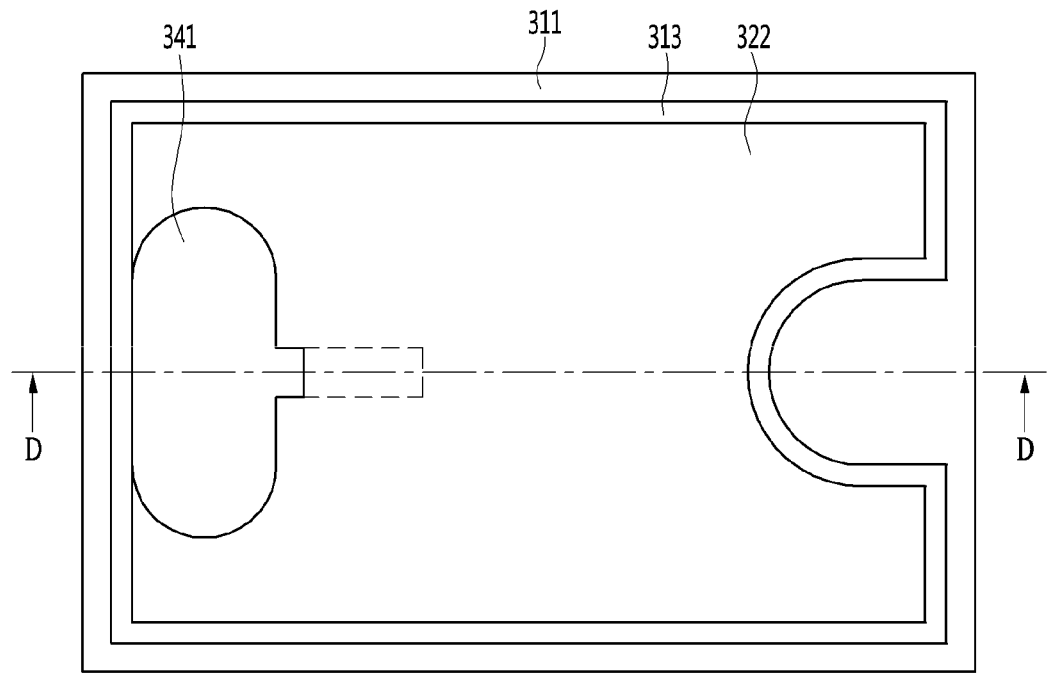
FIGS. 28a and 28b are respectively a plan view and a cross-sectional view illustrating an example in which a partial region of the light-emitting structure is etched by the semiconductor device manufacturing method according to an embodiment of the present invention.
Figure 28B:
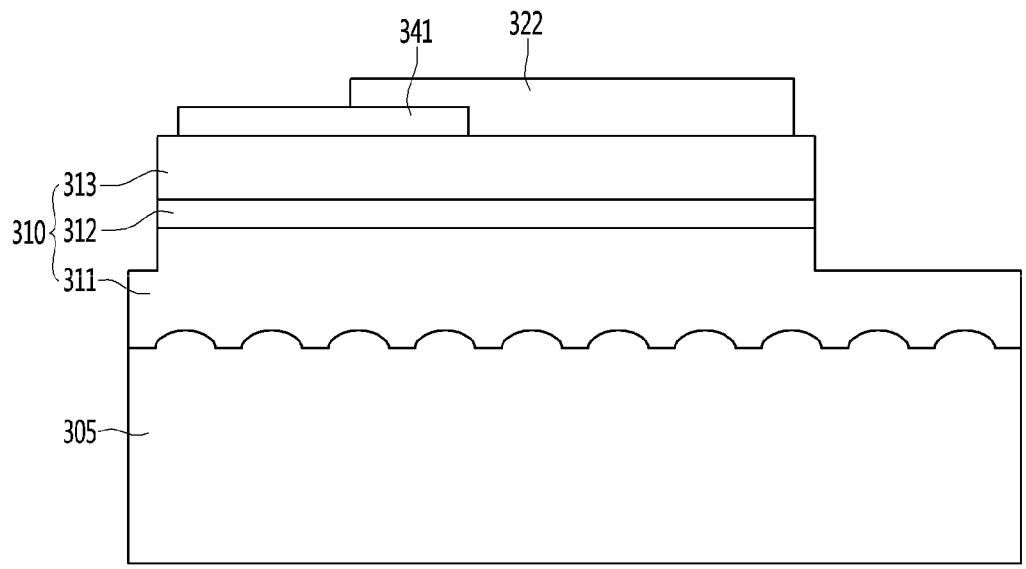

Next, as illustrated in FIGS. 28a and 28b, a part of the upper surface of the first conductivity type semiconductor layer 311 may be exposed through a process of etching the light-emitting structure 310.

FIGS. 28a and 28b are respectively a plan view and a cross-sectional view illustrating an example in which a partial region of the light-emitting structure is etched by the semiconductor device manufacturing method according to an embodiment of the present invention. FIG. 28b is a cross-sectional view taken along line D-D of the plan view illustrated in FIG. 28a.

A part of the upper surface of the first conductivity type semiconductor layer 311 may be exposed through a process of etching a partial region of the first conductivity type semiconductor layer 311 and a partial region of the active layer 312. At this time, a partial region of the first conductivity type semiconductor layer 311 may also be etched, and the first conductivity type semiconductor layer 311 may be provided as a stepped structure having different thicknesses according to a region.

Figure 29A:
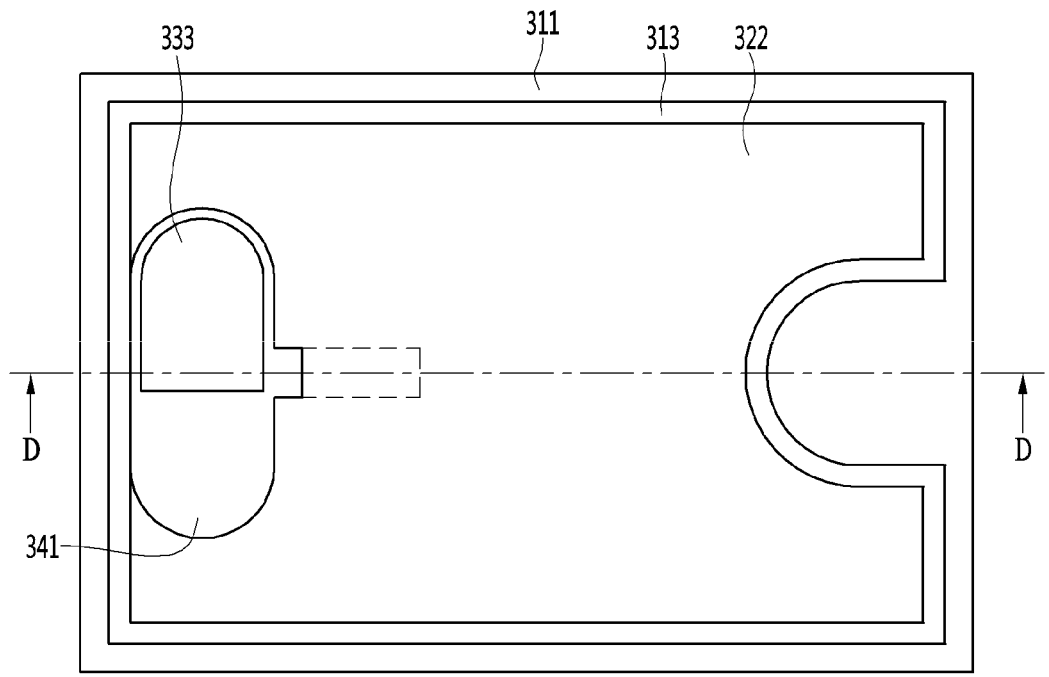
FIGS. 29a and 29b are respectively a plan view and a cross-sectional view illustrating an example in which a gate electrode is formed by the semiconductor device manufacturing method according to an embodiment of the present invention.
Figure 29B:
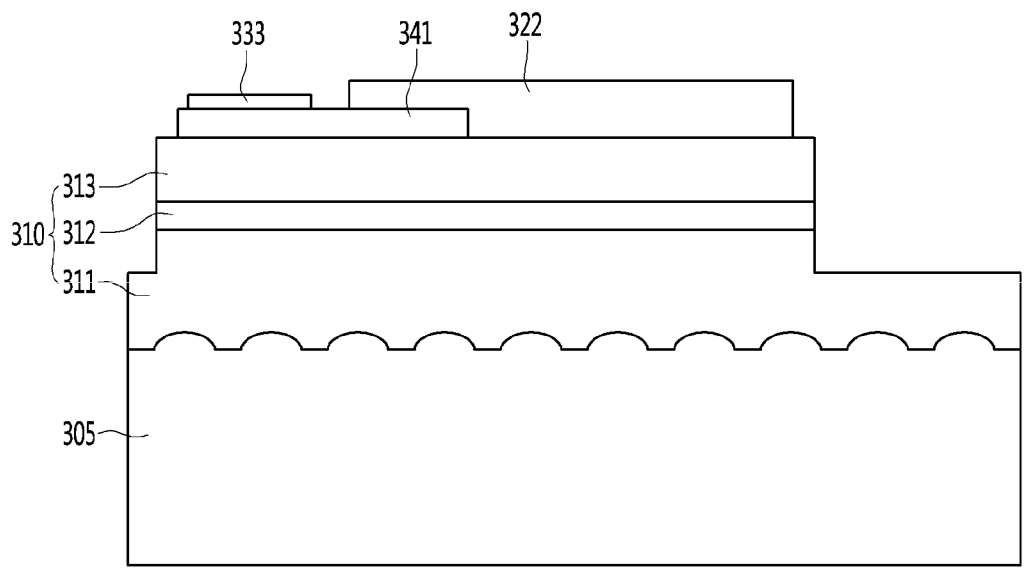

Next, as illustrated in FIGS. 29a and 29b, a gate electrode 333 may be formed on the first insulating layer 341.

FIGS. 29a and 29b are respectively a plan view and a cross-sectional view illustrating an example in which the gate electrode is formed by the semiconductor device manufacturing method according to an embodiment of the present invention. FIG. 29b is a cross-sectional view taken along line D-D of the plan view illustrated in FIG. 29a.

According to an embodiment, the gate electrode 333 may be provided on a partial region of the upper surface of the first insulating layer 341.

Figure 30A:
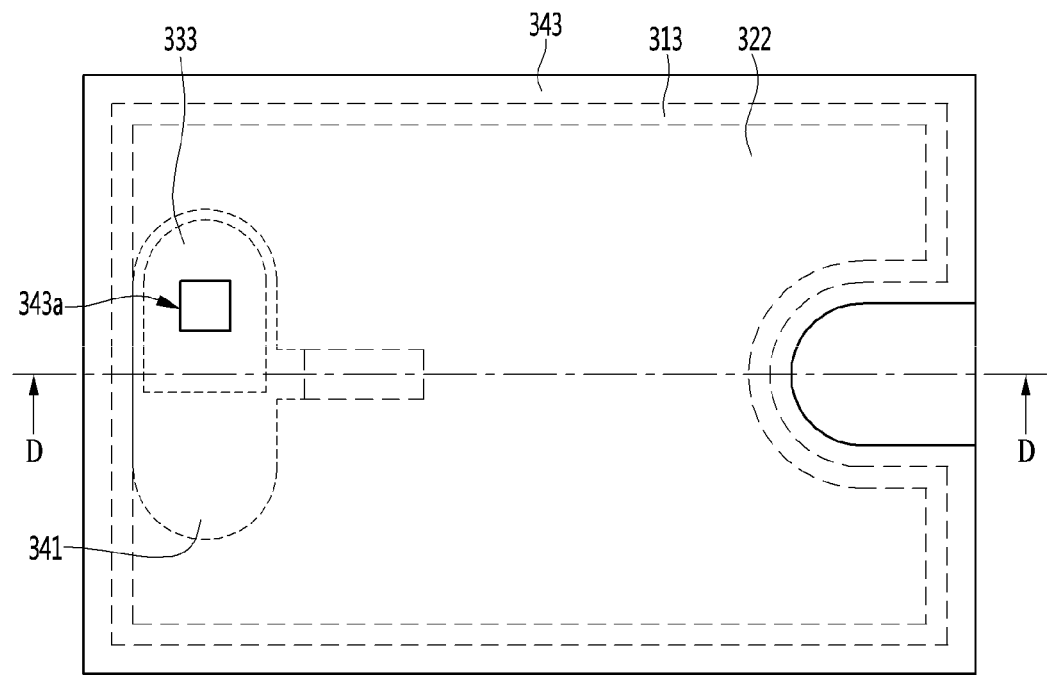
FIGS. 30a and 30b are respectively a plan view and a cross-sectional view illustrating an example in which a second insulating layer is formed by the semiconductor device manufacturing method according to an embodiment of the present invention.
Figure 30B:
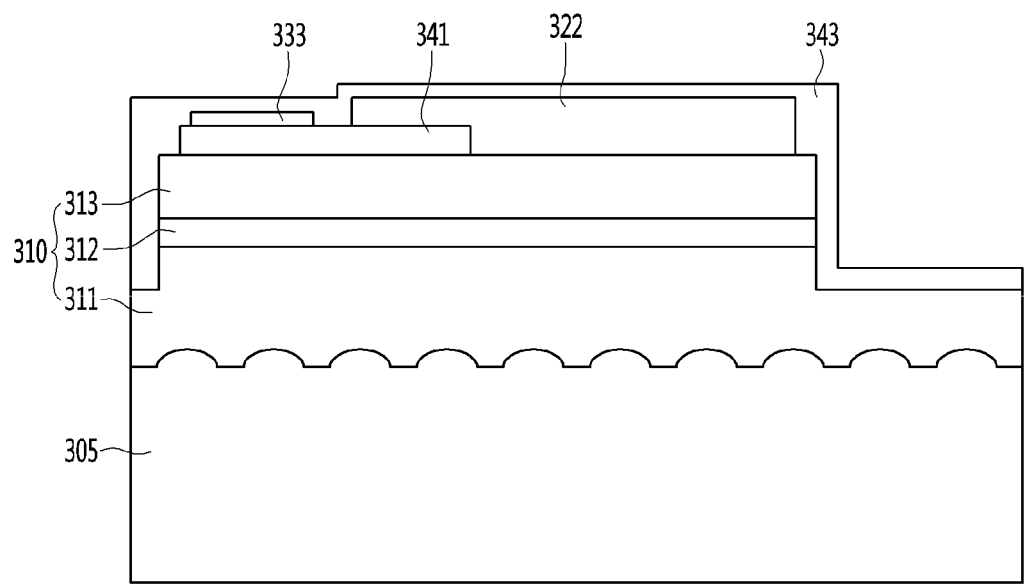

Next, as illustrated in FIGS. 30a and 30b, a second insulating layer 343 may be formed on the gate electrode 333 and the second electrode 322.

FIGS. 30a and 30b are respectively a plan view and a cross-sectional view illustrating an example in which the second insulating layer is formed by the semiconductor device manufacturing method according to an embodiment of the present invention. FIG. 30b is a cross-sectional view taken along line D-D of the plan view illustrated in FIG. 30a.

The second insulating layer 343 may be provided on the light-emitting structure 310. The second insulating layer 343 may be provided on the side surface of the light-emitting structure 310. At this time, a first gate contact hole 343a may be provided in the second insulating layer 243 disposed on the gate electrode 333. A partial region of the gate electrode 333 may be exposed from the second insulating layer 343 by the first gate contact hole 343a.

For example, the second insulating layer 343 may include an insulating material. The second insulating layer 343 may include oxide, nitride, or an organic material. For example, the second insulating layer 343 may include at least one selected from $SiO_2$, $SiN_x$, $Al_2O_3$, and the like.

Figure 31A:
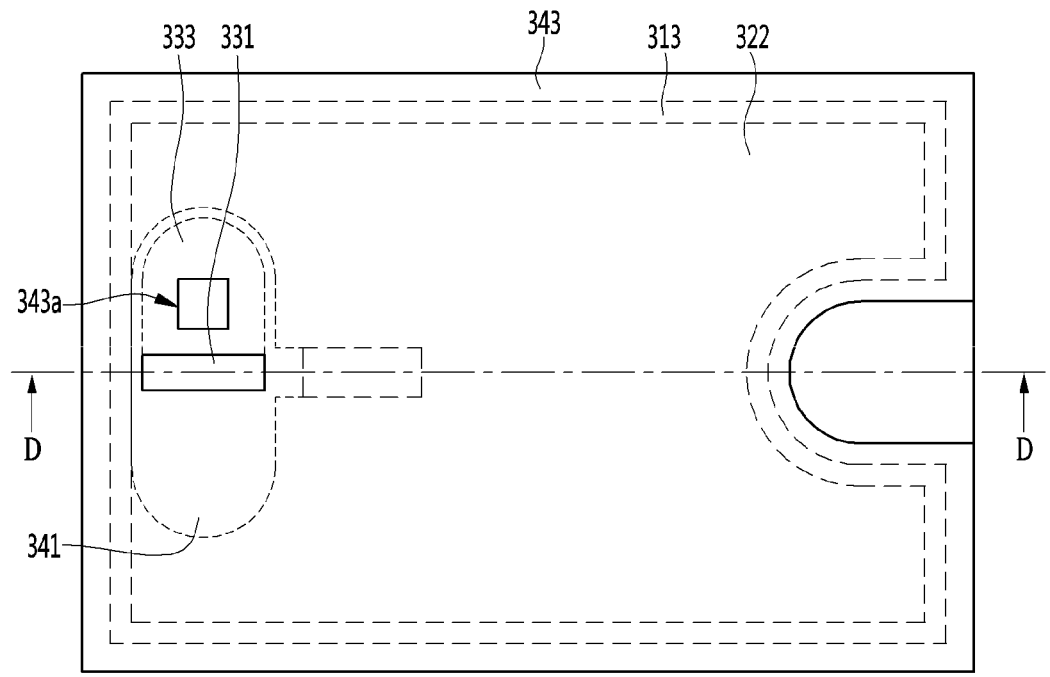
FIGS. 31a and 31b are respectively a plan view and a cross-sectional view illustrating an example in which a semiconductor layer is formed by the semiconductor device manufacturing method according to an embodiment of the present invention.
Figure 31B:
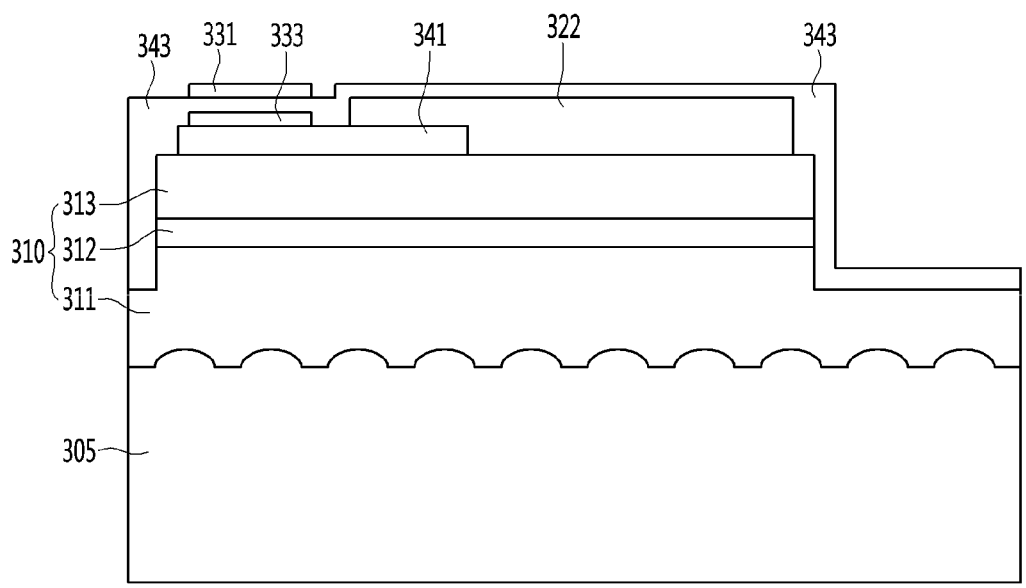

Next, as illustrated in FIGS. 31a and 31b, a semiconductor layer 331 may be formed on the second insulating layer 343.

FIGS. 31a and 31b are respectively a plan view and a cross-sectional view illustrating an example in which the semiconductor layer is formed by the semiconductor device manufacturing method according to an embodiment of the present invention. FIG. 31b is a cross-sectional view taken along line D-D of the plan view illustrated in FIG. 31a.

The semiconductor layer 331 may be disposed in a partial region of the upper surface of the second insulating layer 343. The semiconductor layer 331 may be disposed on the second insulating layer 343 and spaced apart from the second electrode 322 by a predetermined distance. The semiconductor layer 331 may be provided on the gate electrode 333. The semiconductor layer 331 may be disposed to overlap a partial region of the gate electrode 333 in a vertical direction.

The semiconductor layer 331 may be formed of, for example, a material different from the material forming the light-emitting structure 310. For example, the semiconductor layer 331 may include a material selected from the group consisting of amorphous silicon, polycrystalline silicon, single crystal silicon, and oxide semiconductor. The material constituting the semiconductor layer 331 may be selected from materials that can be formed at a lower temperature than a forming temperature of the light-emitting structure 310. Therefore, even when the semiconductor layer 331 is formed after the light-emitting structure 310 is formed, it does not influence the physical properties of the light-emitting structure 310, and it is possible to prevent the light extraction efficiency of the light-emitting structure 310 from being reduced. Examples of the oxide semiconductor may be selected from the group consisting of indium gallium zinc oxide (IGZO), indium gallium oxide (IGO), and indium zinc oxide (IZO).

Figure 32A:
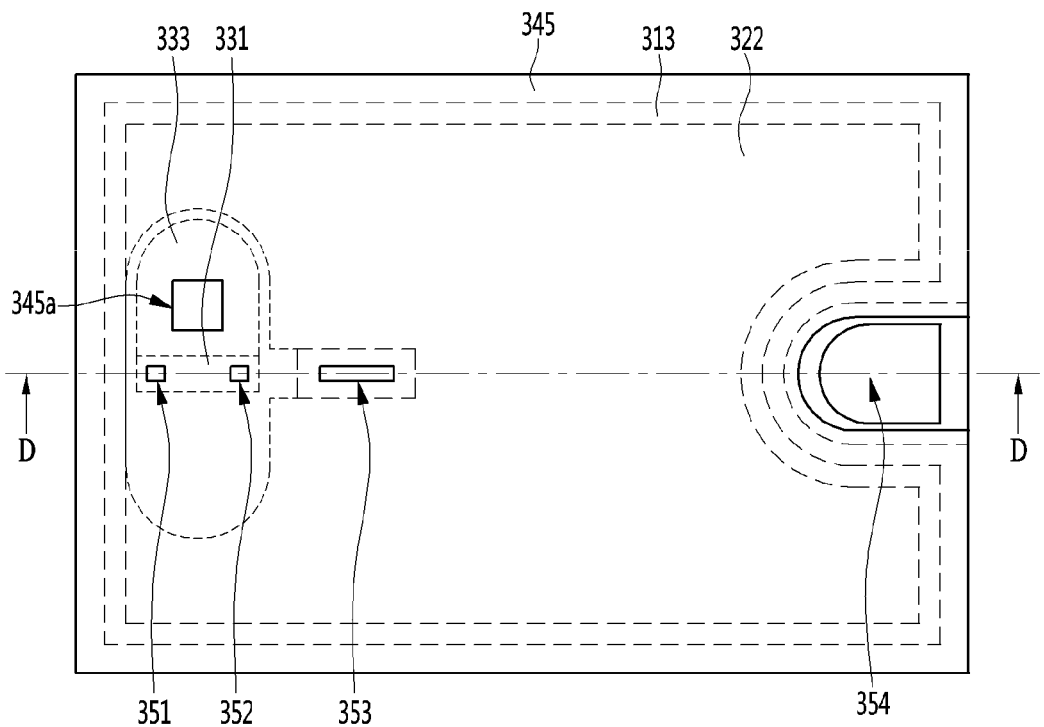
FIGS. 32a and 32b are respectively a plan view and a cross-sectional view illustrating an example in which a third insulating layer is formed by the semiconductor device manufacturing method according to an embodiment of the present invention.
Figure 32B:
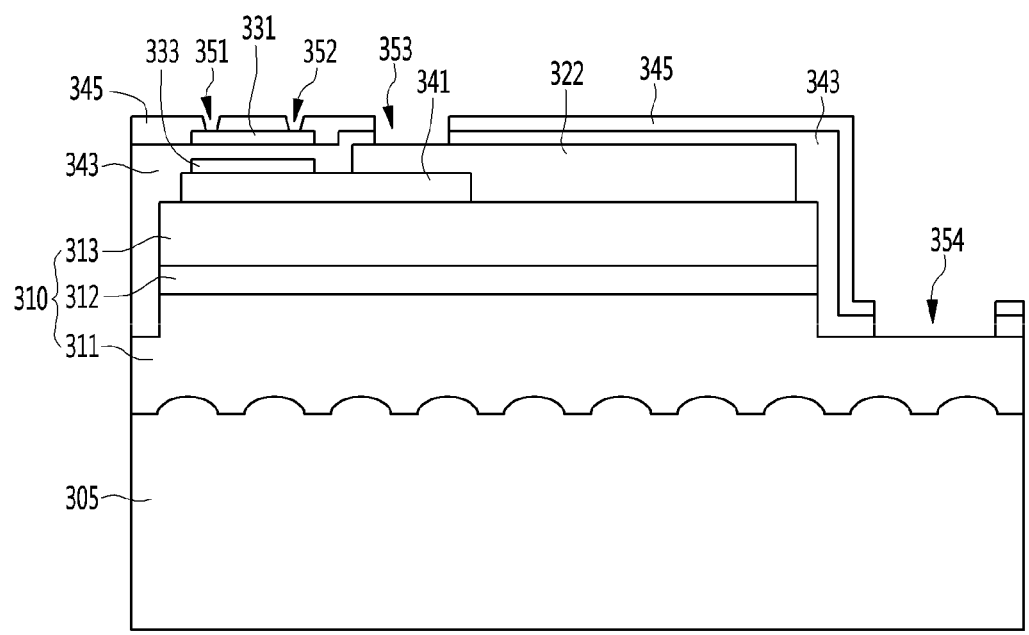

Next, as illustrated in FIGS. 32a and 32b, a third insulating layer 345 may be formed on the upper surface and the side surface of the light-emitting structure 310.

FIGS. 32a and 32b are respectively a plan view and a cross-sectional view illustrating an example in which the third insulating layer is formed by the semiconductor device manufacturing method according to an embodiment of the present invention. FIG. 32b is a cross-sectional view taken along line D-D of the plan view illustrated in FIG. 32a.

The third insulating layer 345 may include a first contact hole 351, a second contact hole 352, a third contact hole 353, and a fourth contact hole 354. A first region of the semiconductor layer 331 may be exposed by the first contact hole 351. A second region of the semiconductor layer 331 may be exposed by the second contact hole 352. A partial region of the second electrode 322 may be exposed by the third contact hole 353. A partial region of the first conductivity type semiconductor layer 311 may be exposed by the fourth contact hole 354. At this time, a second gate contact hole 345a may be provided in the third insulating layer 345 disposed on the gate electrode 333. A partial region of the gate electrode 333 may be exposed from the third insulating layer 345 by the second gate contact hole 345a. The third insulating layer 345 may be disposed on the second electrode 322. The third insulating layer 345 may be disposed on the semiconductor layer 331. The third insulating layer 345 may be disposed on the second insulating layer 343.

For example, the third insulating layer 345 may include an insulating material. The third insulating layer 345 may include oxide, nitride, or an organic material. For example, the third insulating layer 345 may include at least one selected from $SiO_2$, $SiN_x$, $Al_2O_3$, and the like.

Figure 33A:
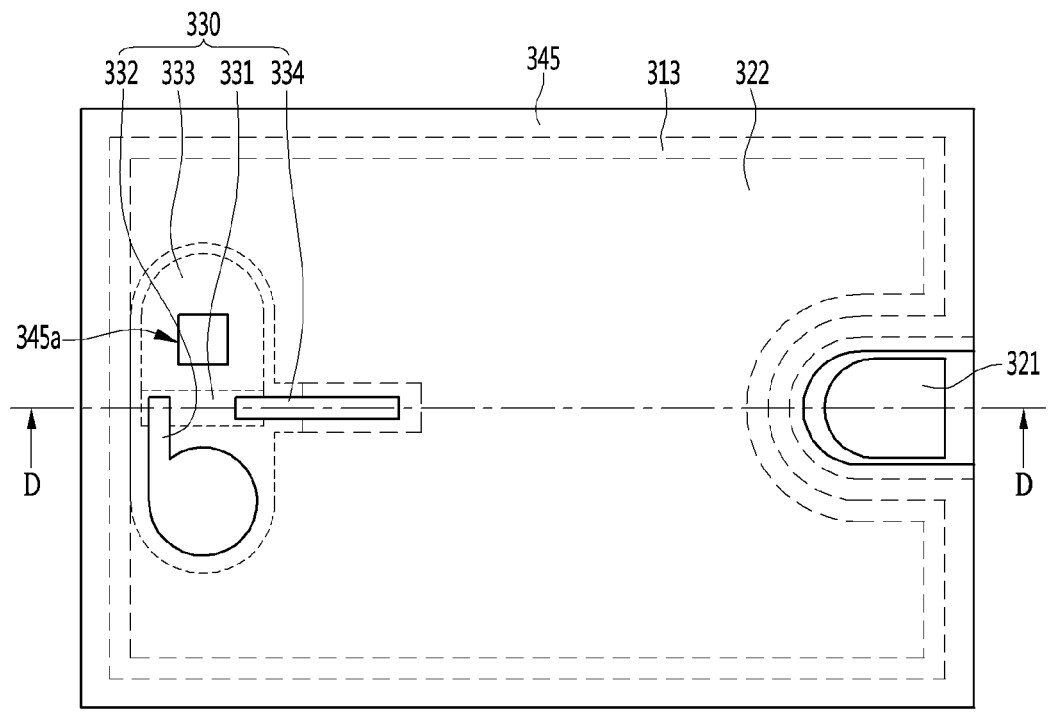
FIGS. 33a and 33b are respectively a plan view and a cross-sectional view illustrating an example in which a transistor is formed by the semiconductor device manufacturing method according to an embodiment of the present invention.
Figure 33B:
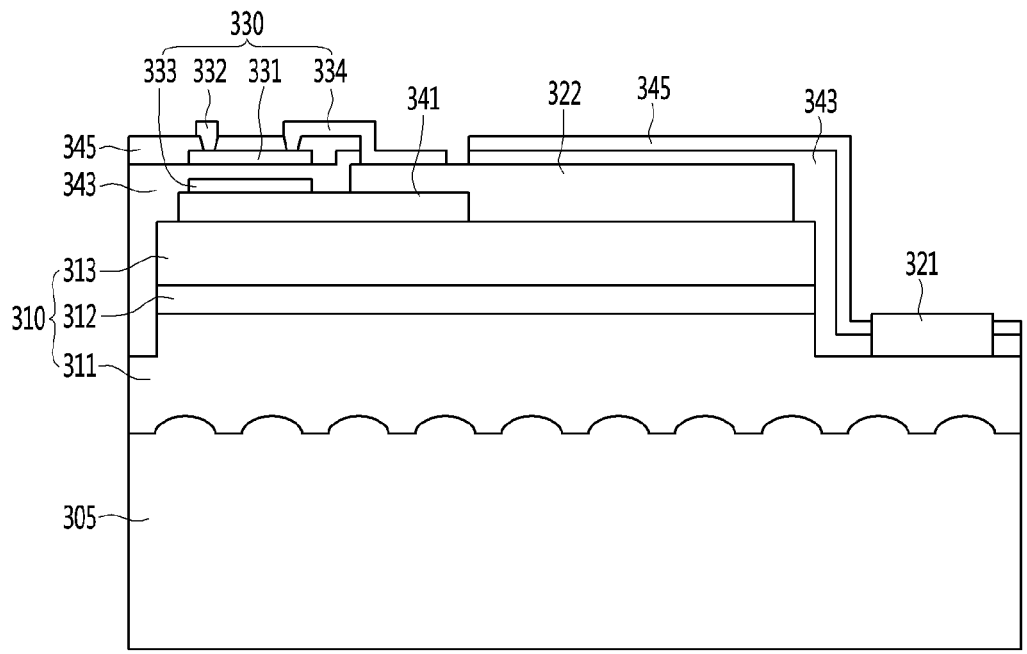

Next, as illustrated in FIGS. 33a and 33b, a transistor may be formed.

FIGS. 33a and 33b are respectively a plan view and a cross-sectional view illustrating an example in which the transistor is formed by the semiconductor device manufacturing method according to an embodiment of the present invention. FIG. 33b is a cross-sectional view taken along line D-D of the plan view illustrated in FIG. 33a.

First, a source electrode 332, a drain electrode 334, and a first electrode 321 may be formed on the third insulating layer 345. The source electrode 332 may be electrically connected to the first region of the semiconductor layer 331 through the first contact hole 351. The drain electrode 334 may be electrically connected to the second region of the semiconductor layer 331 through the second contact hole 352, and may be electrically connected to the second electrode 322 through the third contact hole 353. The second region of the semiconductor layer 331 may be electrically connected to the second electrode 322 through the drain electrode 334.

The source electrode 332 may be electrically connected to a first region of the semiconductor layer 331. The source electrode 332 may be disposed on the first region of the semiconductor layer 331. The source electrode 332 may be disposed on the third insulating layer 345. The drain electrode 334 may be electrically connected to a second region of the semiconductor layer 331. The drain electrode 334 may be disposed on the second region of the semiconductor layer 331. The drain electrode 334 may be disposed on the third insulating layer 345.

For example, the first region and the second region of the semiconductor layer 331 may be provided to include high-concentration impurities. High-concentration impurities may be provided in the first region and the second region of the semiconductor layer 331 through, for example, an ion implant process. Therefore, in the semiconductor layer 331, the first region to which the source electrode 332 is to be electrically connected and the second region to which the drain electrode 334 is to be electrically connected may be provided as high-concentration impurity regions.

The gate electrode 333 may be disposed under the semiconductor layer 331. The gate electrode 333 may be disposed under between the first region and the second region of the semiconductor layer 331. The gate electrode 333 may be disposed spaced apart from the semiconductor layer 331. The upper surface of the gate electrode 333 may be disposed spaced apart from the lower surface of the semiconductor layer 331. The second insulating layer 343 may be disposed between the gate electrode 333 and the semiconductor layer 331. For example, the gate electrode 333 and the semiconductor layer 331 may be disposed spaced apart by the thickness of the second insulating layer 343.

According to an embodiment, a current flow from the source electrode 332 to the drain electrode 334 may be controlled according to the magnitude of a voltage applied to the gate electrode 333. That is, when a voltage exceeding a threshold voltage of the transistor 330 is applied to the gate electrode 333, a current may flow from the source electrode 332 to the drain electrode 334. External power is electrically connected to the gate electrode 333 through the second gate contact hole 345a. Meanwhile, according to an embodiment, in forming the source electrode 332 and the drain electrode 334, a gate pad electrically connected to the gate electrode 333 through the second gate contact hole 345a may be formed on the third insulating film 345.

In addition, the semiconductor device according to an embodiment may include a first electrode 321 and a second electrode 322 as illustrated in FIGS. 33a and 33b. The first electrode 321 and the second electrode 322 may be electrically connected to the light-emitting structure 310. The first electrode 321 may be electrically connected to the first conductivity type semiconductor layer 311. For example, the first electrode 321 may be disposed on the first conductivity type semiconductor layer 311. The first electrode 321 may be disposed spaced apart from the side surface of the active layer 312. The second electrode 322 may be electrically connected to the second conductivity type semiconductor layer 313. For example, the second electrode 322 may be disposed on the second conductivity type semiconductor layer 313. The second electrode 322 may be disposed on the active layer 312. The light-emitting structure 310 may be driven by the voltage applied to the first electrode 321 and the second electrode 322. Light may be generated in the active layer 312 of the light-emitting structure 310 by the voltage applied between the first electrode 321 and the second electrode 322.

For example, the first electrode 321 may include a region that ohmic-contacts the first conductivity type semiconductor layer 311. The first electrode 321 may include a single layer or a multi-layer including at least one selected from Cr, Ni, Ti, Ge, Zn, Mg, Ca, Al, Ag, Rh, W, Pt, Au, AuGe, and AuGe/Ni/Au. For example, the source electrode 332, the gate electrode 333, and the drain electrode 334 may be formed of the same material as the first electrode 321. In addition, the source electrode 332, the gate electrode 333, and the drain electrode 334 may be formed of different materials as the first electrode 321.

The above-described semiconductor device manufacturing method according to the embodiment is merely an example, and it can be understood by a person skilled in the art that various modifications and applications can be made thereto.

Figure 34A:
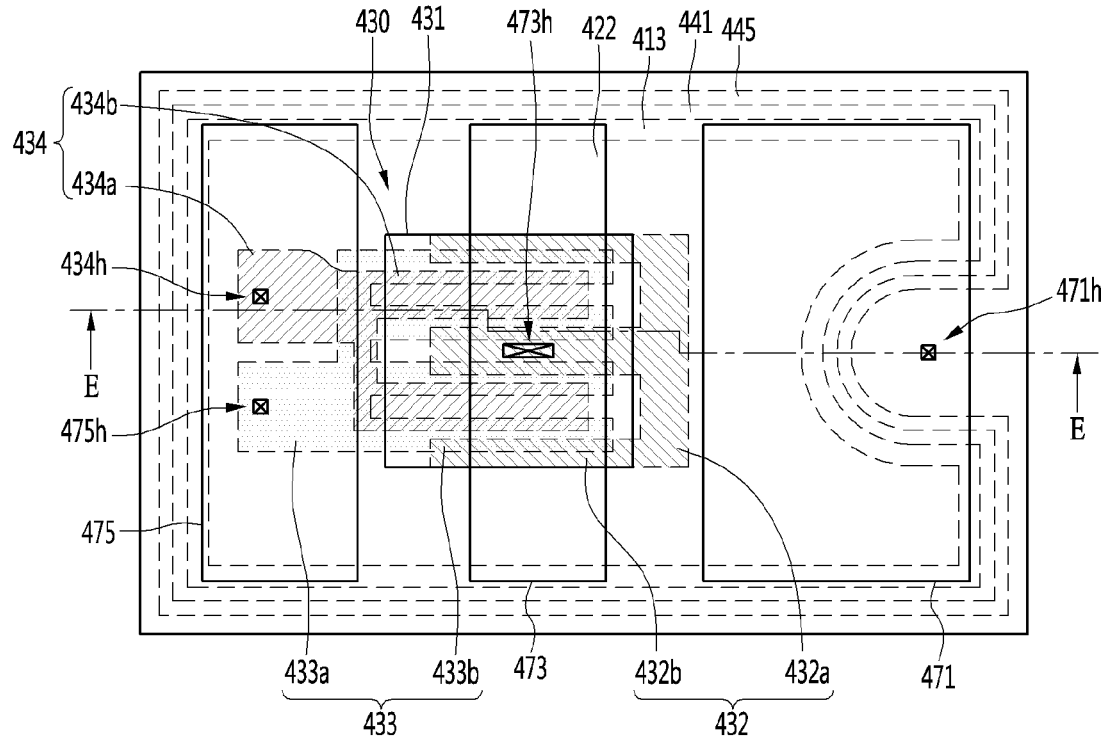
FIGS. 34a and 34b are respectively a plan view and a cross-sectional view illustrating another example of a semiconductor device according to an embodiment of the present invention.
Figure 34B:
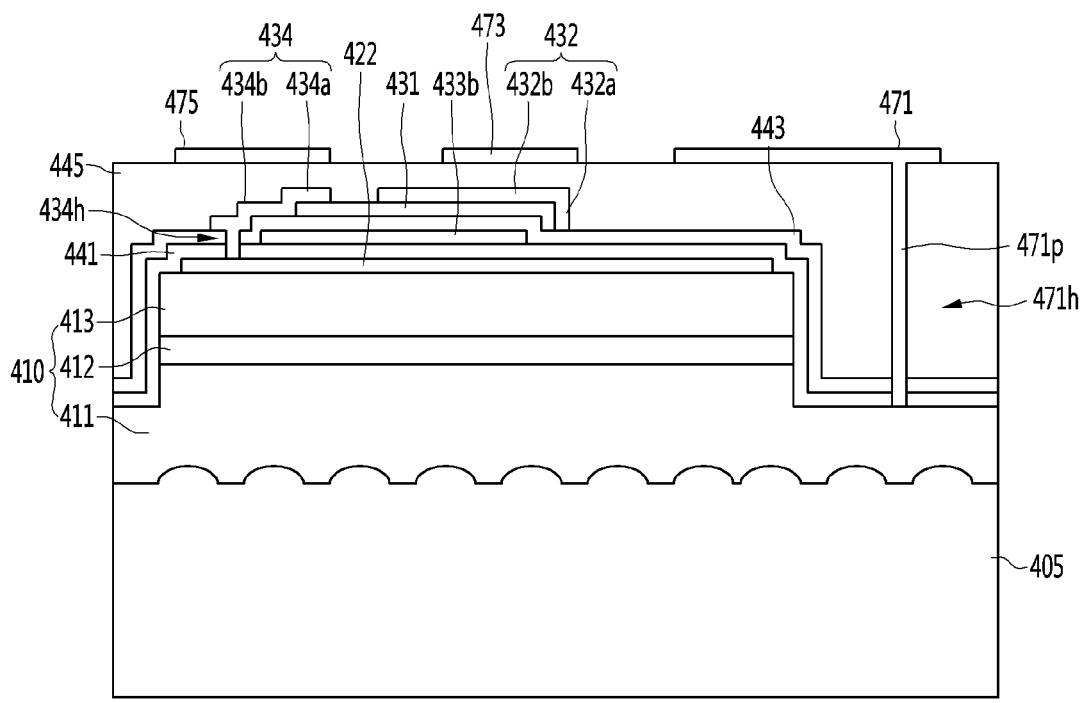

Meanwhile, FIGS. 34a and 34b are respectively a plan view and a cross-sectional view illustrating another example of a semiconductor device according to an embodiment of the present invention. In describing the semiconductor device according to the embodiment with reference to FIGS. 34a and 34b the description redundant to the matters described above will be omitted.

FIGS. 34a and 34b are respectively a plan view and a cross-sectional view illustrating another example of a semiconductor device according to an embodiment of the present invention. FIG. 34b is a cross-sectional view taken along line E-E of the plan view illustrated in FIG. 34a.

A semiconductor device according to an embodiment may include a light-emitting structure 410 and a transistor 430 as illustrated in FIGS. 34a and 34b. For example, the transistor 430 may be disposed on the light-emitting structure 410. The transistor 430 may be electrically connected to the light-emitting structure 410. The semiconductor device according to the embodiment may control the driving of the transistor 430 and adjust the light emission of the light-emitting structure 410. The transistor 430 may be provided as, for example, a bottom gate transistor structure.

The light-emitting structure 410 may include a first conductivity type semiconductor layer 411, an active layer 412, and a second conductivity type semiconductor layer 413. The active layer 412 may be disposed between the first conductivity type semiconductor layer 411 and the second conductivity type semiconductor layer 413. For example, the active layer 412 may be disposed on the first conductivity type semiconductor layer 411, and the second conductivity type semiconductor layer 413 may be disposed on the active layer 412.

For example, the first conductivity type semiconductor layer 411 may be formed as an n-type semiconductor layer in which an n-type dopant is added as a first conductive dopant, and the second conductivity type semiconductor layer 413 may be formed as a p-type semiconductor layer in which a p-type dopant is added as a second conductive dopant. In addition, on the contrary, the first conductivity type semiconductor layer 411 may be formed as a p-type semiconductor layer, and the second conductivity type semiconductor layer 413 may be formed as an n-type semiconductor layer. Hereinafter, a case where the first conductivity type semiconductor layer 411 is provided as an n-type semiconductor layer and the second conductivity type semiconductor layer 413 is provided as a p-type semiconductor layer will be described.

In the light-emitting structure 410, a wavelength band of generated light may be changed according to a material constituting the active layer 412. The selection of materials constituting the first conductivity type semiconductor layer 411 and the second conductivity type semiconductor layer 413 may be changed according to the material constituting the active layer 412. The light-emitting structure 410 may be implemented by compound semiconductor. The light-emitting structure 410 may be implemented by, for example, a group II-VI compound semiconductor or a group III-V compound semiconductor. For example, the light-emitting structure 410 may be implemented by including at least two elements selected from the group consisting of aluminum (Al), gallium (Ga), indium (In), Phosphorus (P), arsenic (As), and nitrogen (N).

The active layer 412 is a layer in which electrons (or holes) injected through the first conductivity type semiconductor layer 411 and holes (or electrons) injected through the second conductivity type semiconductor layer 413 recombine with each other and light is emitted by a band gap difference between energy bands according to a forming material of the active layer 412. The active layer 412 may be formed to have one of a single well structure, a multiple well structure, a quantum dot structure, or a quantum wire structure. The active layer 412 may be implemented by compound semiconductor. The active layer 412 may be implemented by, for example, a group II-VI compound semiconductor or a group III-V compound semiconductor.

When light of a blue wavelength band or a green wavelength band is generated in the active layer 412, the active layer 412 may be implemented by, for example, a semiconductor material having a formula of $In_xAl_yGa_{1-x-y}N$ ($0 \leq x \leq 1$, $0 \leq y \leq 1$, $0 \leq x+y \leq 1$). When the active layer 412 is implemented by a multi well structure, the active layer 412 may be implemented by stacking a plurality of well layers and a plurality of barrier layers. In addition, when light of a red wavelength band is generated in the active layer 412, the active layer 412 may be implemented by, for example, a semiconductor material having a formula of $(Al_xGa_{1-x})_yIn_{1-y}P$ ($0 \leq x \leq 1$, $0 \leq y \leq 1$). The active layer 412 may be selected from, for example, AlGaInP, AlInP, GaP, and GaInP.

The first conductivity type semiconductor layer 411 may include, for example, an n-type semiconductor layer. The first conductivity type semiconductor layer 411 may be implemented by compound semiconductor. The first conductivity type semiconductor layer 411 may be implemented by, for example, a group II-VI compound semiconductor or a group III-V compound semiconductor. For example, when light of a blue wavelength band or a green wavelength band is generated in the active layer 412, the first conductivity type semiconductor layer 411 may be implemented by, for example, a semiconductor material having a formula of $In_xAl_yGa_{1-x-y}N$ ($0 \leq x \leq 1$, $0 \leq y \leq 1$, $0 \leq x+y \leq 1$). In addition, when light of a red wavelength band is generated in the active layer 412, the first conductivity type semiconductor layer 411 may be implemented by, for example, a semiconductor material having a formula of $(Al_xGa_{1-x})_yIn_{1-y}P$ ($0 \leq x \leq 1$, $0 \leq y \leq 1$). In the first conductivity type semiconductor layer 411, y may have a value of 0.5 and x may have a value of 0.5 to 0.8 in the formula. The first conductivity type semiconductor layer 411 may be selected from the group consisting of GaN, AlN, AlGaN, InGaN, InN, InAlGaN, AlInN, AlGaAs, GaP, GaAs, GaAsP, AlGaInP, AlInP, and GaInP, and an n-type dopant such as Si, Ge, Sn, Se, or Te may be doped.

The second conductivity type semiconductor layer 413 may be implemented by compound semiconductor. The second conductivity type semiconductor layer 413 may be implemented by, for example, a group II-VI compound semiconductor or a group III-V compound semiconductor. For example, when light of a blue wavelength band or a green wavelength band is generated in the active layer 412, the second conductivity type semiconductor layer 413 may be implemented by, for example, a semiconductor material having a formula of $In_xAl_yGa_{1-x-y}N$ ($0 \leq x \leq 1$, $0 \leq y \leq 1$, $0 \leq x+y \leq 1$). In addition, when light of a red wavelength band is generated in the active layer 412, the second conductivity type semiconductor layer 413 may be implemented by, for example, a semiconductor material having a formula of $(Al_xGa_{1-x})_yIn_{1-y}P$ ($0 \leq x \leq 1$, $0 \leq y \leq 1$). The second conductivity type semiconductor layer 413 may be selected from the group consisting of GaN, AlN, AlGaN, InGaN, InN, InAl-GaN, AlInN, AlGaAs, GaP, GaAs, GaAsP, AlGaInP, AlInP, and GaInP, and a p-type dopant such as Mg, Zn, Ca, Sr, or Ba may be doped.

The transistor 430 may include a semiconductor layer 431, a source electrode 432, a gate electrode 433, and a drain electrode 434. The transistor 430 may be disposed on the light-emitting structure 410. The transistor 430 may be disposed on the second conductivity type semiconductor layer 413. The area of the transistor 430 may be smaller than the area of the second conductivity type semiconductor layer 413 when viewed from above the semiconductor device. The transistor 430 may be disposed on the active layer 412. The area of the transistor 430 may be smaller than the area of the active layer 412 when viewed from above the semiconductor device.

The semiconductor layer 431 may be formed of, for example, a material different from the material forming the light-emitting structure 410. For example, the semiconductor layer 431 may include a material selected from the group consisting of amorphous silicon, polycrystalline silicon, single crystal silicon, and oxide semiconductor. The material constituting the semiconductor layer 431 may be selected from materials that can be formed at a lower temperature than a forming temperature of the light-emitting structure 410. Therefore, even when the semiconductor layer 431 is formed after the light-emitting structure 410 is formed, it does not influence the physical properties of the light-emitting structure 410, and it is possible to prevent the light extraction efficiency of the light-emitting structure 410 from being reduced. Examples of the oxide semiconductor may be selected from the group consisting of indium gallium zinc oxide (IGZO), indium gallium oxide (IGO), and indium zinc oxide (IZO).

The source electrode 432 may be electrically connected to a first region of the semiconductor layer 431. The source electrode 432 may be disposed on the first region of the semiconductor layer 431. The drain electrode 434 may be electrically connected to a second region of the semiconductor layer 431. The drain electrode 434 may be disposed on the second region of the semiconductor layer 431.

For example, the first region and the second region of the semiconductor layer 431 may be provided to include high-concentration impurities. High-concentration impurities may be provided in the first region and the second region of the semiconductor layer 431 through, for example, an ion implant process. Therefore, in the semiconductor layer 431, the first region to which the source electrode 432 is to be electrically connected and the second region to which the drain electrode 434 is to be electrically connected may be provided as high-concentration impurity regions.

The gate electrode 433 may be disposed under the semiconductor layer 431. The gate electrode 433 may be disposed spaced apart from the semiconductor layer 431. The upper surface of the gate electrode 433 may be disposed spaced apart from the lower surface of the semiconductor layer 431. A second insulating layer 443 may be disposed between the gate electrode 433 and the semiconductor layer 431. For example, the gate electrode 433 and the semiconductor layer 431 may be disposed spaced apart by the thickness of the second insulating layer 443.

According to an embodiment, a current flow from the source electrode 432 to the drain electrode 434 may be controlled according to the magnitude of a voltage applied to the gate electrode 433. That is, when a voltage exceeding a threshold voltage of the transistor 430 is applied to the gate electrode 433, a current may flow from the source electrode 432 to the drain electrode 434.

Meanwhile, the semiconductor device according to an embodiment may include a second electrode 422 as illustrated in FIGS. 34a and 34b. The second electrode 422 may be electrically connected to the second conductivity type semiconductor layer 413. For example, the second electrode 422 may be disposed on the second conductivity type semiconductor layer 413. The second electrode 422 may be arranged on the active layer 412.

For example, the second electrode 422 may include a material that ohmic-contacts the second conductivity type semiconductor layer 413. For example, the second electrode 422 may include a transparent conductive oxide. For example, the second electrode 422 may include at least one material selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

The semiconductor device according to an embodiment may include a first insulating layer 441 as illustrated in FIGS. 34a and 34b. The first insulating layer 441 may be disposed on the light-emitting structure 410. The first insulating layer 441 may be disposed on the upper surface and the side surface of the light-emitting structure 410. The first insulating layer 441 may be disposed on the second conductivity type semiconductor layer 413. The first insulating layer 441 may be disposed on the active layer 412. The first insulating layer 441 may be disposed under the transistor 430. The first insulating layer 441 may be disposed on the second electrode 422. The first insulating layer 441 may be disposed between the light-emitting structure 410 and the transistor 430. The first insulating layer 441 may be disposed between the second conductivity type semiconductor layer 413 and the transistor 430. The first insulating layer 441 may be disposed between the second electrode 422 and the transistor.

The first insulating layer 441 may reflect light provided from the light-emitting structure 410. The first insulating layer 441 may reflect light provided from the active layer 412. The first insulating layer 441 may receive light generated in the active layer 412 and reflect the light downward. Therefore, it is possible to prevent the light generated in the active layer 412 from being incident on the transistor 430 and disappearing and to improve the light extraction efficiency of the semiconductor device.

For example, the first insulating layer 441 may include an insulating material. The first insulating layer 441 may include oxide or nitride. The first insulating layer 441 may include silicon-based oxide or silicon-based nitride. The first insulating layer 441 may include metal oxide. For example, the first insulating layer 441 may include at least one selected from $SiO_2$, $SiN_x$, $Al_2O_3$, and the like. The first insulating layer 441 may include metal oxide including $TiO_2$.

The first insulating layer 441 may be provided as a plurality of layers having different refractive indices. For example, the first insulating layer 441 may be formed by stacking a first layer having a first refractive index and a second layer having a second refractive index as one pair, and may be formed by sequentially stacking a plurality of pairs. Therefore, the first insulating layer 441 may be provided as a distributed Bragg reflector (DBR) layer and reflects light incident from the light-emitting structure 410, thereby preventing light generated in the light-emitting structure 410 from disappearing at the transistor 430. As one example, the first insulating layer 441 may be provided by stacking a plurality of pairs each including a $SiO_2$ layer and a $TiO_2$ layer as one pair.

The semiconductor device according to an embodiment may include a second insulating layer 443 as illustrated in FIGS. 34a and 34b. The second insulating layer 443 may be disposed on the upper surface of the light-emitting structure 410. The second insulating layer 443 may be disposed on the side surface of the light-emitting structure 410. The second insulating layer 443 may be disposed on the first insulating layer 441. The second insulating layer 443 may be disposed on the gate electrode 443. The second insulating layer 443 may be disposed on the second electrode 422. The gate electrode 433 may be disposed between the first insulating layer 441 and the second insulating layer 443.

For example, the second insulating layer 443 may include an insulating material. The second insulating layer 443 may include oxide, nitride, or an organic material. For example, the second insulating layer 443 may include at least one selected from $SiO_2$, $SiN_x$, $Al_2O_3$, and the like.

The semiconductor layer 431 may be disposed on the second insulating layer 443. The second electrode 422 may be electrically connected to the drain electrode 434. The first region of the drain electrode 434 may be electrically connected to the semiconductor layer 431. The first region of the drain electrode 434 may be disposed on the semiconductor layer 431. The second region of the drain electrode 434 may be electrically connected to the second electrode 422. The second region of the drain electrode 434 may be disposed on the second electrode 422. One end of the drain electrode 434 may be electrically connected to the second electrode 422 through the drain contact hole 434h provided by passing through the first insulating layer 441 and the second insulating layer 443. For example, one end of the drain electrode 434 may pass through the first insulating layer 441 and the second insulating layer 443 and contact the upper surface of the second electrode 422.

The first region of the source electrode 432 may be electrically connected to the semiconductor layer 431. For example, the first region of the source electrode 432 may be disposed on the semiconductor layer 431. The second region of the source electrode 432 may be disposed on the second insulating layer 443.

Therefore, a current flow from the source electrode 432 to the drain electrode 434 may be controlled according to power applied to the gate electrode 433, and power may be applied to the second electrode 422 through the drain electrode 434. According to an embodiment, power applied between the second electrode 422 may be controlled by the control of the gate electrode 433, and the light emission in the light-emitting structure 410 may be controlled.

The source electrode 432, the gate electrode 433, and the drain electrode 434 may include a single layer or a multilayer including at least one selected from Cr, Ni, Ti, Ge, Zn, Mg, Ca, Al, Ag, Rh, W, Pt, Au, AuGe, and AuGe/Ni/Au. The source electrode 432, the gate electrode 433, and the drain electrode 434 may be formed of the same material or different materials.

The semiconductor device according to an embodiment may include a third insulating layer 445 as illustrated in FIGS. 34a and 34b. The third insulating layer 445 may be disposed on the second insulating layer 443. The third insulating layer 445 may be disposed on the transistor 430. The third insulating layer 445 may be disposed on the source electrode 432. The third insulating layer 445 may be disposed on the drain electrode 434. For example, the third insulating layer 445 may include an insulating material. The third insulating layer 445 may include oxide, nitride, or an organic material. For example, the third insulating layer 445 may include at least one selected from $SiO_2$, $SiN_x$, $Al_2O_3$, and the like.

The semiconductor device according to an embodiment may include a first bonding pad 471, a second bonding pad 473, and a third bonding pad 475 as illustrated in FIGS. 34a and 34b. For example, the first bonding pad 471, the second bonding pad 473, and the third bonding pad 475 may be disposed on the light-emitting structure 410. The second bonding pad 473 and the third bonding pad 475 may be disposed on the transistor 430.

The first bonding pad 471 may be electrically connected to the first conductivity type semiconductor layer 411. The first transistor 471 may be disposed on the first conductivity type semiconductor layer 411. The first bonding pad 471 may be disposed on the third insulating layer 445. The first bonding pad 471 may be electrically connected to the first conductivity type semiconductor layer 411 through a first bonding pad contact hole 471h. The first insulating layer 471 may include a bonding pad extension portion 471p provided in the first bonding pad contact hole 471h. The first bonding pad contact hole 471h may be provided to pass through the first insulating layer 441, the second insulating layer 443, and the third insulating layer 445.

Meanwhile, the first bonding pad 471 is illustrated in FIGS. 34a and 34b as directly contacting the first conductivity type semiconductor layer 411, but according to an embodiment, a first electrode may be further disposed on the first conductivity type semiconductor layer 411. That is, according to an embodiment, the first electrode may be disposed on the first conductivity type semiconductor layer 411, and the first bonding pad 471 may contact the first electrode.

In addition, the second bonding pad 473 may be disposed on the third insulating layer 445. The second bonding pad 473 may be electrically connected to the source electrode 432. For example, one end of the second bonding pad 473 may pass through the third insulating layer 445 and contact the upper surface of the source electrode 432. The second bonding pad 473 may be electrically connected to the source electrode 432 through the second bonding pad contact hole 473h provided in the third insulating film 445.

In addition, the third bonding pad 475 may be disposed on the third insulating layer 445. The third bonding pad 475 may be electrically connected to the gate electrode 433. For example, one end of the third bonding pad 475 may pass through the second insulating layer 443 and the third insulating layer 445 and contact the upper surface of the gate electrode 433. The third bonding pad 475 may be electrically connected to the gate electrode 433 through the third bonding pad contact hole 475h provided in the second insulating layer 443 and the third insulating film 445.

For example, the first bonding pad 471, the second bonding pad 473, and the third bonding pad 475 may include a single layer or a multi-layer including at least one selected from Cr, Ni, Ti, Ge, Zn, Mg, Ca, Al, Ag, Rh, W, Pt, Au, AuGe, AuGe/Ni/Au, In, InAg, and AuIn.

The semiconductor device according to an embodiment may include a substrate 405 as illustrated in FIGS. 34a and 34b. For example, the substrate 405 may be a growth substrate on which the light-emitting structure 410 can be grown. For example, an uneven structure may be provided on the upper surface of the substrate 405. The uneven structure provided in the substrate 405 may reduce defects during the growth of the light-emitting structure 410, may improve crystal quality, and may reflect light emitted from the active layer 412 so as to improve the luminescent efficiency. For example, the substrate 405 may include at least one selected from a sapphire ($Al_2O_3$) substrate, SiC, GaAs, GaN, ZnO, Si, GaP, InP, and Ge.

Meanwhile, the semiconductor device according to an embodiment may be supplied with power from the outside by, for example, a flip chip bonding method. The first bonding pad 471, the second bonding pad 473, and the third bonding pad 475 are illustrated in FIGS. 34a and 34b as being provided in an upper direction, but when the flip chip bonding method is applied, the upper and lower structure may be reversed such that the first bonding pad 471, the second bonding pad 473, and the third bonding pad 475 are disposed in a lower direction. Therefore, the substrate 405 may be disposed at the upper portion.

When the semiconductor device according to an embodiment is electrically connected to the circuit substrate by the flip chip bonding method, power may be supplied to the first conductivity type semiconductor layer 411 through the first bonding pad 471. In addition, power may be supplied to the source electrode 432 through the second bonding pad 473. In addition, power may be supplied to the gate electrode 433 through the third bonding pad 475. Therefore, when a voltage higher than a threshold voltage of the transistor 430 is applied through the third bonding pad 475, a current flows from the source electrode 432 to the drain electrode 434. Power may be supplied to the second electrode 422 through the drain electrode 434. Power applied to the second electrode 422 may be supplied to the second conductivity type semiconductor layer 413. Therefore, light may be generated in the light-emitting structure 410 by the power applied between the first conductivity type semiconductor layer 411 and the second conductivity type semiconductor layer 413.

According to an embodiment, the driving of the transistor 430 is controlled by the power applied to the second bonding pad 473 and the third bonding pad 475. In addition, power supply to the second electrode 422 may be controlled by the control of the transistor 430. Therefore, the light emission in the light-emitting structure 410 may be controlled by the power applied to the first bonding pad 471 and the power applied to the second electrode 422. The transistor 430 may be controlled by the powers applied to the first bonding pad 471, the second bonding pad 473, and the third bonding pad 475, and the light emission in the light-emitting structure 410 may be controlled.

As described above, the semiconductor device according to the embodiment may control the light emission of the light-emitting structure 410 through the control of the transistor 430. According to an embodiment, since whether to cause the light-emitting structure 410 to emit light by using the control of the transistor 430 can be controlled, it is possible to more accurately control whether to cause the light-emitting structure 410 to emit light, thereby more easily implementing the control of the light emission time and the light emission interval.

In addition, the transistor 430 is disposed on the light-emitting structure 410, thereby maximizing the size of the active layer 412. If the transistor 430 is disposed at or near the side surface of the active layer 412, the size of the active layer 412 may be reduced as much as the size of the transistor 430. However, according to an embodiment, the transistor 430 is disposed on the active layer 412, thereby preventing the area of the active layer 412 from being reduced. Since an amount of light generated in the light-emitting structure 410 is affected by the area of the active layer 412, an amount of light generated in the active layer 412 increases, thereby improving the light extraction efficiency and the luminance as a whole.

Meanwhile, the case of the semiconductor device in which one light-emitting structure 410 and one transistor 430 are provided is illustrated in FIGS. 34a and 34b but the semiconductor device according to an embodiment may include a plurality of light-emitting structures and a plurality of transistors. When the plurality of transistors are provided, the plurality of transistors may be connected in parallel or in series according to a circuit design. Therefore, the degree of freedom of the circuit design can be increased, and the degree of light emitted in the plurality of light-emitting structures can be effectively controlled according to necessity. In addition, the semiconductor device according to an embodiment may include a plurality of light-emitting structures, and the plurality of light-emitting structures may be implemented to emit light of different wavelength bands. Therefore, the semiconductor device according to an embodiment may selectively or independently control the light emission in the plurality of light-emitting structures having different wavelength bands through the control of the plurality of transistors.

The semiconductor device described above may be implemented to emit light of various wavelength bands according to the selection of the active layer. For example, it is possible to implement a display panel or a display apparatus in which one color pixel is constituted by using the blue semiconductor device, the green semiconductor device, and the red semiconductor device described above. The semiconductor device according to an embodiment may be applied to various fields requiring a light source. The semiconductor device according to an embodiment may be applied to, for example, an electronic sign board, a large-size display apparatus, and a signage, thereby implementing a high-resolution light source. In addition, the semiconductor device according to an embodiment may be applied to a communication device. For example, the semiconductor device according to an embodiment may be applied to a visible light communication (VLC), light WiFi (LiFi), or the like which transmits data by using light.

Figure 35:
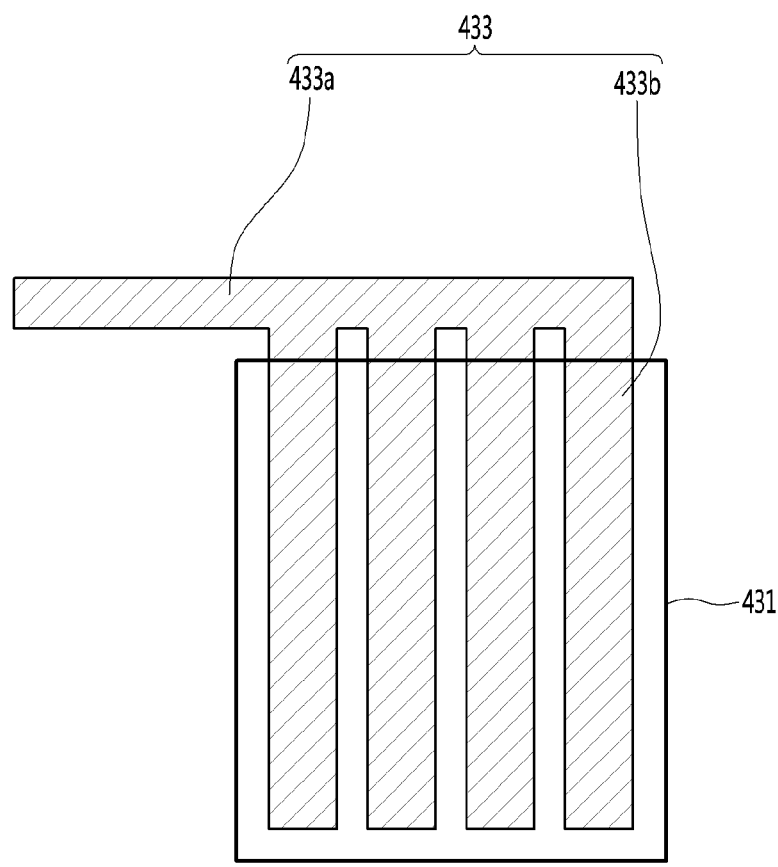
FIG. 35 is a view conceptually illustrating an example of a gate electrode applied to the semiconductor device illustrated in FIGS. 34a and 34b.
Figure 36:
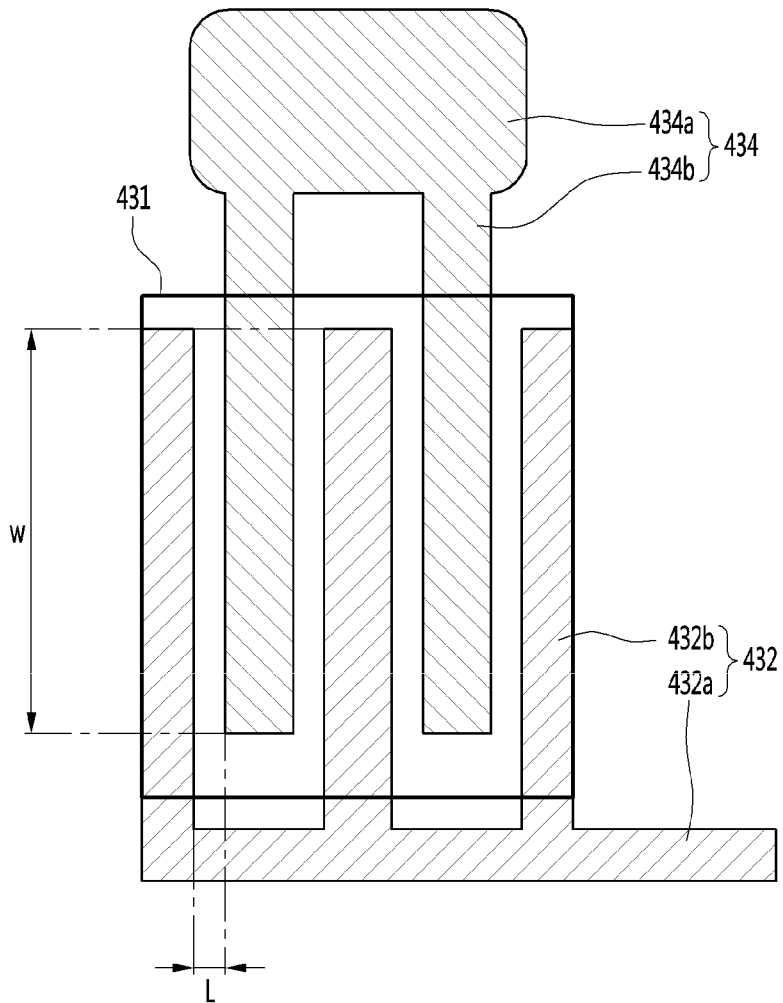
FIG. 36 is a view conceptually illustrating an example of a source electrode and a drain electrode applied to the semiconductor device illustrated in FIGS. 34a and 34b.

Meanwhile, FIG. 35 is a view conceptually illustrating an example of a gate electrode applied to the semiconductor device illustrated in FIGS. 34a and 34b and FIG. 36 is a view conceptually illustrating an example of a source electrode and a drain electrode applied to the semiconductor device illustrated in FIGS. 34a and 34b.

In the semiconductor device according to an embodiment, the gate electrode 433 may include a gate body electrode 433a and a gate branch electrode 433b as illustrated in FIGS. 34a, 34b and 35. The gate branch electrode 433b may be provided in plurality. The gate branch electrode 433b may extend from the gate body electrode 433a The plurality of gate branch electrodes 433b may extend in parallel. The plurality of gate branch electrodes 433b may be disposed spaced apart from each other. The gate electrode 433 may be disposed to overlap the semiconductor layer 431 in a vertical direction. For example, the gate branch electrode 433b of the gate electrode 433 may be disposed to overlap the semiconductor layer 431 in a vertical direction.

In addition, in the semiconductor device according to an embodiment, the source electrode 432 may include a source body electrode 432a and a source branch electrode 433b as illustrated in FIGS. 34a, 34b and 36. The source branch electrode 432b may be provided in plurality. The source branch electrode 432b may extend from the source body electrode 432a The plurality of source branch electrodes 432b may extend in parallel. The plurality of source branch electrodes 432b may be disposed spaced apart from each other. The source electrode 432 may be disposed to overlap the semiconductor layer 431 in a vertical direction. For example, the source branch electrode 432b of the source electrode 432 may be disposed to overlap the semiconductor layer 431 in a vertical direction.

In addition, in the semiconductor device according to an embodiment, the drain electrode 434 may include a drain body electrode 434a and a drain branch electrode 434b as illustrated in FIGS. 34a, 34b and 36. The drain branch electrode 434b may be provided in plurality. The drain branch electrode 434b may extend from the drain body electrode 434a The plurality of drain branch electrodes 434b may extend in parallel. The plurality of drain branch electrodes 434b may be disposed spaced apart from each other. The drain electrode 434 may be disposed to overlap the semiconductor layer 431 in a vertical direction. For example, the drain branch electrode 434b of the drain electrode 434 may be disposed to overlap the semiconductor layer 431 in a vertical direction.

The plurality of source branch electrodes 432b and the plurality of drain branch electrodes 434b may be alternatively disposed. The source branch electrode 432b may be disposed between the drain branch electrodes 434b. The drain branch electrode 434b may be disposed between the source branch electrodes 432b. The plurality of source branch electrodes 432b and the plurality of drain branch electrodes 434b may be alternatively disposed on the semiconductor layer 431 to provide a plurality of channels. The plurality of source branch electrodes 432b and the plurality of drain branch electrodes 434b may be disposed to overlap each other on the semiconductor layer 431 in a horizontal direction. A channel may be provided in the overlapping region in the horizontal direction on the semiconductor layer 431 between the plurality of source branch electrodes 432b and the plurality of drain branch electrodes 434b.

For example, as illustrated in FIG. 36, three source branch electrodes 432b may be provided, and two drain branch electrodes 434b may be provided. The two drain branch electrodes 434b may be disposed between the three source branch electrodes 432b. The three source branch electrodes 432b and the two drain branch electrodes 434b may be disposed on the semiconductor layer 431. The three source branch electrodes 432b and the two drain branch electrodes 434b may provide four channels. At this time, each channel may have a channel length L that is a distance from the source branch electrode 432b to the drain branch electrode 434b. In addition, each channel may have a channel width W in which the source branch electrode 432b and the drain branch electrode 434b are disposed to overlap each other in a horizontal direction.

According to an embodiment, as illustrated in FIG. 35, the gate electrode 433 may be provided for controlling a current flow in the channel provided between the source branch electrode 432b and the drain branch electrode 434b. For example, the gate electrode 433 may include four gate branch electrodes 433b. The plurality of gate branch electrodes 433b may be overlapped in a vertical direction to the plurality of channels provided by the plurality of source branch electrodes 432b and the plurality of drain branch electrodes 434b. The width of the gate branch electrode 433b may be larger than the channel length L. The gate branch electrode 433b may be overlapped in a vertical direction to a partial region of the source branch electrode 432b and a partial region of the drain branch electrode 434b.

Meanwhile, the case where the gate electrode 434b. includes the plurality of gate branch electrodes 433b is illustrated in FIG. 35, but the gate electrode 433 may be provided in a vertical direction to a channel region provided between the source electrode 432 and the drain electrode 434 without branched electrodes, such that the current flow between the source electrode 432 and the drain electrode 434 can be controlled. The comparison between the case where the gate electrode 433 has the branch electrode and the case where the gate electrode 433 does not have the branch electrode will be additionally described later.

In the semiconductor device according to an embodiment, the gate electrode 433 may include a gate body electrode 433a and a gate branch electrode 433b as illustrated in FIGS. 34a and 34b. The gate body electrode 433a may be provided in plurality. For example, the third bonding pad 475 may be electrically connected to the gate body electrode 433a through the third bonding pad contact hole 475h. The third bonding pad 475 may directly contact the upper surface of the gate body electrode 433a through the third bonding pad contact hole 475h. The case where the third bonding pad contact hole 475h is provided on the gate body electrode 433a is illustrated in FIGS. 34a and 34b but the third bonding pad contact hole 475h may be provided on the gate branch electrode 433b. At this time, the third bonding pad 475 may be connected to the upper surface of the gate branch electrode 433b through the third bonding pad contact hole 475h.

In addition, the source electrode 432 may include a source body electrode 432a and a source branch electrode 432b. The source branch electrode 432b may be provided in plurality. For example, the second bonding pad 473 may be electrically connected to the source branch electrode 432b through the second bonding pad contact hole 473h. The second bonding pad 473 may directly contact the upper surface of the source branch electrode 432b through the second bonding pad contact hole 473h. The case where the second bonding pad contact hole 473h is provided on the source branch electrode 432b is illustrated in FIGS. 34a and 34b but the second bonding pad contact hole 473h may be provided on the source body electrode 432b. At this time, the second bonding pad 473 may directly contact the upper surface of the source body electrode 432a through the second bonding pad contact hole 473h. In addition, the second bonding pad contact hole 473h may be provided on the branch electrode disposed in the center among the plurality of source branch electrodes 432b, and may be disposed on the branch electrode disposed at the outside.

In addition, the drain electrode 434 may include a drain body electrode 434a and a drain branch electrode 434b. The drain branch electrode 434b may be provided in plurality. For example, the drain electrode 434 may be electrically connected to the second electrode 422 through the drain contact hole 434h. The drain body electrode 434a may directly contact the upper surface of the second electrode 422 through the drain contact hole 434h. The case where the drain contact hole 434h is provided under the drain body electrode 434a is illustrated in FIGS. 34a and 34b but the drain contact hole 434h may be provided under the drain branch electrode 434b. At this time, the drain branch electrode 434b may directly contact the upper surface of the second electrode 422 through the drain contact hole 434h.

According to an embodiment, the number of the source branch electrodes 432b, the number of the gate branch electrodes 433b, and the number of the drain branch electrodes 434b may be variously changed according to the size of the semiconductor device and the design purpose of the semiconductor device.

Figure 37:
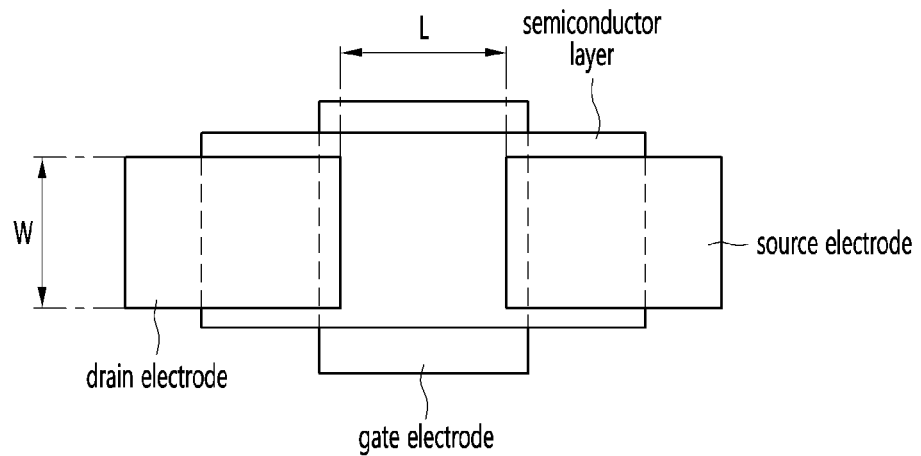
FIG. 37 is a view describing a current gain of a general transistor.
Figure 38:
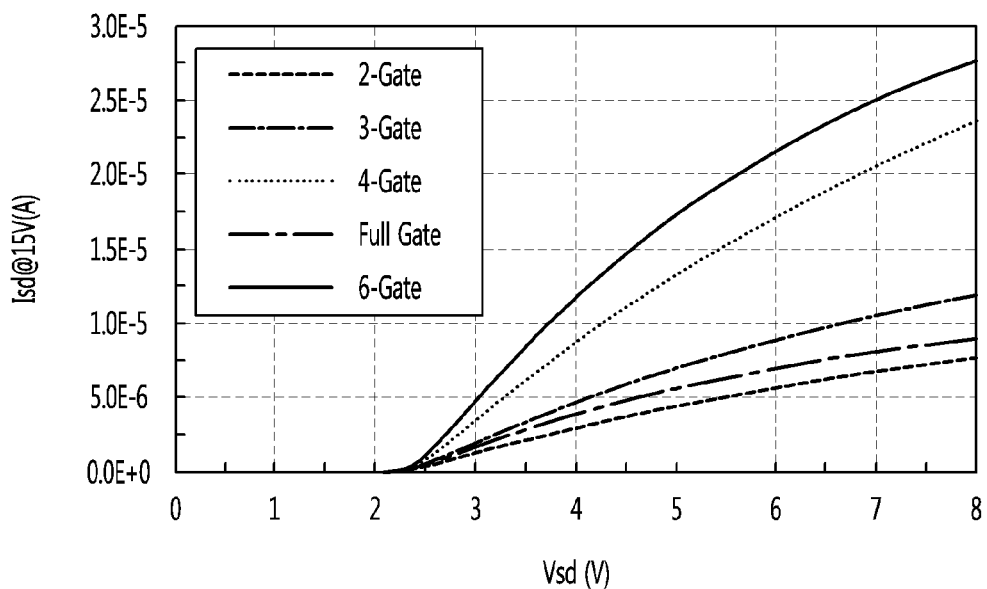
FIG. 38 is a graph showing a voltage-current change between a source electrode and a drain electrode according to the branch electrode number of a gate electrode in the semiconductor device illustrated in FIGS. 34a and 34b.

An effect difference of the transistor according to the structural change in the gate electrode, the source electrode, and the drain electrode will be described with reference to FIGS. 37 and 38. FIG. 37 is a view describing a current gain of a general transistor, and FIG. 38 is a graph showing a voltage-current change between a source electrode and a drain electrode according to the branch electrode number of a gate electrode in the semiconductor device illustrated in FIGS. 34a and 34b.

As illustrated in FIG. 37, the general transistor may include a semiconductor layer, a gate electrode, a source electrode, and a drain electrode. A channel may be provided between the source electrode and the drain electrode, and the source may have a channel width W and a channel length L from the source electrode to the drain electrode.

It is known that in the transistor having the structure illustrated in FIG. 37, a current Id flowing between the source electrode and the drain electrode is proportional to a current gain K. The current gain may be expressed by the following equation.

$$K = (½)\mu_{eff} Cg (W/L)$$

$\mu_{eff}$: field effect mobility
Cg: gate electrostatic capacitance per unit area The embodiment is a method for increasing the ratio W/L of the channel width W to the channel length L so as to increase the current gain K, and a method for changing a connection structure between the source electrode and the drain electrode was considered. That is, according to an embodiment, as described with reference to FIG. 36, the source electrode 432 may include a source body electrode 432a and a plurality of source branch electrodes 432b, and the drain electrode 434 may include a drain body electrode 434a and a plurality of drain branch electrodes 434b.

For example, the transistor having the structure illustrated in FIG. 36 may include three source branch electrodes 432b, two drain branch electrodes 434b, and four channels. Each channel may be provided between the source branch electrode 432b and the drain branch electrode 434b. Each channel may have a channel width W and a channel length L.

Meanwhile, as descried with reference to FIG. 35, the gate electrode 433 for controlling the current flow in the channel layer may include a gate body electrode 433a and a plurality of gate branch electrodes 433b. The number of the plurality of gate branch electrodes 433b may correspond to the number of the channels. The gate electrode 433 illustrated in FIG. 35 may include four gate branch electrodes 433b corresponding to four channels.

Table 1 shows data according to the structural change in the gate electrode, the source electrode, and the drain electrode in the transistor according to an embodiment.

TABLE 1

| Number of gate branch electrodes | Number of channels (n) | Current density | (W/L) *n | SD current (mA) | Line width ratio | Current density ratio | (line width ratio)* (current density ratio) |
|---|---|---|---|---|---|---|---|
| 2 Gate | 2 | 0.000286 | 28 | 5.65E−06 | 1.00 | 1.00 | 1.0 |
| 3 Gate | 3 | 0.000317 | 42 | 8.88E−06 | 1.50 | 1.11 | 1.7 |
| 4 Gate | 4 | 0.000397 | 56 | 1.71E−05 | 2.00 | 1.39 | 2.8 |
| Full Gate | 4 | 0.000219 | 48 | 6.96E−06 | 1.71 | 0.77 | 1.3 |
| 6 Gate | 6 | 0.000103 | 216 | 2.16E−05 | 7.71 | 0.36 | 2.8 |

In the transistor of the "2 gate" structure, the transistor of the "3 gate" structure, and the transistor of the "4 gate" structure shown in Table 1, the gate electrode, the source electrode, and the drain electrode may be provided similarly to the structures illustrated in FIGS. 35 and 36. The transistor of the "2 gate" structure may include two gate branch electrodes, and two channels are provided between the source branch electrode and the drain branch electrode. The transistor of the "3 gate" structure may include three gate branch electrodes, and three channels are provided between the source branch electrode and the drain branch electrode. The transistor of the "4 gate" structure may include four gate branch electrodes, and four channels are provided between the source branch electrode and the drain branch electrode. The transistor of the "2 gate" structure, the transistor of the "3 gate" structure, and the transistor of the "4 gate" structure may have the same channel width W and the same channel length L. For example, data about the case where the ratio W/L of the channel width W to the channel length L is 14 was extracted. The line width ratio and the current density ratio are relative values based on the "2 gate" structure. The current density is a density of a current applied to the semiconductor layer.

FIG. 38 is a graph showing a source-drain current with respect to a voltage difference between the source electrode and the drain electrode when 15 V is applied to the gate electrode in the transistor of each structure shown in Table 1. As illustrated in Table 1 and FIG. 38, it can be seen that the source-drain current with respect to the same source-drain voltage is increased from the "2 gate" structure to the "4 gate" structure.

The transistor of the "full gate" structure shown in Table 1 includes four channels and the case where the gate electrode does not include the branch electrode is shown. For example, for the transistor of the "full gate" structure, data about the case where the ratio W/L of the channel width W to the channel length L is 12 was extracted. Meanwhile, in the transistor of the "full gate" structure, the value of "(W/L)*n" expected to influence the current gain is a value between the "3 gate" structure and the "4 gate" structure, but as illustrated in FIG. 38, it can be confirmed that the source-drain current value has a value between the "2 gate" structure and the "3 gate" structure. According to the extracted data, when the structure of the channel is complicated like the branch structure connected from the branch electrodes, it is confirmed that it is influenced by the channel length L, the channel width W, the number n of channels, and the current density. When the structure of the channel is complicated like the branch structure connected from the branch electrodes, it is necessary to consider the value of "line width ratio current density ratio" in estimating the source-drain current value.

The transistor of the "6 gate" structure shown in Table 1 may include four gate branch electrodes, and sixth channels are provided between the source branch electrode and the drain branch electrode. For example, for the transistor of the "6 gate" structure, data about the case where the ratio W/L of the channel width W to the channel length L is 36 was extracted. As illustrated in Table 1 and FIG. 38, it can be seen that the source-drain current with respect to the same source-drain voltage is more increased in the transistor of the "6 gate" structure than the transistors of other structures.

The structure of the gate electrode, the source electrode, and the drain structure described with reference to FIGS. 35 to 38 is not limited to the semiconductor device described with reference to FIGS. 34a and 34b but may be applied to any semiconductor devices according to the embodiments. That is, the semiconductor device described with reference to FIGS. 1 to 34a and 34b may include a source electrode having branch electrodes and a drain electrode having branch electrodes. In addition, the semiconductor device described with reference to FIGS. 1 to 34a and 34b may include a gate electrode having branch electrodes.

An example of a method for manufacturing the semiconductor device illustrated in FIGS. 34a and 34b will be described with reference to the accompanying drawings. In describing the semiconductor device manufacturing method according to the embodiment with reference to the accompanying drawings, the description redundant to the matters described above will be omitted.

Figure 39A:
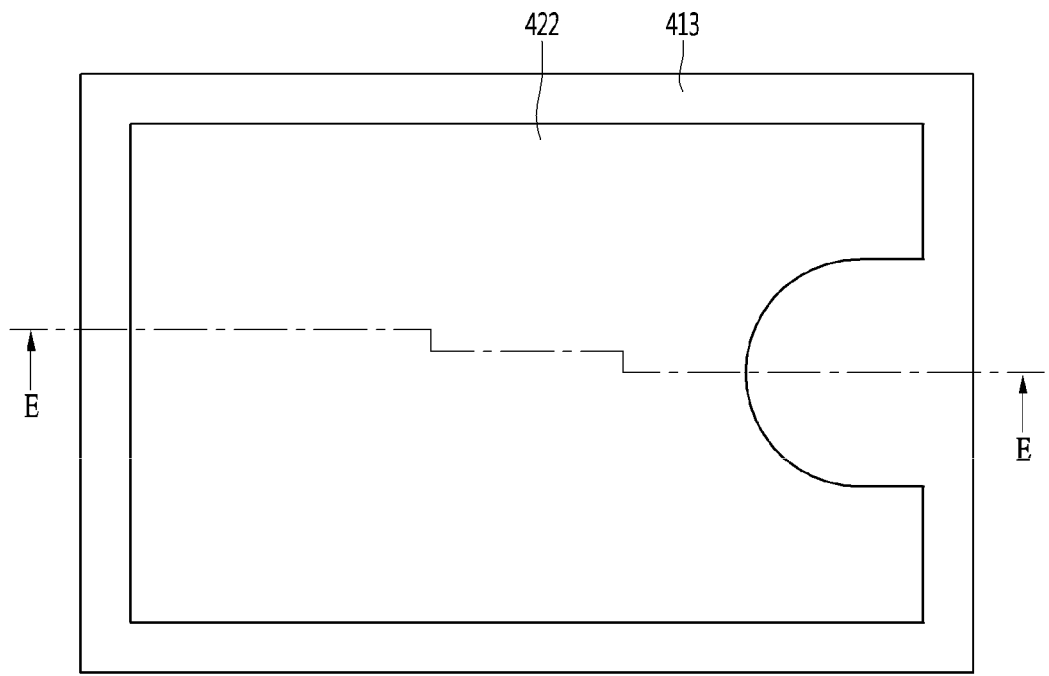
FIGS. 39a and 39b are respectively a plan view and a cross-sectional view illustrating an example in which a light-emitting structure and a second electrode are formed by the semiconductor device manufacturing method according to an embodiment of the present invention.
Figure 39B:
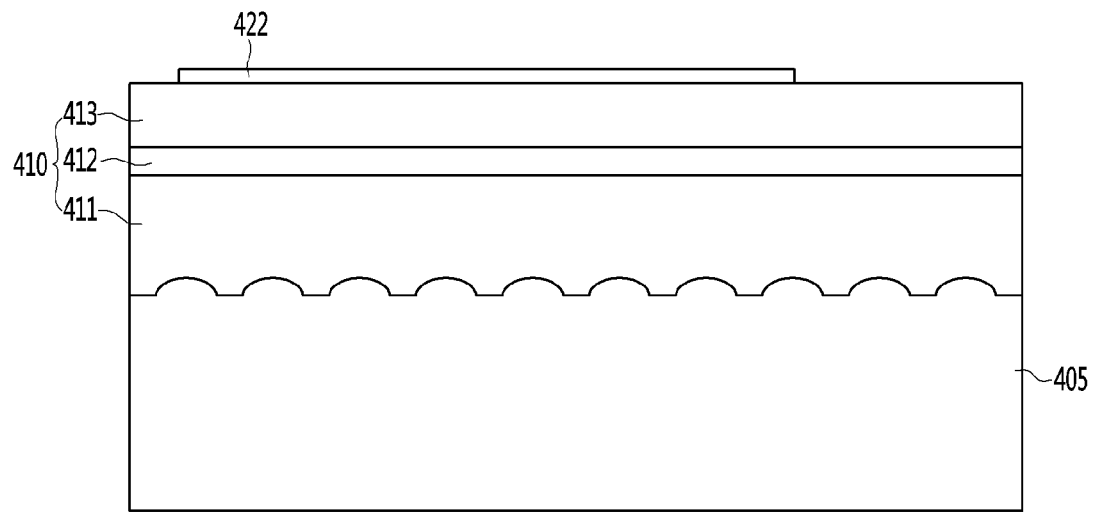

FIGS. 39a and 39b are respectively a plan view and a cross-sectional view illustrating an example in which the light-emitting structure and the second electrode are formed by the semiconductor device manufacturing method according to an embodiment of the present invention. FIG. 39b is a cross-sectional view taken along line E-E of the plan view illustrated in FIG. 39a.

According to the semiconductor device manufacturing method according to an embodiment, a light-emitting structure 410 may be formed on a substrate 405 as illustrated in FIGS. 39a and 39b. For example, the light-emitting structure 410 may be grown on the substrate 405. The light-emitting structure 410 may include a first conductivity type semiconductor layer 411, an active layer 412, and a second conductivity type semiconductor layer 413.

For example, the first conductivity type semiconductor layer 411 may be formed as an n-type semiconductor layer in which an n-type dopant is added as a first conductive dopant, and the second conductivity type semiconductor layer 413 may be formed as a p-type semiconductor layer in which a p-type dopant is added as a second conductive dopant. In addition, on the contrary, the first conductivity type semiconductor layer 411 may be formed as a p-type semiconductor layer, and the second conductivity type semiconductor layer 413 may be formed as an n-type semiconductor layer. Hereinafter, a case where the first conductivity type semiconductor layer 411 is provided as an n-type semiconductor layer and the second conductivity type semiconductor layer 413 is provided as a p-type semiconductor layer will be described.

In the light-emitting structure 410, a wavelength band of generated light may be changed according to a material constituting the active layer 412. The selection of materials constituting the first conductivity type semiconductor layer 411 and the second conductivity type semiconductor layer 413 may be changed according to the material constituting the active layer 412. The light-emitting structure 410 may be implemented by compound semiconductor. The light-emitting structure 410 may be implemented by, for example, a group II-VI compound semiconductor or a group III-V compound semiconductor. For example, the light-emitting structure 410 may be implemented by including at least two elements selected from the group consisting of aluminum (Al), gallium (Ga), indium (In), Phosphorus (P), arsenic (As), and nitrogen (N).

The active layer 412 is a layer in which electrons (or holes) injected through the first conductivity type semiconductor layer 411 and holes (or electrons) injected through the second conductivity type semiconductor layer 413 recombine with each other and light is emitted by a band gap difference between energy bands according to a forming material of the active layer 412. The active layer 412 may be formed to have one of a single well structure, a multiple well structure, a quantum dot structure, or a quantum wire structure. The active layer 412 may be implemented by compound semiconductor. The active layer 412 may be implemented by, for example, a group II-VI compound semiconductor or a group III-V compound semiconductor.

When light of a blue wavelength band or a green wavelength band is generated in the active layer 412, the active layer 412 may be implemented by, for example, a semiconductor material having a formula of $In_xAl_yGa_{1-x-y}N$ $0 \le x \le 1$, $0 \le y \le 1$, $0 \le x+y \le 1$). When the active layer 412 is implemented by a multi well structure, the active layer 412 may be implemented by stacking a plurality of well layers and a plurality of barrier layers. In addition, when light of a red wavelength band is generated in the active layer 412, the active layer 412 may be implemented by, for example, a semiconductor material having a formula of $(Al_xGa_{1-x})_yIn_{1-y}P$ ($0 \le x \le 1$, $0 \le y \le 1$). The active layer 412 may be selected from, for example, AlGaInP, AlInP, GaP, and GaInP.

The first conductivity type semiconductor layer 411 may include, for example, an n-type semiconductor layer. The first conductivity type semiconductor layer 411 may be implemented by compound semiconductor. The first conductivity type semiconductor layer 411 may be implemented by, for example, a group II-VI compound semiconductor or a group III-V compound semiconductor. For example, when light of a blue wavelength band or a green wavelength band is generated in the active layer 412, the first conductivity type semiconductor layer 411 may be implemented by, for example, a semiconductor material having a formula of $In_xAl_yGa_{1-x-y}N$ ($0 \le x \le 1$, $0 \le y \le 1$, $0 \le x+y \le 1$). In addition, when light of a red wavelength band is generated in the active layer 412, the first conductivity type semiconductor layer 411 may be implemented by, for example, a semiconductor material having a formula of $(Al_xGa_{1-x})_yIn_{1-y}P$ ($0 \le x \le 1$, $0 \le y \le 1$). In the first conductivity type semiconductor layer 411, y may have a value of 0.5 and x may have a value of 0.5 to 0.8 in the formula. The first conductivity type semiconductor layer 411 may be selected from the group consisting of GaN, AlN, AlGaN, InGaN, InN, InAlGaN, AlInN, AlGaAs, GaP, GaAs, GaAsP, AlGaInP, AlInP, and GaInP, and an n-type dopant such as Si, Ge, Sn, Se, or Te may be doped.

The second conductivity type semiconductor layer 413 may be implemented by compound semiconductor. The second conductivity type semiconductor layer 413 may be implemented by, for example, a group II-VI compound semiconductor or a group III-V compound semiconductor. For example, when light of a blue wavelength band or a green wavelength band is generated in the active layer 412, the second conductivity type semiconductor layer 413 may be implemented by, for example, a semiconductor material having a formula of $InAl_yGa_{1-x-y}N$ ($0 \le x \le 1$, $0 \le y \le 1$, $0 \le x+y \le 1$). In addition, when light of a red wavelength band is generated in the active layer 412, the second conductivity type semiconductor layer 413 may be implemented by, for example, a semiconductor material having a formula of $(Al_xGa_{1-x})_yIn_{1-y}P$ ($0 \le x \le 1$, $0 \le y \le 1$). The second conductivity type semiconductor layer 413 may be selected from the group consisting of GaN, AlN, AlGaN, InGaN, InN, InAlGaN, AlInN, AlGaAs, GaP, GaAs, GaAsP, AlGaInP, AlInP, and GaInP, and a p-type dopant such as Mg, Zn, Ca, Sr, or Ba may be doped.

For example, the substrate 405 may be a growth substrate on which the light-emitting structure 410 can be grown. For example, an uneven structure may be provided on the upper surface of the substrate 405. The uneven structure provided in the substrate 405 may reduce defects during the growth of the light-emitting structure 410, may improve crystal quality, and may reflect light emitted from the active layer 412 so as to improve the luminescent efficiency. For example, the substrate 405 may include at least one selected from a sapphire ($Al_2O_3$) substrate, SiC, GaAs, GaN, ZnO, Si, GaP, InP, and Ge.

A second electrode 422 may be formed on the light-emitting structure 410. The second electrode 422 may be disposed on the second conductivity type semiconductor layer 413. The second electrode 422 may be disposed on a partial region of the upper surface of the second conductivity type semiconductor layer 413.

For example, the second electrode 422 may include a material that ohmic-contacts the second conductivity type semiconductor layer 413. For example, the second electrode 422 may include a transparent conductive oxide. For example, the second electrode 422 may include at least one material selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

Figure 40A:
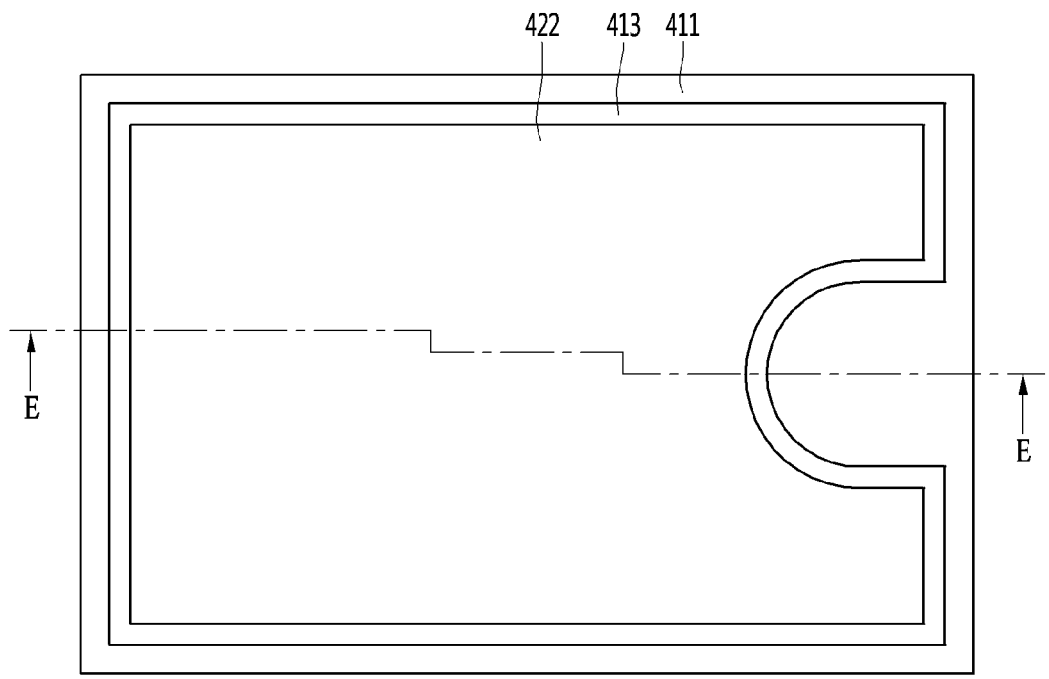
FIGS. 40a and 40b are respectively a plan view and a cross-sectional view illustrating an example in which a partial region of the light-emitting structure is etched by the semiconductor device manufacturing method according to an embodiment of the present invention.
Figure 40B:
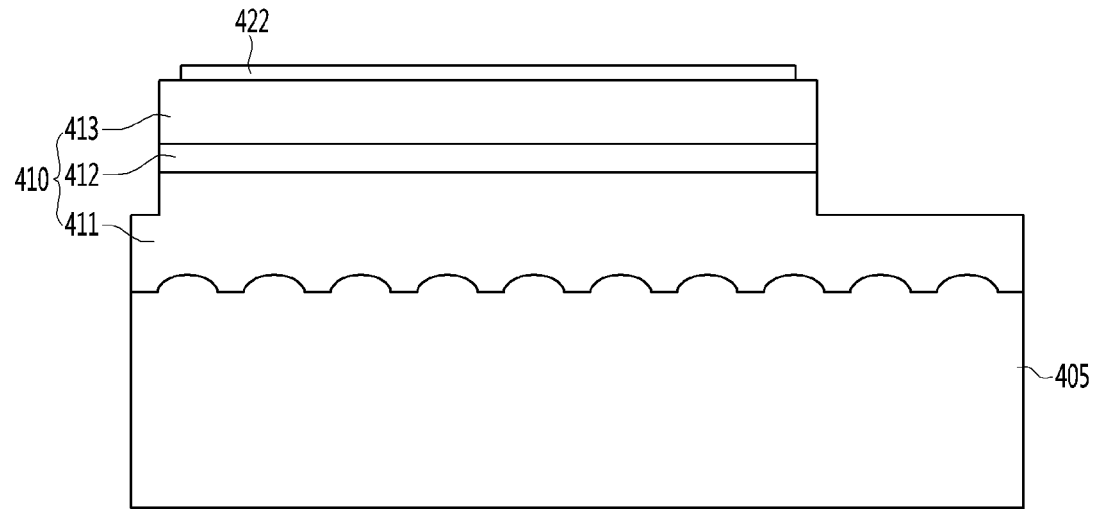

Next, as illustrated in FIGS. 40a and 40b, a part of the upper surface of the first conductivity type semiconductor layer 411 may be exposed through a process of etching the light-emitting structure 410.

FIGS. 40a and 40b are respectively a plan view and a cross-sectional view illustrating an example in which a partial region of the light-emitting structure is etched by the semiconductor device manufacturing method according to an embodiment of the present invention. FIG. 40b is a cross-sectional view taken along line E-E of the plan view illustrated in FIG. 40a.

A part of the upper surface of the first conductivity type semiconductor layer 411 may be exposed through a process of etching a partial region of the first conductivity type semiconductor layer 411 and a partial region of the active layer 412. At this time, a partial region of the first conductivity type semiconductor layer 411 may also be etched, and the first conductivity type semiconductor layer 411 may be provided as a stepped structure having different thicknesses according to a region.

Figure 41A:
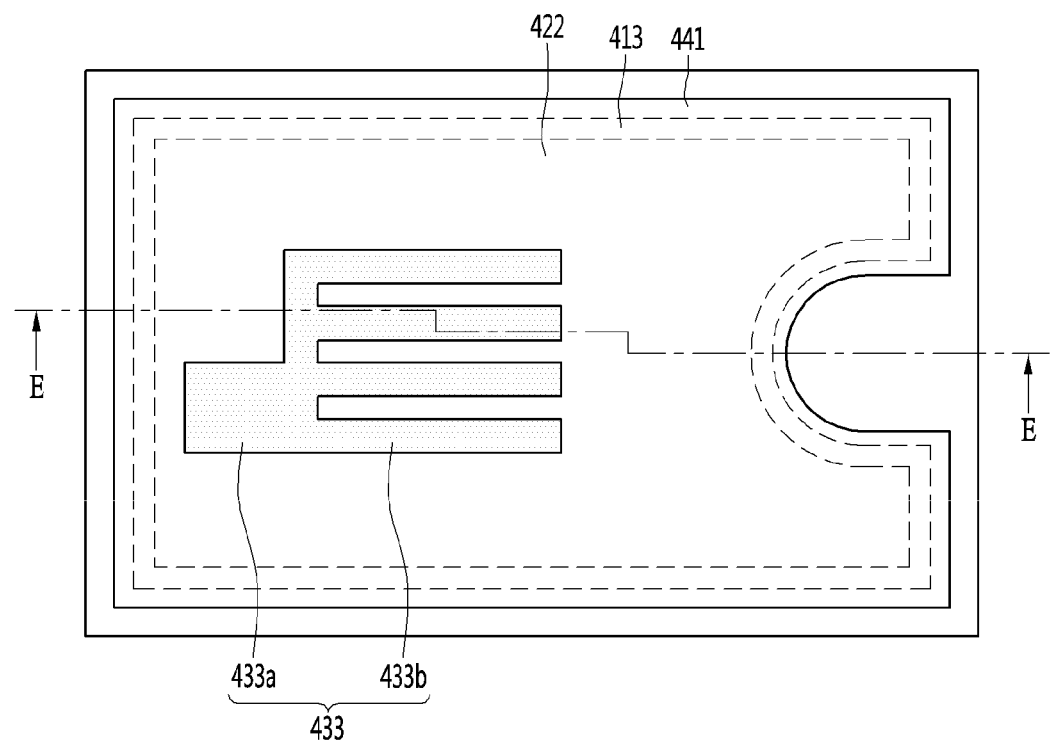
FIGS. 41a and 41b are respectively a plan view and a cross-sectional view illustrating an example in which a first insulating layer and a gate electrode are formed by the semiconductor device manufacturing method according to an embodiment of the present invention.
Figure 41B:
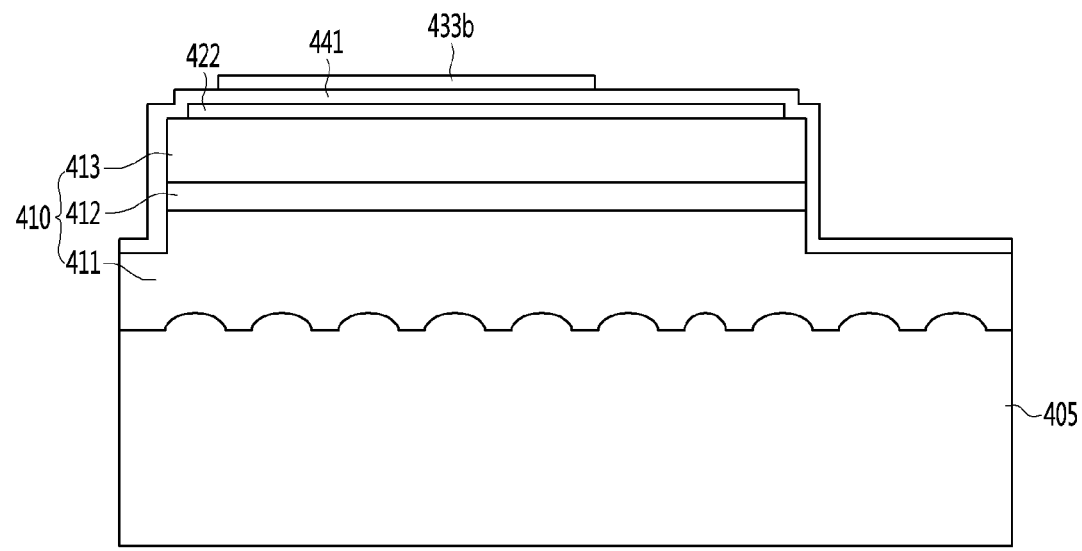

Next, as illustrated in FIGS. 41a and 41b, a first insulating layer 441 may be formed on the light-emitting structure 410.

FIGS. 41a and 41b are respectively a plan view and a cross-sectional view illustrating an example in which the first insulating layer and the gate electrode are formed by the semiconductor device manufacturing method according to an embodiment of the present invention. FIG. 41b is a cross-sectional view taken along line E-E of the plan view illustrated in FIG. 41a.

The first insulating layer 441 may be disposed on the second conductivity type semiconductor layer 413. The first insulating layer 441 may be disposed on the second electrode 422.

For example, the first insulating layer 441 may include an insulating material. The first insulating layer 441, as an example, may include oxide or nitride. The first insulating layer 441 may include silicon-based oxide or silicon-based nitride. The first insulating layer 441 may include metal oxide. For example, the first insulating layer 441 may include at least one selected from $SiO_2$, $SiN_x$, $Al_2O_3$, and the like. The first insulating layer 441 may include metal oxide including $TiO_2$.

The first insulating layer 441 may be provided as a plurality of layers having different refractive indices. For example, the first insulating layer 441 may be formed by stacking a first layer having a first refractive index and a second layer having a second refractive index as one pair, and may be formed by sequentially stacking a plurality of pairs. Therefore, the first insulating layer 441 may be provided as a distributed Bragg reflector (DBR) layer and reflects light incident from the light-emitting structure 410. As one example, the first insulating layer 441 may be provided by stacking a plurality of pairs each including a $SiO_2$ layer and a $TiO_2$ layer as one pair.

Next, as illustrated in FIGS. 41a and 41b, a gate electrode 433 may be formed on the first insulating layer 441. The gate electrode 433 may include a gate body electrode 433a and a gate branch electrode 433b. The gate branch electrode 433b may be provided in plurality. The gate branch electrode 433b may extend from the gate body electrode 433a The plurality of gate branch electrodes 433b may extend in parallel. The plurality of gate branch electrodes 433b may be disposed spaced apart from each other.

The gate electrode 433 may include a single layer or a multi-layer including at least one selected from Cr, Ni, Ti, Ge, Zn, Mg, Ca, Al, Ag, Rh, W, Pt, Au, AuGe, and AuGe/Ni/Au.

Figure 42A:
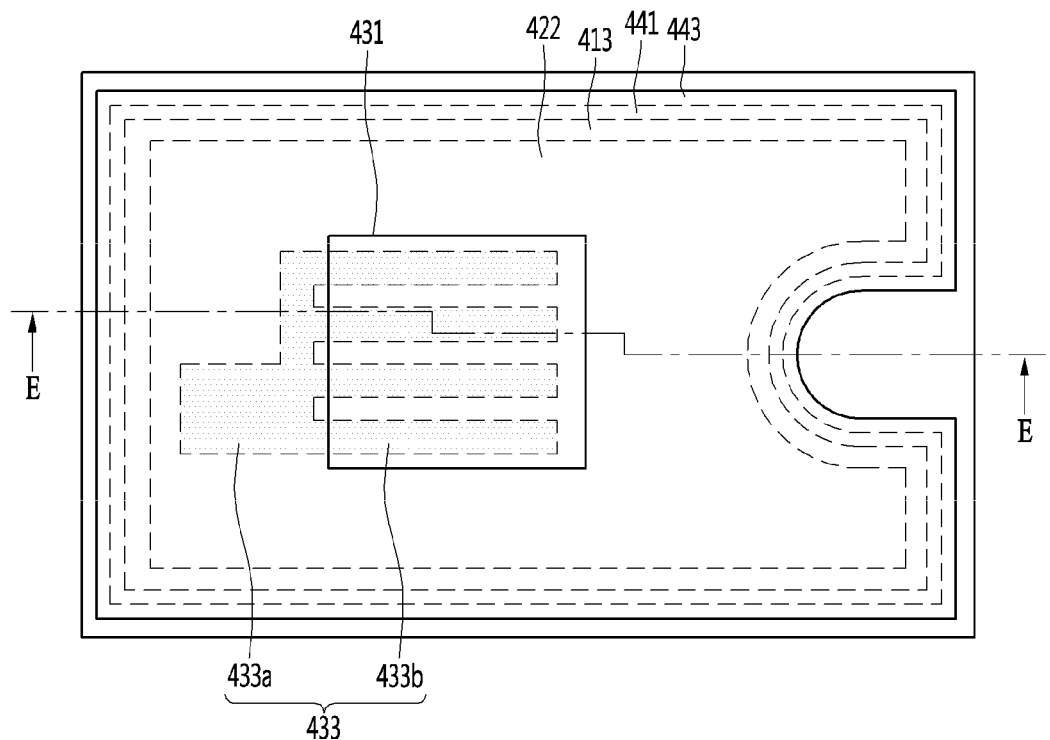
FIGS. 42a and 42b are respectively a plan view and a cross-sectional view illustrating an example in which a semiconductor layer is formed by the semiconductor device manufacturing method according to an embodiment of the present invention.
Figure 42B:
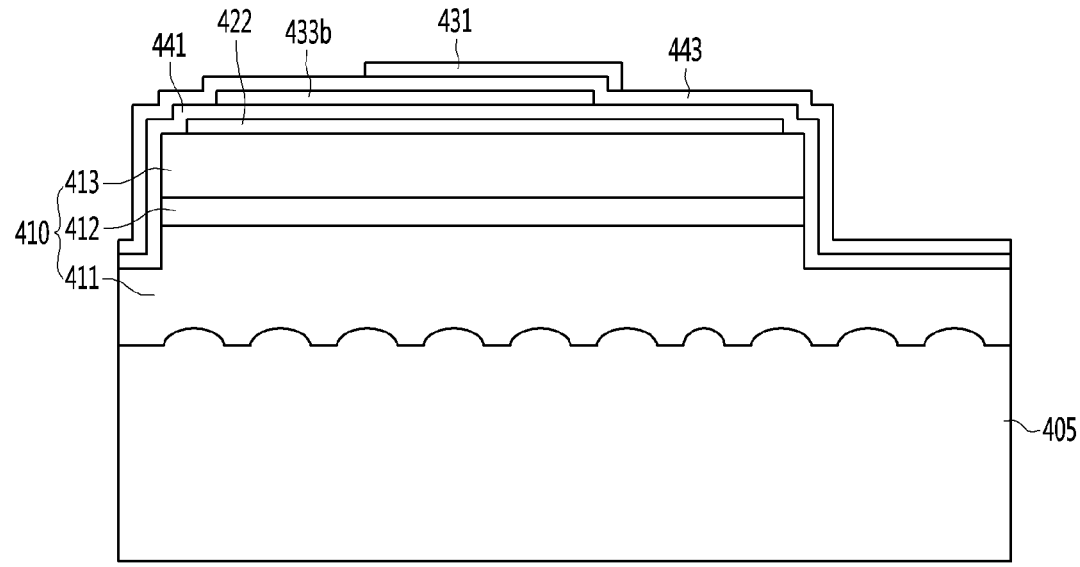

Next, as illustrated in FIGS. 42a and 42b, a second insulating layer 433 and a semiconductor layer 431 may be formed on the gate electrode 433.

FIGS. 42a and 42b are respectively a plan view and a cross-sectional view illustrating an example in which the second insulating layer and the semiconductor layer are formed by the semiconductor device manufacturing method according to an embodiment of the present invention. FIG. 42b is a cross-sectional view taken along line E-E of the plan view illustrated in FIG. 42a.

The second insulating layer 443 may be provided on the light-emitting structure 410. The second insulating layer 443 may be disposed on the upper surface and the side surface of the light-emitting structure 410.

For example, the second insulating layer 443 may include an insulating material. The second insulating layer 443 may include oxide, nitride, or an organic material. For example, the second insulating layer 443 may include at least one selected from $SiO_2$, $SiN_x$, $Al_2O_3$, and the like.

Next, as illustrated in FIGS. 42a and 42b, a semiconductor layer 431 may be formed on the second insulating layer 443. The semiconductor layer 431 may be disposed in a partial region of the upper surface of the second insulating layer 443. For example, the semiconductor layer 431 may be disposed on the second insulating layer 443 to overlap the second electrode 422 in a vertical direction. The semiconductor layer 431 may be disposed on the second insulating layer 443 to overlap the gate electrode 433 in a vertical direction. The semiconductor layer 431 may be disposed on the second insulating layer 443 to overlap the gate branch electrode 433b in a vertical direction.

The semiconductor layer 431 may be formed of, for example, a material different from the material forming the light-emitting structure 410. For example, the semiconductor layer 431 may include a material selected from the group consisting of amorphous silicon, polycrystalline silicon, single crystal silicon, and oxide semiconductor. The material constituting the semiconductor layer 431 may be selected from materials that can be formed at a lower temperature than a forming temperature of the light-emitting structure 410. Therefore, even when the semiconductor layer 431 is formed after the light-emitting structure 410 is formed, it does not influence the physical properties of the light-emitting structure 410, and it is possible to prevent the light extraction efficiency of the light-emitting structure 410 from being reduced. Examples of the oxide semiconductor may be selected from the group consisting of indium gallium zinc oxide (IGZO), indium gallium oxide (IGO), and indium zinc oxide (IZO).

Figure 43A:
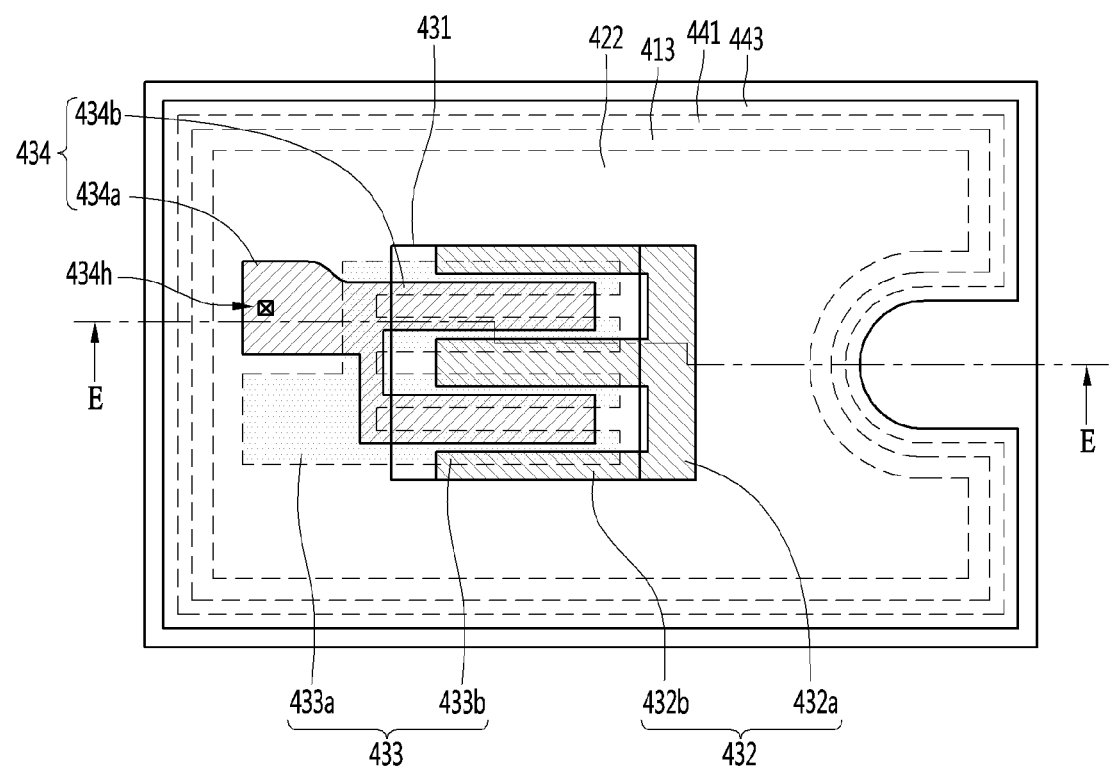
FIGS. 43a and 43b are respectively a plan view and a cross-sectional view illustrating an example in which a source electrode and a drain electrode are formed by the semiconductor device manufacturing method according to an embodiment of the present invention.
Figure 43B:
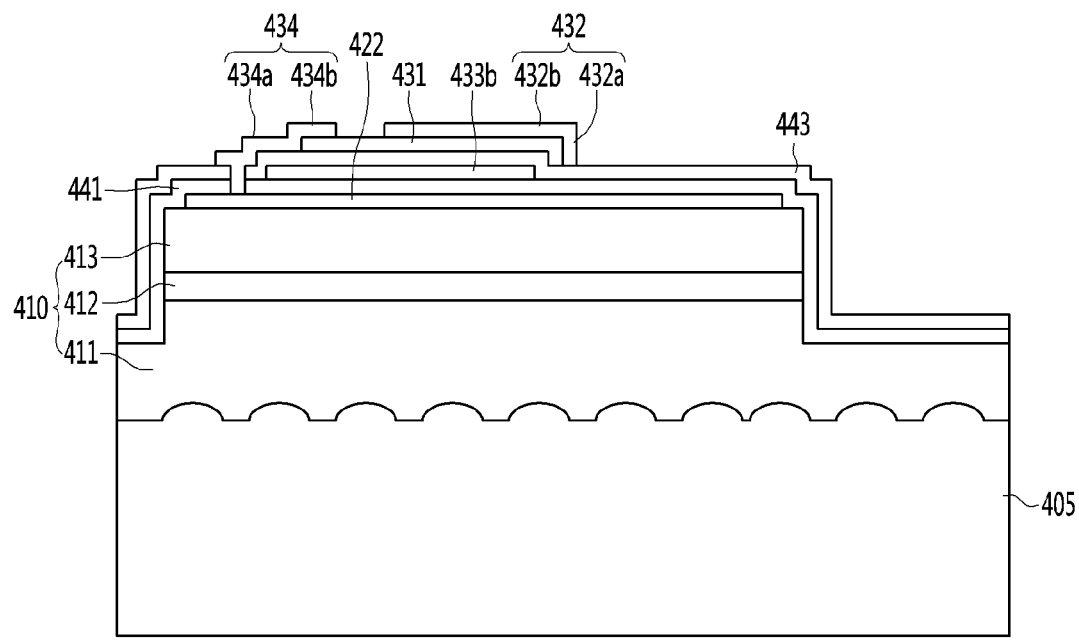

Next, as illustrated in FIGS. 43a and 43b, a source electrode 432 and a drain electrode 434 may be formed.

FIGS. 43a and 43b are respectively a plan view and a cross-sectional view illustrating an example in which the source electrode and the drain electrode are formed by the semiconductor device manufacturing method according to an embodiment of the present invention. FIG. 43b is a cross-sectional view taken along line E-E of the plan view illustrated in FIG. 43a.

According to an embodiment, a drain contact hole 434h may be formed to pass through the first insulating layer 441 and the second insulating layer 443. A source electrode 432 and a drain electrode 434 may be formed on the semiconductor layer 431. The drain electrode 434 may be electrically connected to the second electrode 422 through the drain contact hole 434h.

The source electrode 432 may include a source body electrode 432a and a source branch electrode 432b. The source branch electrode 432b may be provided in plurality. The source branch electrode 432b may extend from the source body electrode 432a. The plurality of source branch electrodes 432b may extend in parallel. The plurality of source branch electrodes 432b may be disposed spaced apart from each other. The source electrode 432 may be disposed to overlap the semiconductor layer 431 in a vertical direction. For example, the source branch electrode 432b of the source electrode 432 may be disposed to overlap the semiconductor layer 431 in a vertical direction.

The drain electrode 434 may include a drain body electrode 434a and a drain branch electrode 434b. The drain branch electrode 434b may be provided in plurality. The drain branch electrode 434b may extend from the drain body electrode 434a. The plurality of drain branch electrodes 434b may extend in parallel. The plurality of drain branch electrodes 434b may be disposed spaced apart from each other. The drain electrode 434 may be disposed to overlap the semiconductor layer 431 in a vertical direction. For example, the drain branch electrode 434b of the drain electrode 434 may be disposed to overlap the semiconductor layer 431 in a vertical direction.

The plurality of source branch electrodes 432b and the plurality of drain branch electrodes 434b may be alternatively disposed. The source branch electrode 432b may be disposed between the drain branch electrodes 434b. The drain branch electrode 434b may be disposed between the source branch electrodes 432b. The plurality of source branch electrodes 432b and the plurality of drain branch electrodes 434b may be alternatively disposed on the semiconductor layer 431 to provide a plurality of channels. The plurality of source branch electrodes 432b and the plurality of drain branch electrodes 434b may be disposed to overlap each other on the semiconductor layer 431 in a horizontal direction. A channel may be provided in the overlapping region in the horizontal direction on the semiconductor layer 431 between the plurality of source branch electrodes 432b and the plurality of drain branch electrodes 434b.

For example, three source branch electrodes 432b may be provided, and two drain branch electrodes 434b may be provided. The two drain branch electrodes 434b may be disposed between the three source branch electrodes 432b. The three source branch electrodes 432b and the two drain branch electrodes 434b may be disposed on the semiconductor layer 431. The three source branch electrodes 432b and the two drain branch electrodes 434b may provide four channels. At this time, each channel may have a channel length L that is a distance from the source branch electrode 432b to the drain branch electrode 434b. In addition, each channel may have a channel width W in which the source branch electrode 432b and the drain branch electrode 434b are disposed to overlap each other in a horizontal direction.

According to an embodiment, the gate electrode 433 may be provided for controlling a current flow in the channel provided between the source branch electrode 432b and the drain branch electrode 434b. For example, the gate electrode 433 may include four gate branch electrodes 433b. The plurality of gate branch electrodes 433b may be overlapped in a vertical direction to the plurality of channels provided by the plurality of source branch electrodes 432b and the plurality of drain branch electrodes 434b. The width of the gate branch electrode 433b may be larger than the channel length L. The gate branch electrode 433b may be overlapped in a vertical direction to a partial region of the source branch electrode 432b and a partial region of the drain branch electrode 434b.

According to an embodiment, the number of the source branch electrodes 432b, the number of the gate branch electrodes 433b, and the number of the drain branch electrodes 434b may be variously changed according to the size of the semiconductor device and the design purpose of the semiconductor device.

The source electrode 432 and the drain electrode 434 may include a single layer or a multi-layer including at least one selected from Cr, Ni, Ti, Ge, Zn, Mg, Ca, Al, Ag, Rh, W, Pt, Au, AuGe, and AuGe/Ni/Au. The source electrode 432, the gate electrode 433, and the drain electrode 434 may be formed of the same material or different materials.

Figure 44A:
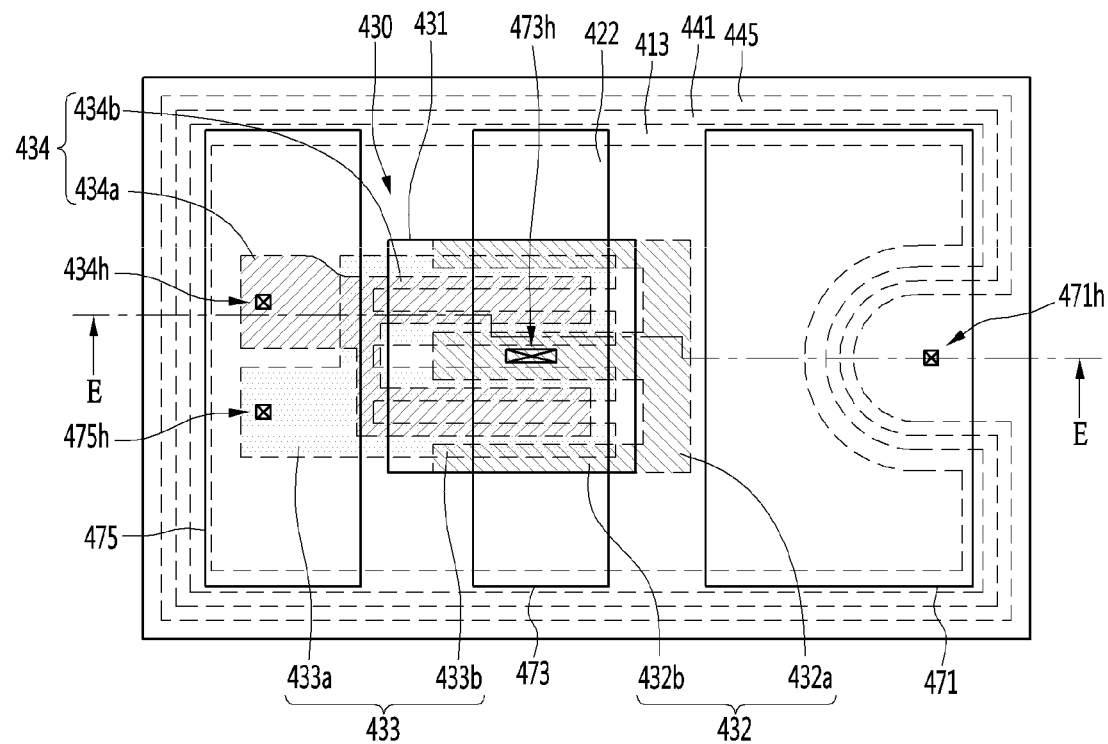
FIGS. 44a and 44b are respectively a plan view and a cross-sectional view illustrating an example in which a first bonding pad, a second bonding pad, and a third bonding pad are formed by the semiconductor device manufacturing method according to an embodiment of the present invention.
Figure 44B:
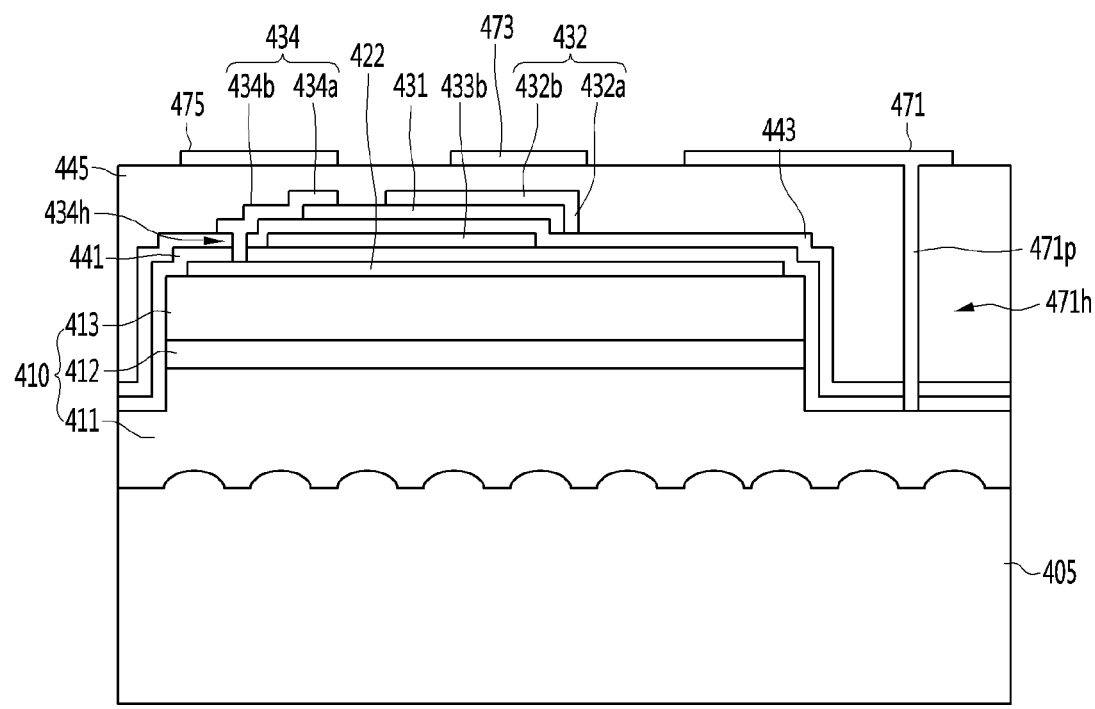

Next, as illustrated in FIGS. 44a and 44b a first bonding pad 471, a second bonding pad 473, and a third bonding pad 475 may be formed.

FIGS. 44a and 44b are respectively a plan view and a cross-sectional view illustrating an example in which a first bonding pad, a second bonding pad, and a third bonding pad are formed by the semiconductor device manufacturing method according to an embodiment of the present invention. FIG. 44b is a cross-sectional view taken along line E-E of the plan view illustrated in FIG. 44a.

First, a third insulating layer 445 may be formed on the source electrode 432 and the drain electrode 434. The third insulating layer 445 may be disposed on the second insulating layer 443. For example, the third insulating layer 445 may include an insulating material. The third insulating layer 445 may include oxide, nitride, or an organic material. For example, the third insulating layer 445 may include at least one selected from $SiO_2$, $SiN_x$, $Al_2O_3$, and the like.

Next, a second bonding pad contact hole 473h may be formed to pass through the third insulating layer 435. The second bonding pad contact hole 473h may expose the upper surface of the source electrode 432. For example, the second bonding pad contact hole 473h may expose the upper surface of the source branch electrode 432b.

Next, a third bonding pad contact hole 475h may be formed to pass through the second insulating layer 433 and the third insulating layer 435. The third bonding pad contact hole 475h may expose the upper surface of the gate electrode 433. For example, the third bonding pad contact hole 473h may expose the upper surface of the gate body electrode 433a.

In addition, a first bonding pad contact hole 471h may be formed to pass through the first insulating layer 431, the second insulating layer 433, and the third insulating layer 435. The first bonding pad contact hole 471h may expose the upper surface of the first conductivity type semiconductor layer 411.

Next, as illustrated in FIGS. 44a and 44b a first bonding pad 471, a second bonding pad 473, and a third bonding pad 475 may be formed on the third insulating layer 445.

The first bonding pad 471 may be electrically connected to the first conductivity type semiconductor layer 411. The first transistor 471 may be disposed on the first conductivity type semiconductor layer 411. The first bonding pad 471 may be electrically connected to the first conductivity type semiconductor layer 411 through the first bonding pad contact hole 471h. The first insulating layer 471 may include a bonding pad extension portion 471p provided in the first bonding pad contact hole 471h.

Meanwhile, the first bonding pad 471 is illustrated in FIGS. 44a and 44b as directly contacting the first conductivity type semiconductor layer 411, but according to an embodiment, a first electrode may be further disposed on the first conductivity type semiconductor layer 411. That is, according to an embodiment, the first electrode may be disposed on the first conductivity type semiconductor layer 411, and the first bonding pad 471 may contact the first electrode.

In addition, the second bonding pad 473 may be electrically connected to the source electrode 432. For example, one end of the second bonding pad 473 may pass through the third insulating layer 445 and contact the upper surface of the source electrode 432. The second bonding pad 473 may be electrically connected to the source electrode 432 through the second bonding pad contact hole 473h provided in the third insulating film 445.

In addition, the third bonding pad 475 may be electrically connected to the gate electrode 433. For example, one end of the third bonding pad 475 may pass through the second insulating layer 443 and the third insulating layer 445 and contact the upper surface of the gate electrode 433. The third bonding pad 475 may be electrically connected to the gate electrode 433 through the third bonding pad contact hole 475h provided in the second insulating layer 443 and the third insulating film 445.

For example, the first bonding pad 471, the second bonding pad 473, and the third bonding pad 475 may include a single layer or a multi-layer including at least one selected from Cr, Ni, Ti, Ge, Zn, Mg, Ca, Al, Ag, Rh, W, Pt, Au, AuGe, AuGe/Ni/Au, In, InAg, and Auln.

The above-described semiconductor device manufacturing method according to the embodiment is merely an example, and it can be understood by a person skilled in the art that various modifications and applications can be made thereto.

Meanwhile, the semiconductor device according to an embodiment may be supplied with power from the outside by, for example, a flip chip bonding method. The first bonding pad 471, the second bonding pad 473, and the third bonding pad 475 are illustrated in FIGS. 44a and 44b as being provided in an upper direction, but when the flip chip bonding method is applied, the upper and lower structure may be reversed such that the first bonding pad 471, the second bonding pad 473, and the third bonding pad 475 are disposed in a lower direction. Therefore, the substrate 405 may be disposed at the upper portion.

When the semiconductor device according to an embodiment is electrically connected to the circuit substrate by the flip chip bonding method, power may be supplied to the first conductivity type semiconductor layer 411 through the first bonding pad 471. In addition, power may be supplied to the source electrode 432 through the second bonding pad 473. In addition, power may be supplied to the gate electrode 433 through the third bonding pad 475. Therefore, when a voltage higher than a threshold voltage of the transistor 430 is applied through the third bonding pad 475, a current flows from the source electrode 432 to the drain electrode 434. Power may be supplied to the second electrode 422 through the drain electrode 434. Power applied to the second electrode 422 may be supplied to the second conductivity type semiconductor layer 413. Therefore, light may be generated in the light-emitting structure 410 by the power applied between the first conductivity type semiconductor layer 411 and the second conductivity type semiconductor layer 413.

According to an embodiment, the driving of the transistor 430 is controlled by the power applied to the second bonding pad 473 and the third bonding pad 475. In addition, power supply to the second electrode 422 may be controlled by the control of the transistor 430. Therefore, the light emission in the light-emitting structure 410 may be controlled by the power applied to the first bonding pad 471 and the power applied to the second electrode 422. The transistor 430 may be controlled by the powers applied to the first bonding pad 471, the second bonding pad 473, and the third bonding pad 475, and the light emission in the light-emitting structure 410 may be controlled.

As described above, the semiconductor device according to the embodiment may control the light emission of the light-emitting structure 410 through the control of the transistor 430. According to an embodiment, since whether to cause the light-emitting structure 410 to emit light by using the control of the transistor 430 can be controlled, it is possible to more accurately control whether to cause the light-emitting structure 410 to emit light, thereby more easily implementing the control of the light emission time and the light emission interval.

In addition, the transistor 430 is disposed on the light-emitting structure 410, thereby maximizing the size of the active layer 412. If the transistor 430 is disposed at or near the side surface of the active layer 412, the size of the active layer 412 may be reduced as much as the size of the transistor 430. However, according to an embodiment, the transistor 430 is disposed on the active layer 412, thereby preventing the area of the active layer 412 from being reduced. Since an amount of light generated in the light-emitting structure 410 is affected by the area of the active layer 412, an amount of light generated in the active layer 412 increases, thereby improving the light extraction efficiency and the luminance as a whole.

Meanwhile, the case of the semiconductor device in which one light-emitting structure 410 and one transistor 430 are provided is illustrated in FIGS. 44a and 44b but the semiconductor device according to an embodiment may include a plurality of light-emitting structures and a plurality of transistors. When the plurality of transistors are provided, the plurality of transistors may be connected in parallel or in series according to a circuit design. Therefore, the degree of freedom of the circuit design can be increased, and the degree of light emitted in the plurality of light-emitting structures can be effectively controlled according to necessity. In addition, the semiconductor device according to an embodiment may include a plurality of light-emitting structures, and the plurality of light-emitting structures may be implemented to emit light of different wavelength bands. Therefore, the semiconductor device according to an embodiment may selectively or independently control the light emission in the plurality of light-emitting structures having different wavelength bands through the control of the plurality of transistors.

The semiconductor device described above may be implemented to emit light of various wavelength bands according to the selection of the active layer. For example, it is possible to implement a display panel or a display apparatus in which one color pixel is constituted by using the blue semiconductor device, the green semiconductor device, and the red semiconductor device described above. The semiconductor device according to an embodiment may be applied to various fields requiring a light source. The semiconductor device according to an embodiment may be applied to, for example, an electronic sign board, a large-size display apparatus, and a signage, thereby implementing a high-resolution light source. In addition, the semiconductor device according to an embodiment may be applied to a communication device. For example, the semiconductor device according to an embodiment may be applied to a visible light communication (VLC), light WiFi (LiFi), or the like which transmits data by using light.

Figure 45:
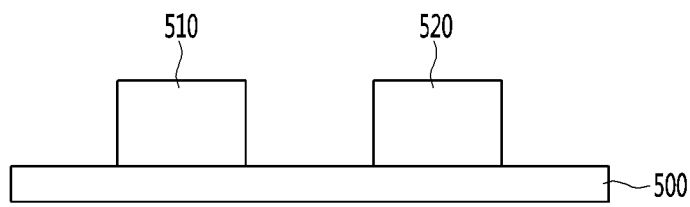
FIG. 45 is a view illustrating a display panel according to an embodiment of the present invention.
Figure 46:
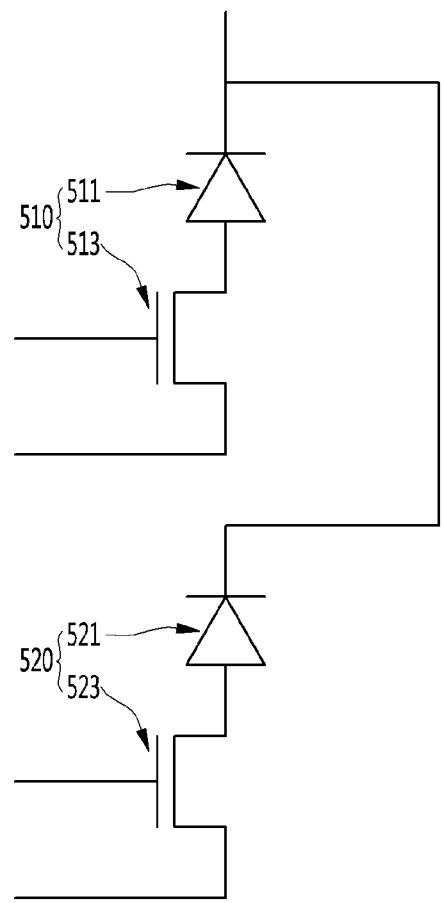
FIG. 46 is an equivalent circuit diagram of the semiconductor device illustrated in FIG. 45.

FIG. 45 is a view illustrating a display panel according to an embodiment of the present invention, and FIG. 46 is an equivalent circuit diagram of the semiconductor device illustrated in FIG. 45.

As illustrated in FIG. 45, the display panel according to an embodiment may include a substrate 500, a first semiconductor device 510, and a second semiconductor device 520. The case where two semiconductor devices are applied is illustrated in FIGS. 45 and 46, but the display panel according to an embodiment may include only one semiconductor device and may include three or more semiconductor devices.

The first semiconductor device 510 may include a first light emitting element 511 and a first transistor 512. The second semiconductor device 520 may include a second light emitting element 521 and a second transistor 523. For example, the first semiconductor device 510 and the second semiconductor device 520 may be one selected from the semiconductor devices described above. The first light emitting element 511 and the second light emitting element 521 may provide light of the same wavelength band, or may provide light of different wavelength bands. The substrate 500 may be a circuit substrate. A control signal may be provided to the first light emitting element 511 and the second light emitting element 512 through the substrate 500.

the semiconductor device according to an embodiment may include a plurality of light-emitting structures and a plurality of transistors. When the plurality of transistors are provided, the plurality of transistors may be connected in parallel or in series according to a circuit design. Therefore, the degree of freedom of the circuit design can be increased, and the degree of light emitted in the plurality of light-emitting structures can be effectively controlled according to necessity. In addition, the semiconductor device according to an embodiment may include a plurality of light-emitting structures, and the plurality of light-emitting structures may be implemented to emit light of different wavelength bands. Therefore, the semiconductor device according to an embodiment may selectively or independently control the light emission in the plurality of light-emitting structures having different wavelength bands through the control of the plurality of transistors. For example, according to an embodiment, it is possible to provide a display panel constituting one color pixel by using the blue semiconductor device, the green semiconductor device, and the red semiconductor device described above.

Figure 47:
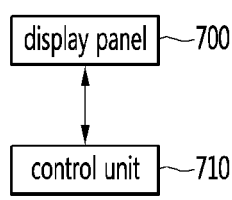
FIG. 47 is a view illustrating a display apparatus according to an embodiment of the present invention.

FIG. 47 is a view illustrating a display apparatus according to an embodiment of the present invention.

The display apparatus according to an embodiment may include a display panel 700 including the semiconductor device described above and a control unit 710 as illustrated in FIG. 47. For example, the display panel 700 may be the display panel described with reference to FIGS. 45 and 46. The control unit 710 may control the light emission of the semiconductor device provided in the display panel 700. The control unit 710 may provide a desired image to the display panel 700 by controlling the power applied to the light emitting element and the transistor of the semiconductor device provided in the display panel 700.

Meanwhile, the semiconductor device according to an embodiment may be applied to a communication device. For example, the semiconductor device according to an embodiment may be applied to a visible light communication (VLC), light WiFi (LiFi), or the like which transmits data by using light.

The communication device according to an embodiment may include a substrate, a semiconductor device disposed on the substrate, and a control unit for controlling the semiconductor device. The semiconductor device according to an embodiment may be disposed on the substrate, and a control signal may be supplied to the semiconductor device through the substrate. The control unit may control the light emission of the semiconductor device and modulate and transmit data. The semiconductor device may be one selected from the semiconductor devices described with reference to FIGS. 1 to 44a and 44b. For example, light emitted by the semiconductor device may have a wavelength of a visible ray band.

Features, structures, and effects described in the above embodiments are incorporated into at least one embodiment, but are not limited to only one embodiment. Furthermore, features, structures, and effects exemplified in one embodiment can easily be combined and modified for another embodiment by those skilled in the art. Therefore, these combinations and modifications should be construed as falling within the scope of the present invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

In a semiconductor device, and a display panel and a display device including the same according to embodiments, light extraction efficiency may be improved and efficient driving may be provided.

In a communication device according to an embodiment, light extraction efficiency may be improved and data may be transmitted by using efficiently controlled light.

The invention claimed is:

1. A semiconductor device, comprising:
   a light-emitting structure comprising a first conductivity type semiconductor layer, an active layer disposed on the first conductivity type semiconductor layer, and a second conductivity type semiconductor layer disposed on the active layer;
   a transistor disposed on the light-emitting structure and comprising a semiconductor layer, a source electrode, a gate electrode, and a drain electrode;
   a second electrode disposed on the second conductivity type semiconductor layer and electrically connected to the drain electrode and the second conductivity type semiconductor layer;
   a first bonding pad disposed on the light-emitting structure and electrically connected to the first conductivity type semiconductor layer;
   a second bonding pad disposed on the transistor and electrically connected to the source electrode; and
   a third bonding pad disposed on the transistor and electrically connected to the gate electrode.

2. The semiconductor device according to claim 1, wherein the transistor is disposed on the active layer.

3. The semiconductor device according to claim 1, comprising a first insulating layer disposed between the second electrode and the transistor.

4. The semiconductor device according to claim 3, wherein the transistor comprises:
   the gate electrode disposed on the first insulating layer;
   a second insulating layer disposed on the gate electrode;
   the semiconductor layer disposed on the second insulating layer;
   the source electrode electrically connected to a first region of the semiconductor layer; and
   the drain electrode electrically connected to a second region of the semiconductor layer, passing through the first insulating layer and the second insulating layer, and electrically connected to the second electrode.

5. The semiconductor device according to claim 4, further comprising a third insulating layer disposed on the source electrode, the drain electrode, and the second insulating layer,
   wherein the first bonding pad is disposed on the third insulating layer, passes through the first insulating layer, the second insulating layer, and the third insulating layer, and is electrically connected to the first conductivity type semiconductor layer, wherein the second bonding pad is disposed on the third insulating layer, passes through the third insulating layer, and is electrically connected to the source electrode, and wherein the third bonding pad is disposed on the third insulating layer, passes through the second insulating layer and the third insulating layer, and is electrically connected to the gate electrode.

6. The semiconductor device according to claim 1, wherein the source electrode comprises a source body electrode and a source branch electrode, and the source branch electrode is provided in plurality and extends from the source body electrode, wherein the drain electrode comprises a drain body electrode and a drain branch electrode, and the drain branch electrode is provided in plurality and extends from the drain body electrode, and wherein a plurality of source branch electrodes and a plurality of drain branch electrodes are alternatively disposed on the semiconductor layer to provide a plurality of channels.

7. The semiconductor device according to claim 6, wherein the gate electrode comprises a gate body electrode and a gate branch electrode, wherein the gate branch electrode is provided in plurality and extends from the gate body electrode, and wherein a plurality of gate branch electrodes are overlapped in a vertical direction to the plurality of channels provided by the plurality of source branch electrodes and the plurality of drain branch electrodes.

8. The semiconductor device according to claim 6, wherein the plurality of source branch electrodes and the plurality of drain branch electrodes overlap each other on the semiconductor layer in a horizontal direction.

9. The semiconductor device according to claim 1, further comprising a first electrode disposed on the first conductivity type semiconductor layer and electrically connected to the first bonding pad and the first conductivity type semiconductor layer.

10. The semiconductor device according to claim 1, wherein the driving of the transistor is controlled by power applied to the second bonding pad and the third bonding pad, such that power is applied to the second electrode, and wherein light emission in the light-emitting structure is controlled by power applied to the first bonding pad and the power applied to the second electrode.

11. A display panel, comprising:
a substrate; and
a semiconductor device disposed on the substrate,
wherein the semiconductor device comprises,
a light-emitting structure comprising a first conductivity type semiconductor layer, an active layer disposed on the first conductivity type semiconductor layer, and a second conductivity type semiconductor layer disposed on the active layer;
a transistor disposed on the light-emitting structure and comprising a semiconductor layer, a source electrode, a gate electrode, and a drain electrode;
a second electrode disposed on the second conductivity type semiconductor layer and electrically connected to the drain electrode and the second conductivity type semiconductor layer;
a first bonding pad disposed on the light-emitting structure and electrically connected to the first conductivity type semiconductor layer;
a second bonding pad disposed on the transistor and electrically connected to the source electrode; and
a third bonding pad disposed on the transistor and electrically connected to the gate electrode.

12. The display panel according to claim 11, wherein the transistor is disposed on the active layer.

13. The display panel according to claim 11, comprising a first insulating layer disposed between the second electrode and the transistor.

14. The display panel according to claim 13, wherein the transistor comprises:
the gate electrode disposed on the first insulating layer;
a second insulating layer disposed on the gate electrode;
the semiconductor layer disposed on the second insulating layer;
the source electrode electrically connected to a first region of the semiconductor layer; and
the drain electrode electrically connected to a second region of the semiconductor layer, passing through the first insulating layer and the second insulating layer, and electrically connected to the second electrode.

15. The display panel according to claim 14, further comprising a third insulating layer disposed on the source electrode, the drain electrode, and the second insulating layer, wherein the first bonding pad is disposed on the third insulating layer, passes through the first insulating layer, the second insulating layer, and the third insulating layer, and is electrically connected to the first conductivity type semiconductor layer, wherein the second bonding pad is disposed on the third insulating layer, passes through the third insulating layer, and is electrically connected to the source electrode, and wherein the third bonding pad is disposed on the third insulating layer, passes through the second insulating layer and the third insulating layer, and is electrically connected to the gate electrode.

16. The display panel according to claim 11, wherein the source electrode comprises a source body electrode and a source branch electrode, and the source branch electrode is provided in plurality and extends from the source body electrode, wherein the drain electrode comprises a drain body electrode and a drain branch electrode, and the drain branch electrode is provided in plurality and extends from the drain body electrode, and wherein a plurality of source branch electrodes and a plurality of drain branch electrodes are alternatively disposed on the semiconductor layer to provide a plurality of channels.

17. The display panel according to claim 16, wherein the gate electrode comprises a gate body electrode and a gate branch electrode, wherein the gate branch electrode is provided in plurality and extends from the gate body electrode, and wherein a plurality of gate branch electrodes are overlapped in a vertical direction to the plurality of channels provided by the plurality of source branch electrodes and the plurality of drain branch electrodes.

18. The display panel according to claim 16, wherein the plurality of source branch electrodes and the plurality of drain branch electrodes overlap each other on the semiconductor layer in a horizontal direction.

19. The display panel according to claim 11, further comprising a first electrode disposed on the first conductivity type semiconductor layer and electrically connected to the first bonding pad and the first conductivity type semiconductor layer.

20. A display apparatus, comprising:
a substrate;
a semiconductor device disposed on the substrate; and
a control unit configured to control light emission of the semiconductor device,
wherein the semiconductor device comprises,
a light-emitting structure comprising a first conductivity type semiconductor layer, an active layer disposed on the first conductivity type semiconductor layer, and a second conductivity type semiconductor layer disposed on the active layer;
a transistor disposed on the light-emitting structure and comprising a semiconductor layer, a source electrode, a gate electrode, and a drain electrode;
a second electrode disposed on the second conductivity type semiconductor layer and electrically connected to the drain electrode and the second conductivity type semiconductor layer;
a first bonding pad disposed on the light-emitting structure and electrically connected to the first conductivity type semiconductor layer;
a second bonding pad disposed on the transistor and electrically connected to the source electrode; and
a third bonding pad disposed on the transistor and electrically connected to the gate electrode.

* * * * *